United States Patent
Ito et al.

(10) Patent No.: US 8,815,478 B2
(45) Date of Patent: Aug. 26, 2014

(54) COLORED CURABLE COMPOSITION, RESIST LIQUID, INK FOR INKJET PRINTING, COLOR FILTER, METHOD OF PRODUCING COLOR FILTER, SOLID-STATE IMAGE SENSOR, LIQUID CRYSTAL DISPLAY, ORGANIC EL DISPLAY, IMAGE DISPLAY DEVICE AND COLORANT COMPOUND

(75) Inventors: Junichi Ito, Shizuoka-ken (JP); Yuki Mizukawa, Shizuoka-ken (JP); Yoshiharu Yabuki, Shizuoka-ken (JP); Shinichi Kanna, Shizuoka-ken (JP); Haruki Inabe, Shizuoka-ken (JP); Yushi Kaneko, Shizuoka-ken (JP); Akiyoshi Goto, Shizuoka-ken (JP)

(73) Assignee: FUJIFILM Corporation, Tokyo (JP)

( * ) Notice: Subject to any disclaimer, the term of this patent is extended or adjusted under 35 U.S.C. 154(b) by 133 days.

(21) Appl. No.: 13/501,650

(22) PCT Filed: Oct. 7, 2010

(86) PCT No.: PCT/JP2010/068098
§ 371 (c)(1),
(2), (4) Date: Jul. 2, 2012

(87) PCT Pub. No.: WO2011/046192
PCT Pub. Date: Apr. 21, 2011

(65) Prior Publication Data
US 2012/0264039 A1    Oct. 18, 2012

(30) Foreign Application Priority Data

Oct. 14, 2009  (JP) .................................. 2009-237658
Jan. 26, 2010  (JP) .................................. 2010-014776

(51) Int. Cl.
*G03F 1/00*    (2012.01)
(52) U.S. Cl.
USPC ............................ 430/7; 430/270.1; 548/403

(58) Field of Classification Search
USPC .................................... 430/7, 270.1; 548/403
See application file for complete search history.

(56) References Cited

U.S. PATENT DOCUMENTS

| | | | |
|---|---|---|---|
| 8,343,696 B2 * | 1/2013 | Ito | 430/7 |
| 2008/0076044 A1 | 3/2008 | Mizukawa et al. | |
| 2010/0055582 A1 | 3/2010 | Mizukawa et al. | |
| 2010/0081071 A1 * | 4/2010 | Ito | 430/7 |
| 2011/0217636 A1 * | 9/2011 | Kanna et al. | 430/7 |

FOREIGN PATENT DOCUMENTS

| | | |
|---|---|---|
| JP | 59-75205 A | 4/1984 |
| JP | 6-75375 A | 3/1994 |
| JP | 2002-201387 A | 7/2002 |
| JP | 3309514 B2 | 7/2002 |
| JP | 2003-57436 A | 2/2003 |
| JP | 2004-339332 A | 12/2004 |
| JP | 2005-77953 A | 3/2005 |
| JP | 2005-316012 A | 11/2005 |
| JP | 2006-258916 A | 9/2006 |
| JP | 2008-292970 A | 12/2008 |
| JP | 2010-84141 A | 4/2010 |
| JP | 2010-85454 A | 4/2010 |

OTHER PUBLICATIONS

International Search Report for PCT/JP2010/068098 dated Nov. 9, 2010.

* cited by examiner

*Primary Examiner* — Stewart Fraser
(74) *Attorney, Agent, or Firm* — Sughrue Mion, PLLC

(57) ABSTRACT

The invention provides a colored curable composition including a dipyrromethene compound having a structure in which a polymerizable group and a carboxyl group are introduced in the same molecule, a resist liquid, an ink for inkjet printing, a color filter, a method of producing a color filter, a solid-state image sensor, a liquid crystal display, an organic EL display, an image display device and a colorant compound.

15 Claims, No Drawings

COLORED CURABLE COMPOSITION, RESIST LIQUID, INK FOR INKJET PRINTING, COLOR FILTER, METHOD OF PRODUCING COLOR FILTER, SOLID-STATE IMAGE SENSOR, LIQUID CRYSTAL DISPLAY, ORGANIC EL DISPLAY, IMAGE DISPLAY DEVICE AND COLORANT COMPOUND

CROSS REFERENCE TO RELATED APPLICATIONS

This application is a National Stage of International Application No. PCT/JP2010/068098 filed Oct. 7, 2010, claiming priority based on Japanese Patent Application Nos. 2009-237658 filed Oct. 14, 2009 and 2010-014776 filed Jan. 26, 2010, the contents of all of which are incorporated herein by reference in their entirety.

BACKGROUND OF THE INVENTION

1. Technical Field

The invention relates to a colored curable composition, a resist liquid, an ink for inkjet printing, a color filter, a method of producing a color filter, a solid-state image sensor, a liquid crystal display, an organic EL display, an image display device and a colorant compound.

2. Background Art

Demands for liquid crystal displays (LCDs), in particular for color liquid crystal displays, have been increasing in recent years as technologies in personal computers and, in particular, large-size liquid crystal displays advance. There are also demands for organic EL displays to become more popular out of requirements for further improved image quality. Meanwhile, demands for solid-state image sensors, such as CCD image sensors, have been remarkably increasing against the backdrop of growing popularity of digital cameras and mobile phones equipped with a camera.

Color filters are used as a key device for these displays and optical elements, and there are increasing demands for lower cost as well as for improved image quality. These color filters typically have a colored pattern of three primary colors of red (R), green (G) and blue (B), and divide light transmitting the color filter into the three primary colors in a display device or a solid-state image sensor.

Colorants used in color filters need to have the following characteristics in common.

Specifically, these colorants are required to exhibit favorable spectroscopic characteristics in terms of color reproducibility; suppressed optical disorder such as light scattering that causes decrease in contrast of a liquid crystal display or unevenness in optical density that causes color irregularity or roughness of a solid-state image sensor; fastness under environmental conditions in which the color filter is used, such as heat fastness, light fastness or moisture fastness; a large molar light absorption constant that enables formation of a thin film; and the like.

A pigment dispersion method is employed as a method of producing a color filter as mentioned above. In this method, since a colored curable composition in which a pigment is dispersed in various kinds of curable compositions is used for preparing a color filter by photolithography or ink jetting, the obtained color filter is stable with respect to light or heat.

In a method of employing photolithography, colored pixels are obtained by applying a radiation-sensitive composition to a substrate by using a spin coater, a roll coater or the like, drying the same to form a film, and developing this film by performing pattern exposure. A color filter can be produced by repeating these processes for a number of times of the colors used in the color filter. Photolithography has been widely used as a suitable method for producing large-sized high-definition color filters, and advantages of this method have been particularly remarkable in the field of producing solid-state image sensors that require even higher levels of resolution in these days.

In the process of producing a color filter for a solid-state image sensor, microscopic patterns are formed by exposing via a mask having a microscopic pattern, developing the same with an alkali solution such that the unexposed portion is dissolved therein. In this process, however, adjusting the solubility (developability) of the cured portion and the uncured portion may be difficult. In particular, when the colored curable composition has a low solubility with respect to an alkali developer, favorable patterns may not be formed due to a colorant remaining in the uncured portion. Therefore, there is need for a colored curable composition having small dependency on the concentration of alkali solution.

In recent years, further improvements in fineness of color filters for solid-state image sensor are desired. However, in conventional pigment dispersion methods, it is difficult to further improve fineness in view of occurrence of color irregularity due to coarse particles of pigment, or the like. Accordingly, it is getting more difficult to apply photolithography by a pigment dispersion method to applications such as solid-state image sensors in which fine patterns are desired. Further, in the field of liquid crystal displays, there are problems in color filters produced by photolithography employing a pigment dispersion method, such as decrease in contrast due to light scattering caused by pigment particles or increase in haze, even though light fastness and heat fastness are favorable.

Moreover, in the technique of photolithography, since a series of processes including application of a radiation-sensitive composition, drying, performing pattern exposure and development need to be repeated for a number of times of colors, problems such as high costs or reduction in yield rate may arise. In particular, as demands for lower prices for expensive color liquid crystal displays increase, demands for lower prices for color filters, which occupies a large portion of the total cost, is increasing. Accordingly, a method of producing a color filter at higher productivity has been increasingly desired.

In view of these circumstances, as a method of producing a color filter that solves the problems in photolithography as mentioned above, a method of forming a color layer (color pixels) by depositing color ink by an inkjet method is proposed (for example, see Japanese Patent Application Laid-Open (JP-A) Nos. 59-75205 and 2004-339332).

An inkjet method is a recording method of forming characters or images by discharging ink droplets directly to a recording medium from extremely fine nozzles, and depositing the ink to the recording medium. This method has such advantages in that large-size color filters can be produced at high productivity, noises are low, operation suitability is favorable, and the like. In the production of a color filter by an inkjet method, an ink for inkjet printing produced by a pigment dispersion method is used. As an ink for inkjet printing produced by a pigment dispersion method is used, an ink for inkjet printing for a color filter is proposed, in which a binder component, a pigment, and a solvent having a boiling point of from 180° C. to 260° C. and a vapor pressure of 1.5 mmHg or less are contained (for example, see JP-A No. 2002-201387).

When an ink for inkjet printing produced by a pigment dispersion method is used for producing color filters, there is demand for improving discharge stability in order to deal with frequent occurrence of nozzle clogging caused by coagulation of pigment in the ink. Further, recoverability of an ink discharge state by performing a discharge recovery operation, such as wiping or purging, tends to decrease due to the coagulated pigment. Moreover, misdirection of ink discharge may occur as a result of nozzle surfaces being scraped with the coagulated ink during wiping.

When a dye is used instead of a pigment dispersion method, achievement of high definition by solving problems of color irregularity and roughness, in the case of color filters for solid-state image sensors, and improvements in optical characteristics in terms of contrast and haze, in the case of color filters for organic EL displays, are expected. Moreover, when a dye is used in an inkjet method, discharge stability is generally high and it is expected that the ink discharge state can be more easily recovered by wiping or purging, even when nozzles are clogged due to increased ink viscosity or the like.

In view of the above circumstances, use of a dye as a colorant has been studied (for example, see JP-A No. 6-75375). However, use of a curable composition containing a dye raises new problems as described below.

(1) Light fastness and heat fastness of dyes are typically inferior to that of pigments. In particular, there is a problem in that optical characteristics of dyes may change due to high temperature at the time of forming an ITO (indium tin oxide) film commonly used in FPDs (flat panel displays) such as an electrode for liquid crystal displays (LCDs).

(2) Dyes tend to suppress radical polymerization reaction, which makes it difficult to design a colored curable composition in a system in which radical polymerization is used as a means of curing.

In particular, in the case of photolithography, (3) Ordinary dyes have a low solubility with respect to an aqueous alkali solution or an organic solvent (hereinafter, also simply referred to as a solvent), which makes it difficult to obtain a curable composition having a desired spectrum.

(4) Dyes tend to interact with other components in the curable composition, which makes it difficult to adjust the solubility in a cured portion and the solubility in an uncured portion (developability).

(5) When the molar light absorbance coefficient (ε) of a dye is low, a large amount of dye needs to be used. As a result, the amounts of other components such as a polymerizable compound (monomer), a binder or a photopolymerization initiator in the curable composition need to be reduced, whereby curability, heat fastness after curing, developability of (non) cured portion or the like of the composition may be lowered.

Due to these problems associated with dyes, it has been difficult to use dye for forming a colored pattern of a color filter having a small thickness and exhibits high definition and excellent fastness. Moreover, since color filters for a solid-state image sensor need to have a thickness of as thin as 1 μm or less, dye needs to be added in the curable composition in large amount, thereby exaggerating the aforementioned problems.

In connection with these problems, various methods including selecting the type of initiator or increasing the amount of initiator have been proposed (for examples, see JP-A No. 2005-316012). Further, a method of producing a color filter is proposed in which a colored pattern is exposed to light while heating a substrate after formation of the colored pattern in order to increase the polymerization rate by performing polymerization at an elevated exposure temperature (see, for example, Japanese Patent No. 3309514). Moreover, a method of producing a color filter is disclosed in which light exposure is performed between the development treatment and the heat treatment in order to suppress deformation of the color filter (see, for example, JP-A No. 2006-258916).

Focusing on favorable spectroscopic characteristics of color filters, colored curable compositions and colorant compounds in which a dipyrromethene dye is used have been studied (see, for example, JP-A No. 2008-292970).

Dye-containing colored compositions for a color filter has a problem in that, in addition to the aforementioned problems, when heat treatment is carried out after the formation of the color filter, color transfer tends to occur between adjacent pixels or between color filter layers when two or more of these are layered.

Moreover, since a large amount of dye needs to be added to the curable composition, relative contents of components that contribute to photolithographic properties are reduced. As a result, the pattern may be easily exfoliated in a region exposed to a low amount of light due to decreased sensitivity, or cause defective pattern formation, such as failure to achieve desired shape or color density due to deformation due to heat or elusion during development.

JP-A No. 2008-292970 discloses spectroscopic characteristics derived from light absorbance characteristics that are unique to dipyrromethene dyes, but does not discuss problems such as color transfer or defective pattern formation.

In view of the above circumstances, a first aspect of the invention provides a colored curable composition, a resist liquid and ink for inkjet printing that form a cured film that exhibits excellent color purity, a high light absorbance coefficient that enables formation of a thin film, and excellent robustness and pattern formation properties.

A second aspect of the invention provides a color filter that exhibits excellent color purity, fastness and pattern formation properties, as well as suppressed color transfer, an image device, a solid-state image device, a liquid crystal display, an organic EL display and an image display device.

A third aspect of the invention provides a method of producing a color filter that exhibits excellent color purity, fastness and pattern formation properties, as well as suppressed color transfer.

A fourth aspect of the invention provides a colorant that exhibits excellent absorbance characteristics, a high molar light absorbance coefficient, and as necessary, excellent developability.

The present inventors have studied various kinds of colorants and, as a result, found that a dipyrromethene dye compound having a specific structure in which a polymerizable group and a carboxyl group are introduced in the same molecule exhibits a favorable color hue and a high light absorbance coefficient, and excellent solubility with respect to an organic solvent. Moreover, the present inventors have found that a cured film formed by a colored curable composition containing this compound exhibits excellent fastness, suppressed color transfer and excellent pattern formation properties (exhibits a low dependency on the concentration of alkali developer).

As mentioned above, it is widely known that dyes tend to suppress radical polymerization reaction. Accordingly, little has been known concerning dipyrromethene dyes in which a polymerizable group is introduced in order to suppress color transfer, much less dipyrromethene dyes in which a carboxyl group is also introduced in order to achieve excellent pattern formation properties.

The dipyrromethene dye compounds according to the invention is a compound having a chelate structure. Although JP-A No. 2008-292970 discloses a compound having a dipyrromethene dye skeleton, this literature does not suggest introducing a specific substituent in a dipyrromethene dye in order to acquire properties required by a colored curable composition for forming a color filter at even higher definition (such as sufficient solubility with respect to an organic solvent, light fastness, heat fastness, temporal stability, solvent resistance after curing, color hue and transmission properties; in particular, pattern formation properties and color transfer when the dye is used for a resist), also in view of adverse effects against the stability of a chelate complex.

DETAILED DESCRIPTION OF THE INVENTION

Hereinafter, description is made in detail with respect to a colored curable composition, a resist liquid, an ink for inkjet printing, a color filter, a method for producing the color filter, an image device, a solid-state image sensor, a liquid crystal display, an organic EL device, an image display device, and a pigment according to the invention. The following descriptions concerning the components may be made based on typical embodiments of the invention, but the invention is not limited to these embodiments.

Further, a numerical range represented by "A to B" in this specification indicates a range including the values of A and B as upper and lower limits of the range, respectively.

(1) Colored Curable Composition

The colored curable composition according to the invention contains, as a colorant, at least one selected from the group consisting of a compound represented by the following formula (1) and a tautomer thereof. The colored curable composition according to the invention is cured by either light or heat, and preferably further contains a radiation-sensitive compound or a polymerizable monomer. In addition, the composition may further contain a solvent and, as necessary, by other components such as a binder and a crosslinking agent.

Compound Represented by Formula (1)

Description is made in detail with respect to the compound represented by formula (1) in the invention.

formula (1)

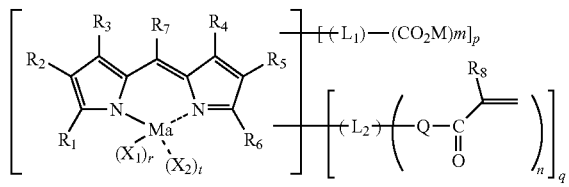

In formula (1), $R_1$ to $R_6$ each independently represent a hydrogen atom or a substituent; $R_7$ represents a hydrogen atom, a halogen atom, an alkyl group, an aryl group or a heterocyclic group; a substituent represented by any of $R_1$ to $R_6$ is a divalent linking group bonded to -$L_1$- or -$L_2$-, or a substituent represented by any of $R_1$ to $R_6$ is a single bond and -$L_1$- or -$L_2$- directly substitutes the dipyrromethene skeleton; Ma represents a metal or a metal compound; $X_1$ represents a group necessary for neutralizing charges of Ma; $X_2$ represents a group capable of binding to Ma; r represents 0 or 1; t represents 0, 1 or 2; $X_1$ and $X_2$ may be bonded to each other to form a five, six or seven-membered ring; M represents a hydrogen atom, an organic base or a metal atom to neutralize charges of —$CO_2$—, or an anion (that is, $CO_2M$ represents $CO_2^-$); $L_1$ represents a single bond or a (m+1)-valent linking group; m represents 1, 2 or 3; p represents 1 or 2; $R_8$ represents a hydrogen atom or a methyl group; Q represents an oxygen atom or $NR_9$ ($R_9$ represents a hydrogen atom, an alkyl group, an alkenyl group, an aryl group, a heterocyclic group, an acyl group, an alkylsulfonyl group or an arylsulfonyl group); $L_2$ represents a single bond or an (n+1)-valent linking group; n represents 1, 2 or 3; q represents 1 or 2; when p is 2, the two of {($L_1$)-($CO_2M$)m} may be the same or different from each other; when q is 2, the two of {($L_2$)-(Q-COC($R_8$)=$CH_2$)n} may be the same or different from each other; when m is 2 or 3, the two or three of ($CO_2M$) may be the same or different from each other; and when n is 2 or 3, the two or three of (Q-COC($R_8$)=$CH_2$) may be the same or different from each other.

In formula (1), $R_1$ to $R_6$ each independently represent a hydrogen atom or a substituent; and $R_7$ represents a hydrogen atom, a halogen atom, an alkyl group, an aryl group or a heterocyclic group.

Examples of the substituent represented by $R_1$ to $R_6$ in formula (1) include a halogen atom (for example, fluorine, chlorine, bromine), an alkyl group (for example, a straight, branched or cyclic alkyl group having preferably 1 to 48 carbon atoms, more preferably 1 to 24 carbon atoms; examples thereof include methyl, ethyl, propyl, isopropyl, butyl, t-butyl, pentyl, hexyl, heptyl, octyl, 2-ethylhexyl, dodecyl, hexadecyl, cyclopropyl, cyclopentyl, cyclohexyl, 1-norbornyl, and 1-adamantyl), an alkenyl group (for example, an alkenyl group having preferably 2 to 48 carbon atoms, more preferably 2 to 18 carbon atoms; examples thereof include vinyl, allyl, and 3-buten-1-yl), an aryl group (for example, an aryl group having preferably 6 to 48 carbon atoms, more preferably 6 to 24 carbon atoms; examples thereof include phenyl and naphthyl), a heterocyclic group (for example, a heterocyclic group having preferably 1 to 32 carbon atoms, more preferably 1 to 18 carbon atoms; examples thereof include 2-thienyl, 4-pyridyl, 2-furyl, 2-pyrimidinyl, 1-pyridyl, 2-benzothiazolyl, 1-imidazolyl, 1-pyrazolyl, and benzotriazol-1-yl), a silyl group (for example, a silyl group having preferably 3 to 38 carbon atoms, more preferably 3 to 18 carbon atoms; examples thereof include trimethylsilyl, triethylsilyl, tributylsilyl, t-butyldimethylsilyl, and t-hexyldimethylsilyl), a hydroxyl group, a cyano group, a nitro group, an alkoxy group (for example, an alkoxy group having preferably 1 to 48 carbon atoms, more preferably 1 to 24 carbon atoms; examples thereof include methoxy, ethoxy, 1-butoxy, 2-butoxy, isopropoxy, t-butoxy, dodecyloxy, and a cycloalkyloxy group such as cyclopentyloxy or cyclohexyloxy), an aryloxy group (for example, an aryloxy group having preferably 6 to 48 carbon atoms, more preferably 6 to 24 carbon atoms; examples thereof include phenoxy and 1-naphthoxy), a heterocyclic oxy group (for example, a heterocyclic oxy group having preferably 1 to 32 carbon atoms, more preferably 1 to 18 carbon atoms; examples thereof include 1-phenyltetrazol-5-oxy and 2-tetrahydropyranyloxy), a silyloxy group (for example, a silyloxy group having preferably 1 to 32 carbon atoms, more preferably 1 to 18 carbon atoms; examples thereof include trimethylsilyloxy, t-butyldimethylsiliyloxy, and diphenylmethylsilyloxy), an acyloxy group (for example, an acyloxy group having preferably 2 to 48 carbon atoms, more preferably 2 to 24 carbon atoms; examples thereof include acetoxy, pivaloyloxy, benzoyloxy, and dodecanoyloxy), an alkoxycarbonyloxy group (for example, an alkoxycarbonyloxy group having preferably 2 to 48 carbon atoms, more preferably 2 to 24 carbon atoms; examples thereof include ethoxycarbonyloxy, t-butoxycarbonyloxy, and a cycloalkyloxycarbonyloxy group such as cyclohexyloxycarbonyloxy), an aryloxycarbonyloxy group (for example, an aryloxycarbonyloxy group having preferably 7 to 32 carbon atoms, more preferably 7 to 24 carbon atoms;

examples thereof include phenoxycarbonyloxy), a carbamoyloxy group (for example, a carbamoyloxy group having preferably 1 to 48 carbon atoms, more preferably 1 to 24 carbon atoms; examples thereof include N,N-dimethylcarbamoyloxy, N-butylcarbamoyloxy, N-phenylcarbamoyloxy, and N-ethyl-N-phenylcarbamoyloxy), a sulfamoyloxy group (for example, a sulfamoyloxy group having preferably 1 to 32 carbon atoms, more preferably 1 to 24 carbon atoms; examples thereof include N,N-diethylsulfamoyloxy and N-propylsulfamoyloxy), an alkylsulfonyloxy group (for example, an alkylsulfonyloxy group having preferably 1 to 38 carbon atoms, more preferably 1 to 24 carbon atoms; examples thereof include methylsulfonyloxy, hexadecylsulfonyloxy, and cyclohexylsulfonyloxy), an aryl sulfonyloxy group (for example, an aryl sulfonyloxy group having preferably 6 to 32 carbon atoms, more preferably 6 to 24 carbon atoms; examples thereof include phenylsulfonyloxy), an acyl group (for example, an acyl group having preferably 1 to 48 carbon atoms, more preferably 1 to 24 carbon atoms; examples thereof include formyl, acetyl, pivaloyl, benzoyl, tetradecanoyl, and cyclohexanoyl), an alkoxycarbonyl group (for example, an alkoxycarbonyl group having preferably 2 to 48 carbon atoms, more preferably 2 to 24 carbon atoms; examples thereof include methoxycarbonyl, ethoxycarbonyl, octadecyloxycarbonyl, cyclohexyloxycarbonyl, and 2,6-di-tert-butyl-4-methylcyclohexyloxycarbonyl), an aryloxycarbonyl group (for example, an aryloxycarbonyl group having preferably 7 to 32 carbon atoms, more preferably 7 to 24 carbon atoms; examples thereof include phenoxycarbonyl), a carbamoyl group (for example, a carbamoyl group having preferably 1 to 48 carbon atoms, more preferably 1 to 24 carbon atoms; examples thereof include carbamoyl, N,N-diethylcarbamoyl, N-ethyl-N-octylcarbamoyl, N,N-dibutylcarbamoyl, N-propylcarbamoyl, N-phenylcarbamoyl, N-methyl-N-phenylcarbamoyl, and N,N-dicyclohexylcarbamoyl), an amino group (for example, an amino group having preferably 32 or less carbon atoms, more preferably 24 or less carbon atoms; examples thereof include amino, methylamino, N,N-dibutylamino, tetradecylamino, 2-ethylhexylamino, and cyclohexylamino), an anilino group (for example, an anilino group having preferably 6 to 32 carbon atoms, more preferably 6 to 24 carbon atoms; examples thereof include anilino and N-methylanilino), a heterocyclic amino group (for example, a heterocyclic amino group having preferably 1 to 32 carbon atoms, more preferably 1 to 18 carbon atoms; examples thereof include 4-pyridylamino), a carbonamido group (for example, a carbonamido group having preferably 2 to 48 carbon atoms, more preferably 2 to 24 carbon atoms; examples thereof include acetamide, benzamide, tetradecaneamido, pivaloylamido, and cyclohexaneamido), a ureido group (for example, a ureido group having preferably 1 to 32 carbon atoms, more preferably 1 to 24 carbon atoms; examples thereof include ureido, N,N-dimethylureido, and N-phenylureido), an imido group (for example, an imido group having preferably 36 or less carbon atoms, more preferably 24 or less carbon atoms; examples thereof include N-succinimido and N-phthalimido), an alkoxycarbonylamino group (for example, an alkoxycarbonylamino group having preferably 2 to 48 carbon atoms, more preferably 2 to 24 carbon atoms; examples thereof include methoxycarbonylamino, ethoxycarbonylamino, t-butoxycarbonylamino, octadecyloxycarbonylamino, and cyclohexyloxycarbonylamino), an aryloxycarbonylamino group (for example, an aryloxycarbonylamino group having preferably 7 to 32 carbon atoms, more preferably 7 to 24 carbon atoms; examples thereof include phenoxycarbonylamino), a sulfonamido group (for example, a sulfonamido group having preferably 1 to 48 carbon atoms, more preferably 1 to 24 carbon atoms; examples thereof include methanesulfonamido, butanesulfonamido, benzenesulfonamido, hexadecanesulfonamido, and cyclohexanesulfonamido), a sulfamoylamino group (for example, a sulfamoylamino group having preferably 1 to 48 carbon atoms, more preferably 1 to 24 carbon atoms; examples thereof include N,N-dipropylsulfamoylamino and N-ethyl-N-dodecylsulfamoylamino), an azo group (for example, an azo group having preferably 1 to 32 carbon atoms, more preferably 1 to 24 carbon atoms; examples thereof include phenylazo and 3-pyrazolylazo), an alkylthio group (for example, an alkylthio group having preferably 1 to 48 carbon atoms, more preferably 1 to 24 carbon atoms; examples thereof include methylthio, ethylthio, octylthio, and cyclohexylthio), an arylthio group (for example, an arylthio group having preferably 6 to 48 carbon atoms, more preferably 6 to 24 carbon atoms; examples thereof include phenylthio), a heterocyclic thio group (for example, a heterocyclic thio group having preferably 1 to 32 carbon atoms, more preferably 1 to 18 carbon atoms; examples thereof include 2-benzothiazolylthio, 2-pyridylthio, and 1-phenyltetrazolylthio), an alkyl sulfinyl group (for example, an alkyl sulfinyl group having preferably 1 to 32 carbon atoms, more preferably 1 to 24 carbon atoms; examples thereof include a dodecanesulfinyl group), an aryl sulfinyl group (for example, an arylsulfinyl group having preferably 6 to 32 carbon atoms, more preferably 6 to 24 carbon atoms; examples thereof include a phenylsulfinyl group), an alkyl sulfonyl group (for example, an alkyl sulfonyl group having preferably 1 to 48 carbon atoms, more preferably 1 to 24 carbon atoms; examples thereof include methylsulfonyl, ethylsulfonyl, propylsulfonyl, butylsulfonyl, isopropylsulfonyl, 2-ethylhexylsulfonyl, hexadecylsulfonyl, octylsulfonyl, and cyclohexylsulfonyl), an aryl sulfonyl group (for example, an aryl sulfonyl group having preferably 6 to 48 carbon atoms, more preferably 6 to 24 carbon atoms; examples thereof include phenylsulfonyl and 1-naphthylsulfonyl), a sulfamoyl group (for example, a sulfamoyl group having preferably 32 or less carbon atoms, more preferably 24 or less carbon atoms; examples thereof include sulfamoyl, N,N-dipropylsulfamoyl, N-ethyl-N-dodecylsulfamoyl, N-ethyl-N-phenylsulfamoyl, and N-cyclohexylsulfamoyl), a sulfo group, a phosphonyl group (for example, a phosphonyl group having preferably 1 to 32 carbon atoms, more preferably 1 to 24 carbon atoms; examples thereof include phenoxyphosphonyl, octyloxyphosphonyl, and phenylphosphonyl), a phosphinoylamino group (for example, a phosphinoylamino group having preferably 1 to 32 carbon atoms, more preferably 1 to 24 carbon atoms; examples thereof include diethoxyphosphinoylamino and dioctyloxyphosphinoylamino), and a carboxyl group.

When a substituent represented by $R_1$ to $R_6$ in formula (1) can have a further substituent, the further substituent may be selected from the above-described substituents represented by $R_1$ to $R_6$. When a substituent represented by $R_1$ to $R_6$ in formula (1) has two or more substituents, these substituents may be the same or different from each other.

$R_1$ and $R_2$, $R_2$ and $R_3$, $R_4$ and $R_5$, and/or $R_5$ and $R_6$ in formula (1) may be each independently bonded to each other to form a five, six or seven-membered, saturated or unsaturated ring.

When $R_1$ and $R_2$, $R_2$ and $R_3$, $R_4$ and $R_5$, and/or $R_5$ and $R_6$ in formula (1) are each independently bonded to each order to form an unsubstituted, five, six or seven-membered, saturated or unsaturated ring, examples thereof include a pyrrole ring, a furan ring, a thiophene ring, a pyrazole ring, an imidazole ring, a triazole ring, an oxazole ring, a thiazole ring, a pyrrolidine ring, a piperidine ring, a cyclopentene ring, a cyclohexene ring, a benzene ring, a pyridine ring, a pyrazine ring, and a pyridazine ring, and preferably a benzene ring and a pyridine ring.

When the five, six or seven-membered ring can have a further substituent, the further substituent may be selected from the above-mentioned substitutents regarding the $R_1$ to $R_6$, and when the ring has two or more substituents, these two or more substituents may be the same or different from each other.

In formula (1), a substituent represented by any one of $R_1$ to $R_6$ is a divalent linking group that is bonded to -$L_1$- or -$L_2$-, or is a single bond and -$L_1$- or -$L_2$- directly substitutes the dipyrromethene skeleton.

Examples of the divalent linking group represented by $R_1$ to $R_6$ include a divalent substituent formed by removing one hydrogen atom from any of the above-mentioned exemplary monovalent substituents for $R_1$ to $R_6$. For example, when a substituent of any one of $R_1$ to $R_6$ is an alkyl group and is bonded to -$L_1$- or -$L_2$-, this substituent represents an alkylene group. When the substituent is an aryl group, this substituent represents an arylene group.

In formula (1), the portion to which -$L_1$- is bonded is at least one of $R_1$ to $R_6$, and from the viewpoint of synthetic compatibility, it is more preferably at least one of $R_1$, $R_3$, $R_4$ and $R_6$, even more preferably at least one of $R_1$ and $R_6$.

In formula (1), the portion to which -$L_2$- is bonded is at least one of $R_1$ to $R_6$, and from the viewpoint of synthetic compatibility, it is more preferably at least one of $R_1$, $R_3$, $R_4$ and $R_6$, even more preferably at least one of $R_1$ and $R_6$.

Preferably, $R_1$ and $R_6$ each independently represent a hydrogen atom, an alkyl group, an alkenyl group, an aryl group, a heterocyclic group, a silyl group, a hydroxyl group, a cyano group, an alkoxy group, an aryloxy group, a heterocyclic oxy group, an acyl group, an alkoxycarbonyl group, a carbamoyl group, an amino group, an anilino group, a heterocyclic amino group, a carbonamide group, an ureido group, an imido group, an alkoxycarbonyl amino group, an aryloxycarbonyl amino group, a sulfonamide group, an azo group, an alkylthio group, an arylthio group, a heterocyclic thio group, an alkyl sulfonyl group, an aryl sulfonyl group, a phosphinoyl amino group, a single bond such that -$L_1$- or -$L_2$- directly substitutes the dipyrromethene skeleton, or a divalent linking group formed from the above-mentioned substituent and bonded to -$L_1$- or -$L_2$-.

More preferably, $R_1$ and $R_6$ each independently represent a hydrogen atom, an alkyl group, an alkenyl group, an aryl group, a heterocyclic group, a cyano group, an acyl group, an alkoxycarbonyl group, a carbamoyl group, an amino group, a heterocyclic amino group, a carbonamide group, an ureido group, an imido group, an alkoxycarbonyl amino group, an aryloxycarbonyl amino group, a sulfonamide group, an azo group, an alkyl sulfonyl group, an aryl sulfonyl group, a phosphinoylamino group, a single bond such that -$L_1$- or -$L_2$- directly substitutes the dipyrromethene skeleton, or a divalent linking group formed from the above-mentioned substituent and bonded to -$L_1$- or -$L_2$-.

Yet more preferably, $R_1$ and $R_6$ each independently represent a hydrogen atom, an alkyl group, an aryl group, a heterocyclic group, an amino group a heterocyclic amino group, a carbonamide group, an ureido group, an imido group, an alkoxycarbonyl amino group, a sulfonamide group, an azo group, an alkyl sulfonyl group, an aryl sulfonyl group, a phosphinoyl amino group, a single bond such that -$L_1$- or -$L_2$- directly substitutes the dipyrromethene skeleton, or a divalent linking group formed from the above-mentioned substituent and bonded to -$L_1$- or -$L_2$-.

Preferably, $R_2$ and $R_5$ each independently represent a hydrogen atom, a halogen atom, an alkyl group, an alkenyl group, an aryl group, a heterocyclic group, a hydroxyl group, a cyano group, a nitro group, an alkoxy group, an aryloxy group, a heterocyclic oxy group, an acyl group, an alkoxycarbonyl group, an aryloxycarbonyl group, a carbamoyl group, an imido group, an alkoxycarbonyl amino group, a sulfonamide group, an azo group, an alkylthio group, an arylthio group, a heterocyclic thio group, an alkyl sulfonyl group, an aryl sulfonyl group, a carboxyl group or a sulfamoyl group.

More preferably, $R_2$ and $R_5$ each independently represent an alkyl group, an alkenyl group, an aryl group, a heterocyclic group, a cyano group, a nitro group, an acyl group, an alkoxycarbonyl group, an aryloxycarbonyl group, a carbamoyl group, an imido group, an alkyl sulfonyl group, an aryl sulfonyl group, a carboxyl group or a sulfamoyl group; and yet more preferably, each independently represents an alkyl group, an aryl group, a heterocyclic group, a cyano group, an acyl group, an alkoxycarbonyl group, a carbamoyl group, an alkyl sulfonyl group, a carboxyl group or an aryl sulfonyl group.

Particularly preferably, $R_2$ and $R_5$ each independently represent any one of the following substituents.

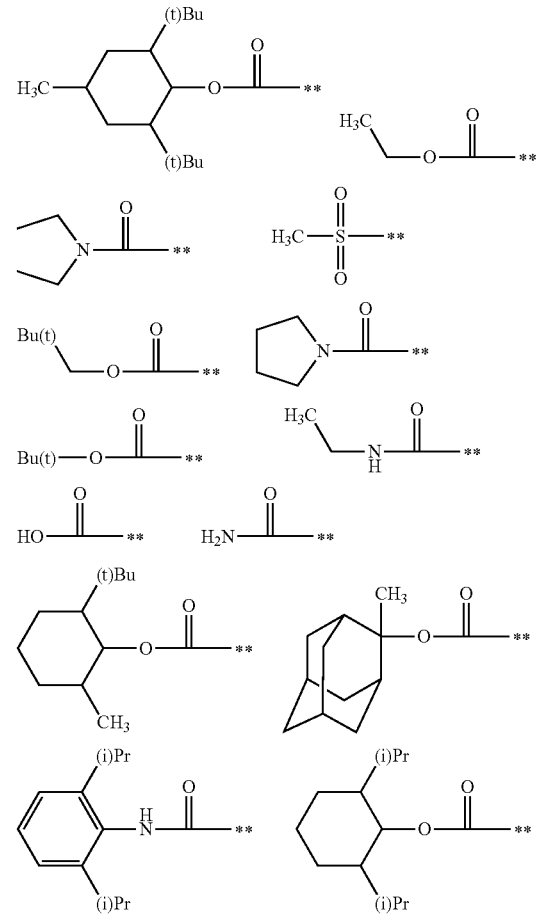

11
-continued
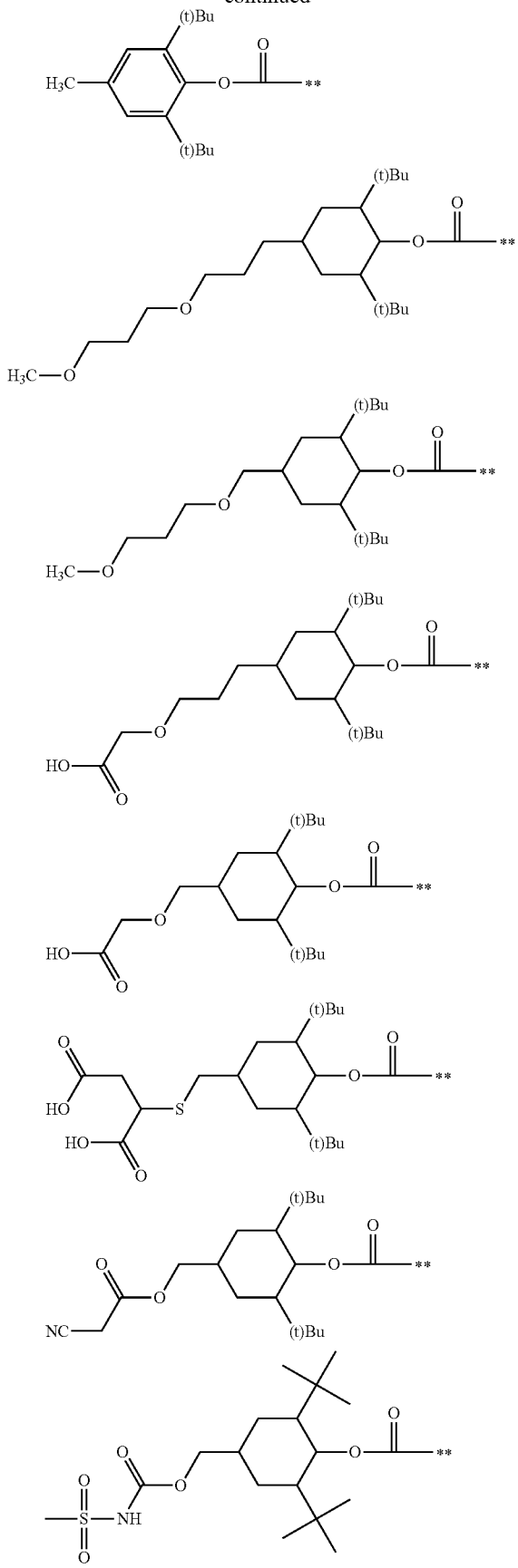
12
-continued
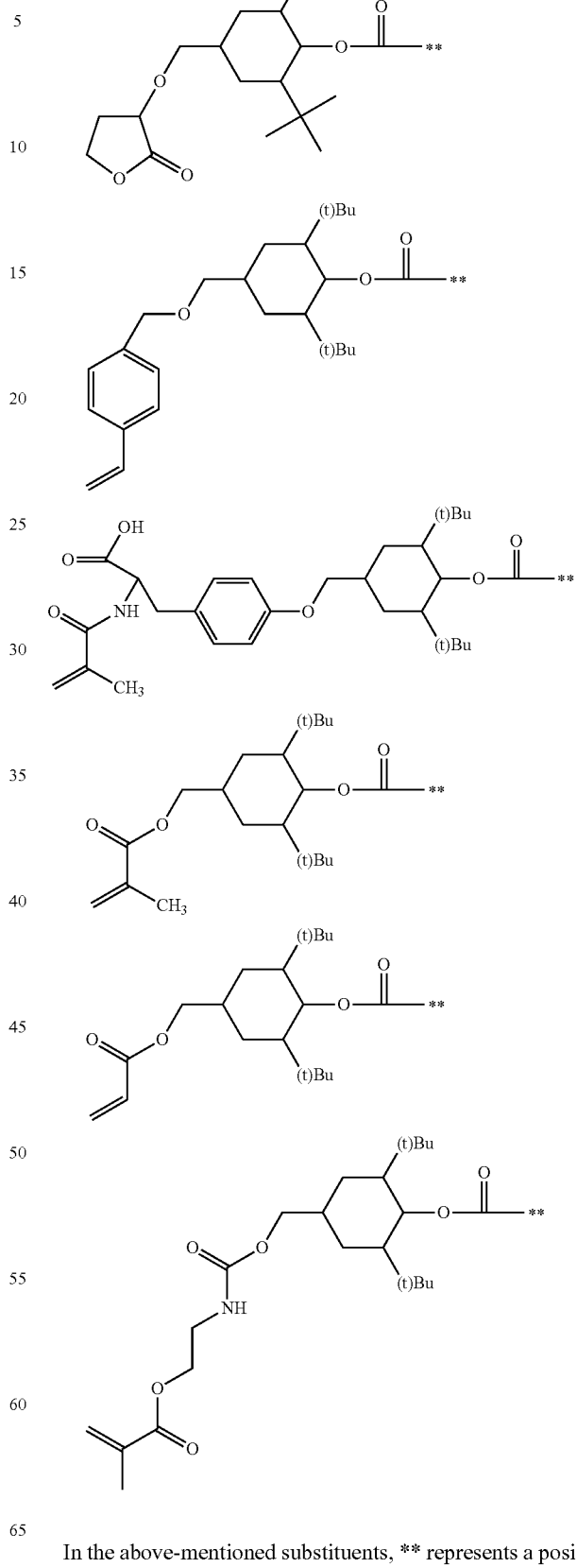
In the above-mentioned substituents, ** represents a position linked to the dipyrromethene skeleton.

$R_2$ and $R_5$ may be the same or different from each other, but $R_2$ and $R_5$ are preferably the same from the synthesis viewpoint.

Preferably, $R_3$ and $R_4$ each independently represent a hydrogen atom, a halogen atom, an alkyl group, an alkenyl group, an aryl group, a heterocyclic group, a silyl group, a hydroxyl group, a cyano group, an alkoxy group, an aryloxy group, a heterocyclic oxy group, an acyl group, an alkoxycarbonyl group, a carbamoyl group, an anilino group, a carbonamide group, an ureido group, an imido group, an alkoxycarbonyl amino group, a sulfonamide group, an azo group, an alkylthio group, an arylthio group, a heterocyclic thio group, an alkyl sulfonyl group, an aryl sulfonyl group, a sulfamoyl group, or a phosphinoyl amino group.

More preferably, $R_3$ and $R_4$ each independently represent a hydrogen atom, an alkyl group, an alkenyl group, an aryl group, a heterocyclic group, a cyano group, an acyl group, an alkoxycarbonyl group, a carbamoyl group, a carbonamide group, an ureido group, an imido group, an alkoxycarbonyl amino group, a sulfonamide group, an alkylthio group, an arylthio group, a heterocyclic thio group, an alkyl sulfonyl group, an aryl sulfonyl group, or a sulfamoyl group. Yet more preferably, $R_3$ and $R_4$ each independently represent a hydrogen atom, an alkyl group, an aryl group, or a heterocyclic group, and particularly preferably, each independently represent an alkyl group or an aryl group. An alkyl group, an aryl group, and a heterocyclic group may be substituted or unsubstituted.

Specifically, an alkyl group, an aryl group and a heterocyclic group are preferably selected from the following groups. Each of the following groups may be substituted or unsubstituted.

The alkyl group is preferably a straight, branched or cyclic alkyl group having 1 to 12 carbon atoms (for example, a methyl group, an ethyl group, an n-propyl group, an isopropyl group, a cyclopropyl group, an n-butyl group, an i-butyl group, a sec-butyl group, a t-butyl group, a cyclobutyl group, a cyclohexyl group, a benzyl group), more preferably a straight, branched or cyclic alkyl group having 1 to 12 carbon atoms (for example, an isopropyl group, a cyclopropyl group, an i-butyl group, a sec-butyl group, a t-butyl group, a cyclobutyl group, a cyclohexyl group), and further preferably a secondary or tertiary alky group having 1 to 12 carbon atoms (for example, an isopropyl group, a cyclopropyl group, a sec-butyl group, a t-butyl group, a cyclobutyl group, and a cyclohexyl group).

The aryl group is preferably a phenyl group or a naphthyl group, and more preferably a phenyl group.

The heterocyclic group is preferably a 2-thienyl group, a 4-pyridyl group, a 2-furyl group, a 2-pyrimidinyl group, a 1-pyridyl group, a 2-benzothiazolyl group, a 1-imidazolyl group, a 1-pyrazolyl group, or a benzotriazol-1-yl group, and more preferably a 2-thienyl group, a 4-pyridyl group, a 2-furyl group, a 2-pyrimidinyl group or a 1-pyridyl group.

$R_3$ and $R_4$ may be the same or different from each other, but $R_3$ and $R_4$ are preferably the same from the synthesis viewpoint.

$R_7$ in formula (1) represents a hydrogen atom, a halogen atom, an alkyl group, an aryl group, or a heterocyclic group, which may be the same as the halogen atom, the alkyl group, the aryl group, and the heterocyclic group as mentioned above as the exemplary substituents for $R_1$ to $R_6$, and preferred examples thereof are also the same.

When the alkyl group, the aryl group, or the heterocyclic group represented by $R_7$ is a group that can have a further substituent, the substituent may be selected from the above-mentioned exemplary substituents for $R_1$ to $R_6$; and when there are two or more substituents, these substituents may be the same or different from each other.

$R_7$ is particularly preferably a hydrogen atom.

Ma in formula (1) represents a metal or a metal compound. The metal or metal compound represented by Ma is not particularly limited, so long as it can form a complex. Examples of Ma include a divalent metal atom, a divalent metal oxide, a divalent metal hydroxide, and a divalent metal chloride.

For example, examples of Ma include metals such as Zn, Mg, Si, Sn, Rh, Pt, Pd, Mo, Mn, Pb, Cu, Ni, Co and Fe, metal chlorides such as $AlCl_3$, $InCl_3$, $FeCl_2$, $TiCl_2$, $SnCl_2$, $SiCl_2$ and $GeCl_2$, metal oxides such as TiO and V=O, and metal hydroxides such as $Si(OH)_2$.

Among them, Ma is preferably Fe, Zn, Mg, Si, Pt, Pd, Mo, Mn, Cu, Ni, Co, TiO, or VO, more preferably Zn, Mg, Si, Pt, Pd, Cu, Ni, Co, or VO, further preferably Fe, Zn, Cu, Co, or V=O, and most preferably Zn, from the viewpoint of stability, spectroscopic properties, heat resistance, light fastness and production suitability of the complex.

Further, the compound represented by formula (1) may be a tautomer.

$X_2$ in formula (1) is not particularly limited, so long as it is a group that can be bonded to Ma, and specific examples thereof include water, alcohols (for example, methanol, ethanol, propanol) and the like, and compounds described in "Metal Chelates" (1), (2) and (3), published in 1955, 1996 and 1997, respectively, authored by Takeichi Sakaguchi and Keihei Ueno (Nankodo Co., Ltd.) Among them, from the production viewpoint, water, carboxylic compounds and alcohols are preferred, and water and carboxylic compounds are more preferred.

In formula (1), $X_1$ represents a group to neutralize charges of Ma. Examples thereof include a halogen atom, a hydroxyl group, a carboxylic acid group, a phosphoric acid group, and a sulfonic acid group. Among them, from the production viewpoint, a halogen atom, a hydroxyl group, a carboxylic acid group and a sulfonic acid group are preferred, and a hydroxyl group and a carboxylic acid group are more preferred.

In formula (1), $X_1$ and $X_2$ may be bonded to each other to form a five, six or seven-membered ring together with Ma. The formed five, six or seven-membered ring may be either a saturated ring or an unsaturated ring. Further, the five, six or seven-membered ring may be formed only from carbon atoms, or may form a heterocycle having at least one atom selected from a nitrogen atom, an oxygen atom and/or a sulfur atom.

In formula (1), r represents 0 or 1, and t represents 0, 1 or 2.

In formula (1), M represents a hydrogen atom, an organic base or a metal atom to neutralize charges of $—CO_2^-$, or an anion (i.e., $CO_2M$ represents $CO_2^-$).

Among them, M is more preferably a hydrogen atom or an anion (i.e., $CO_2M$ represents $CO_2^-$).

In formula (1), $L_1$ represents a single bond or a (m+1)-valent linking group.

Examples of the (m+1)-valent linking group represented by $L_1$ include an alkyl group having 1 to 10 carbon atoms (hereinafter, exemplary groups for $L_1$ include those formed by removing 1 to m hydrogen atoms from the substituent, e.g., an alkyl group includes a divalent alkylene group (m=1), a trivalent alkanetriyl group (m=2) and a quadrivalent alkanetetrayl group (m=3)), an aryl group having 6 to 12 carbon atoms, an alkyl thioether group having 1 to 10 carbon atoms, an aryl thioether group having 6 to 12 carbon atoms, an alkyl ether group having 1 to 10 carbon atoms, an aryl ether group having 6 to 12 carbon atoms, an alkyl amino group having 1 to carbon atoms, an aryl amino group having 6 to 12 carbon atoms, an alkyl amido group having 1 to 10 carbon atoms, an aryl amido group having 6 to 12 carbon atoms, an alkyl carbamoyl group having 1 to 10 carbon atoms, an aryl carbamoyl group having 6 to 12 carbon atoms, an alkyl sulfonamide group having 1 to 10 carbon atoms, an aryl sulfonamide group having 6 to 12 carbon atoms, an alkyl sulfamoyl group having 1 to 10 carbon atoms, an aryl sulfamoyl group having 6 to 12 carbon atoms. Specific examples of these groups include the following.

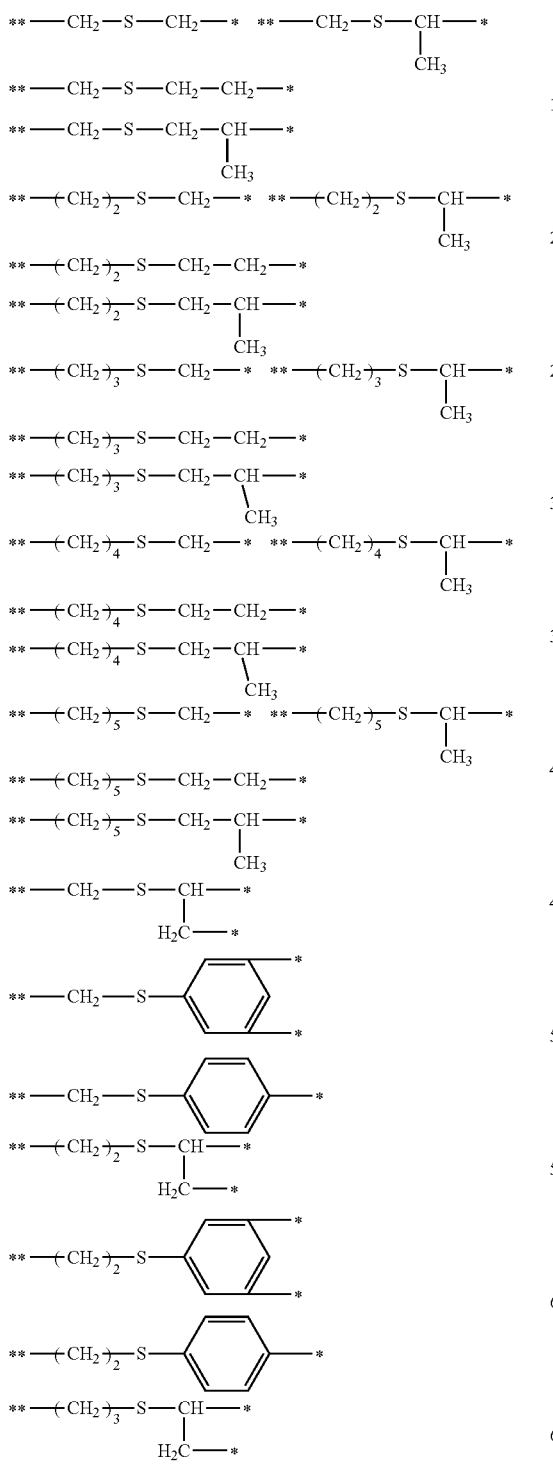

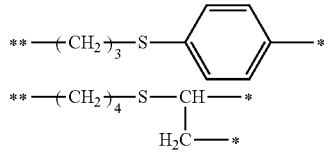
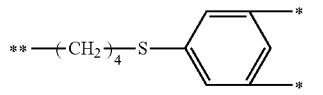
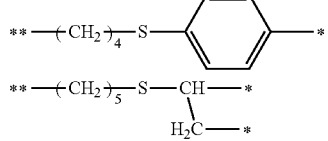
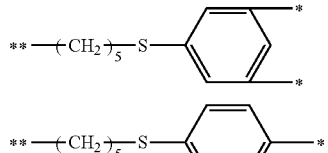
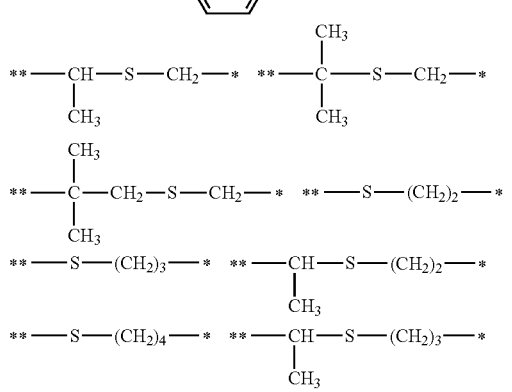
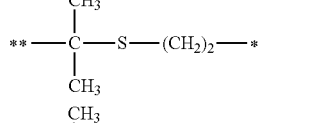
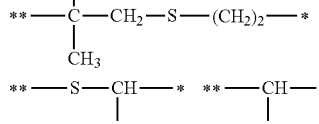
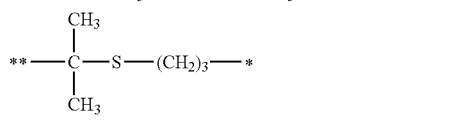
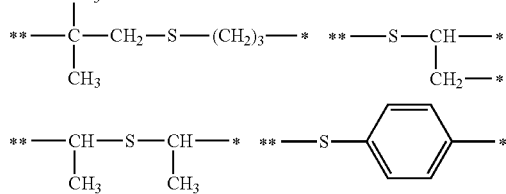

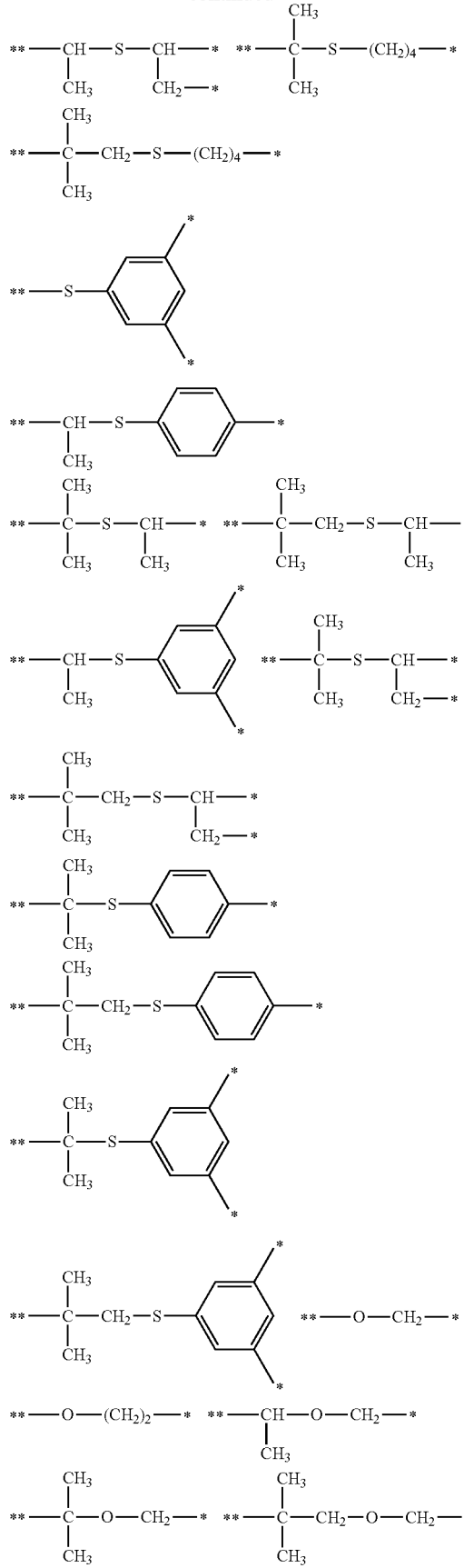
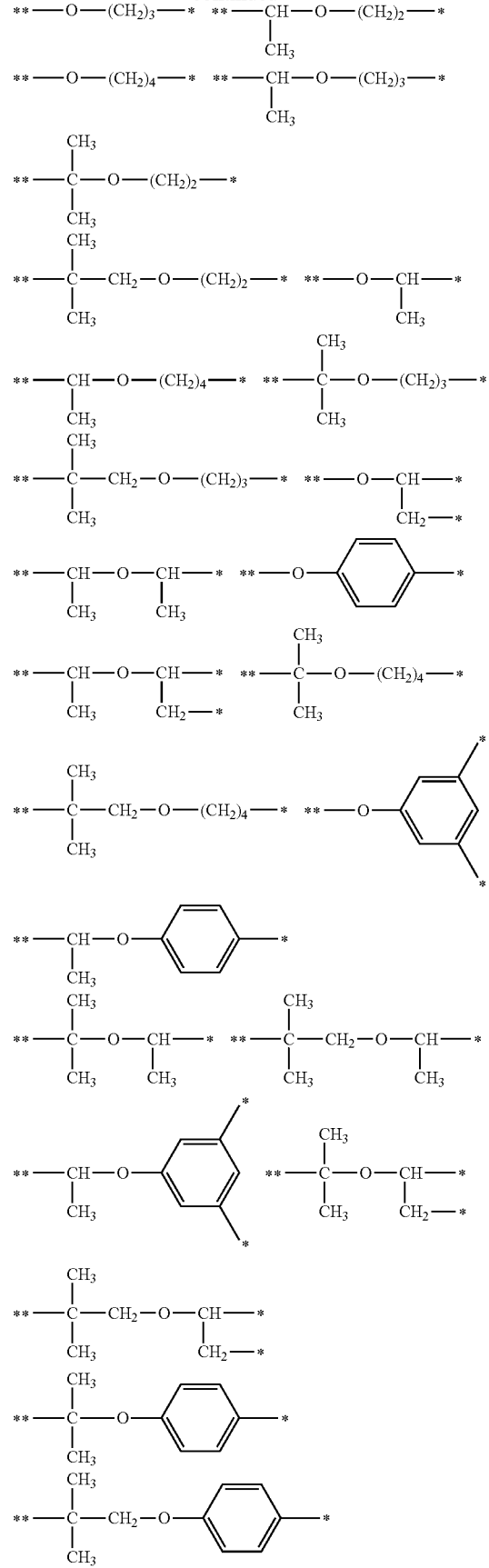

-continued
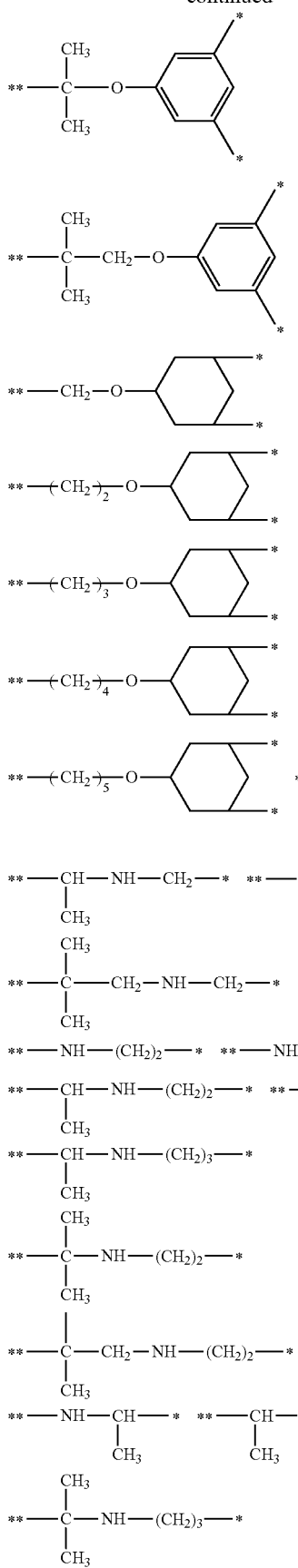
-continued
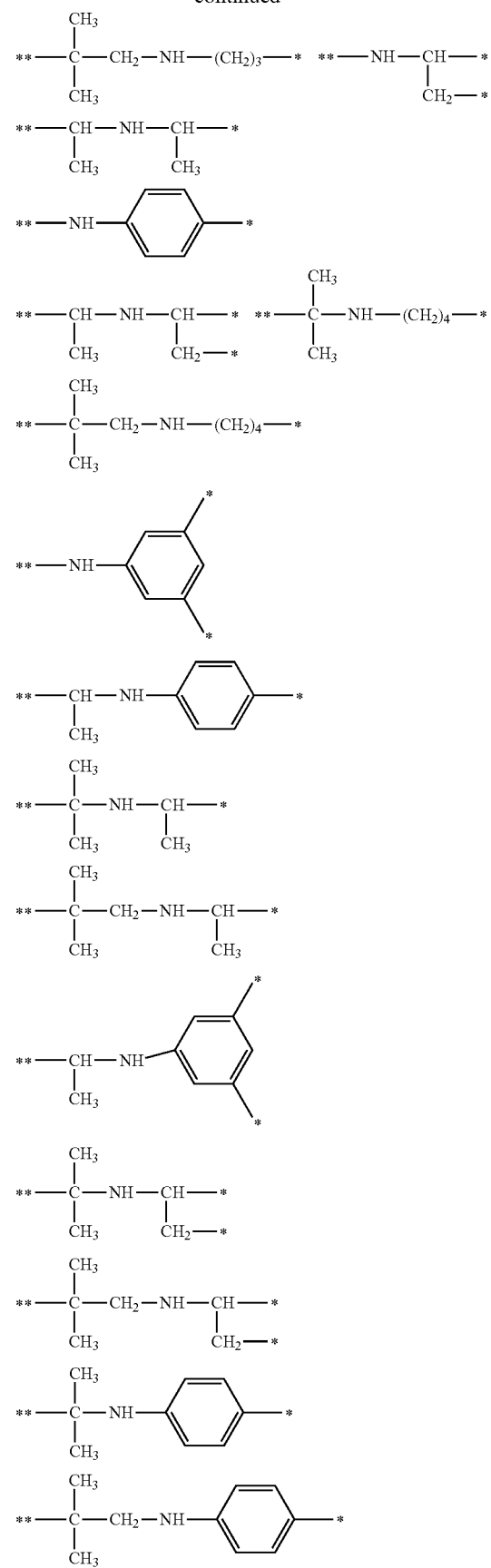

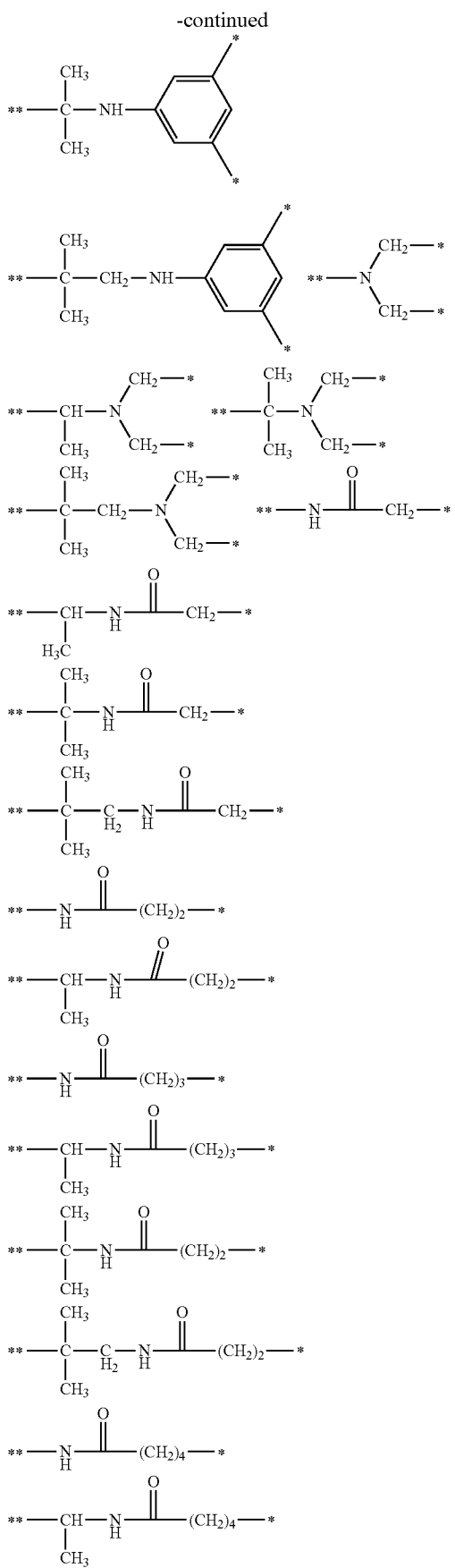
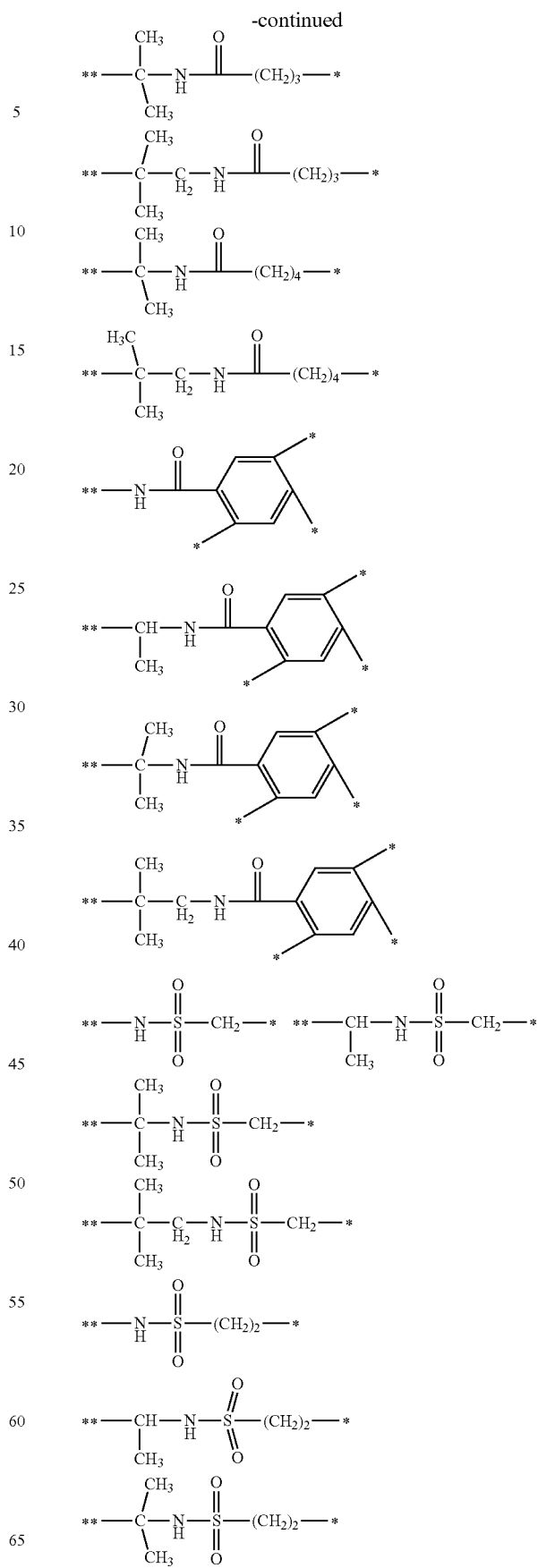

-continued

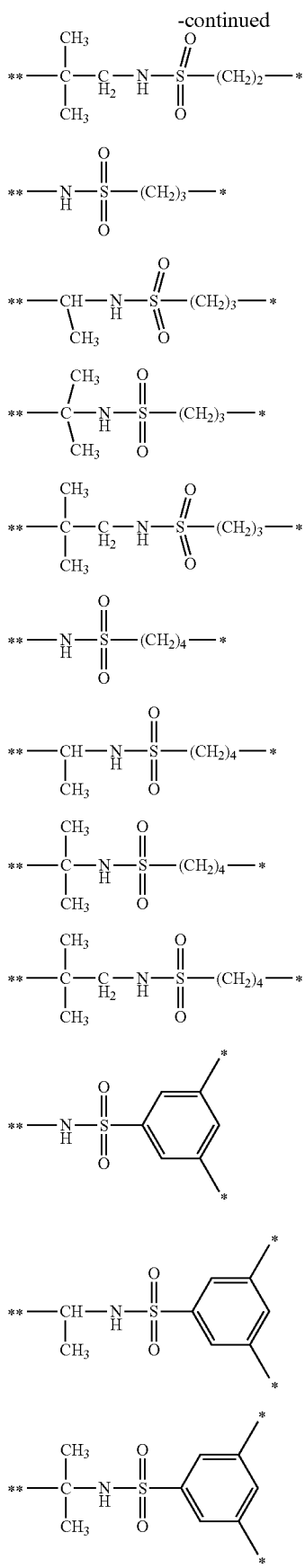

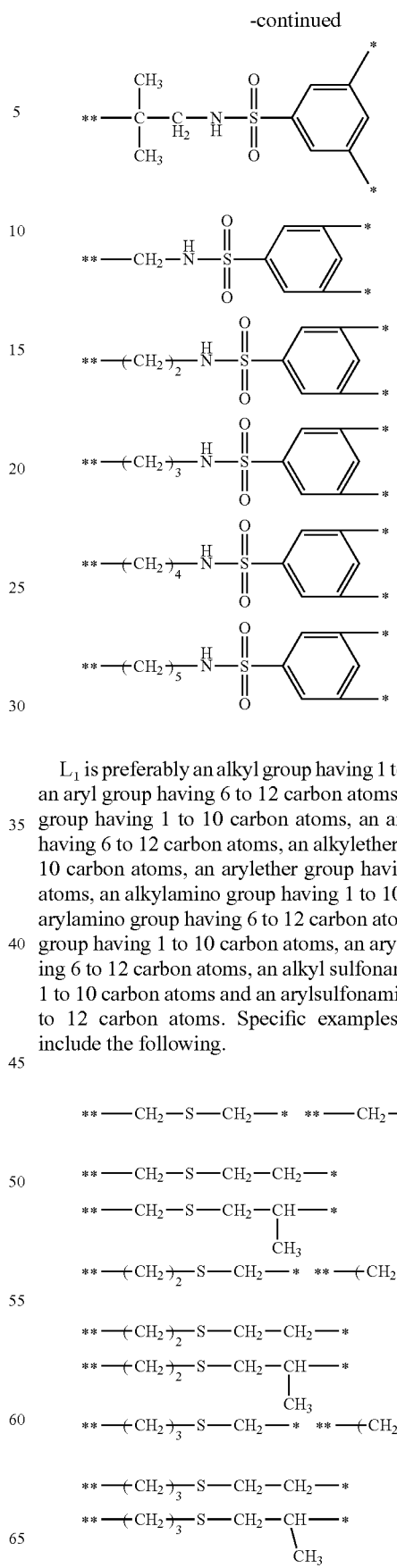

$L_1$ is preferably an alkyl group having 1 to 10 carbon atoms, an aryl group having 6 to 12 carbon atoms, an alkylthioether group having 1 to 10 carbon atoms, an arylthioether group having 6 to 12 carbon atoms, an alkylether group having 1 to 10 carbon atoms, an arylether group having 6 to 12 carbon atoms, an alkylamino group having 1 to 10 carbon atoms, an arylamino group having 6 to 12 carbon atoms, an alkylamide group having 1 to 10 carbon atoms, an arylamide group having 6 to 12 carbon atoms, an alkyl sulfonamide group having 1 to 10 carbon atoms and an arylsulfonamide group having 6 to 12 carbon atoms. Specific examples of these groups include the following.

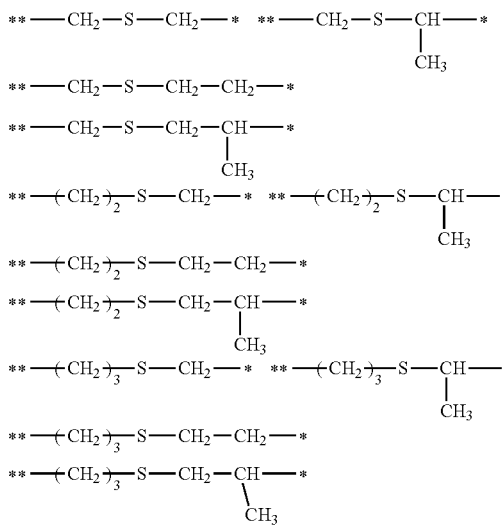

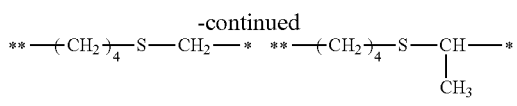
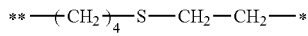
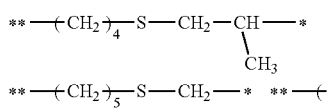
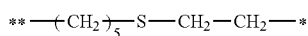
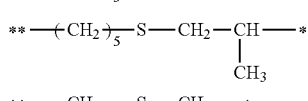
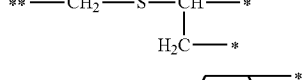
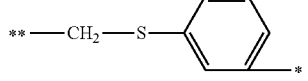
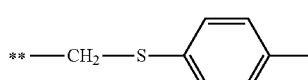
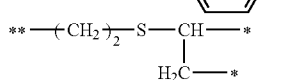
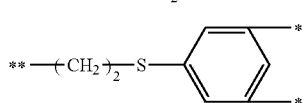
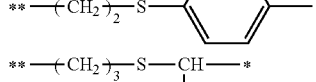
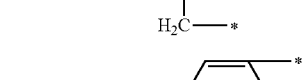
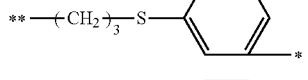
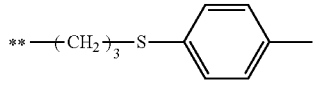
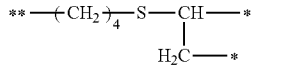
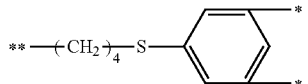
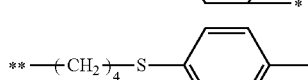
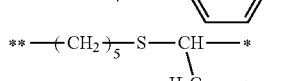
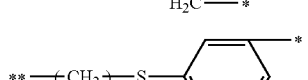
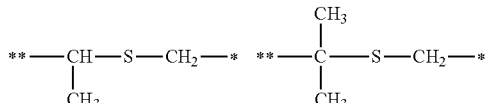
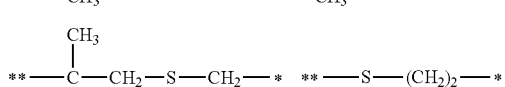
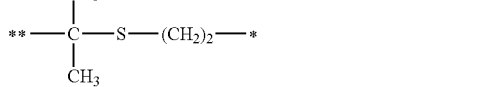
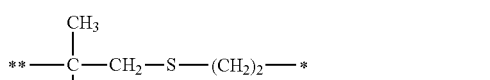
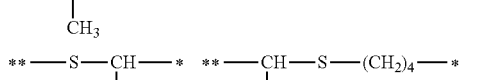
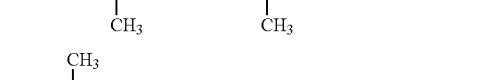
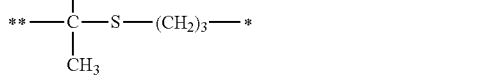
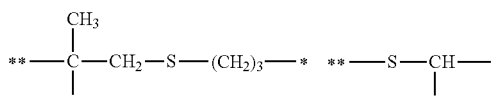
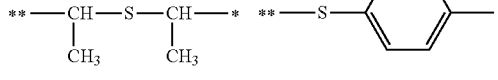
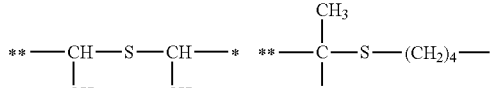
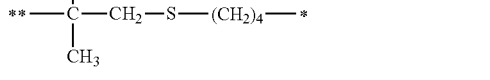

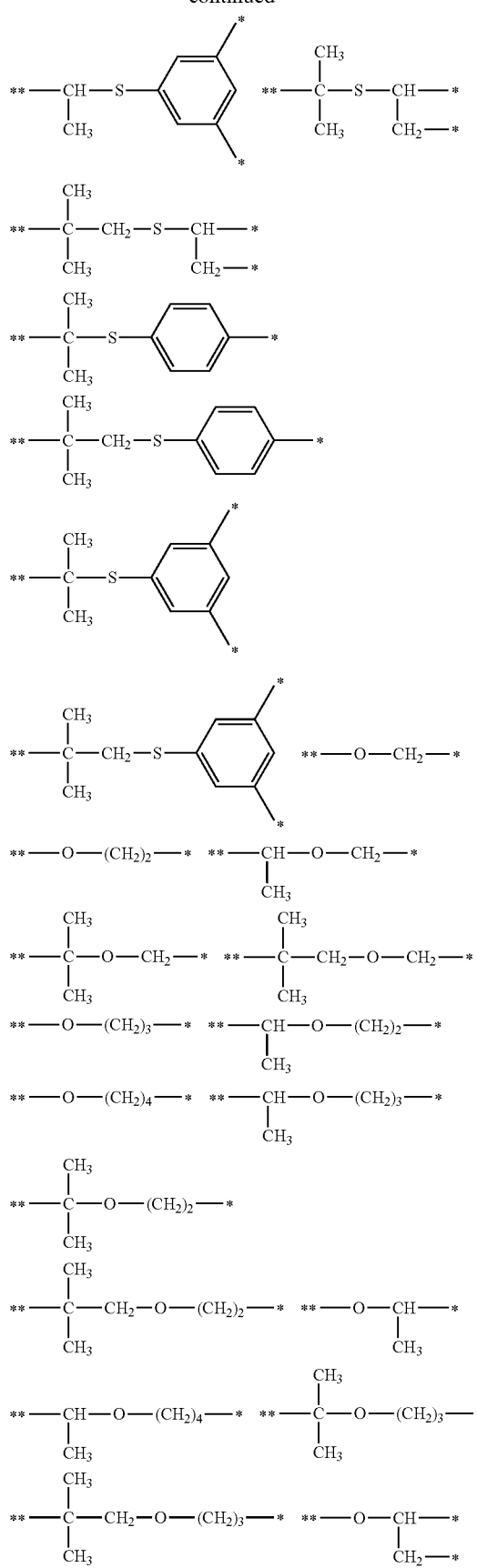
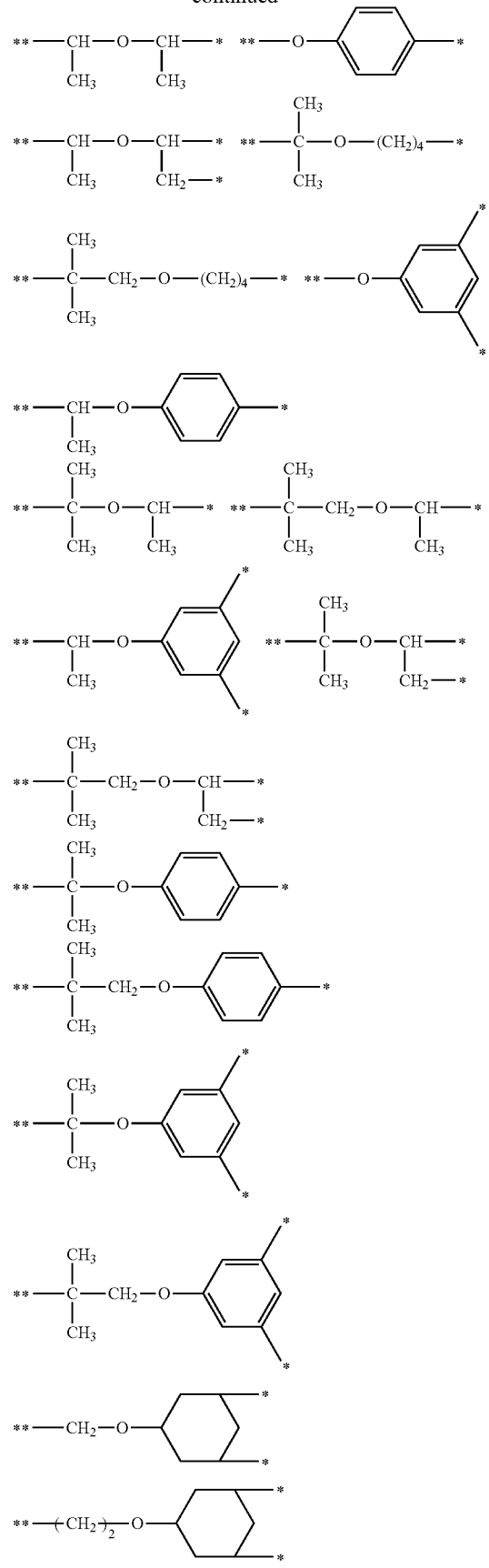

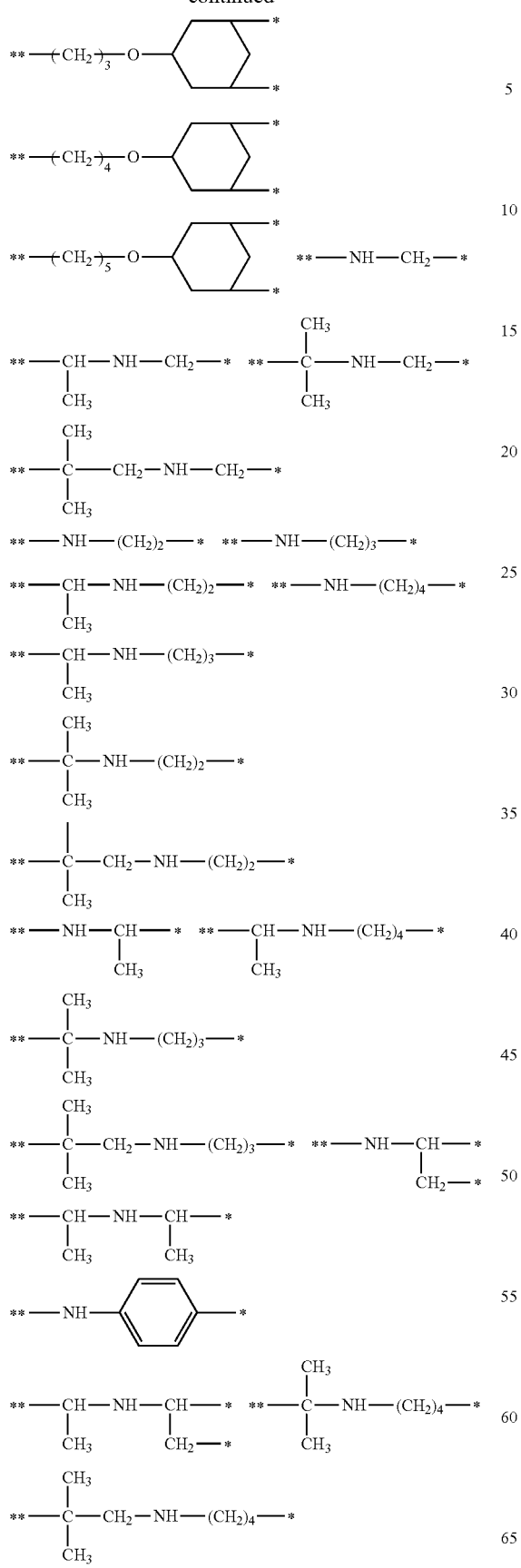
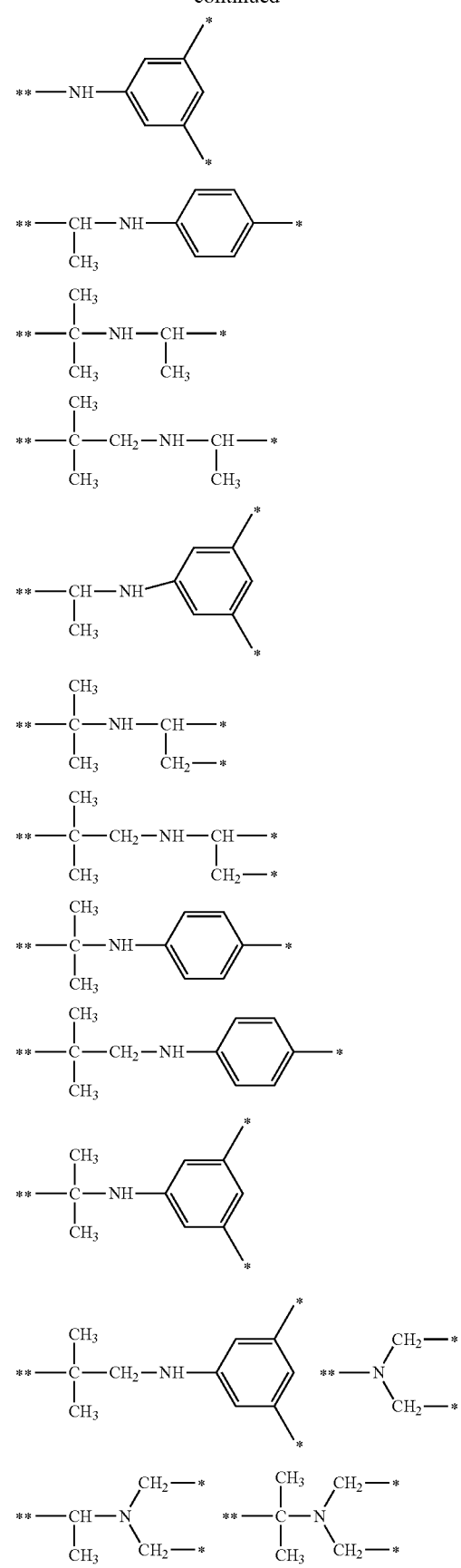

-continued
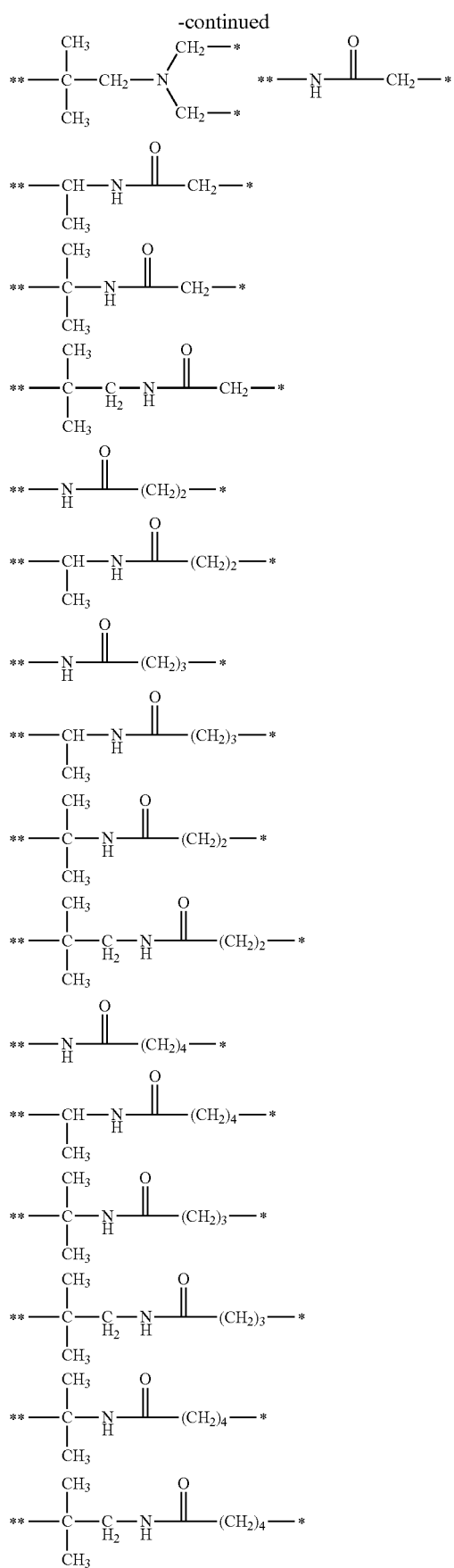
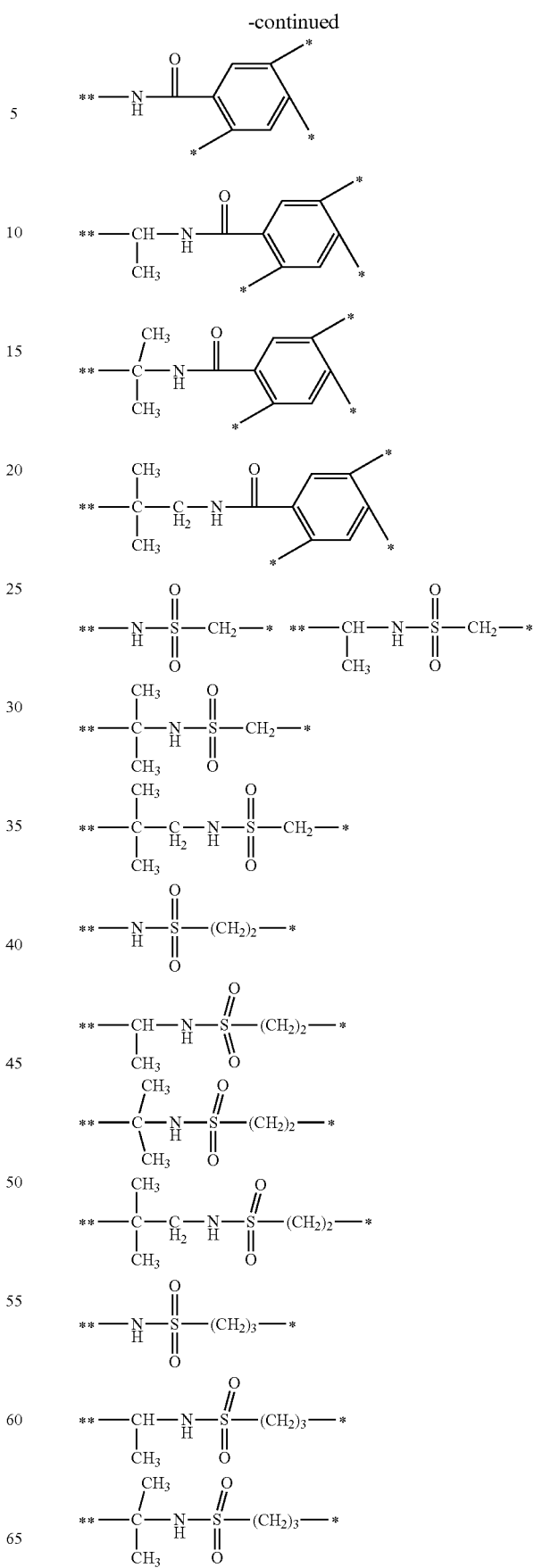

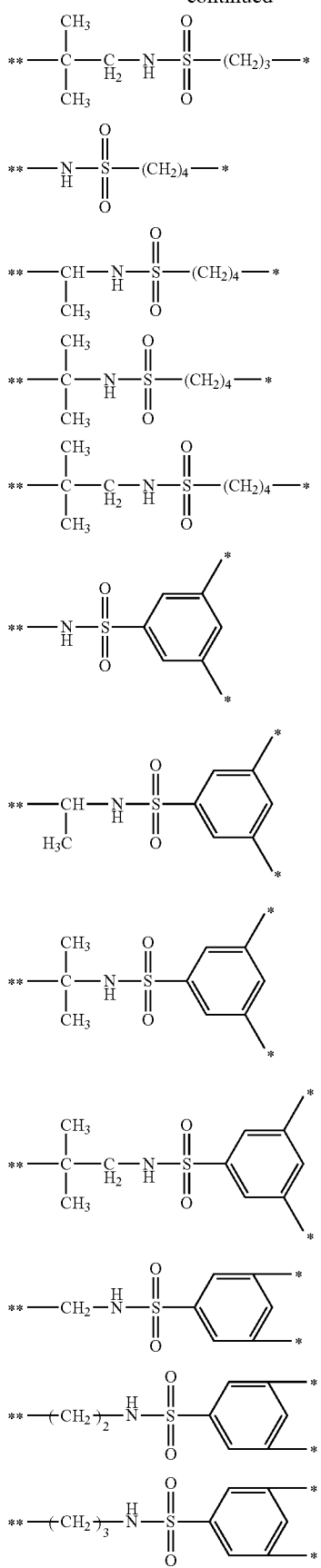
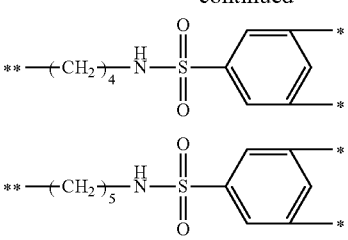

$L_1$ is more preferably an alkyl group having 1 to 10 carbon atoms, an aryl group having 6 to 12 carbon atoms, an alkylthioether group having 1 to 10 carbon atoms, an arylthioether group having 6 to 12 carbon atoms, an alkylether group having 1 to 10 carbon atoms, an arlyether group having 6 to 12 carbon atoms, an alkylamino group having 1 to 10 carbon atoms, an arylamino group having 6 to 12 carbon atoms, an alkylamide group having 1 to 10 carbon atoms, an arylamide group having 6 to 12 carbon atoms, an alkyl sulfonamide group having 1 to 10 carbon atoms and an arylsulfonamide group having 6 to 12 carbon atoms. Specific examples of these groups include the following.

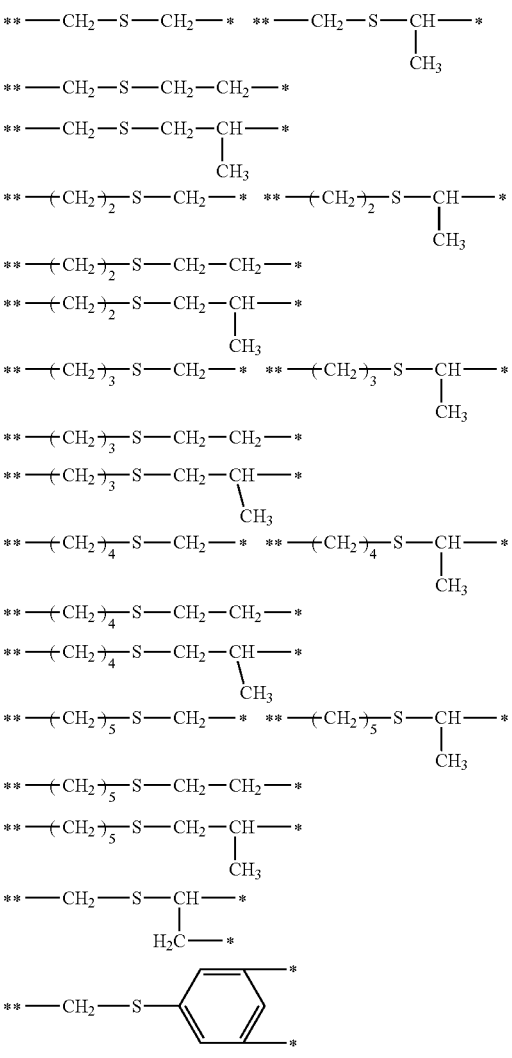

-continued
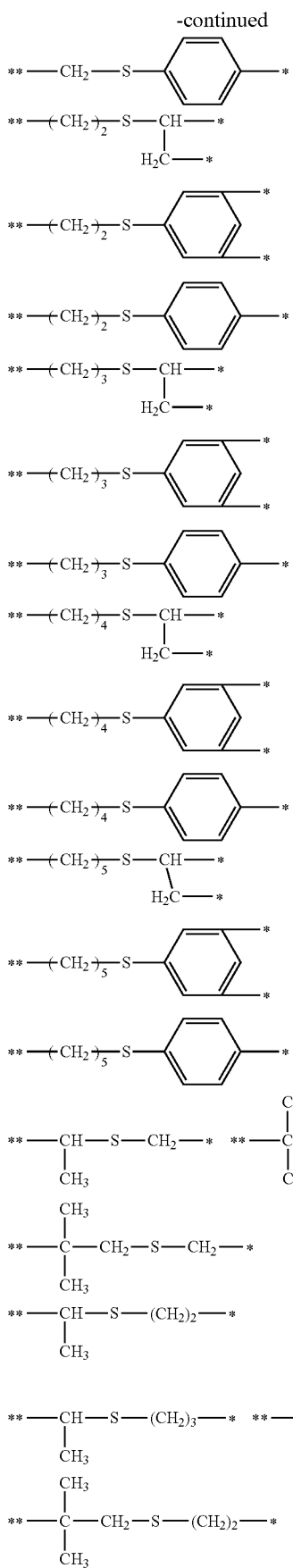
-continued
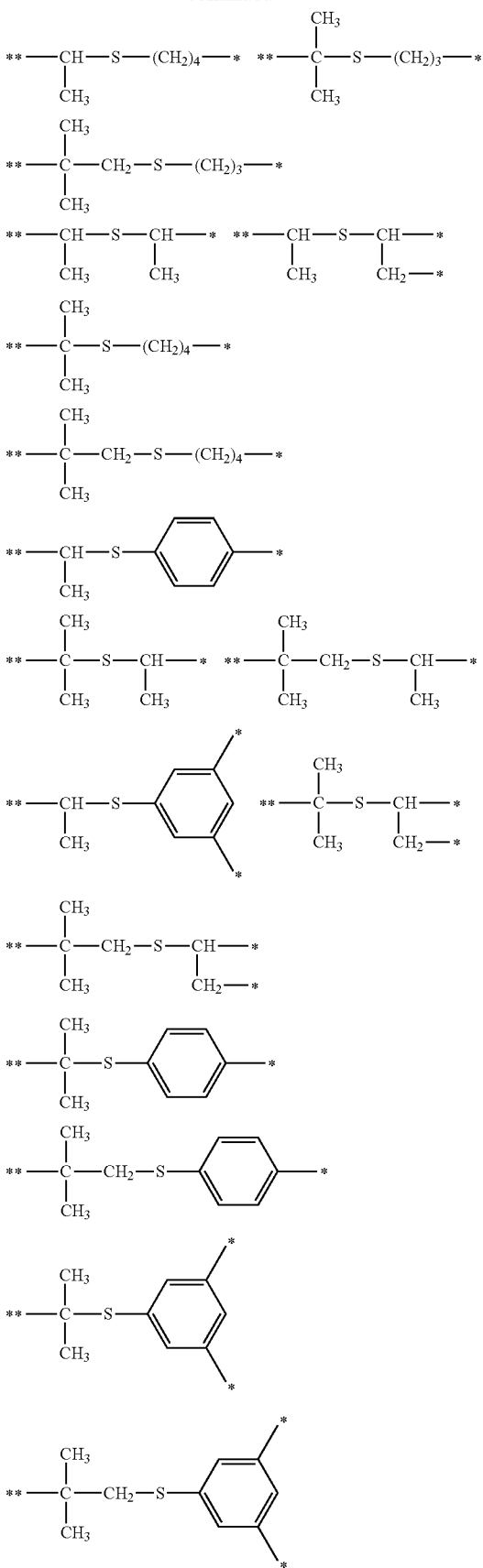

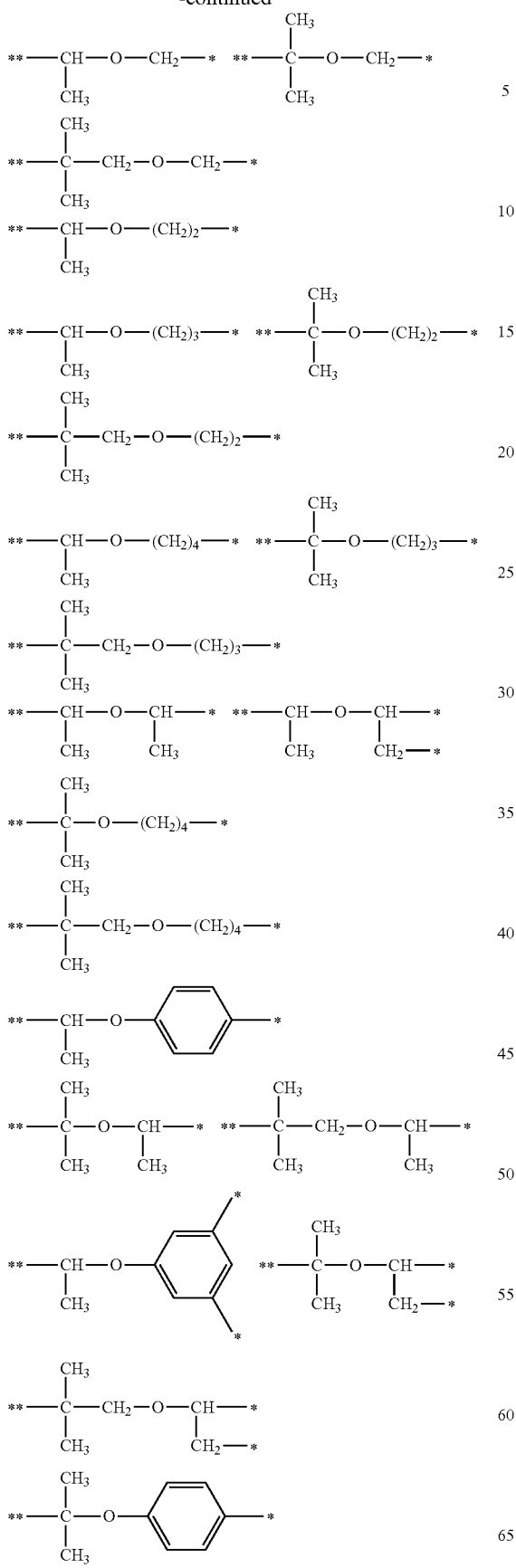
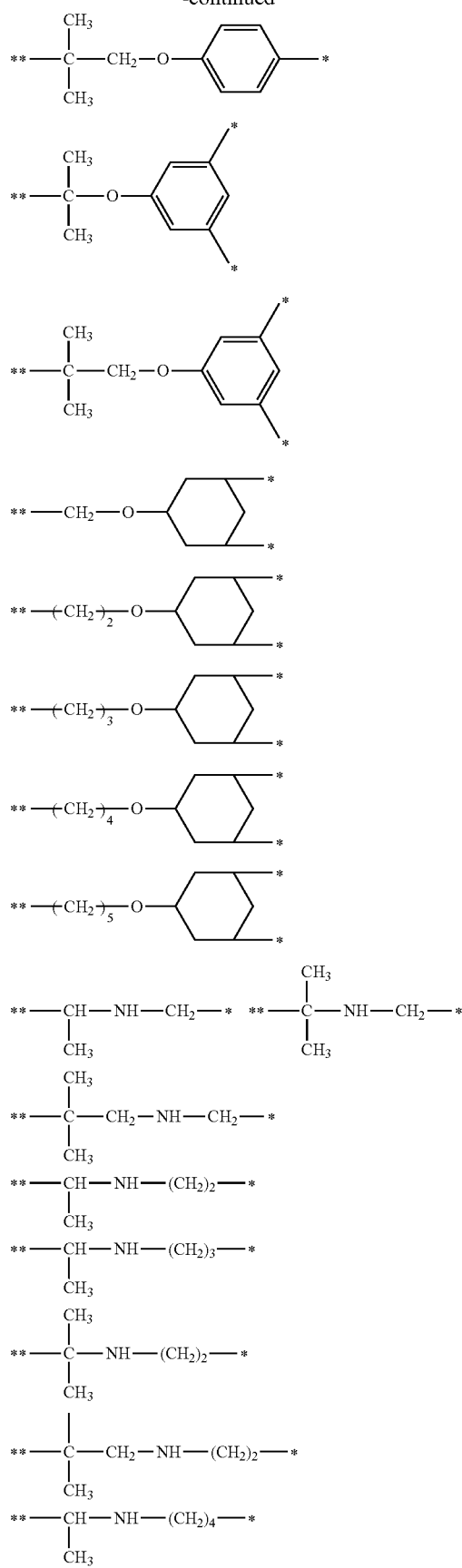

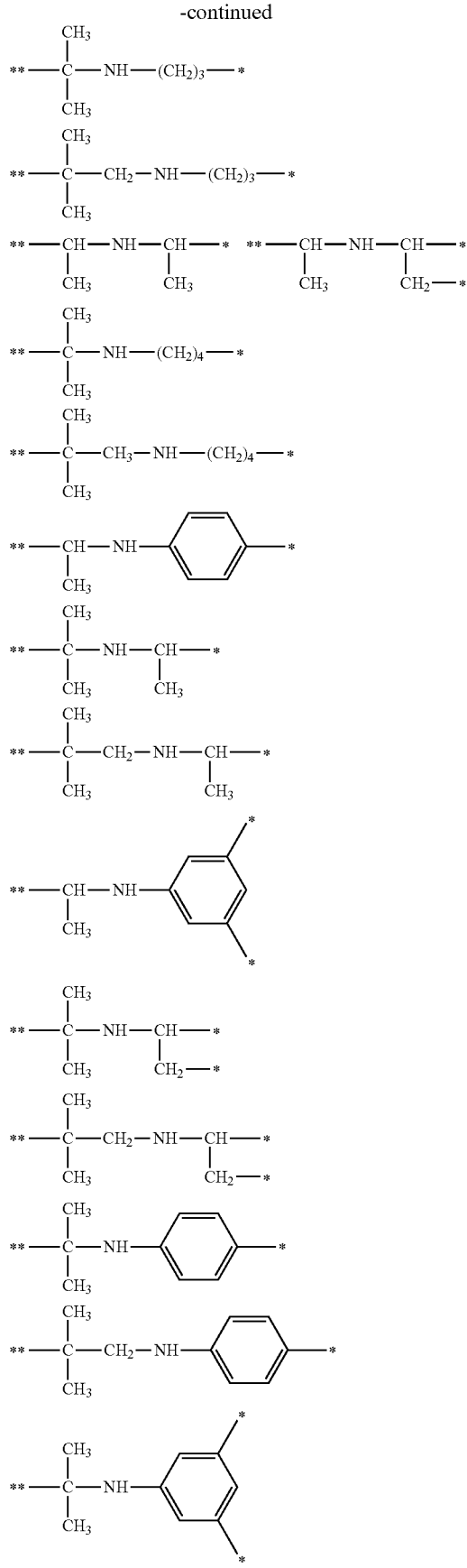
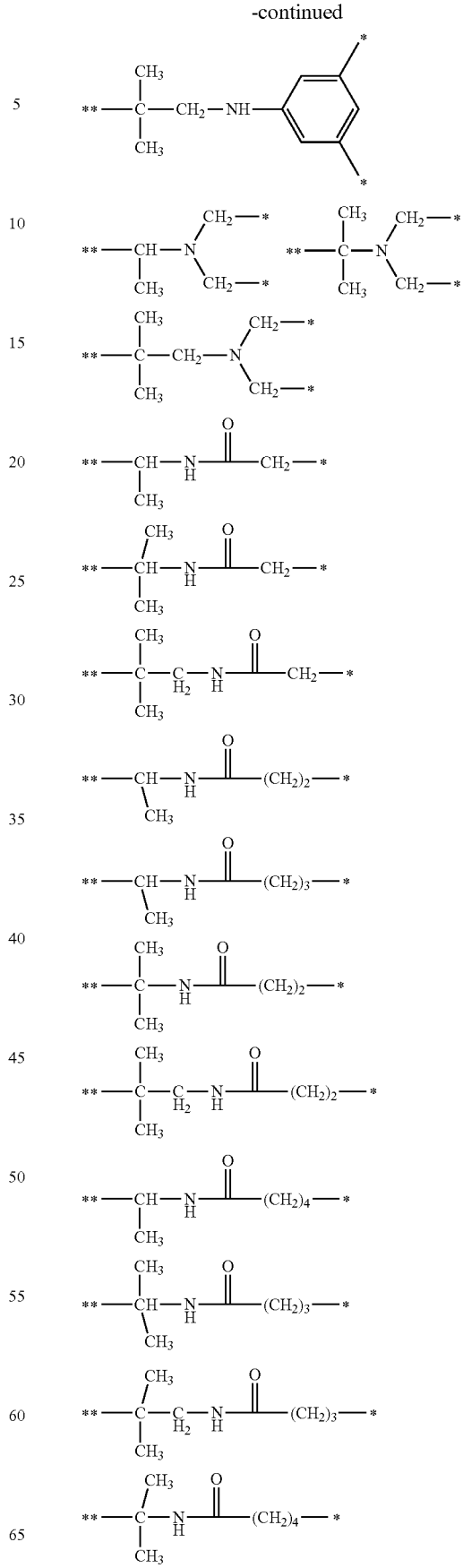

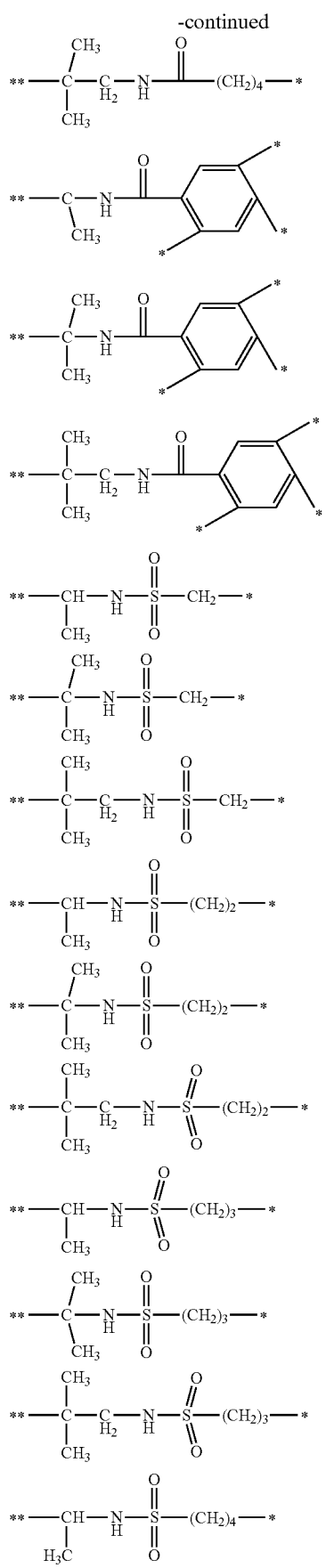
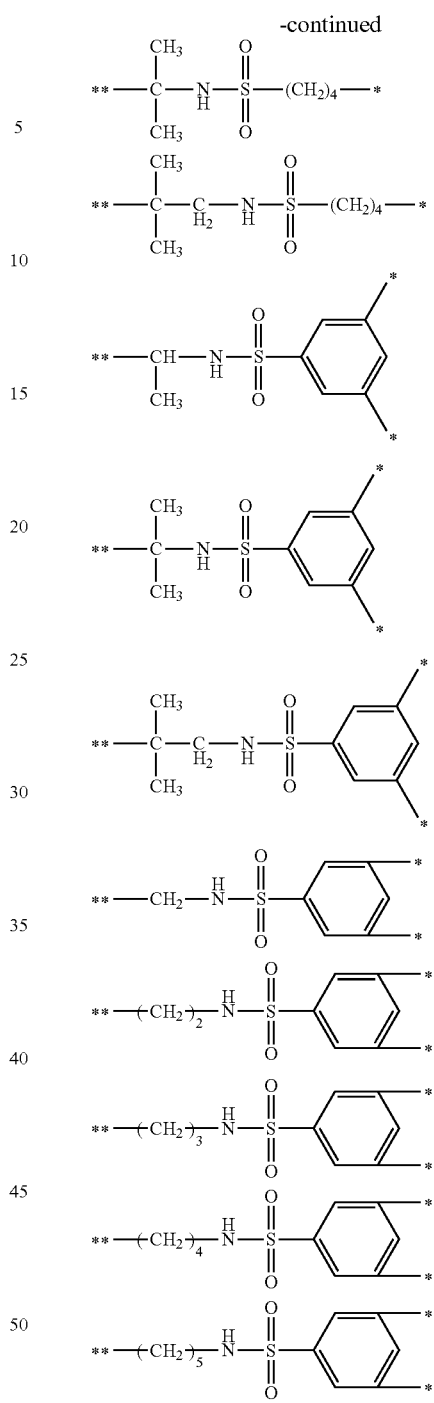

L₁ is further preferably an alkyl group having 1 to 10 carbon atoms, an aryl group having 6 to 12 carbon atoms, an alkylthioether group having 1 to 10 carbon atoms, an arylthioether group having 6 to 12 carbon atoms, an alkylether group having 1 to 10 carbon atoms, an arylether group having 6 to 12 carbon atoms, an alkylamino group having 1 to 10 carbon atoms, an arylamino group having 6 to 12 carbon atoms, an alkylamide group having 1 to 10 carbon atoms, an arylamide group having 6 to 12 carbon atoms, an alkyl sulfonamide group having 1 to 10 carbon atoms and an arylsulfonamide group having 6 to 12 carbon atoms. Specific examples of these groups include the following.

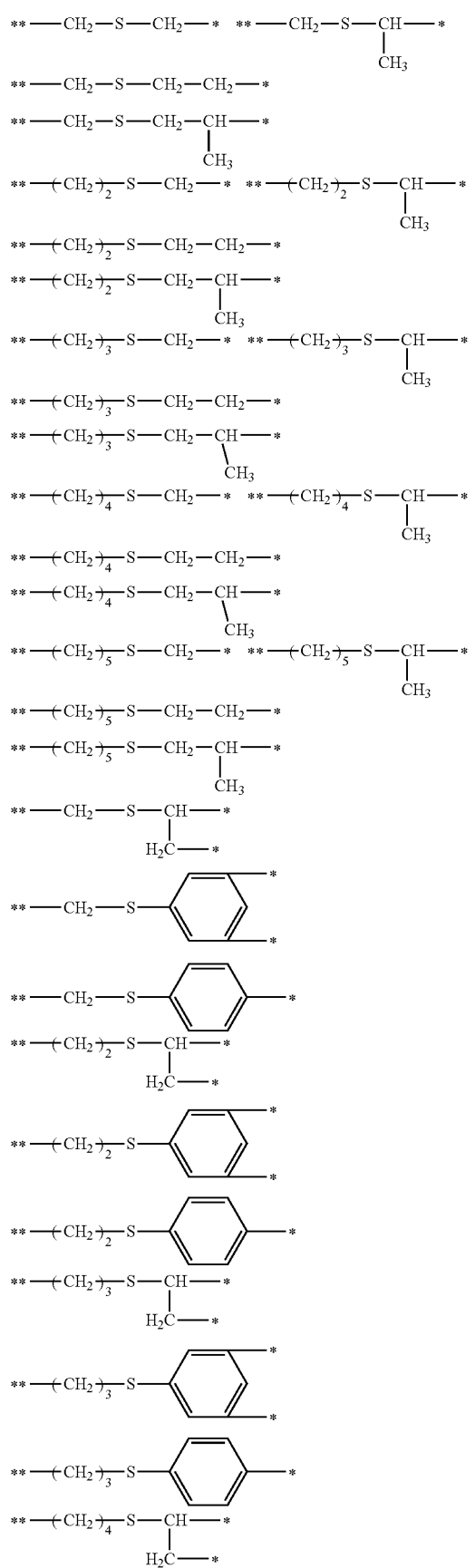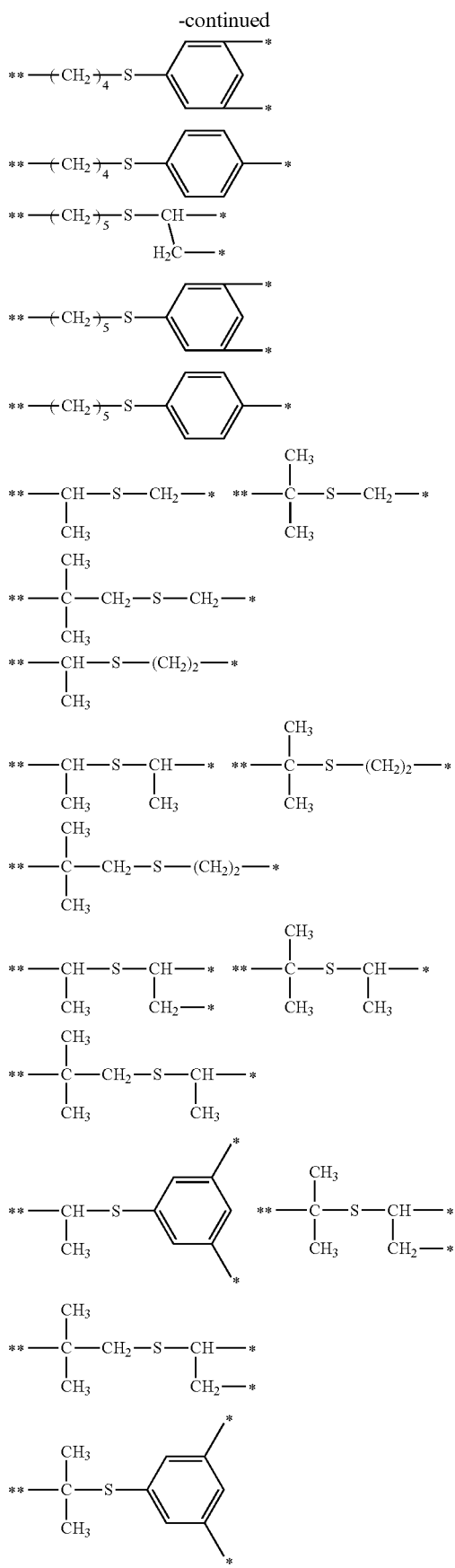

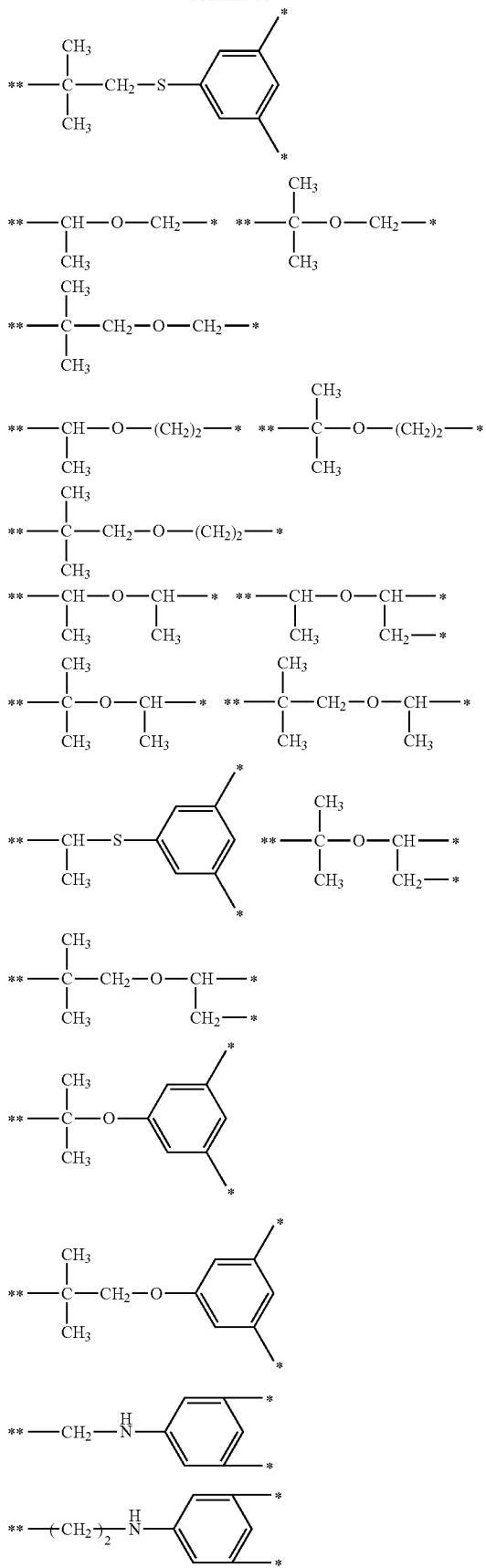
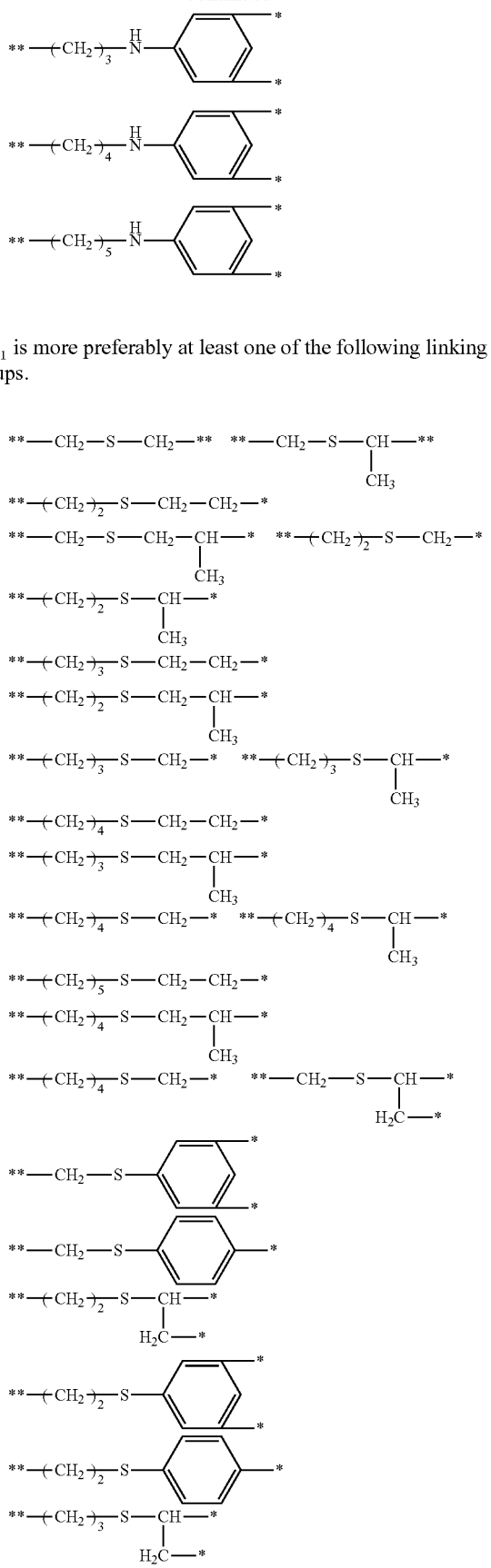
L$_1$ is more preferably at least one of the following linking groups.

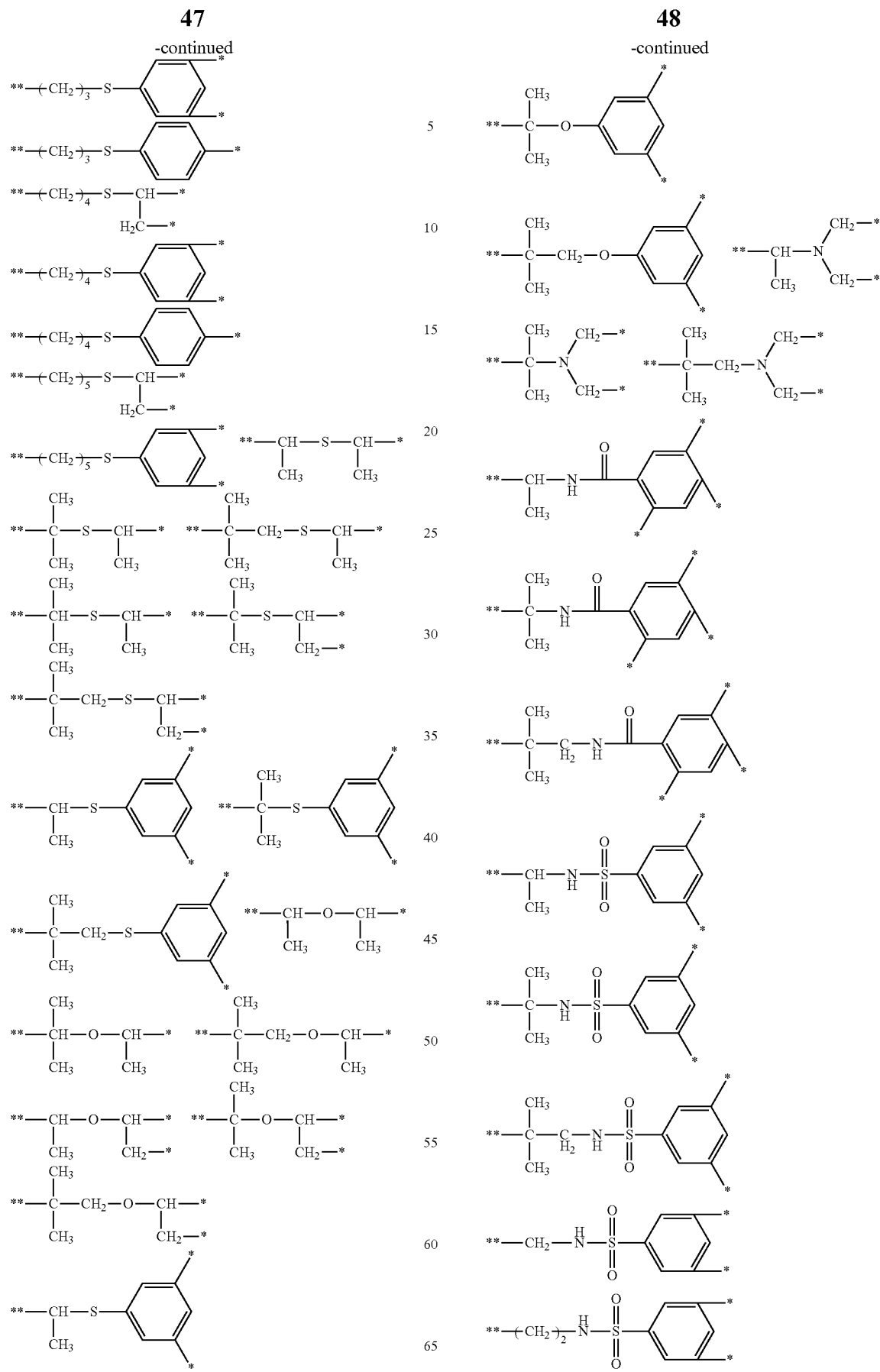

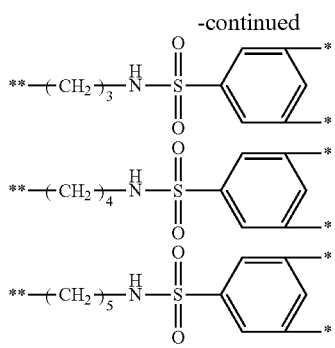

In the above linking groups, * represents a position linked to —COOM, and ** represents a position linked to the dipyrromethene skeleton directly or via a substituent represented by any of $R_1$ to $R_6$.

In formula (1), m represents 1, 2 or 3, preferably 1 or 2, more preferably 2.

In formula (1), p represents 1 or 2, preferably 1.

In formula (1), $R_8$ represents a hydrogen atom or a methyl group.

In formula (1), Q represents an oxygen group or $NR_9$ ($R_9$ represents a hydrogen atom, an alkyl group, an alkenyl group, a heterocyclic group, an acyl group, an alkylsulfonyl group or an arylsulfonyl group).

In formula (1), $L_2$ represents a single bond or a (n+1)-valent linking group.

Examples of the (n+1)-valent linking group represented by $L_2$ an alkyl group having 1 to carbon atoms, an aryl group having 6 to 12 carbon atoms, an alkylthioether group having 1 to carbon atoms, an arylthioether group having 6 to 12 carbon atoms, an alkylether group having 1 to 10 carbon atoms, an arylether group having 6 to 12 carbon atoms, an alkylamino group having 1 to 10 carbon atoms, an arylamino group having 6 to 12 carbon atoms, an alkylamide group having 1 to 10 carbon atoms, an arylamide group having 6 to 12 carbon atoms, an alkylcarbanoyl group having 1 to 10 carbon atoms, an arylcarbanoyl group having 6 to 12 carbon atoms, an alkyl sulfonamide group having 1 to 10 carbon atoms and an arylsulfonamide group having 6 to 12 carbon atoms, an aryl sulfonamide group having 6 to 12 carbon atoms, an alkylsulfamoyl group having 1 to 10 carbon atoms, and an arylsulfanoyl group having 6 to 12 carbon atoms. Specific examples of these groups include the following.

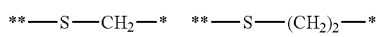
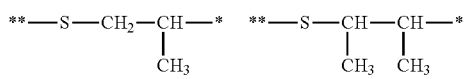
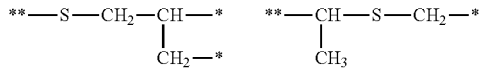

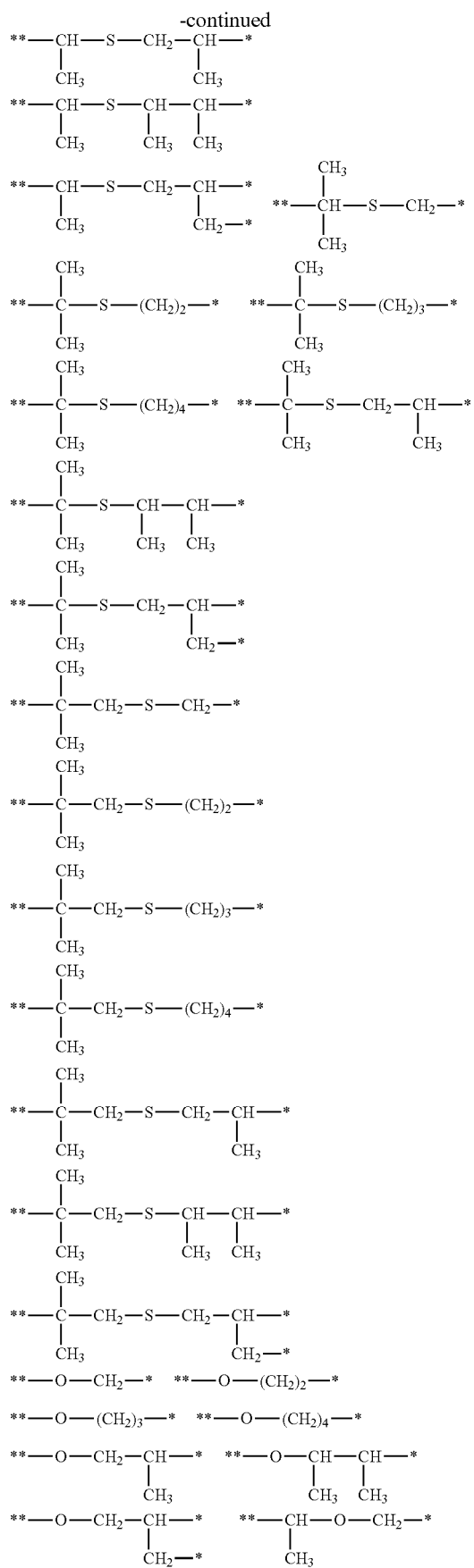

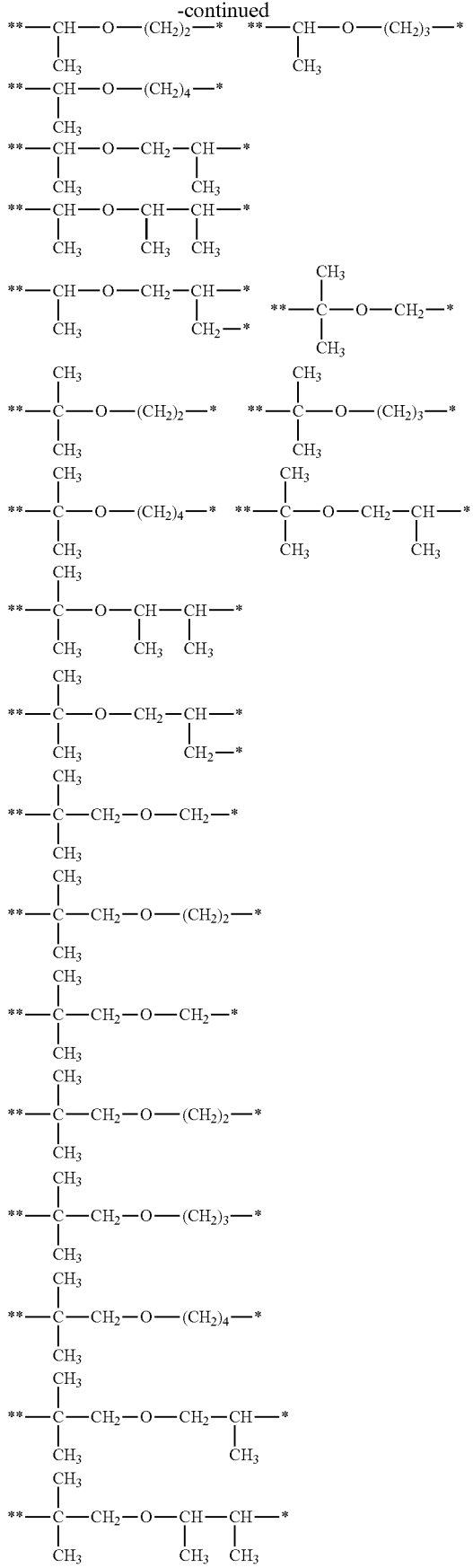
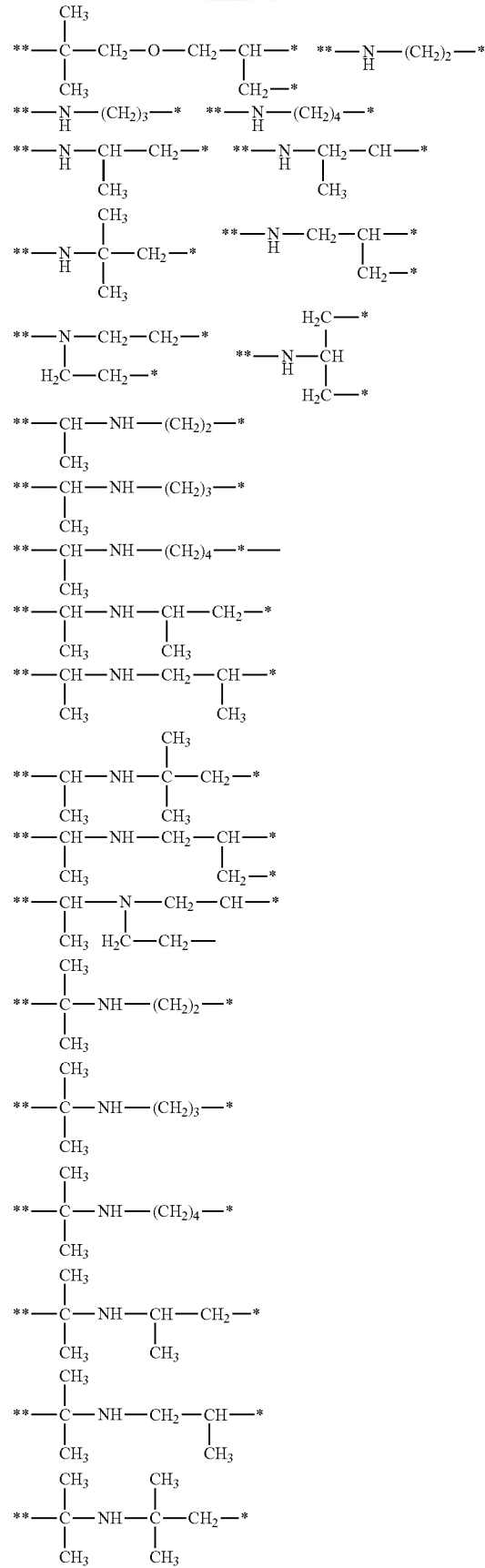

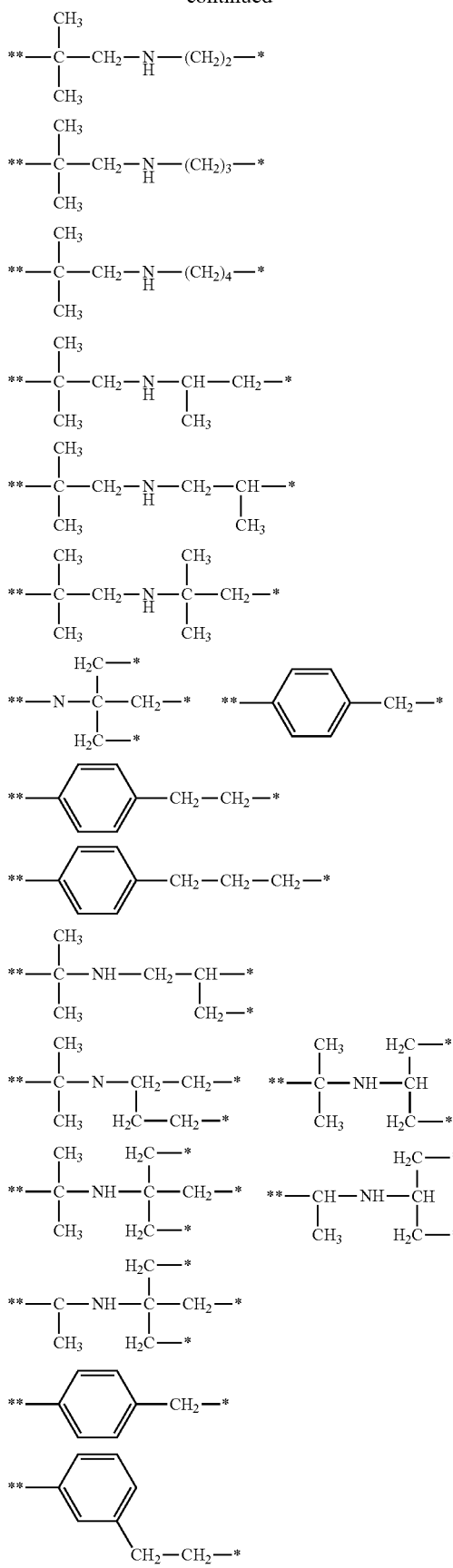

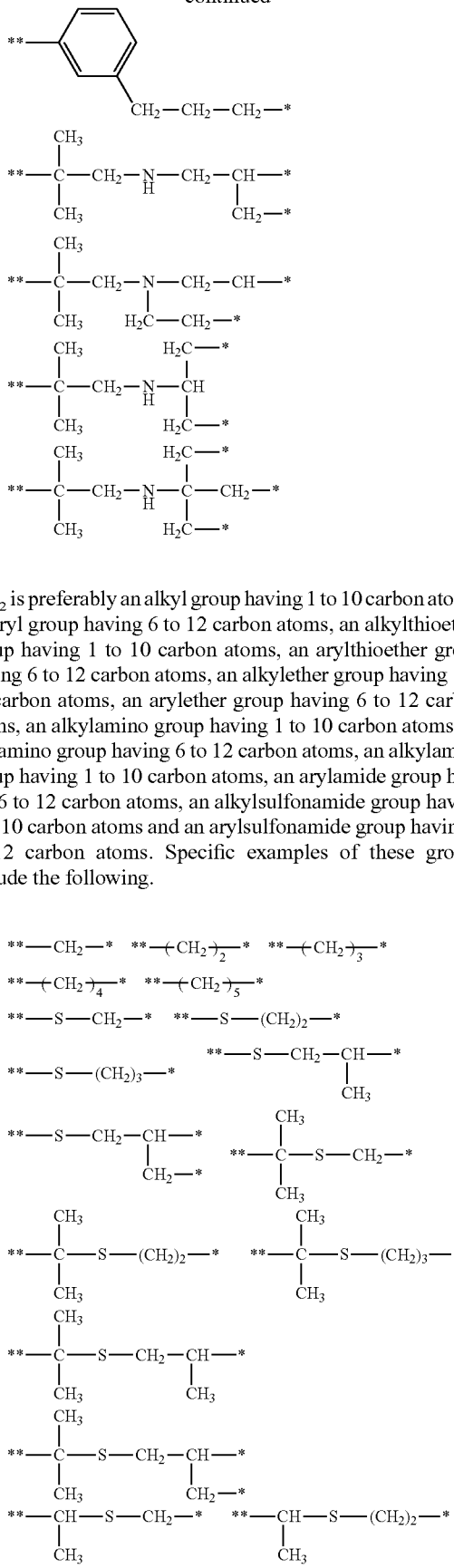

$L_2$ is preferably an alkyl group having 1 to 10 carbon atoms, an aryl group having 6 to 12 carbon atoms, an alkylthioether group having 1 to 10 carbon atoms, an arylthioether group having 6 to 12 carbon atoms, an alkylether group having 1 to 10 carbon atoms, an arylether group having 6 to 12 carbon atoms, an alkylamino group having 1 to 10 carbon atoms, an arylamino group having 6 to 12 carbon atoms, an alkylamide group having 1 to 10 carbon atoms, an arylamide group having 6 to 12 carbon atoms, an alkylsulfonamide group having 1 to 10 carbon atoms and an arylsulfonamide group having 6 to 12 carbon atoms. Specific examples of these groups include the following.

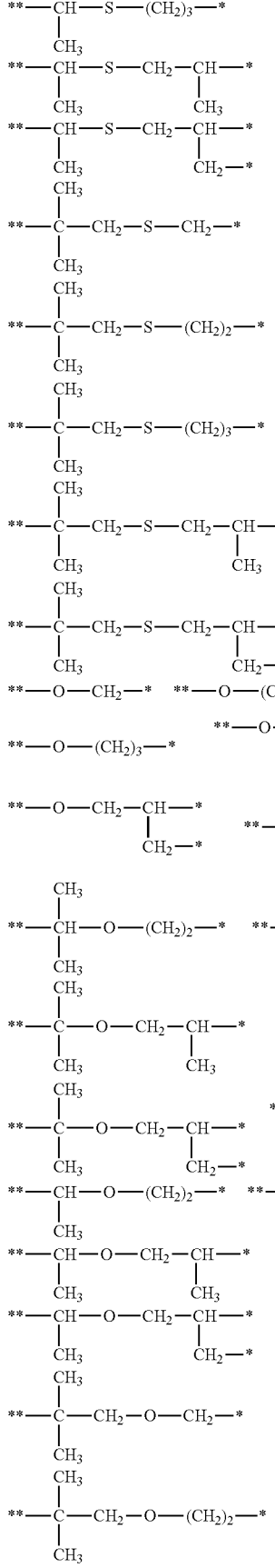
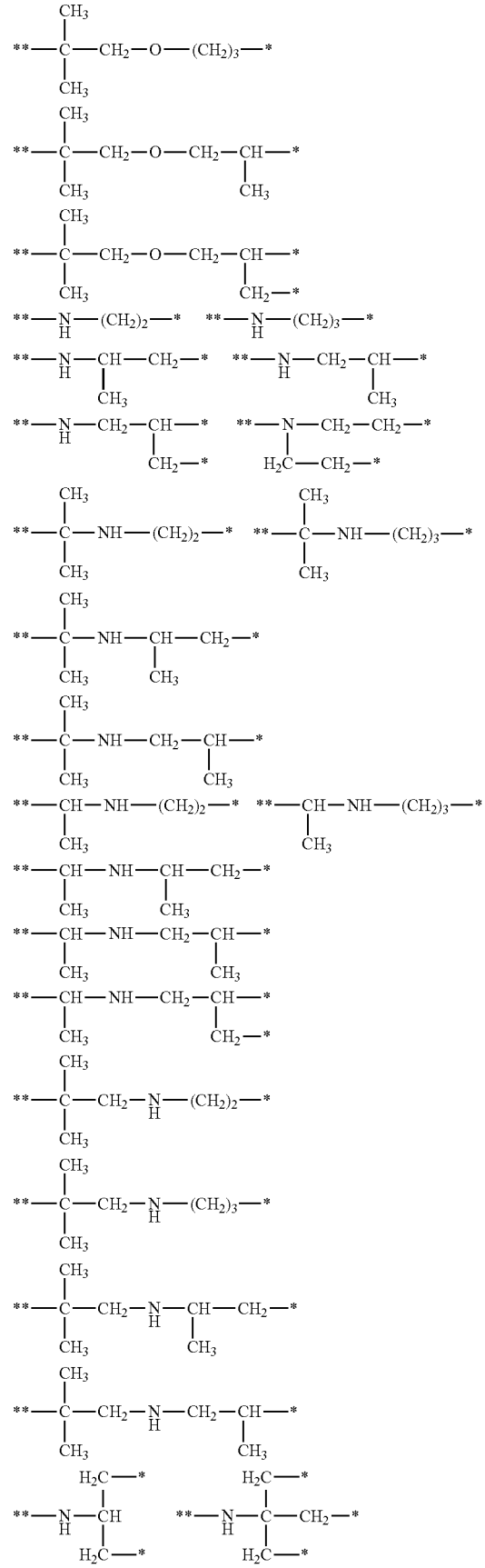

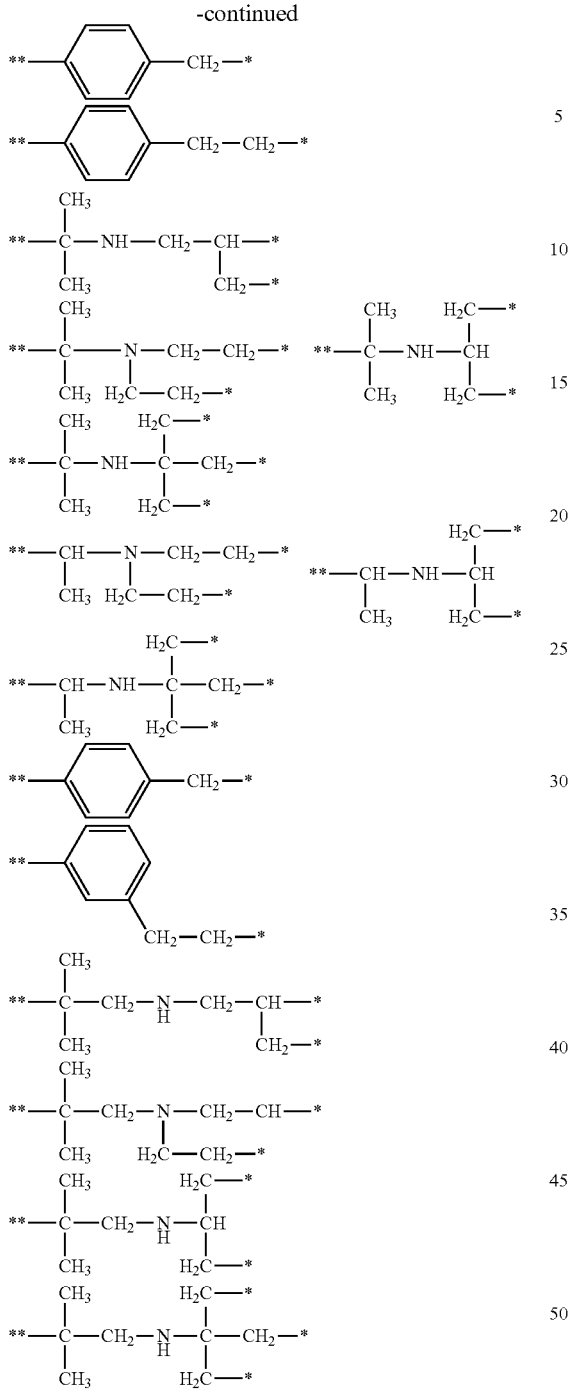
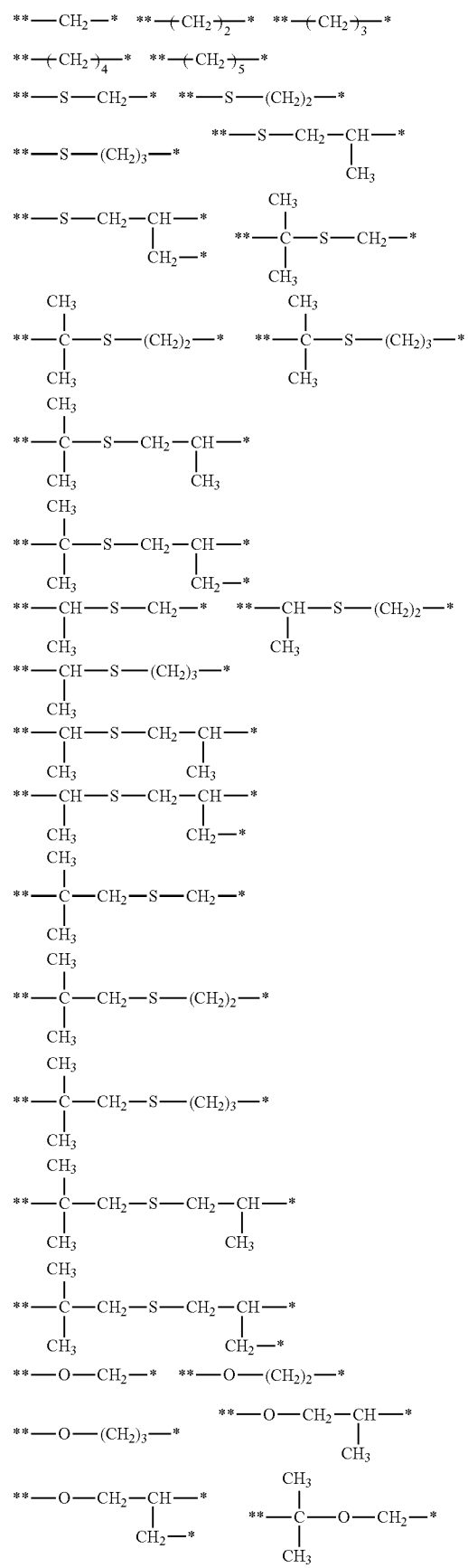

$L_2$ is more preferably an alkyl group having 1 to 10 carbon atoms, an aryl group having 6 to 12 carbon atoms, an alkylthioether group having 1 to 10 carbon atoms, an arylthioether group having 6 to 12 carbon atoms, an alkylether group having 1 to 10 carbon atoms, an arylether group having 6 to 12 carbon atoms, an alkylamino group having 1 to 10 carbon atoms, an arylamino group having 6 to 12 carbon atoms, an alkylamide group having 1 to 10 carbon atoms, an arylamide group having 6 to 12 carbon atoms, an alkylsulfonamide group having 1 to 10 carbon atoms and an arylsulfonamide group having 6 to 12 carbon atoms. Specific examples of these groups include the following.

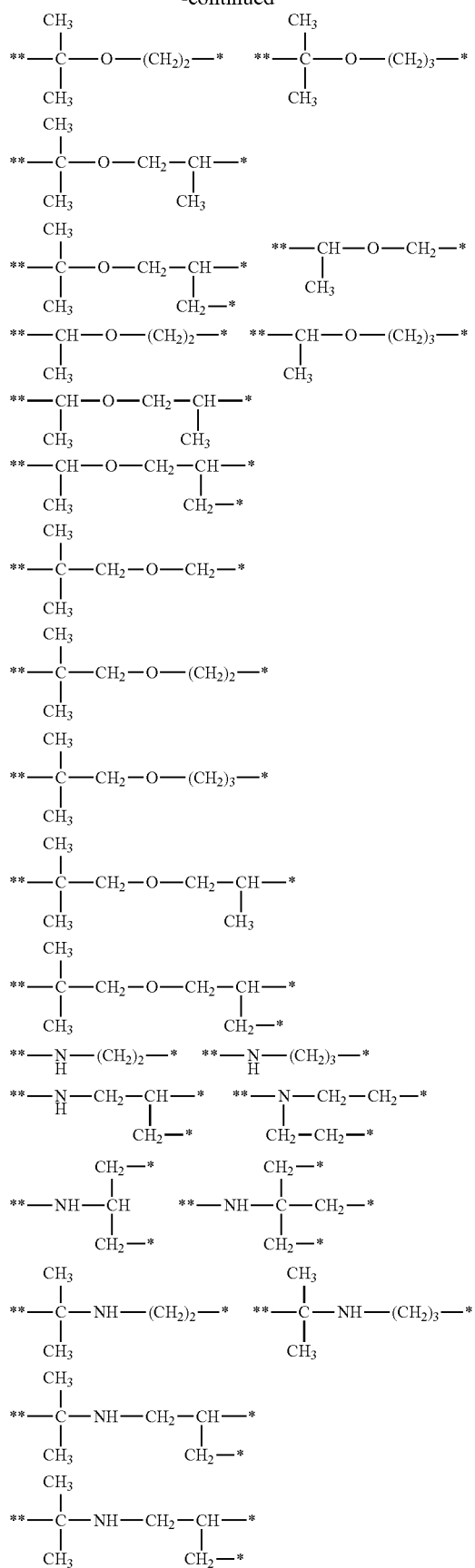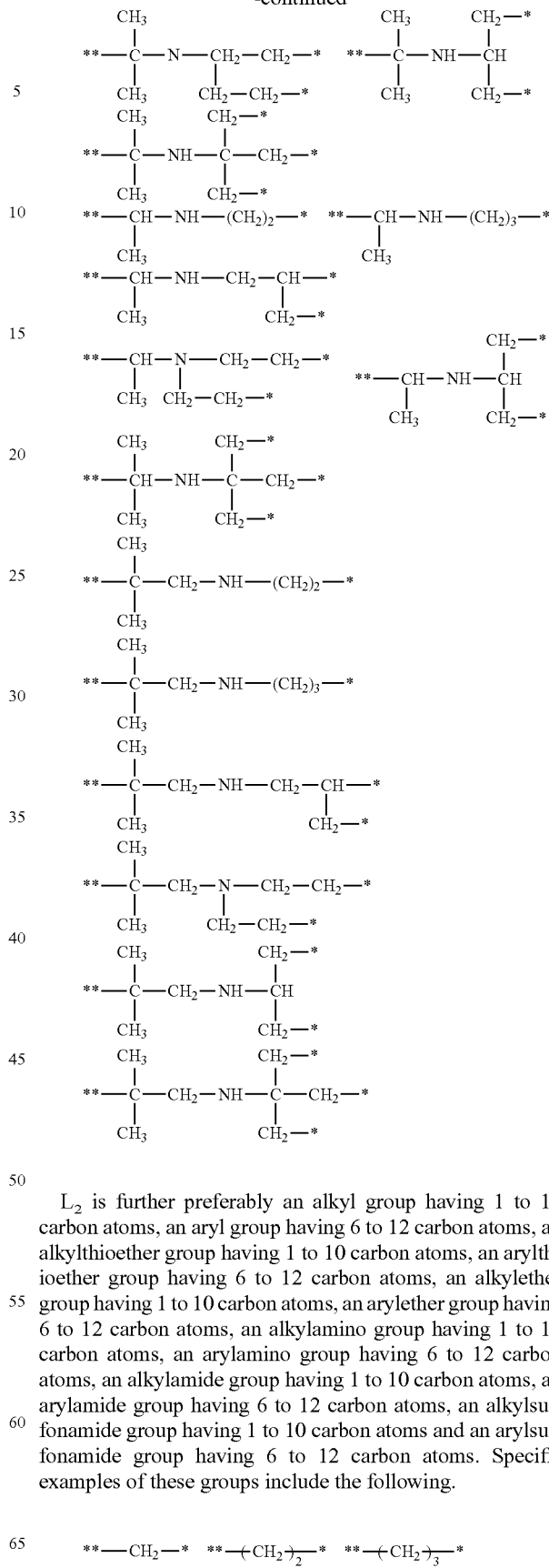

$L_2$ is further preferably an alkyl group having 1 to 10 carbon atoms, an aryl group having 6 to 12 carbon atoms, an alkylthioether group having 1 to 10 carbon atoms, an arylthioether group having 6 to 12 carbon atoms, an alkylether group having 1 to 10 carbon atoms, an arylether group having 6 to 12 carbon atoms, an alkylamino group having 1 to 10 carbon atoms, an arylamino group having 6 to 12 carbon atoms, an alkylamide group having 1 to 10 carbon atoms, an arylamide group having 6 to 12 carbon atoms, an alkylsulfonamide group having 1 to 10 carbon atoms and an arylsulfonamide group having 6 to 12 carbon atoms. Specific examples of these groups include the following.

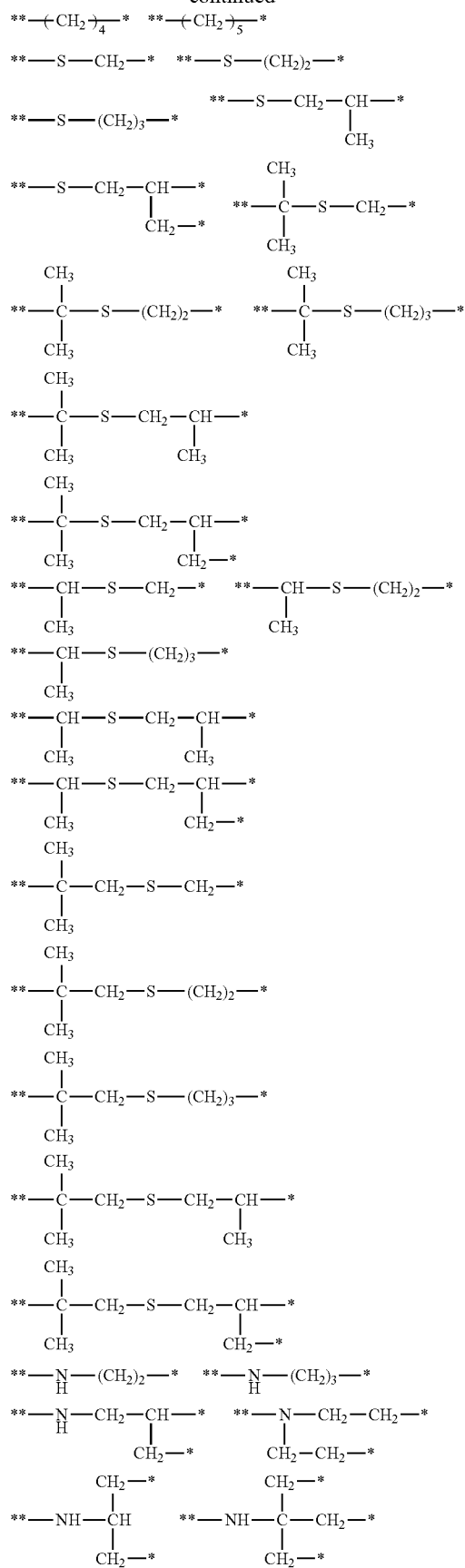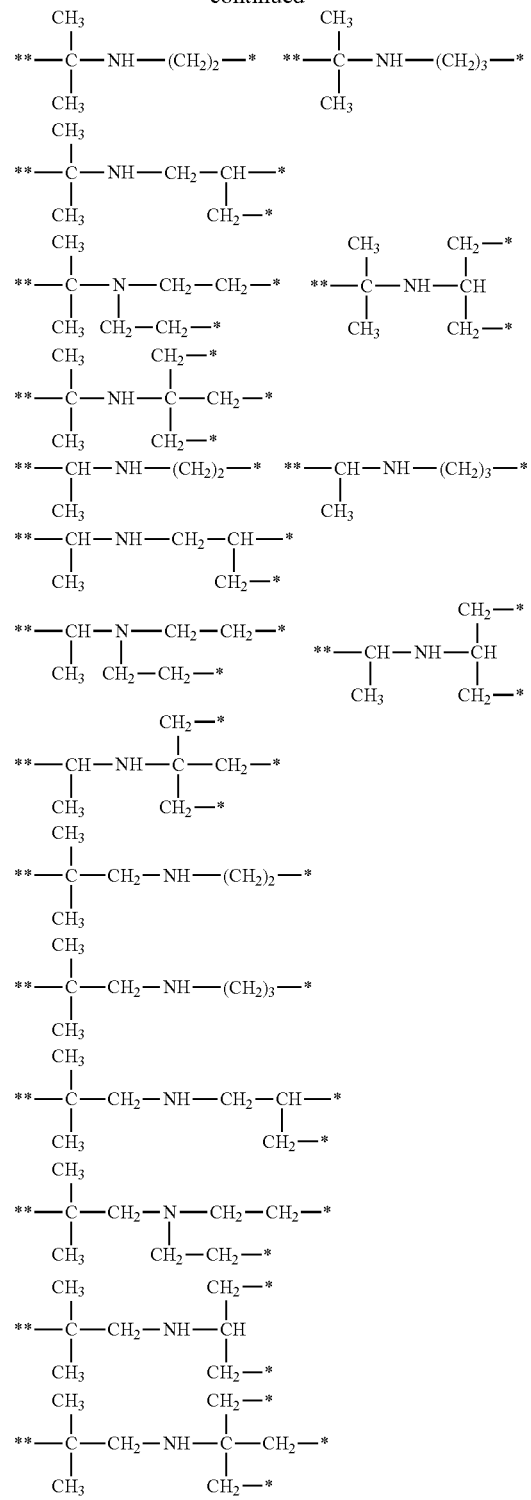
$L_2$ is more preferably any one of the following linking groups.
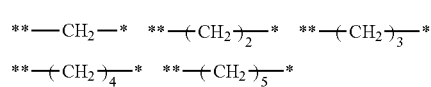

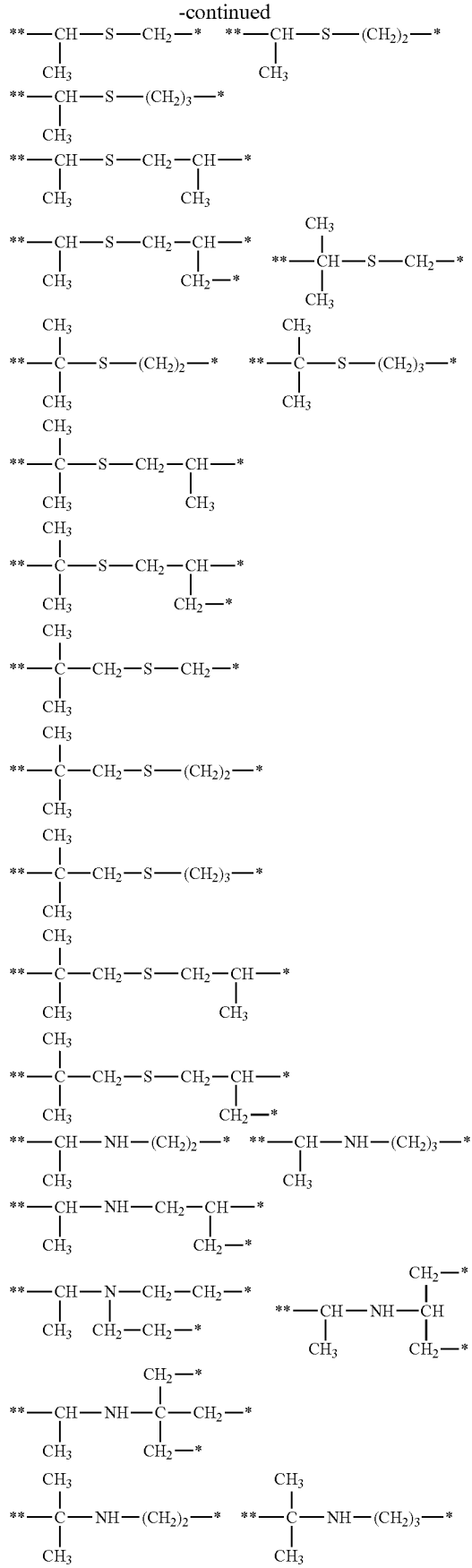
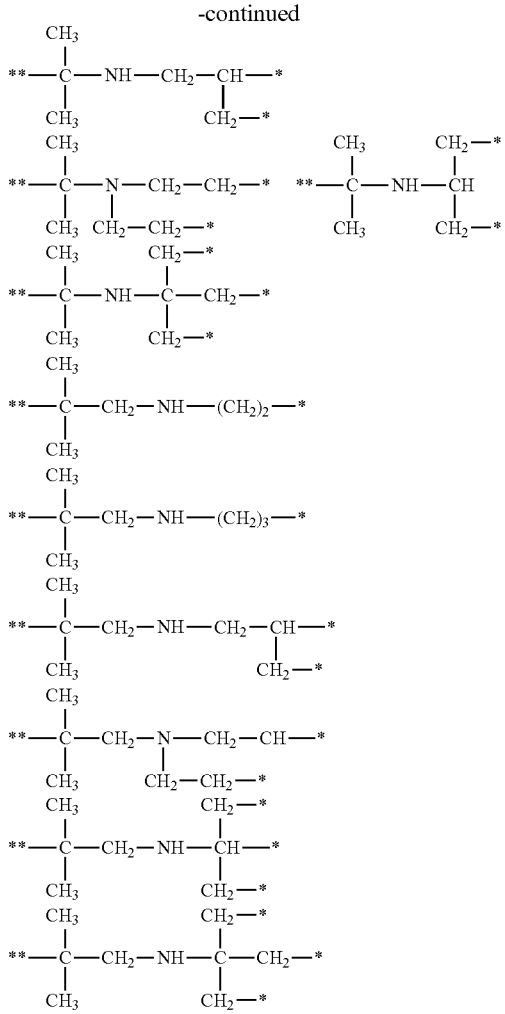

In the above linking groups, * represents a position linked to -Q-, and ** represents a position linked to the dipyrromethene skeleton directly or via a substituent represented by any of $R_1$ to $R_6$.

In formula (1), n represents 1, 2 or 3, preferably 1 or 2, more preferably 2.

In formula (1), q represents 1 or 2, preferably 1.

In formula (1), when p is 2, the two of $\{(L_1)\text{-}(CO_2M)m\}$ may be the same or different from each other. When q is 2, the two of $\{(L_2)\text{-}(Q\text{-}COC(R_8)\!=\!CH_2)n\}$ may be the same or different from each other. When m is 2 or 3, the two or three of $(CO_2M)$ may be the same or different from each other. When n is 2 or 3, the two or three of $(Q\text{-}COC(R_8)\!=\!CH_2)$ may be the same or different from each other.

In formula (1), the group represented by -$(L_1)$-$(CO_2M)m$ is preferably any one of the following substituents.

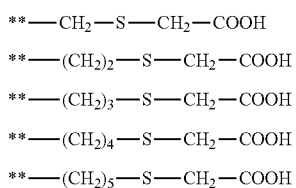

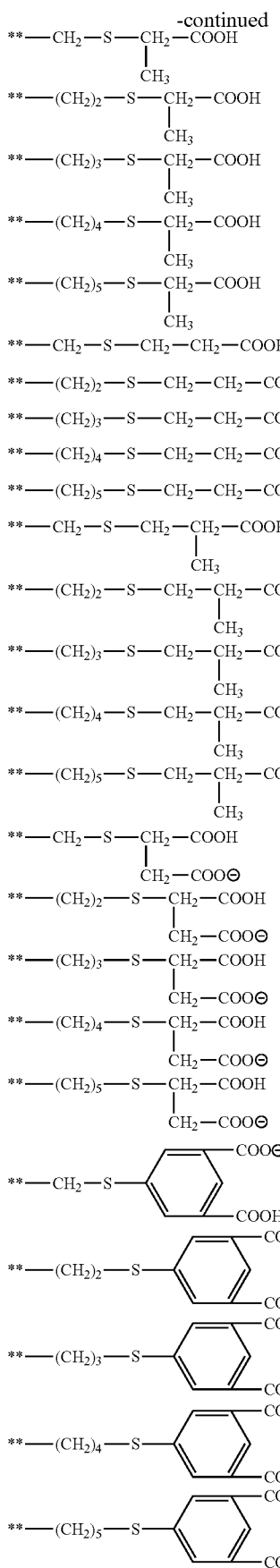
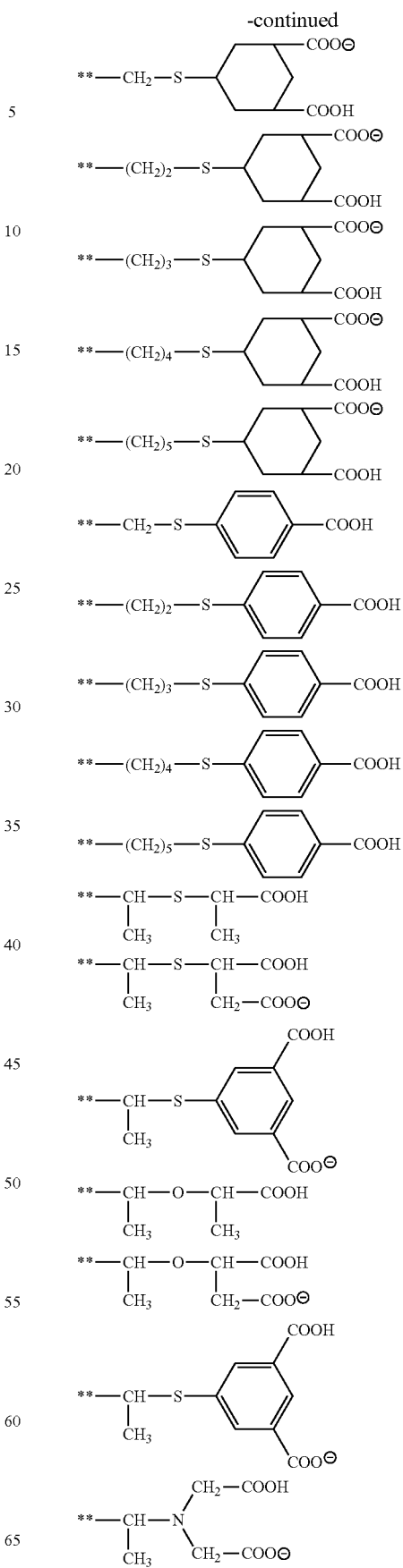

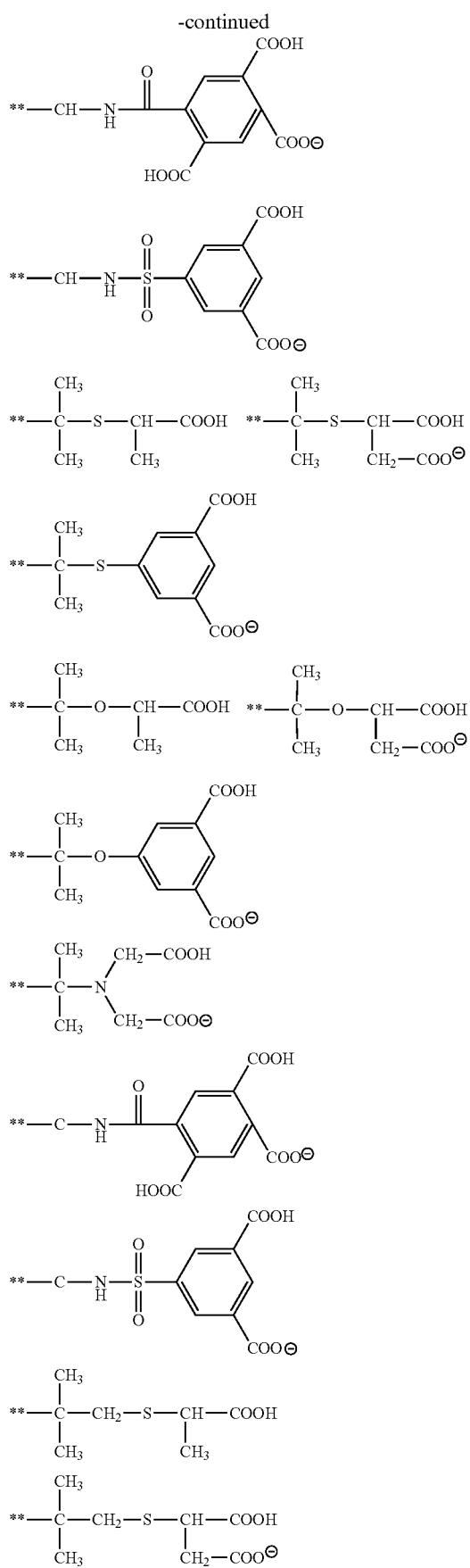
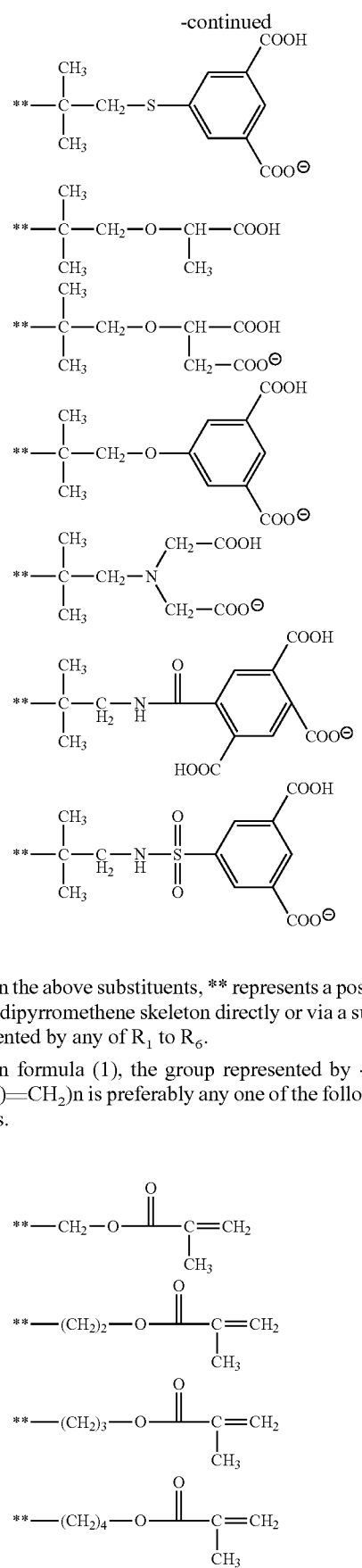
In the above substituents, ** represents a position linked to the dipyrromethene skeleton directly or via a substituent represented by any of $R_1$ to $R_6$.
In formula (1), the group represented by -($L_2$)-(Q-COC($R_8$)=$CH_2$)n is preferably any one of the following substituents.

-continued

\*\*—(CH₂)₅—O—C(=O)—C(CH₃)=CH₂

\*\*—CH₂—O—C(=O)—CH=CH₂

\*\*—(CH₂)₂—O—C(=O)—CH=CH₂

\*\*—(CH₂)₃—O—C(=O)—CH=CH₂

\*\*—(CH₂)₄—O—C(=O)—CH=CH₂

\*\*—(CH₂)₅—O—C(=O)—CH=CH₂

\*\*—CH(CH₃)—S—CH₂—O—C(=O)—CH=CH₂

\*\*—CH(CH₃)—S—(CH₂)₂—O—C(=O)—CH=CH₂

\*\*—CH(CH₃)—S—(CH₂)₃—O—C(=O)—CH=CH₂

\*\*—CH(CH₃)—S—CH₂—CH(CH₃)—O—C(=O)—CH=CH₂

\*\*—CH(CH₃)—S—CH₂—CH(CH₂—O—C(=O)—CH=CH₂)—O—C(=O)—CH=CH₂

\*\*—C(CH₃)₂—CH₂—S—CH₂—O—C(=O)—CH=CH₂

\*\*—C(CH₃)₂—CH₂—S—(CH₂)₂—O—C(=O)—CH=CH₂

\*\*—C(CH₃)₂—CH₂—S—(CH₂)₃—O—C(=O)—CH=CH₂

\*\*—C(CH₃)₂—S—CH₂—O—C(=O)—CH=CH₂

\*\*—C(CH₃)₂—S—(CH₂)₂—O—C(=O)—CH=CH₂

-continued

\*\*—C(CH₃)₂—S—(CH₂)₃—O—C(=O)—CH=CH₂

\*\*—C(CH₃)₂—S—CH₂—CH(CH₃)—O—C(=O)—CH=CH₂

\*\*—C(CH₃)₂—S—CH₂—CH(CH₂—O—C(=O)—CH=CH₂)—O—C(=O)—CH=CH₂

\*\*—C(CH₃)₂—CH₂—S—CH₂—CH(CH₃)—O—C(=O)—CH=CH₂

\*\*—C(CH₃)₂—CH₂—S—CH₂—CH(CH₂—O—C(=O)—CH=CH₂)—O—C(=O)—CH=CH₂

\*\*—CH(CH₃)—NH—(CH₂)₂—O—C(=O)—CH=CH₂

\*\*—CH(CH₃)—NH—(CH₂)₃—O—C(=O)—CH=CH₂

\*\*—CH(CH₃)—NH—CH₂—CH(CH₂—O—C(=O)—CH=CH₂)—O—C(=O)—CH=CH₂

\*\*—CH(CH₃)—N(CH₂—CH₂—O—C(=O)—CH=CH₂)—CH₂—CH₂—O—C(=O)—CH=CH₂

\*\*—CH(CH₃)—NH—CH(CH₂—O—C(=O)—CH=CH₂)₂

\*\*—CH(CH₃)—NH—C(CH₂—O—C(=O)—CH=CH₂)₃

\*\*—C(CH₃)(CH₂—)—NH—(CH₂)₂—O—C(=O)—CH=CH₂

71
-continued
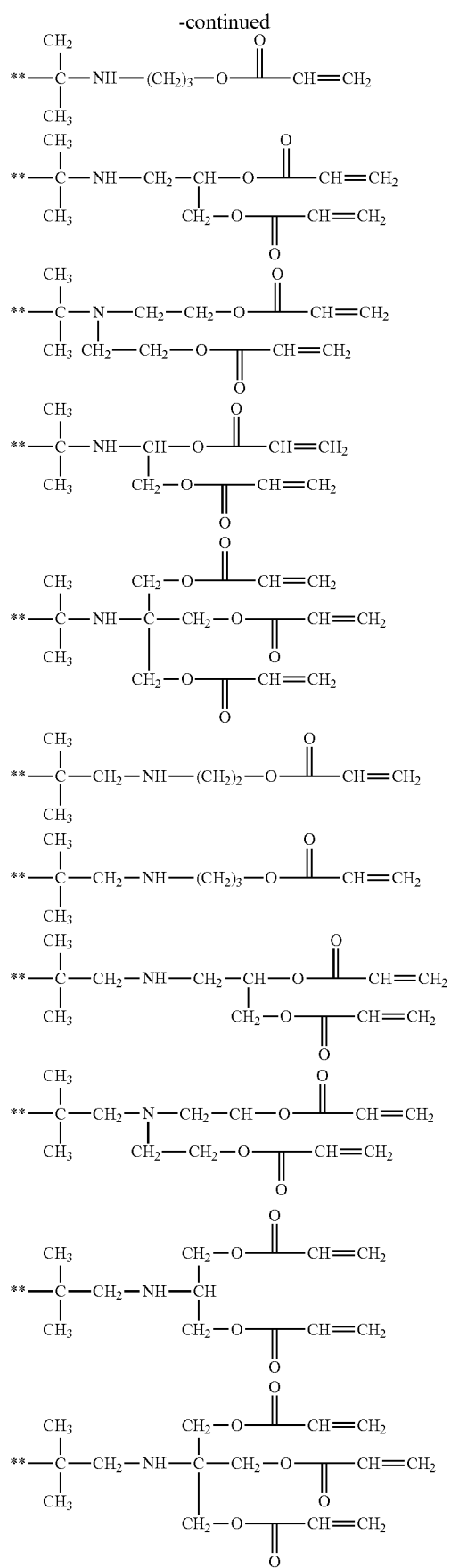
72
-continued
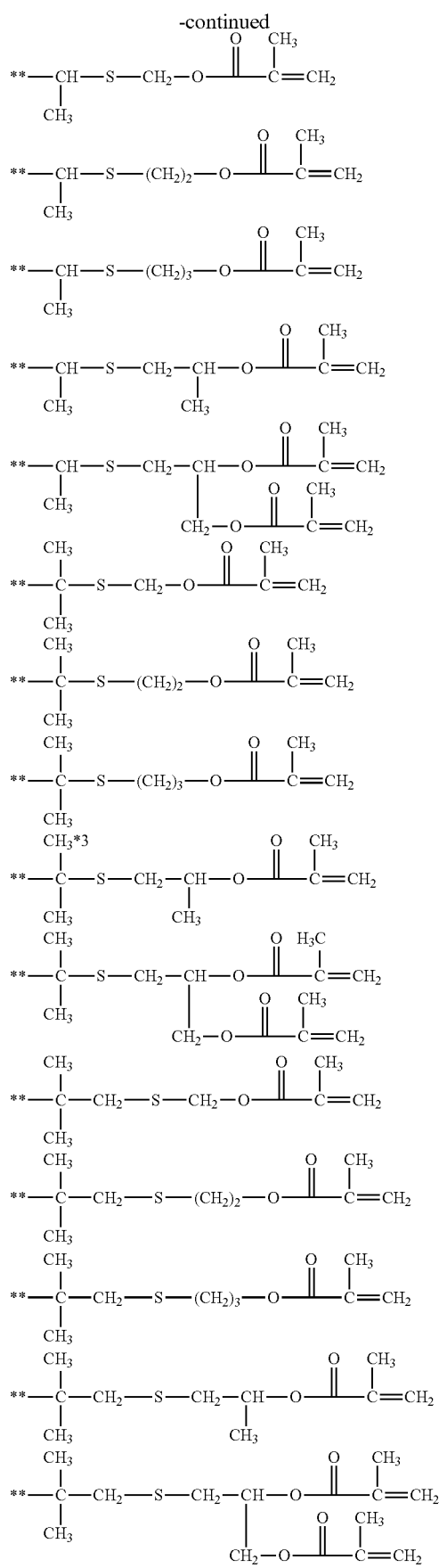

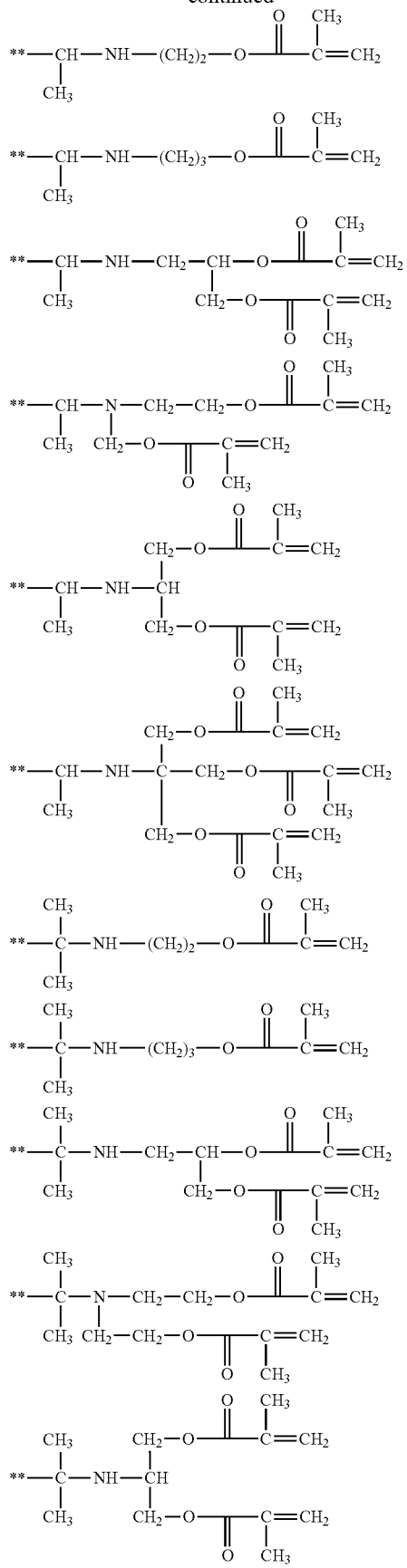
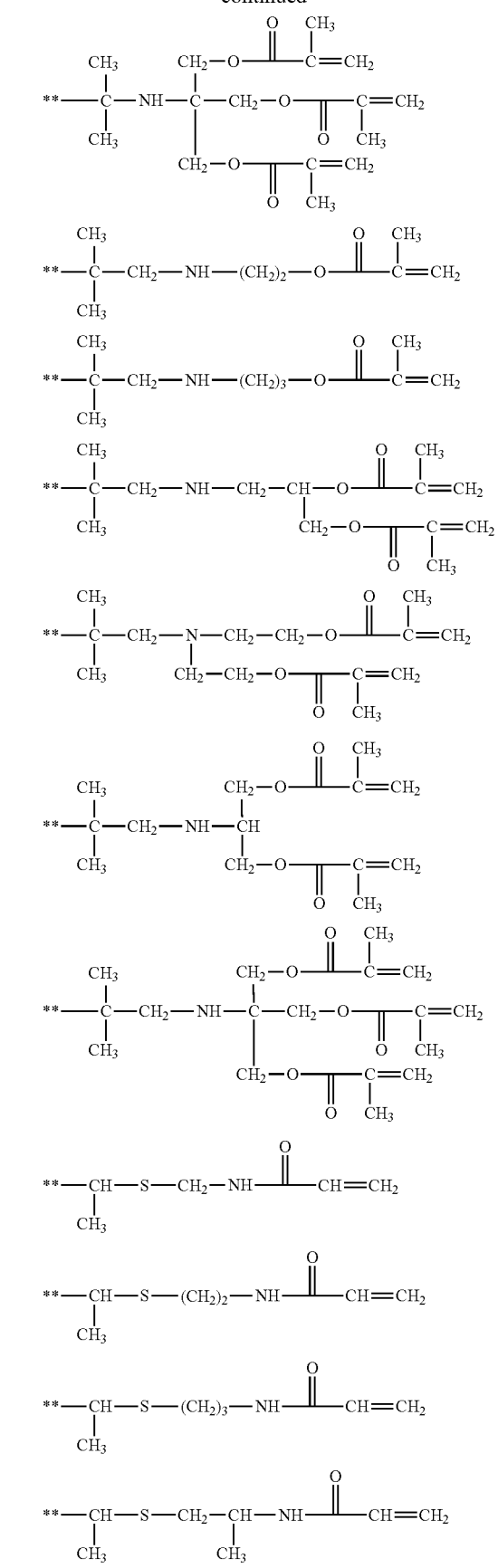

-continued
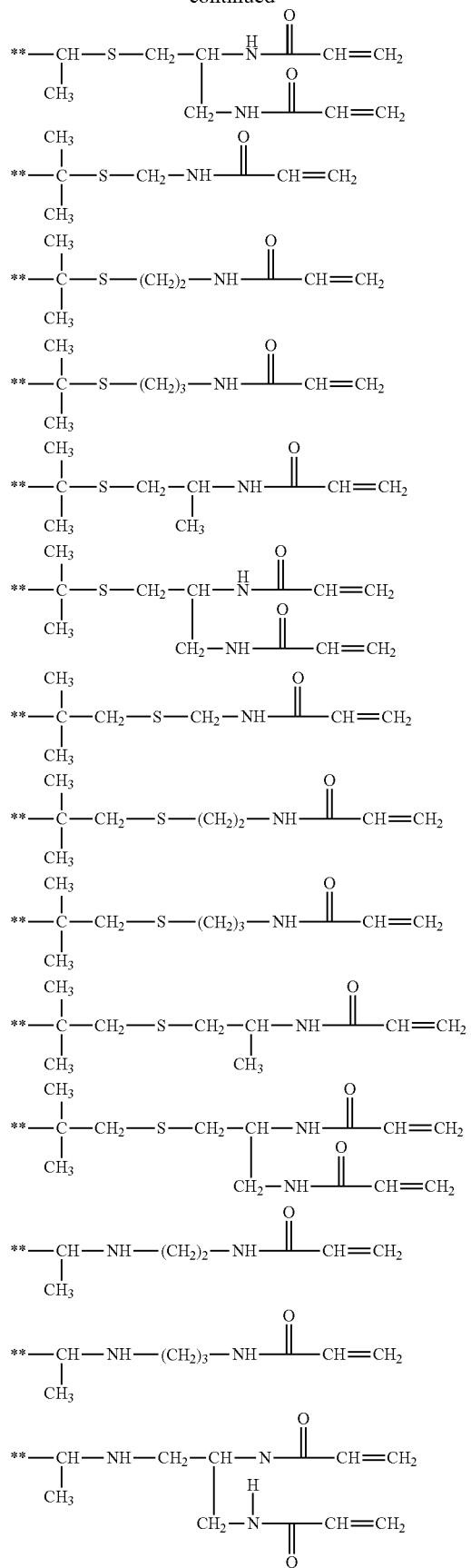
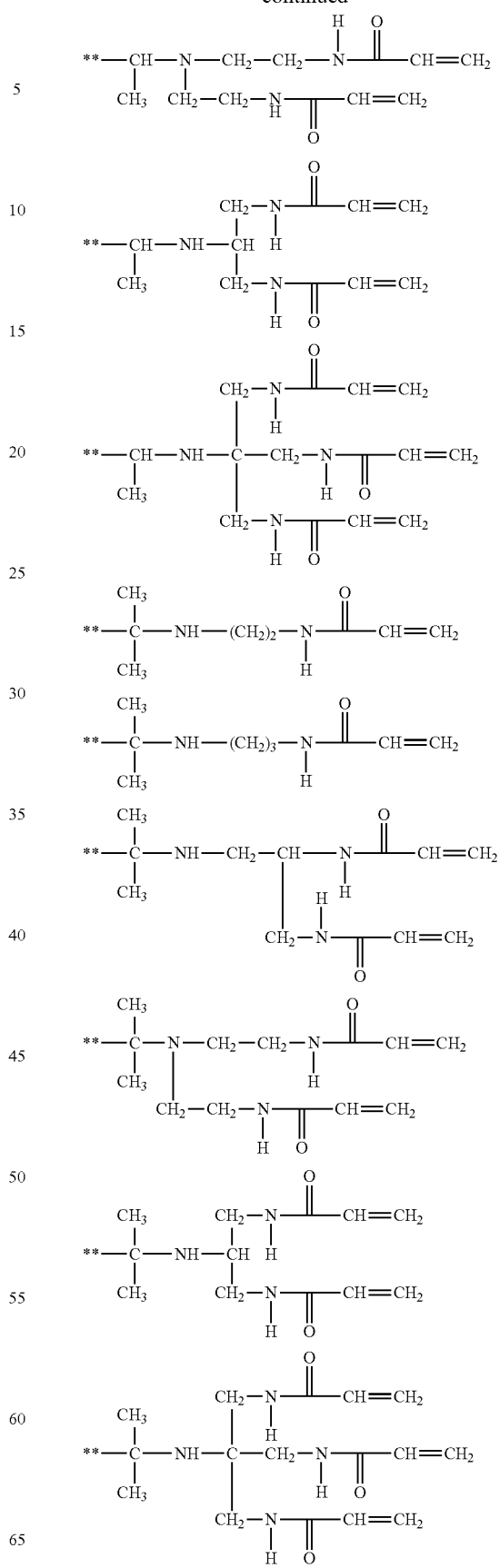

77
-continued
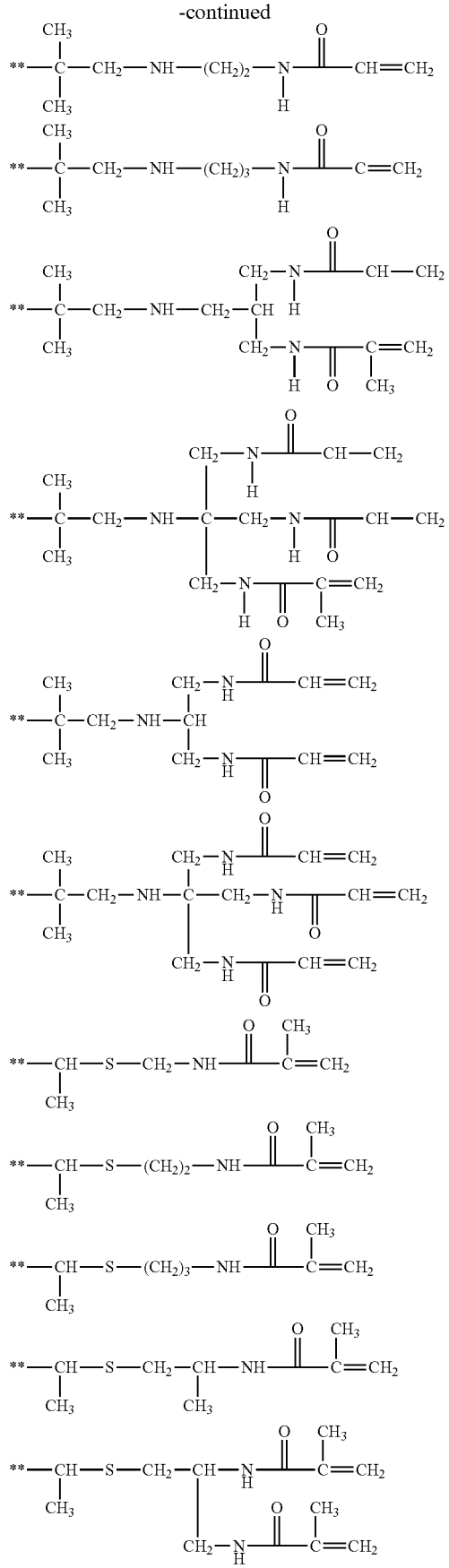
78
-continued
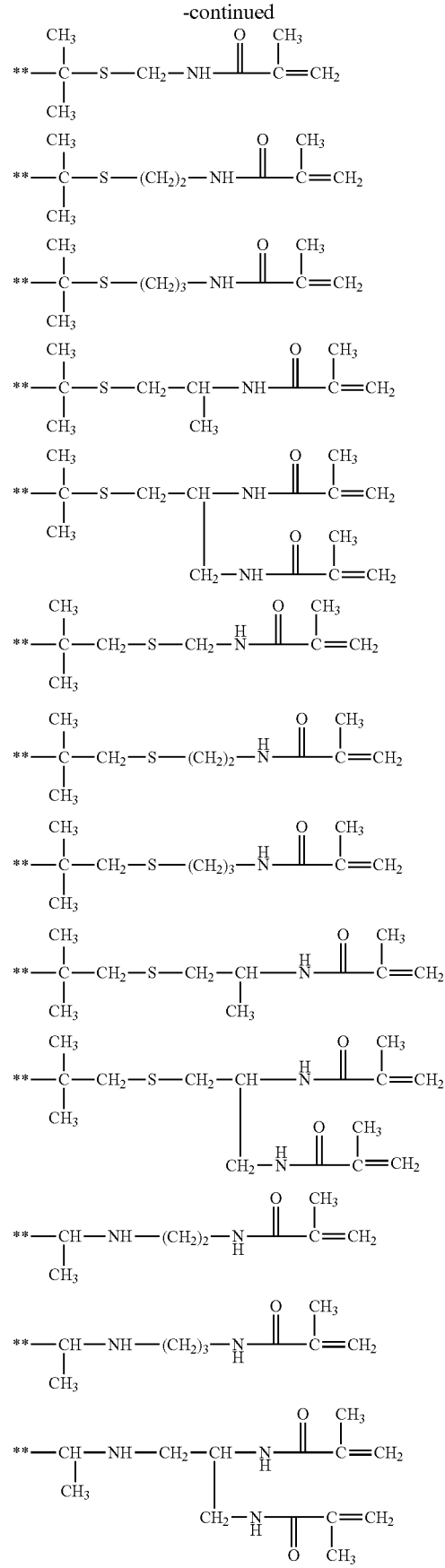

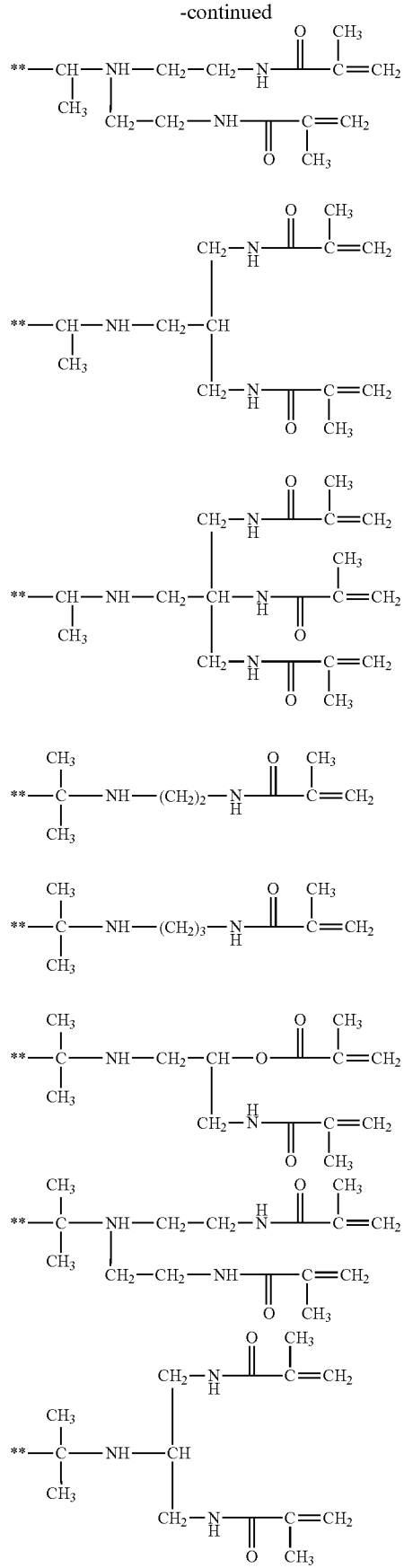
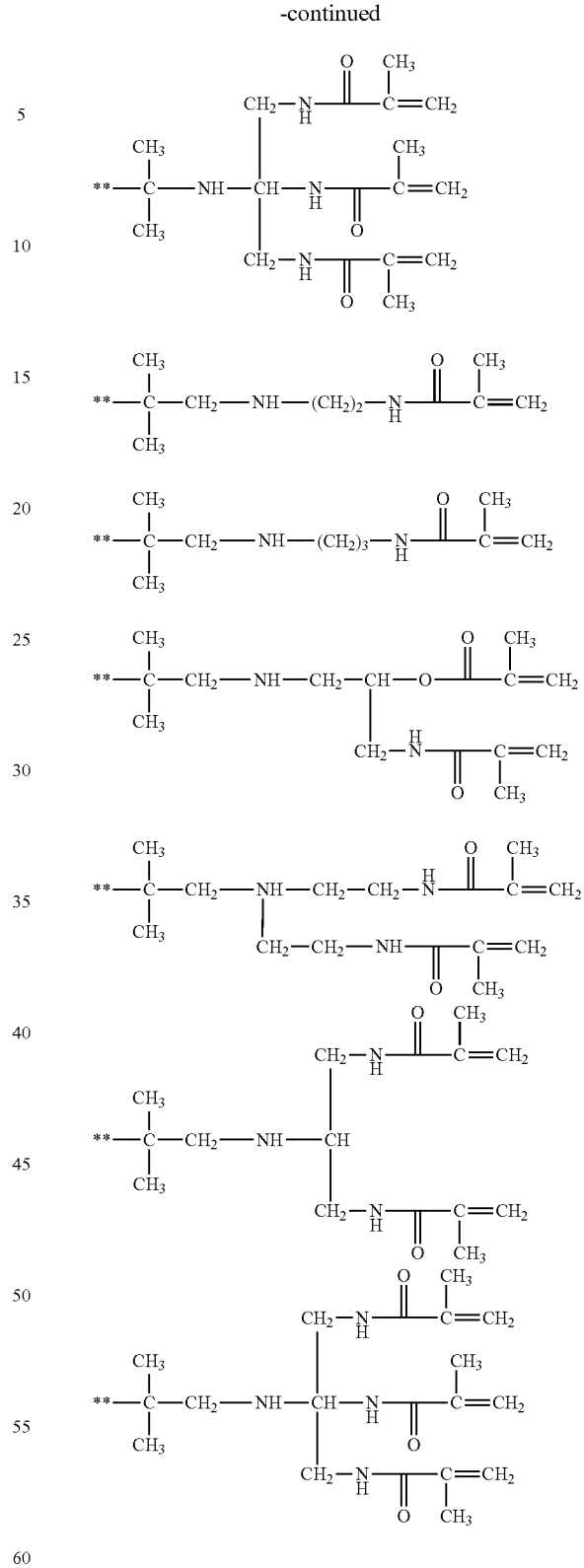
In the above substituents, ** represents a position linked to the dipyrromethene skeleton directly or via a substituent represented by any of $R_1$ to $R_6$.
The compound represented by formula (1) is particularly preferably a compound represented by formula (2), from the viewpoint of effectively achieving the effect according to the invention.

Compound represented by formula (2)

The compound represented by formula (1) is preferably a compound represented by the following formula (2).

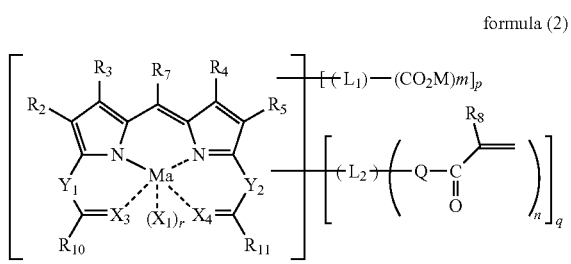

formula (2)

In formula (2), $R_2$ to $R_5$ each independently represent a hydrogen atom or a substituent; $R_7$ represents a hydrogen atom, a halogen atom, an alkyl group, an aryl group or a heterocyclic group; $R_{10}$ and $R_{11}$ each independently represent an alkyl group, an alkenyl group, an aryl group, a heterocyclic group, an alkoxy group, an aryloxy group, an amino group, an anilino group or a heterocyclic amino group; a substituent represented by any of $R_2$ to $R_5$, $R_{10}$ or $R_{11}$ is a divalent linking group bonded to -$L_1$- or -$L_2$-, or a substituent represented by any of $R_2$ to $R_5$, $R_{10}$ or $R_{11}$ is a single bond and -$L_1$- or -$L_2$- directly substitutes the dipyrromethene skeleton; Ma represents a metal or a metal compound; $X_1$ represents a group to neutralize charges of Ma; r represents 0 or 1; $X_3$ and $X_4$ each independently represent NR (R represents a hydrogen atom, an alkyl group, an alkenyl group, an aryl group, a heterocyclic group, an acyl group, an alkylsulfonyl group or an arylsulfonyl group), a nitrogen atom, an oxygen atom or a sulfur atom; $Y_1$ and $Y_2$ each independently represent NR (R represents a hydrogen atom, an alkyl group, an alkenyl group, an aryl group, a heterocyclic group, an acyl group, an alkylsulfonyl group or an arylsulfonyl group) or an oxygen atom; $R_{10}$ and $Y_1$ may be bonded to each other to form a five, six or seven-membered ring; $R_{11}$ and $Y_2$ may be bonded to each other to form a five, six or seven-membered ring; M represents a hydrogen atom, or an organic base or a metal atom to neutralize charges of —$CO_2^-$, or an anion (i.e., $CO_2M$ represents $CO_2^-$); $L_1$ represents a single bond or a (m+1)-valent linking group; m represents 1, 2 or 3; p represents 1 or 2; $R_8$ represents a hydrogen atom or a methyl group; Q represents an oxygen atom or $NR_9$ ($R_9$ represents a hydrogen atom, an alkyl group, an alkenyl group, an aryl group, a heterocyclic group, an acyl group, an alkylsulfonyl group or an arylsulfonyl group); $L_2$ represents a single bond or an (n+1)-valent linking group; n represents 1, 2 or 3; q represents 1 or 2; when p is 2, the two of {($L_1$)-($CO_2M$)m} may be the same or different from each other; when q is 2, the two of {($L_2$)-(Q-COC($R_8$)=$CH_2$)n} may be the same or different from each other; when m is 2 or 3, the two or three of ($CO_2M$) may be the same or different from each other; and when n is 2 or 3, the two or three of (Q-COC($R_8$)=$CH_2$) may be the same or different from each other.

In formula (2), $R_2$ to $R_5$ have the same definitions as $R_2$ to $R_5$ in formula (1), and preferable examples are also the same.

In formula (2), $R_7$ in formula (2) has the same definitions as $R_7$ in formula (1), and preferable examples are also the same.

In formula (2), $R_{10}$ and $R_{11}$ each independently represent an alkyl group, an alkenyl group, an aryl group, a heterocyclic group, an alkoxy group, an aryloxy group, an amino group, an anilino group or a heterocyclic amino group.

Among them, $R_{10}$ and $R_{11}$ are preferably an alkyl group, an alkenyl group, an aryl group, a heterocyclic group, an alkoxy group, an aryloxy group or a heterocyclic amino group, and more preferably an alkyl group, an alkenyl group, an alkoxy group, or an aryloxy group.

In formula (2), a substituent represented by any of $R_2$ to $R_5$, $R_{10}$ or $R_{11}$ is a divalent linking group bonded to -$L_1$- or -$L_2$-, or a substituent represented by any of $R_2$ to $R_5$, $R_{10}$ or $R_{11}$ is a single bond and -$L_1$- or -$L_2$- directly substitutes the dipyrromethene skeleton.

In formula (2), a portion to which -$L_1$- is bonded is more preferably at least one of $R_3$, $R_4$, $R_{10}$ or $R_{11}$, and further preferably at least one of $R_{10}$ or $R_{11}$, from the viewpoint of synthetic compatibility.

In formula (2), a portion to which -$L_2$- is bonded is more preferably at least one of $R_3$, $R_4$, $R_{10}$ or $R_{11}$, and further preferably at least one of $R_{10}$ or $R_{11}$, from the viewpoint of synthetic compatibility.

In formula (2), Ma, $X_1$, r, M, $L_1$, m, p, $R_8$, Q, $L_2$, n and q have the same definitions as Ma, $X_1$, r, M, $L_1$, m, p, $R_8$, Q, $L_2$, n, and q in formula (1), and preferable examples are also the same.

In formula (2), $X_3$ and $X_4$ each independently represent NR (R represents a hydrogen atom, an alkyl group, an alkenyl group, an aryl group, a heterocyclic group, an acyl group, an alkylsulfonyl group or an arylsulfonyl group), a nitrogen atom, an oxygen atom, or a sulfur atom.

Among them, $X_3$ and $X_4$ are preferably NR (R represents a hydrogen atom, an alkyl group, or an alkenyl group), a nitrogen atom, an oxygen atom, or a sulfur atom, and more preferably NR (R represents a hydrogen atom), a nitrogen atom, an oxygen atom, or a sulfur atom.

In formula (2), $Y_1$ and $Y_2$ each independently represent NR (R represents a hydrogen atom, an alkyl group, an alkenyl group, an aryl group, a heterocyclic group, an acyl group, an alkylsulfonyl group or an arylsulfonyl group), or an oxygen atom.

Among them, $Y_1$ and $Y_2$ are preferably NR (R represents a hydrogen atom, an alkyl group or an alkenyl group) or an oxygen atom, more preferably NR (R represents a hydrogen atom) or an oxygen atom.

In formula (2), $R_{10}$ and $Y_1$ may be bonded to each other to form a five, six or seven-membered ring; and $R_{11}$ and $Y_2$ may be bonded to each other to form a five, six or seven-membered ring. Examples of the five, six or seven-membered ring include the rings as described above.

With respect to the combination of preferable substituents in the compound represented by formula (2), the compound preferably includes at least one of these substituents selected from the above-mentioned preferred examples. A compound including more substituents selected from the preferred examples is more preferred, and a compound including all substituents selected from the preferred examples is most preferred.

The following are specific examples of the compound represented by formula (2), but the invention is not limited thereto.

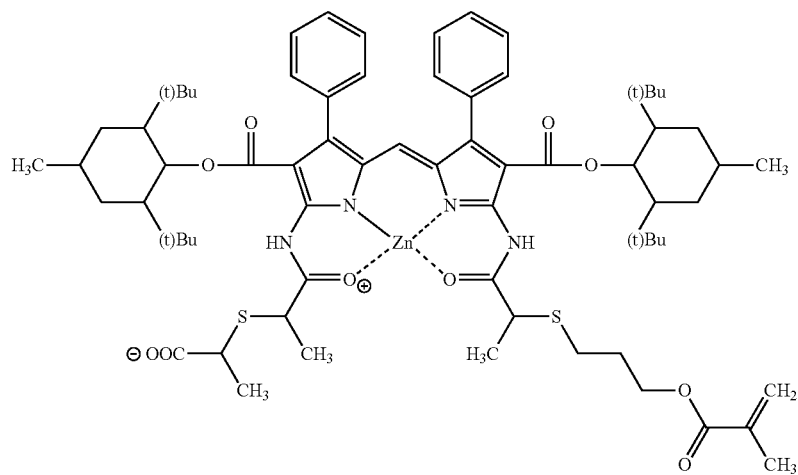
(a-1)
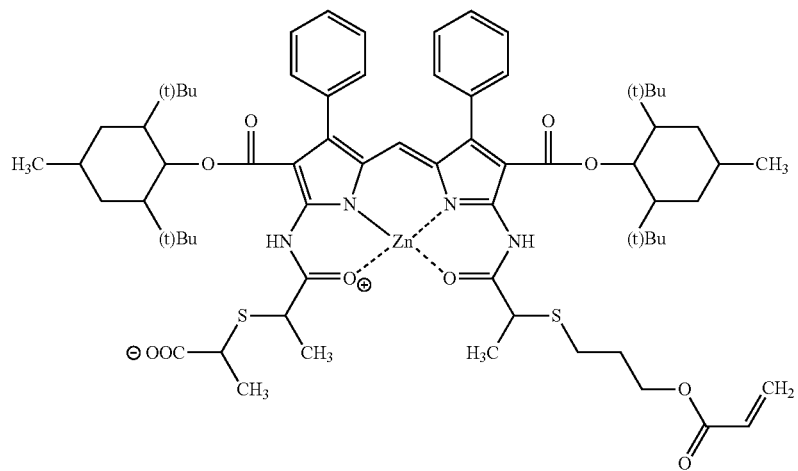
(a-2)
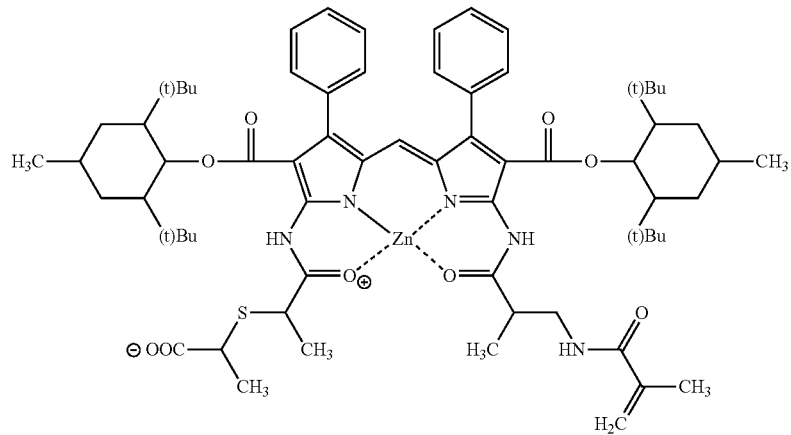
(a-3)

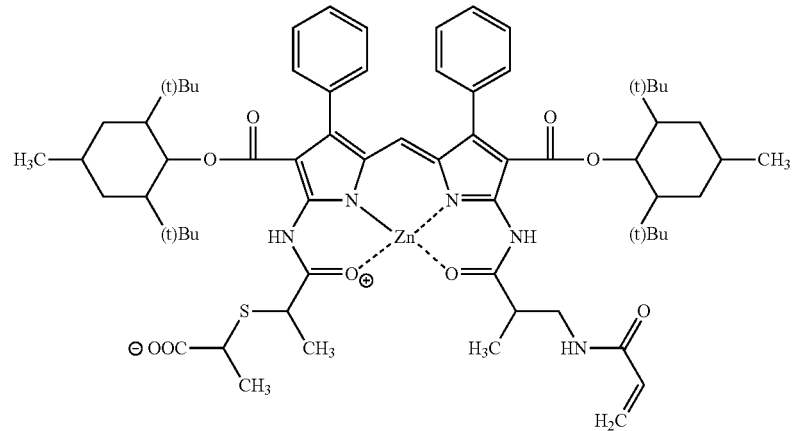
(a-4)
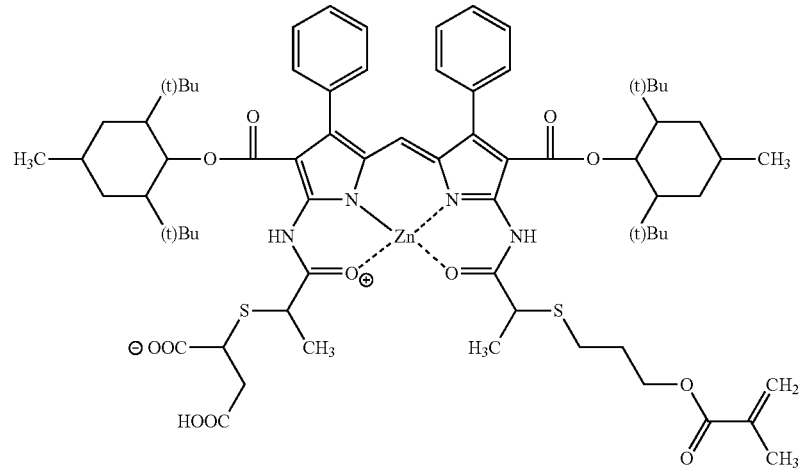
(a-5)
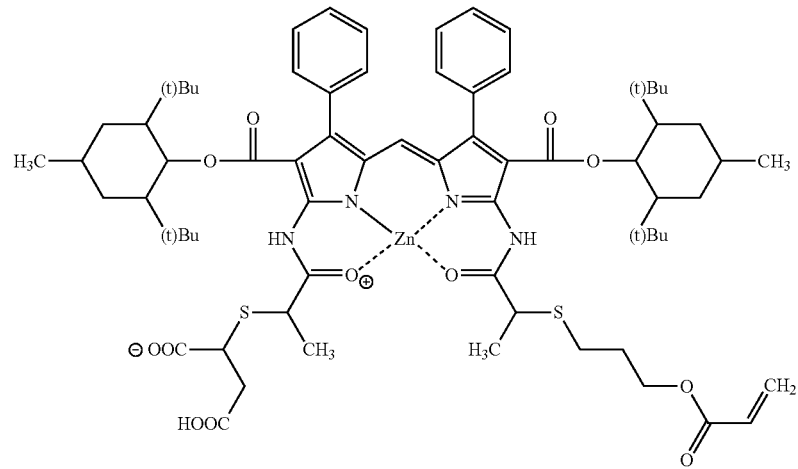
(a-6)

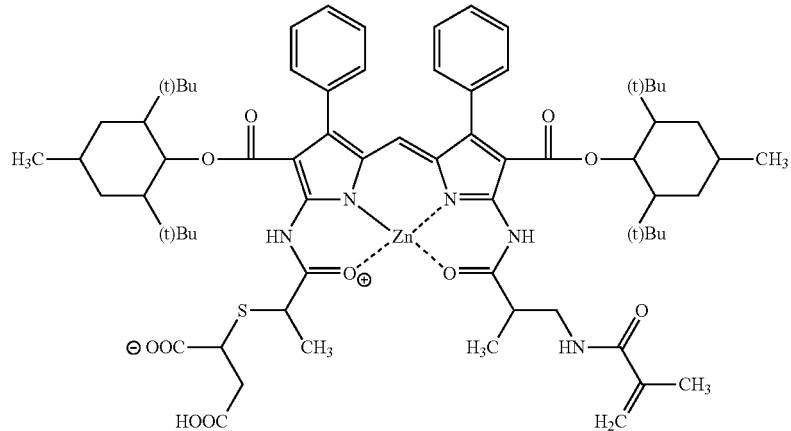
(a-7)
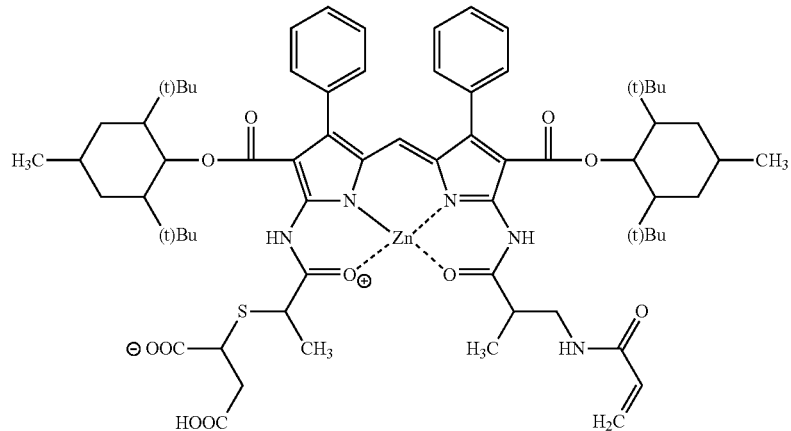
(a-8)
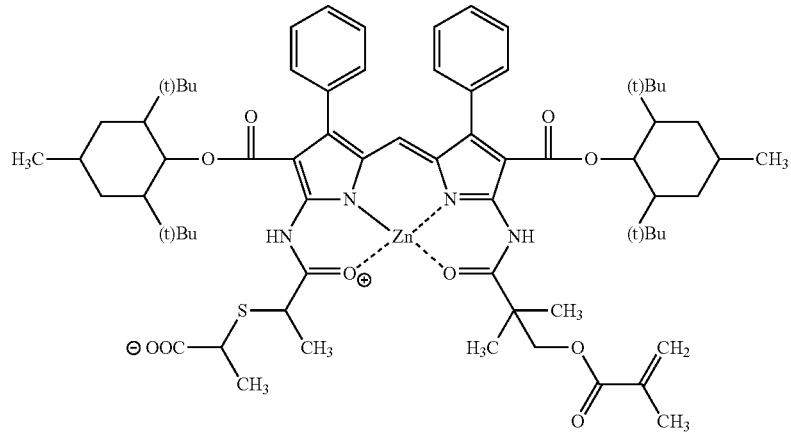
(a-9)

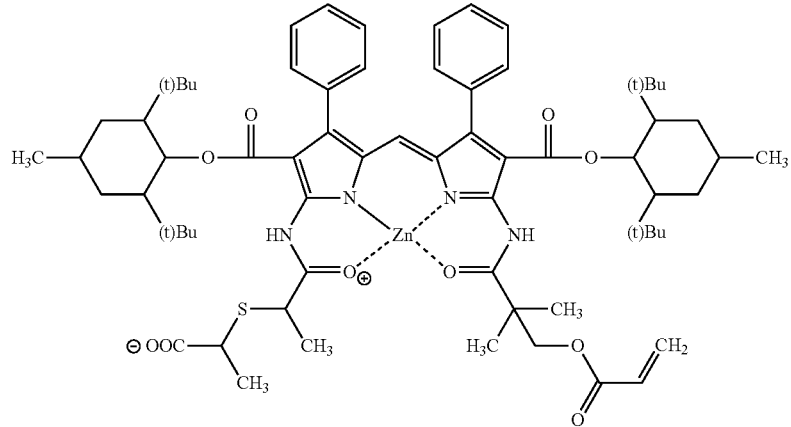
(a-10)
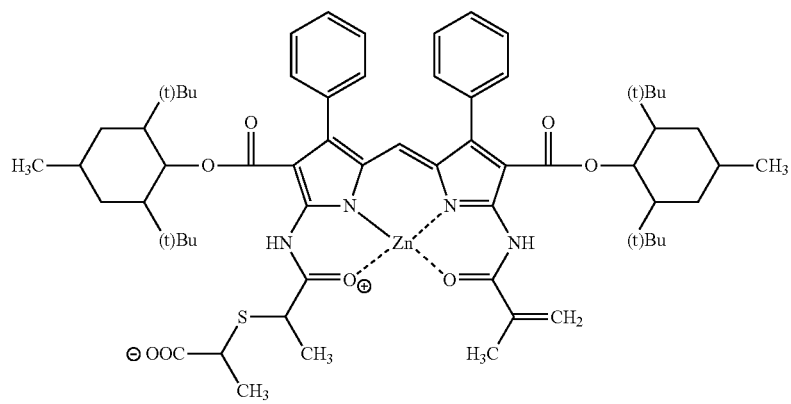
(a-11)
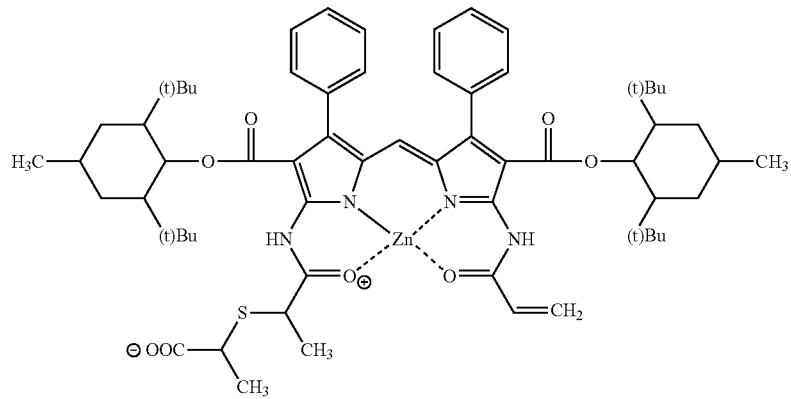
(a-12)

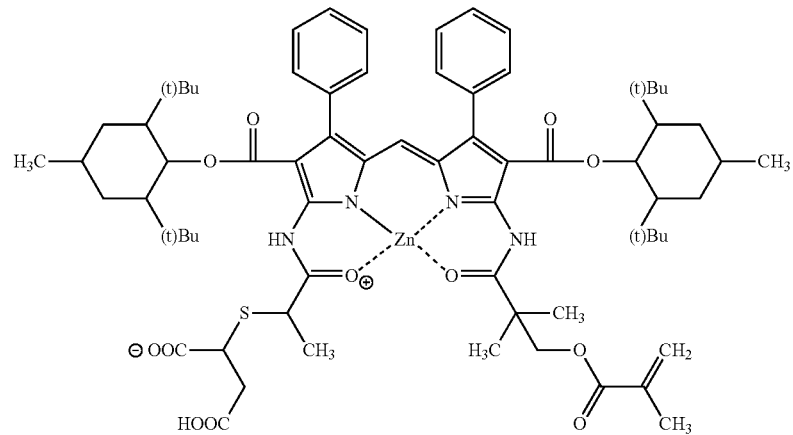
(a-13)
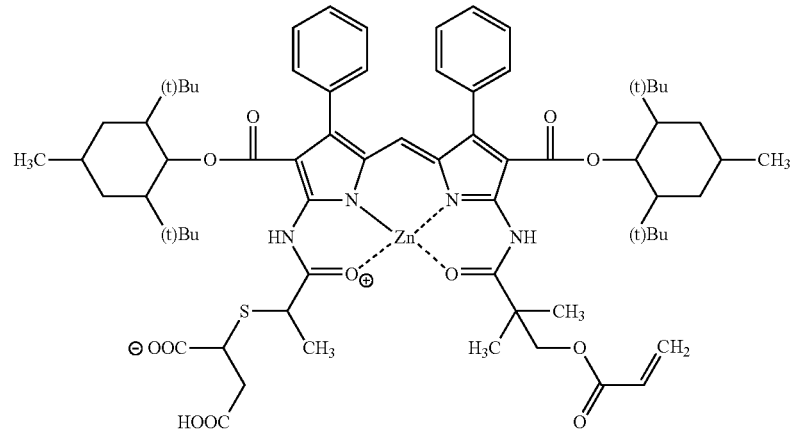
(a-14)
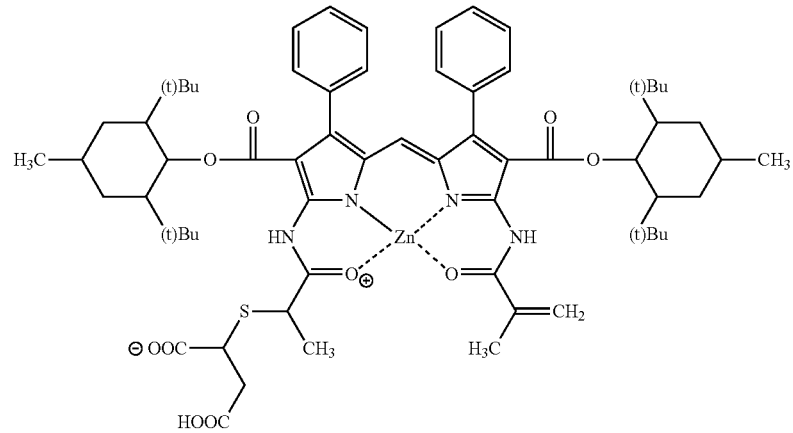
(a-15)

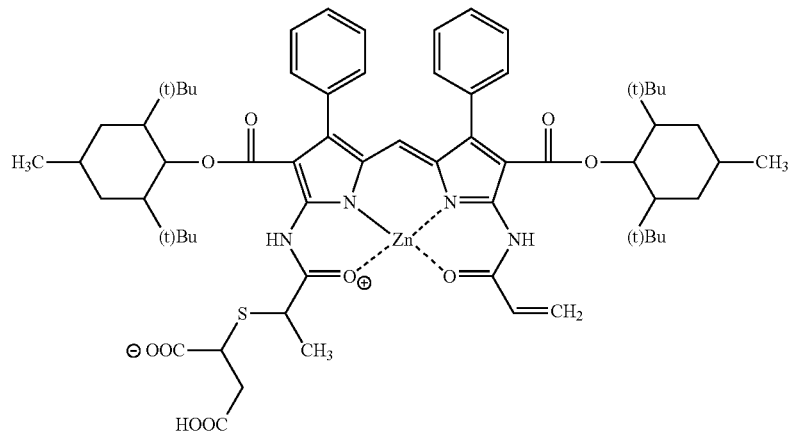
(a-16)
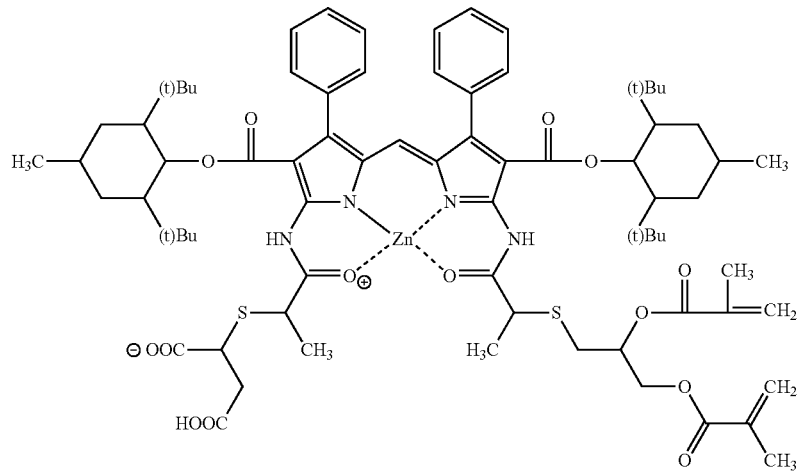
(a-17)
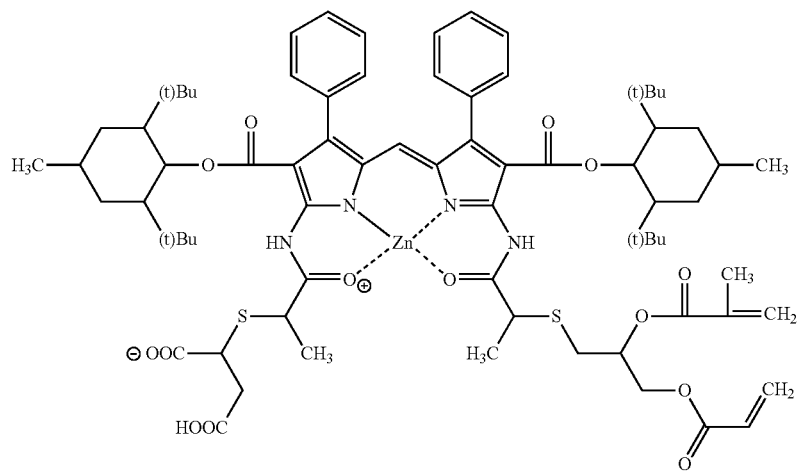
(a-18)

-continued
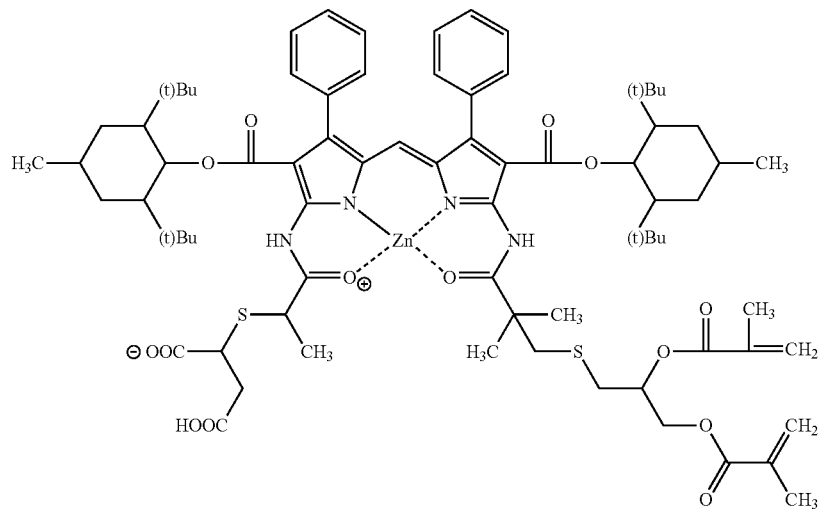
(a-19)
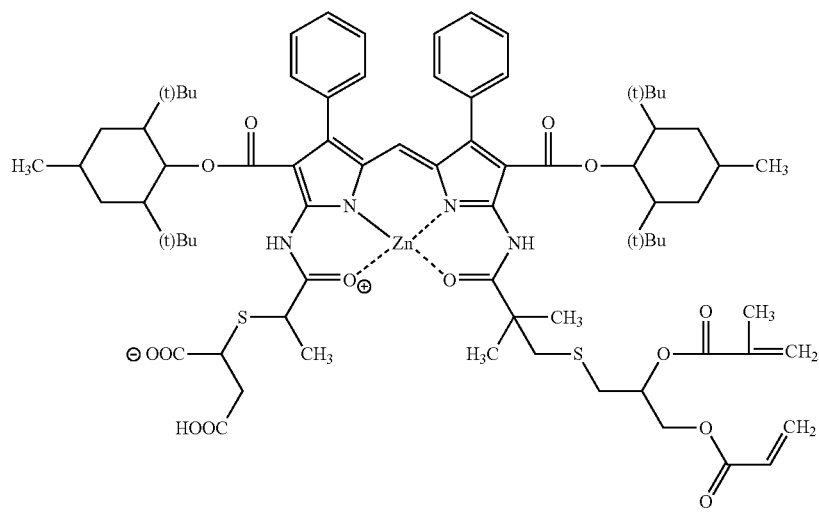
(a-20)
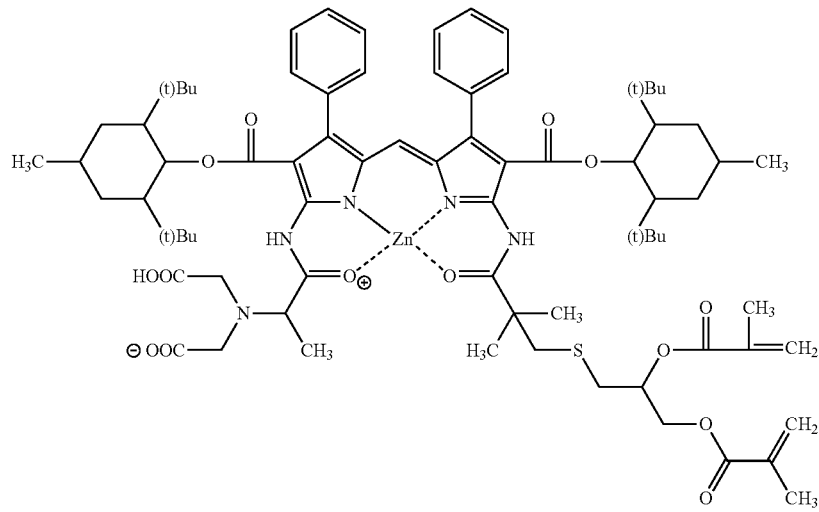
(a-21)

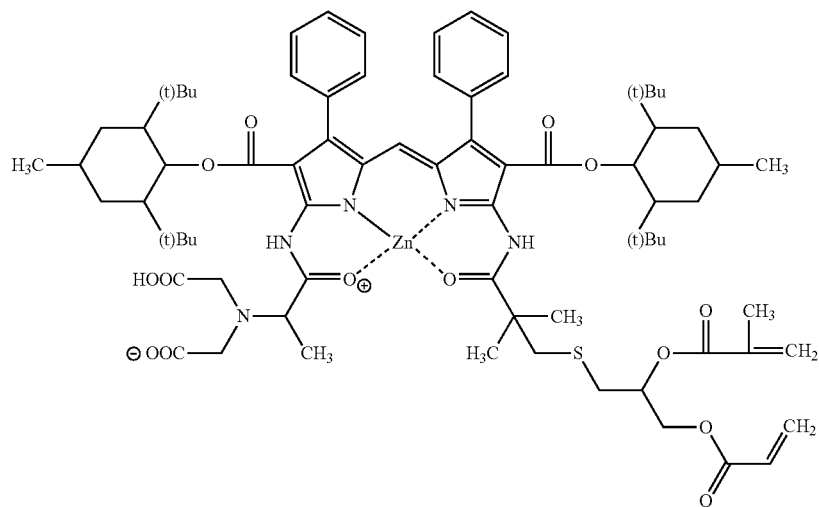
(a-22)
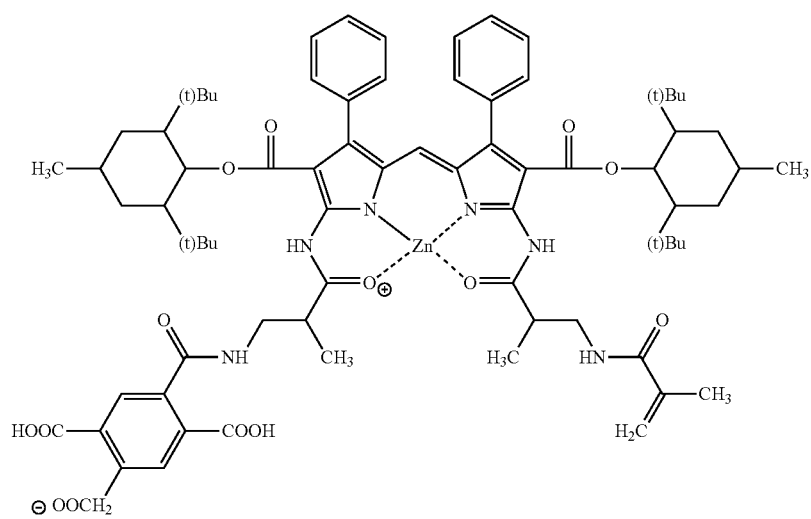
(a-23)
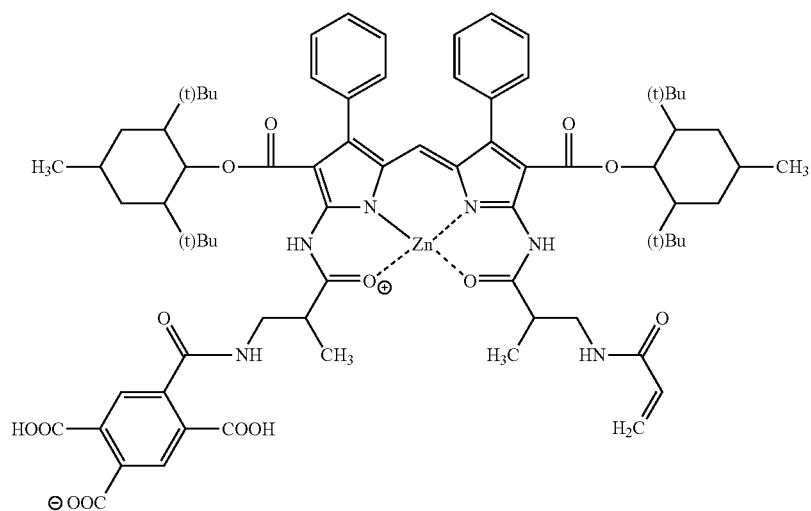
(a-24)

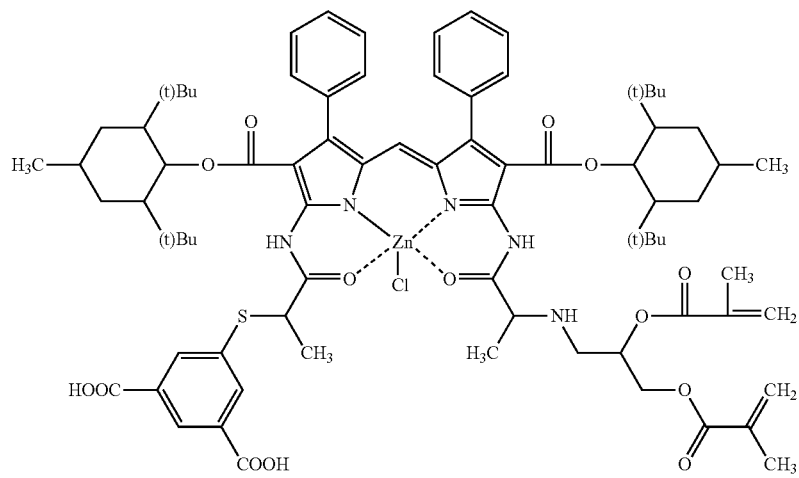
(a-25)
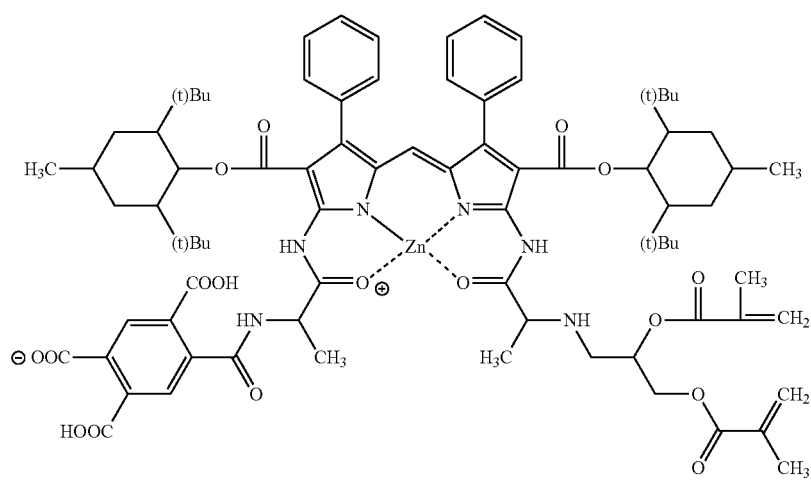
(a-26)
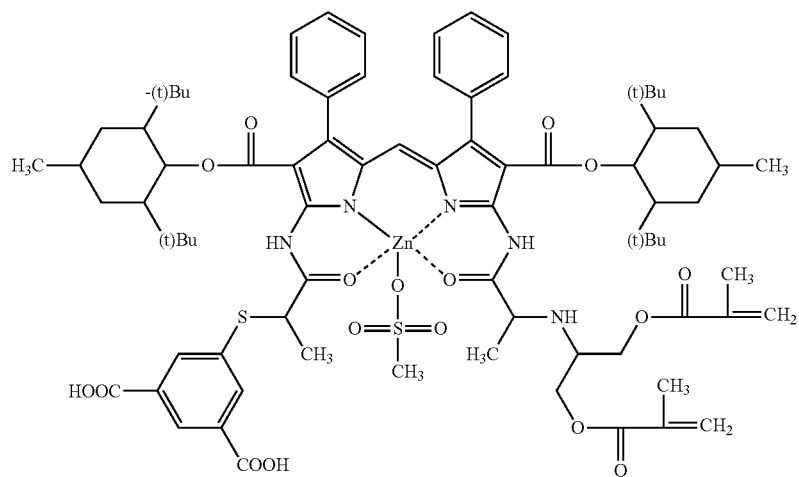
(a-27)

(a-28)
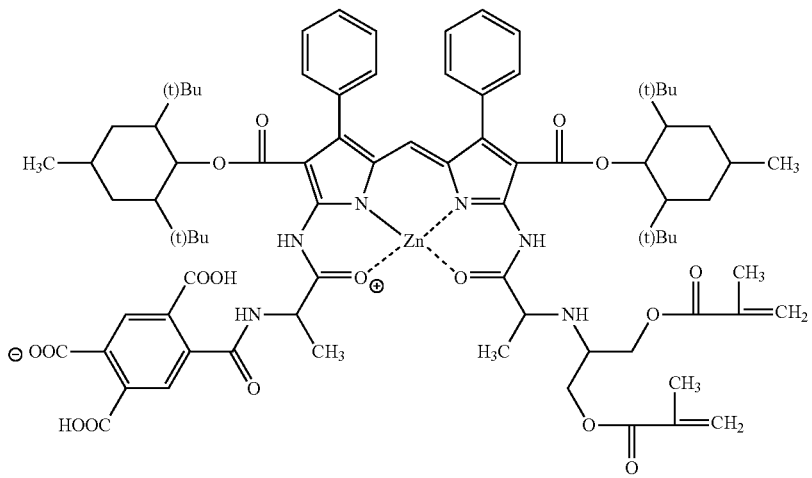
(a-29)
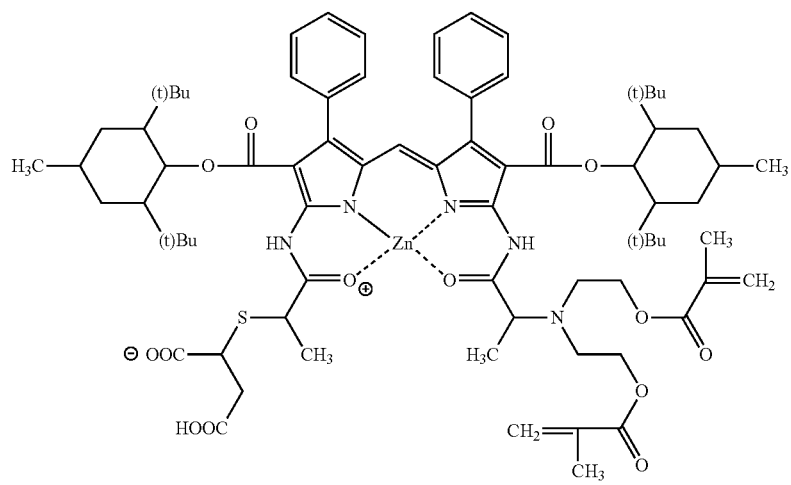
(a-30)
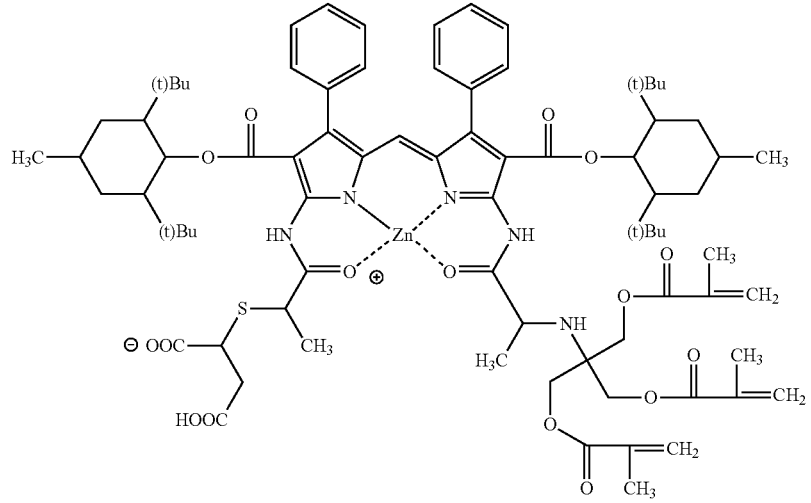

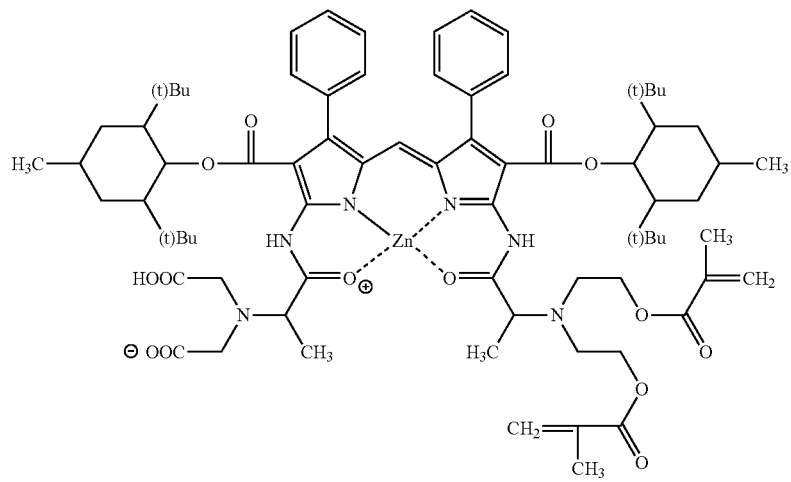
(a-31)
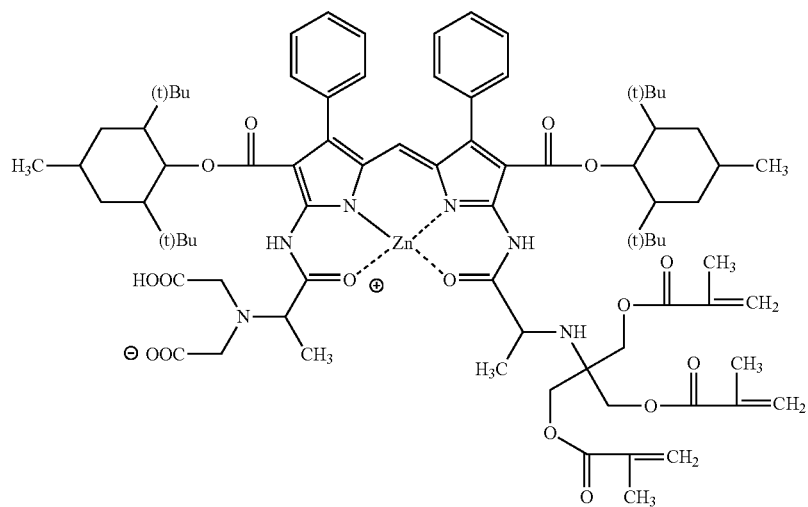
(a-32)
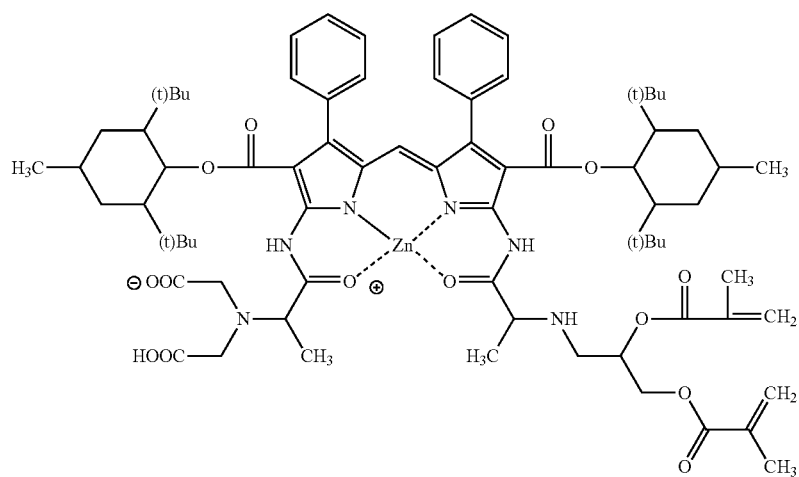
(a-33)

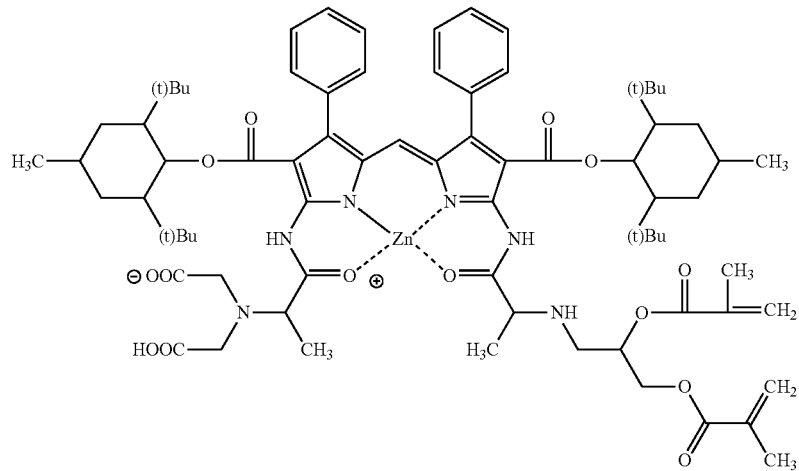
(a-34)
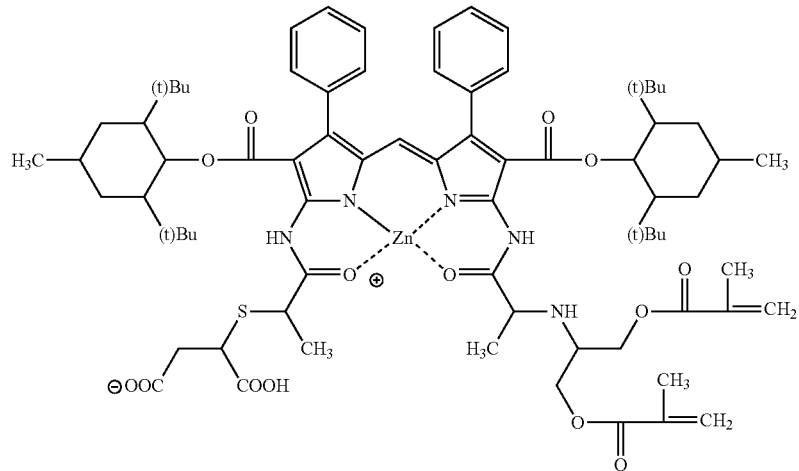
(a-35)
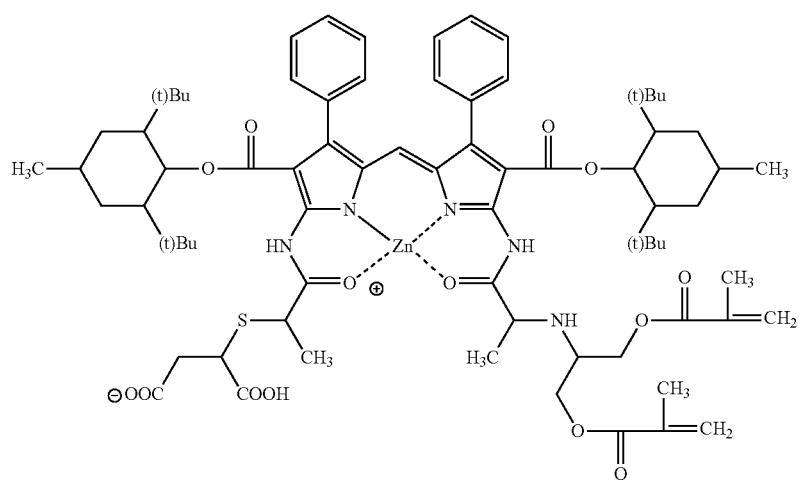
(a-36)

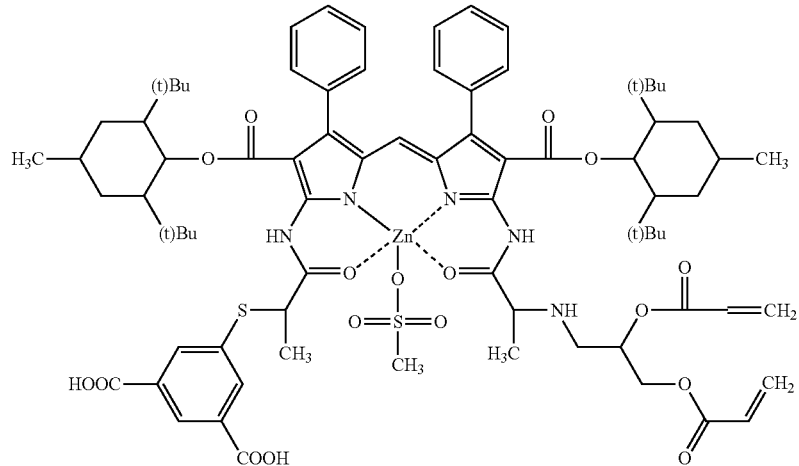
(a-37)
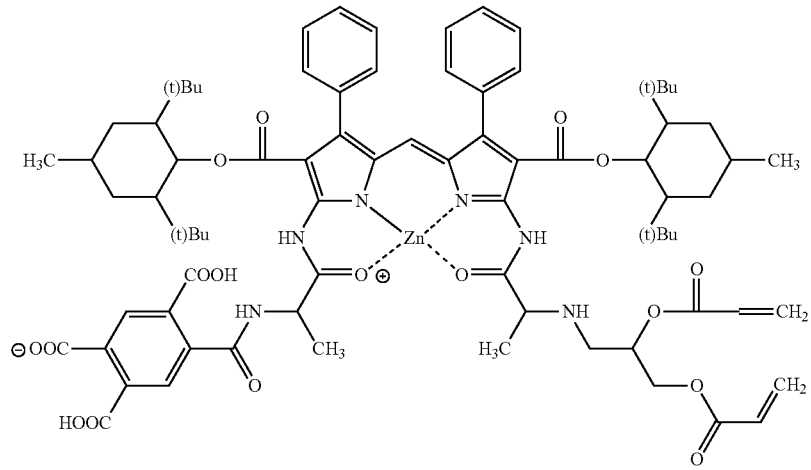
(a-38)
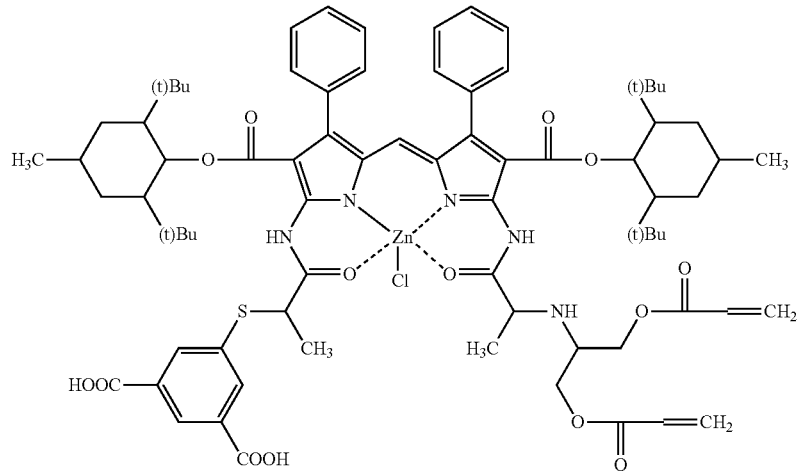
(a-39)

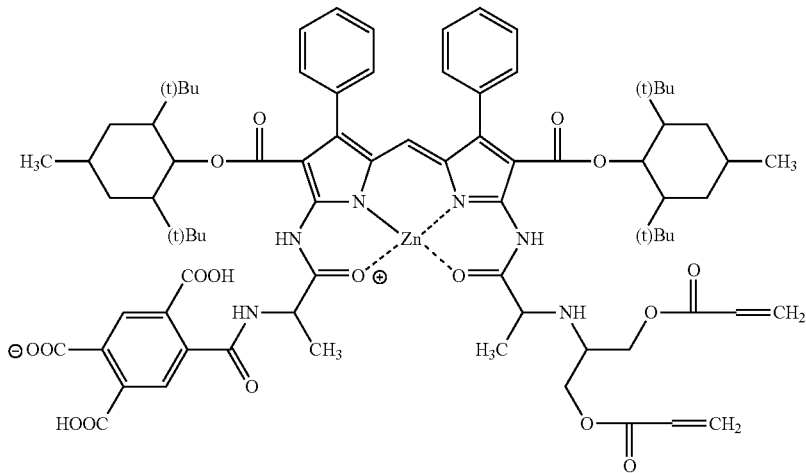
(a-40)
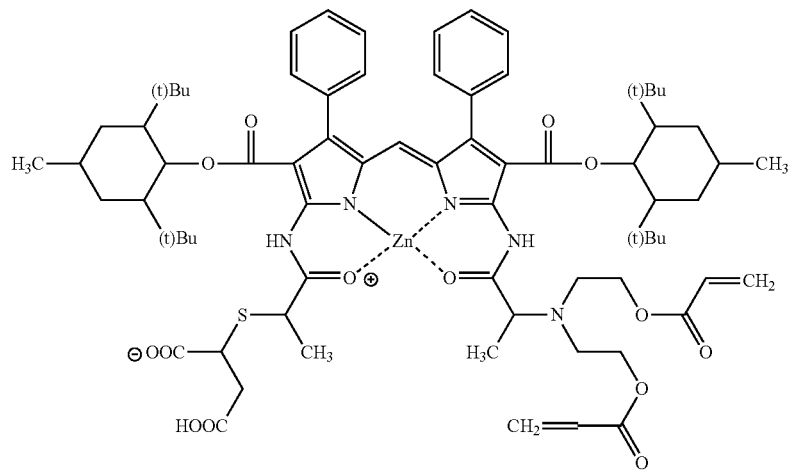
(a-41)
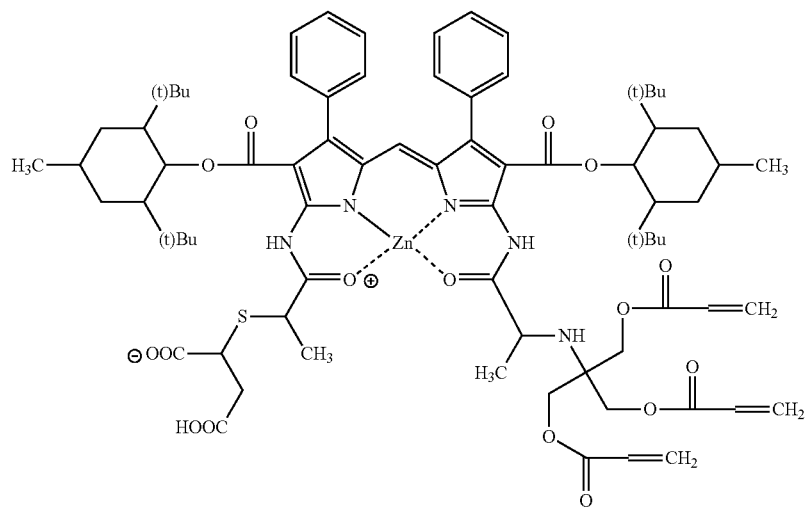
(a-42)

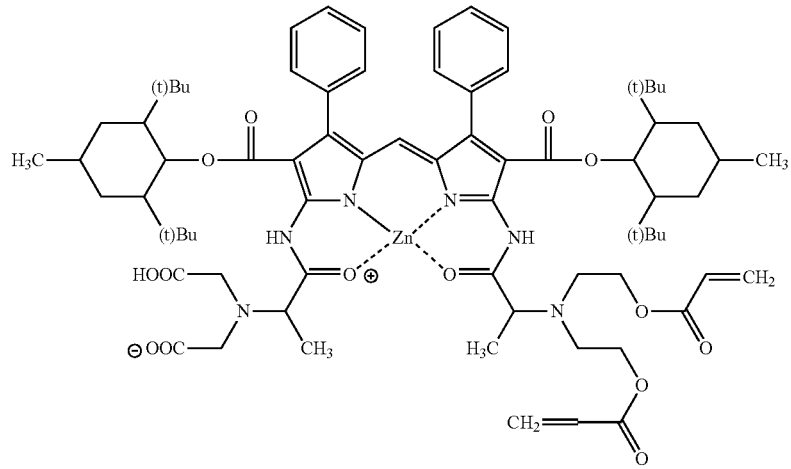
(a-43)
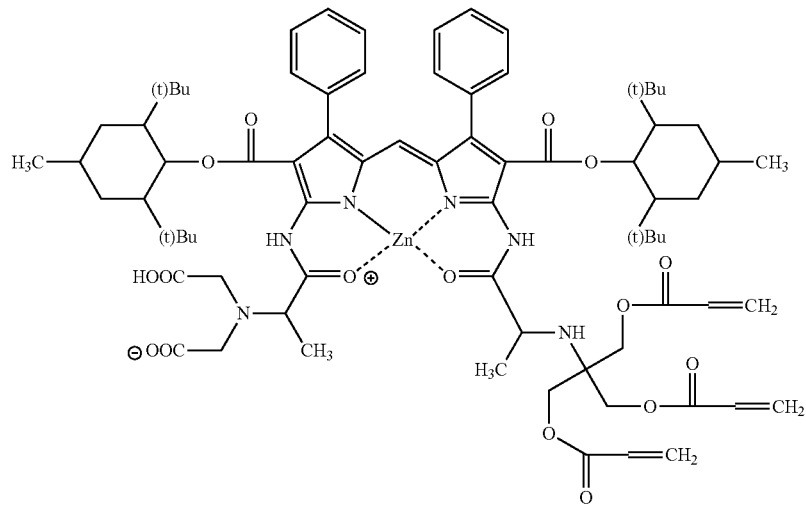
(a-44)
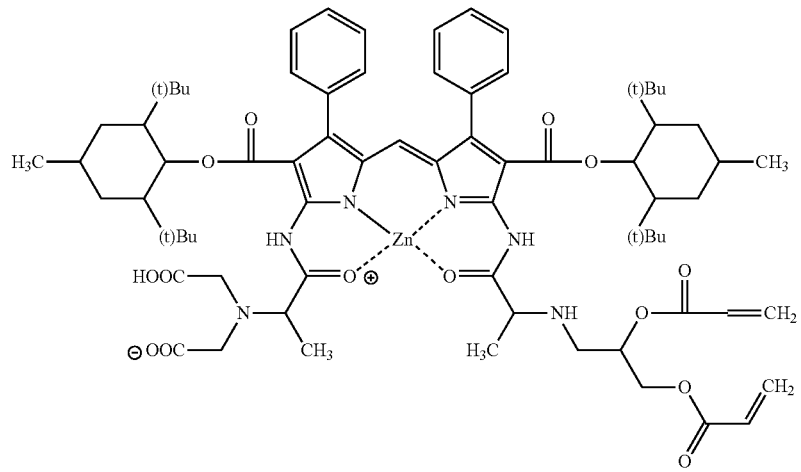
(a-45)

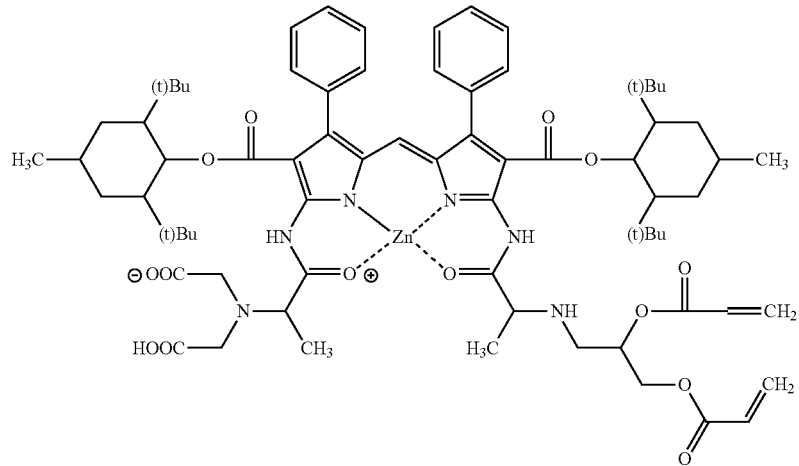
(a-46)
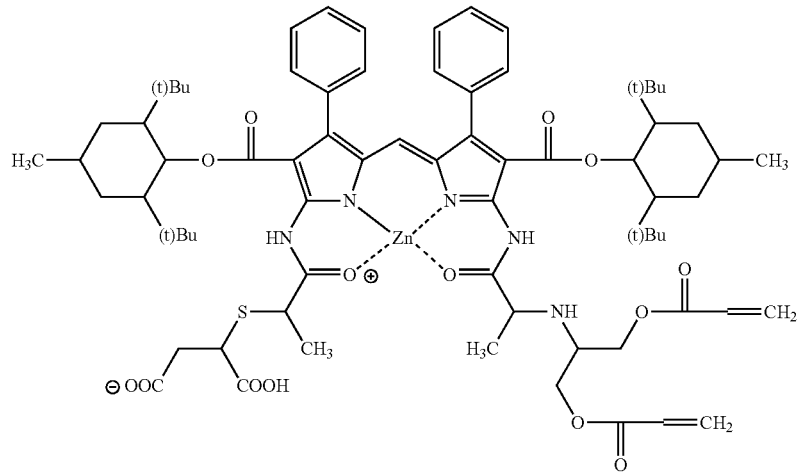
(a-47)
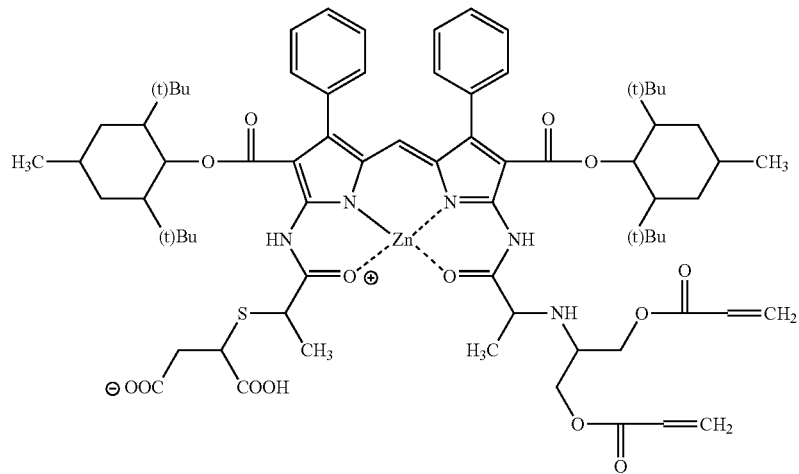
(a-48)

(b-1)
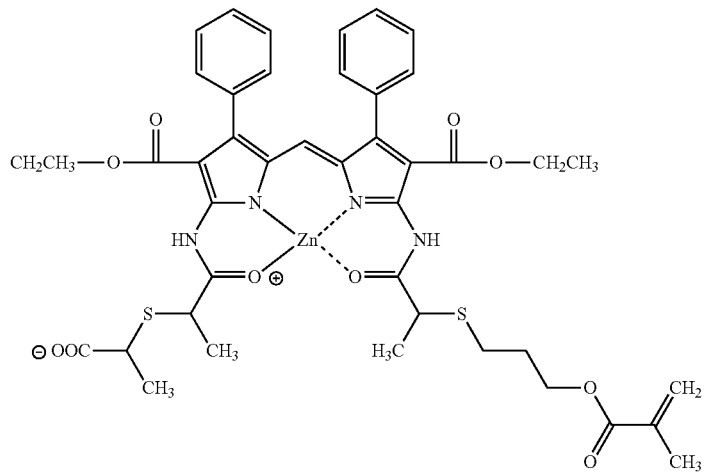
(b-2)
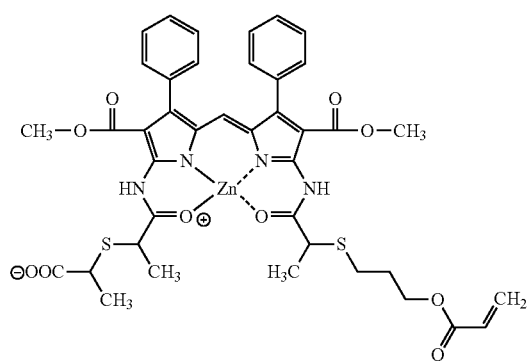
(b-3)
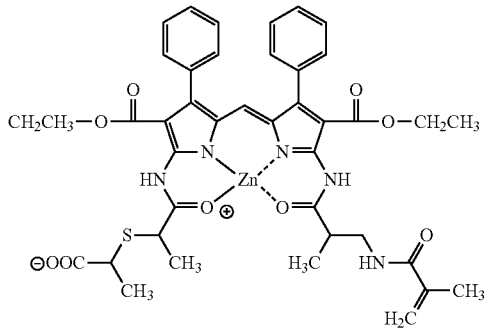
(b-4)
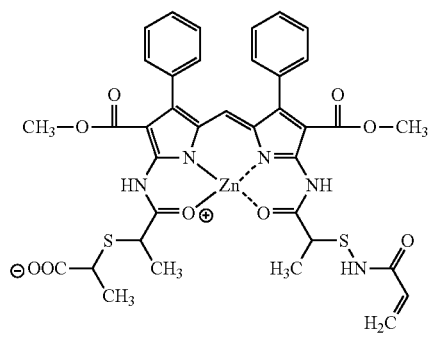
(b-5)
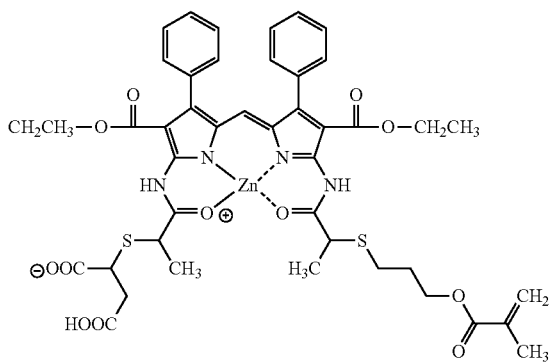

117 118
-continued
(b-6)
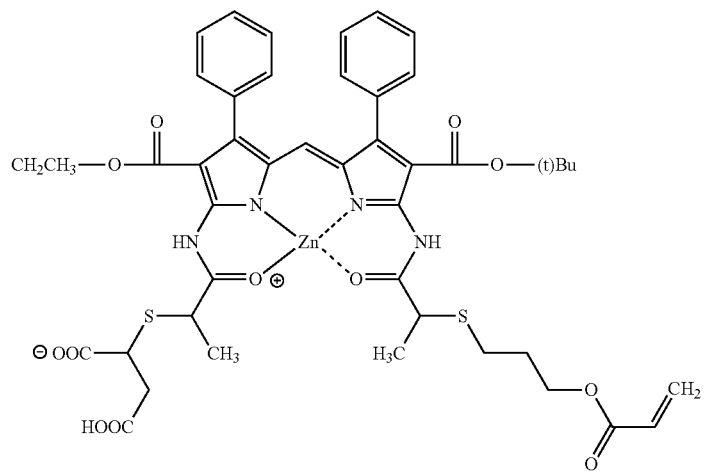
(b-7)
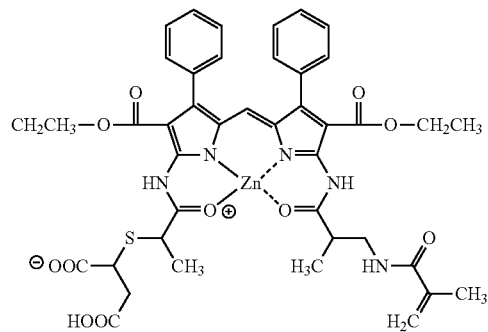
(b-8)
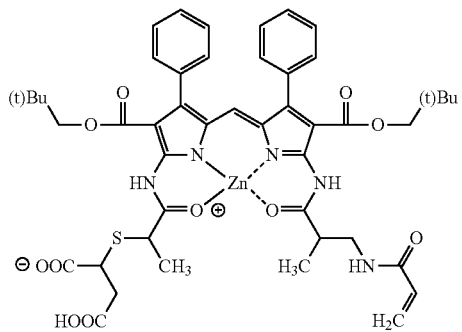
(b-9)
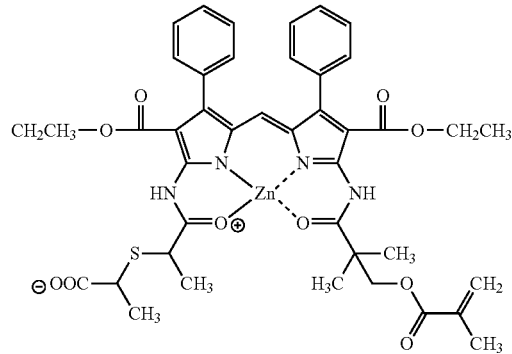
(b-10)
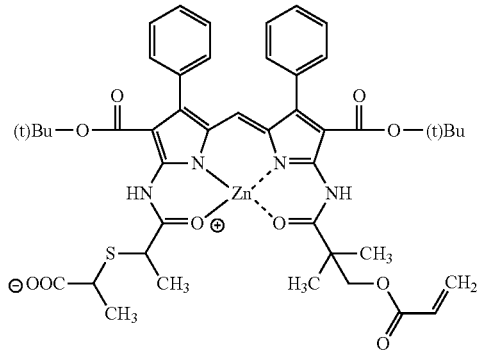
(b-11)
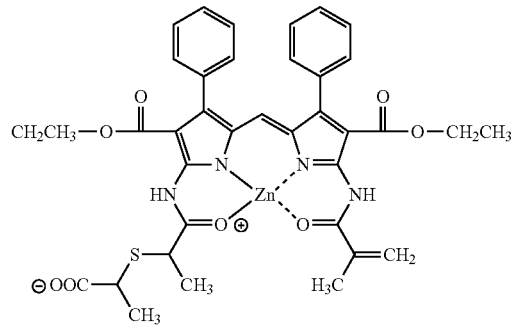
(b-12)
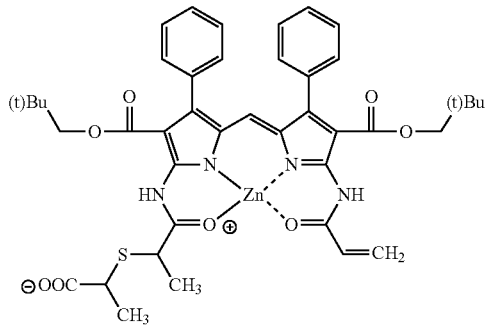

(b-13)
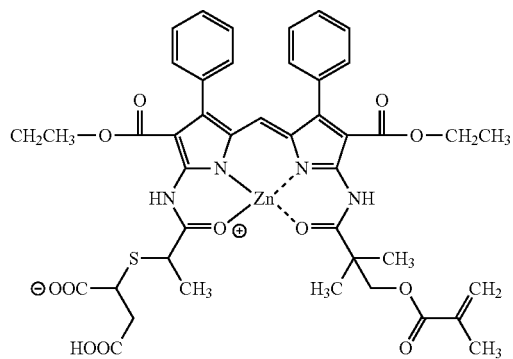
(b-14)
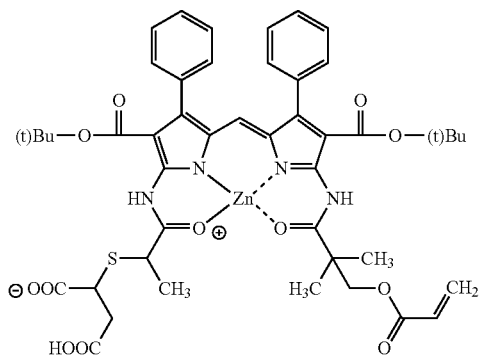
(b-15)
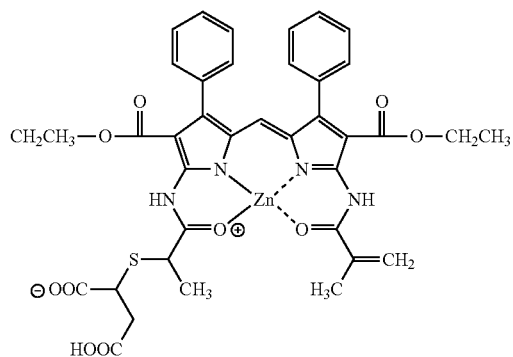
(b-16)
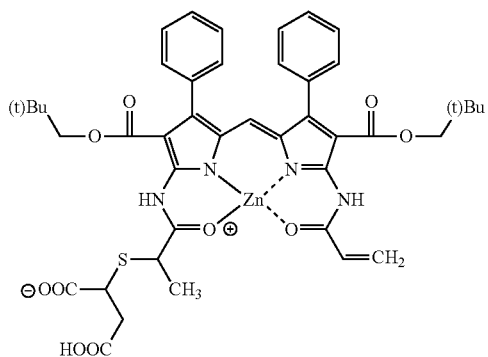
(b-17)
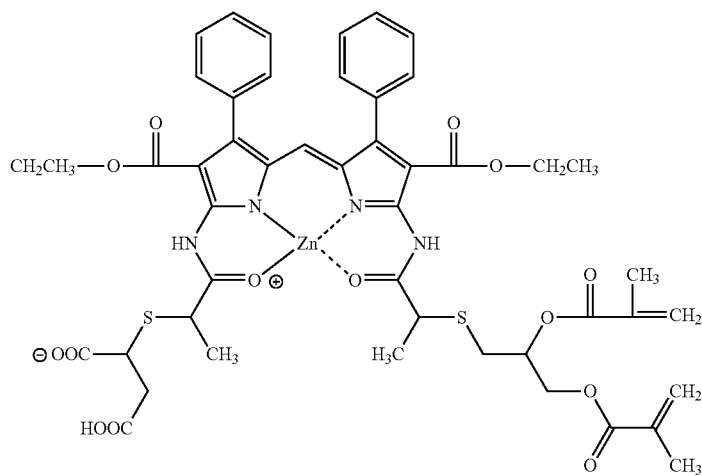

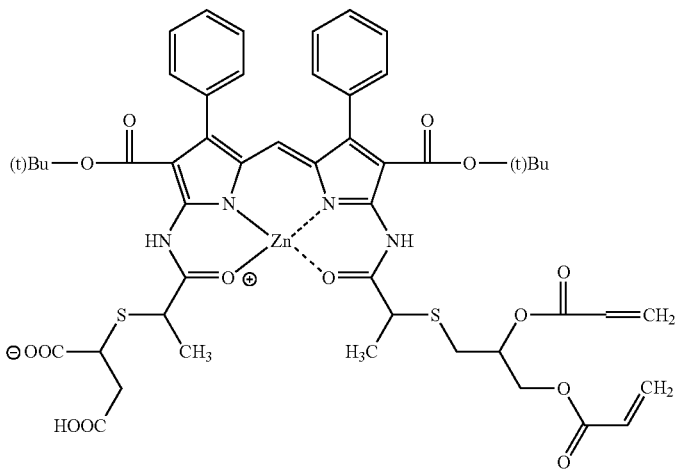
(b-18)
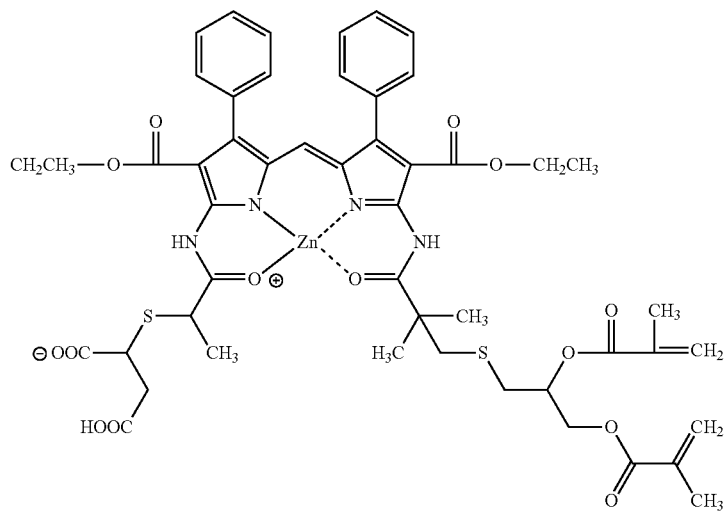
(b-19)
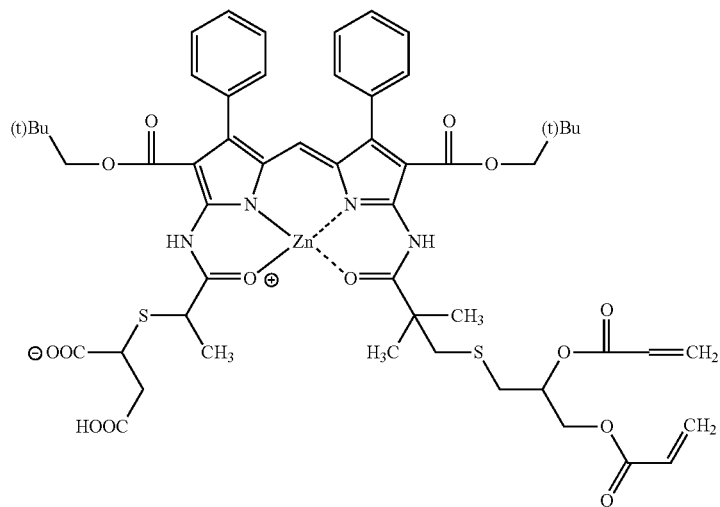
(b-20)

(b-21)
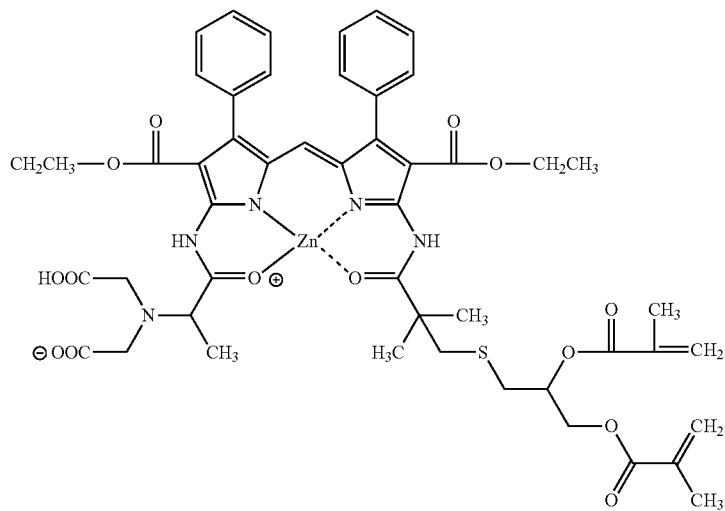
(b-22)
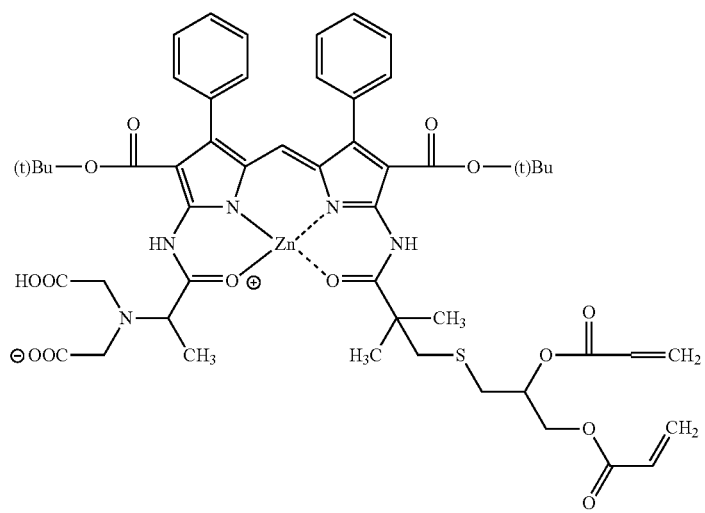
(b-23)
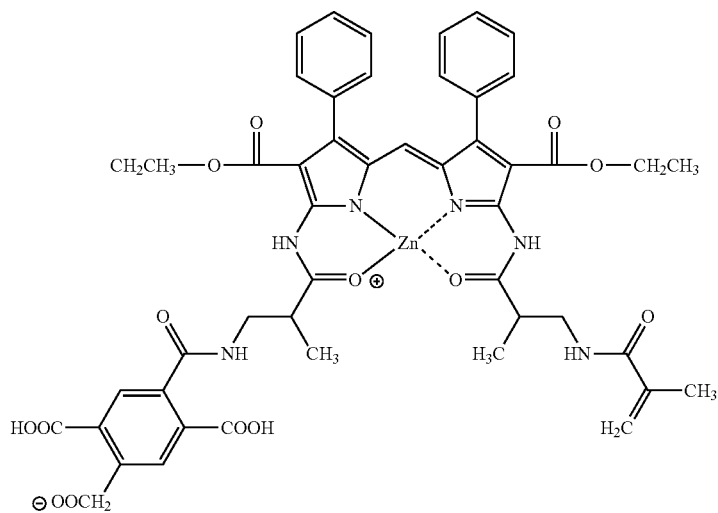

(b-24)
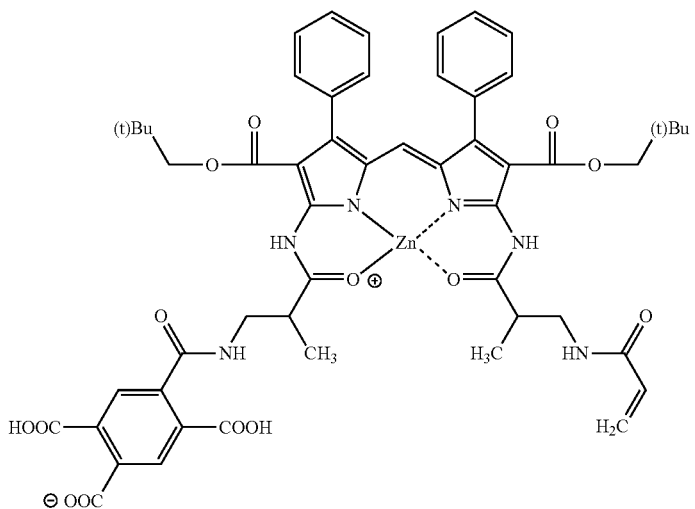
(b-25)
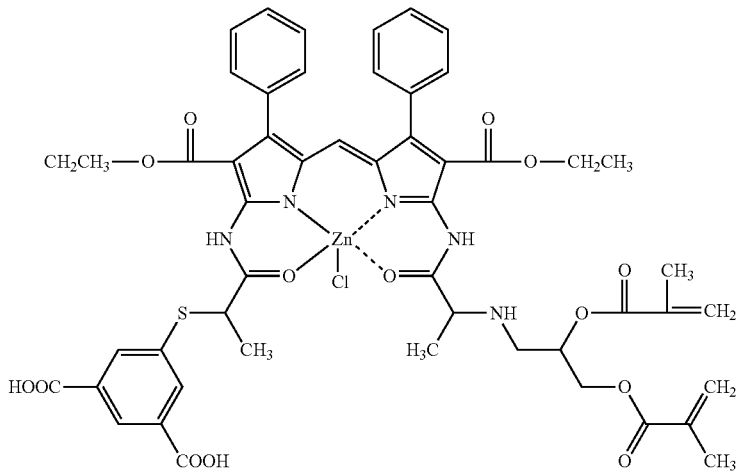
(b-26)
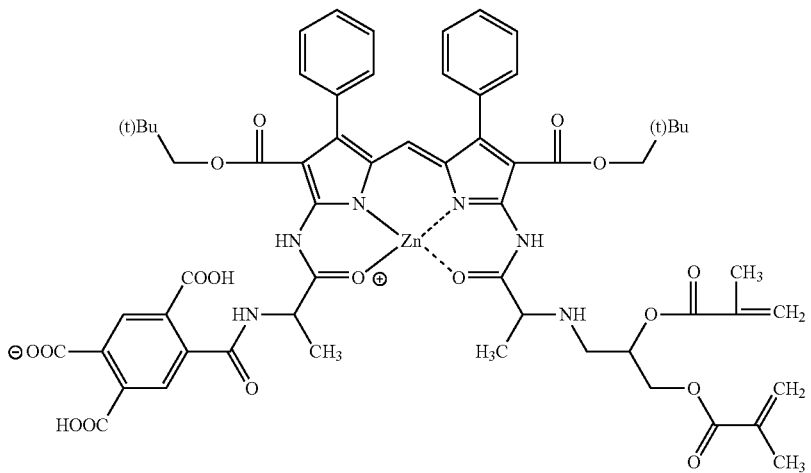

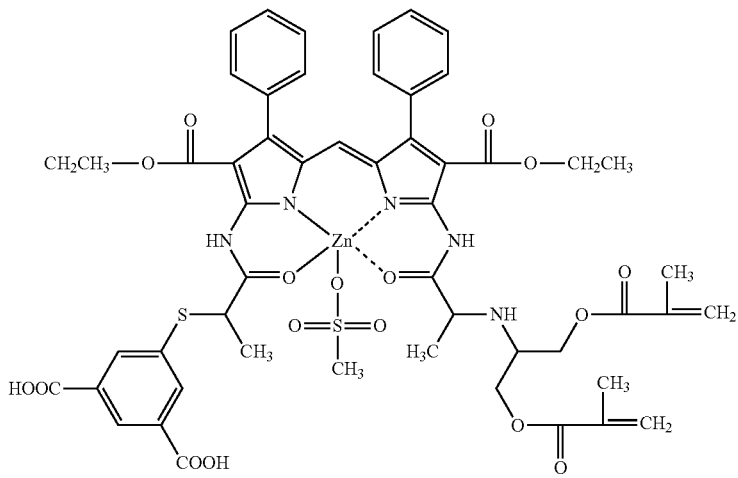
(b-27)
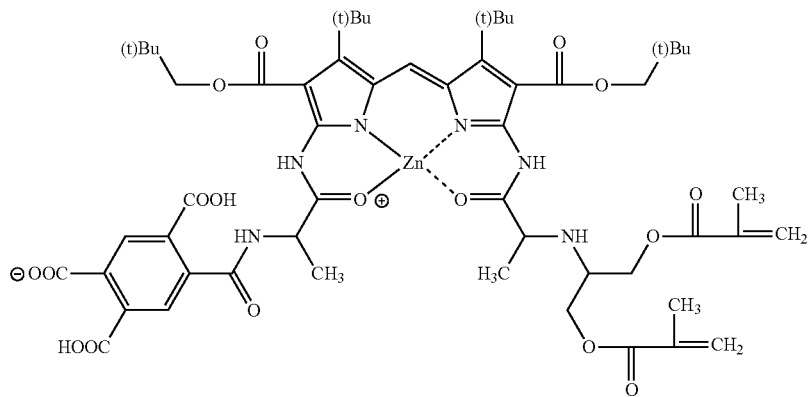
(b-28)
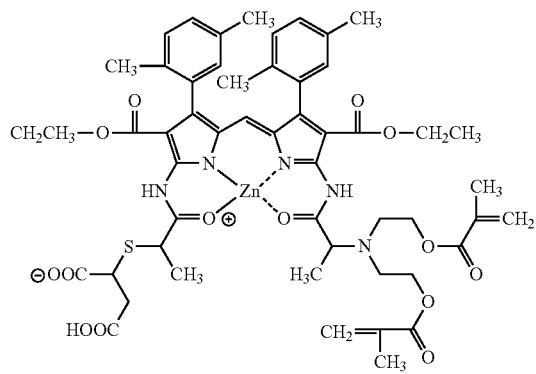
(b-29)
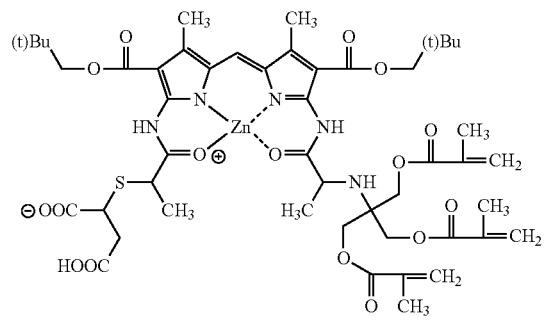
(b-30)

-continued
(b-31)
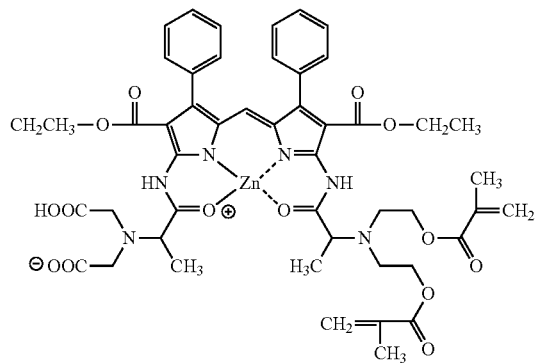
(b-32)
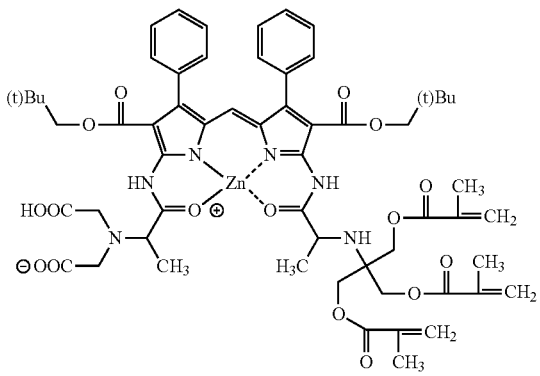
(b-33)
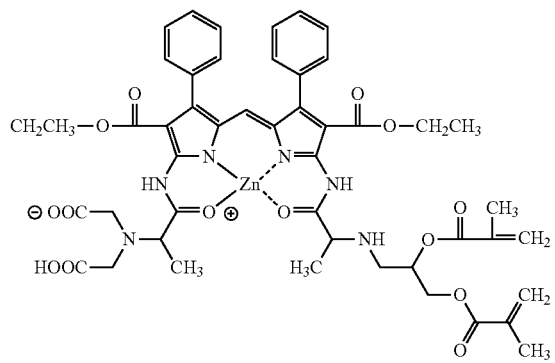
(b-34)
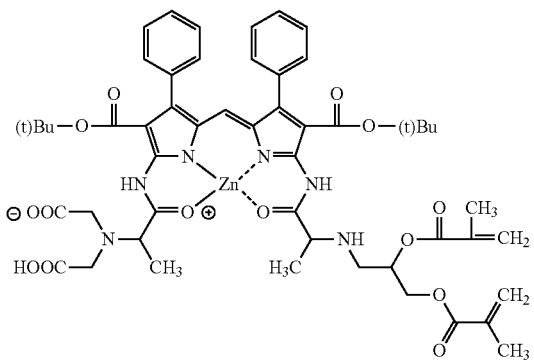
(b-35)
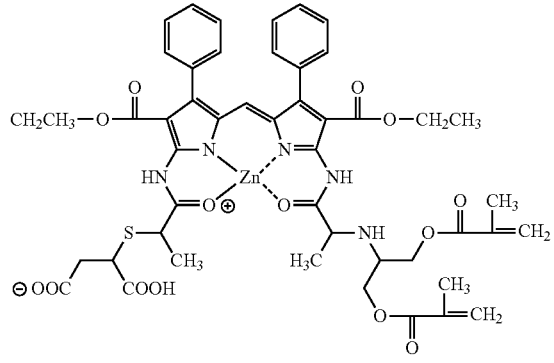
(b-36)
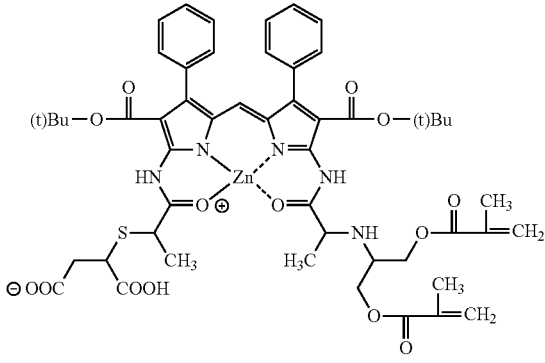
(b-37)
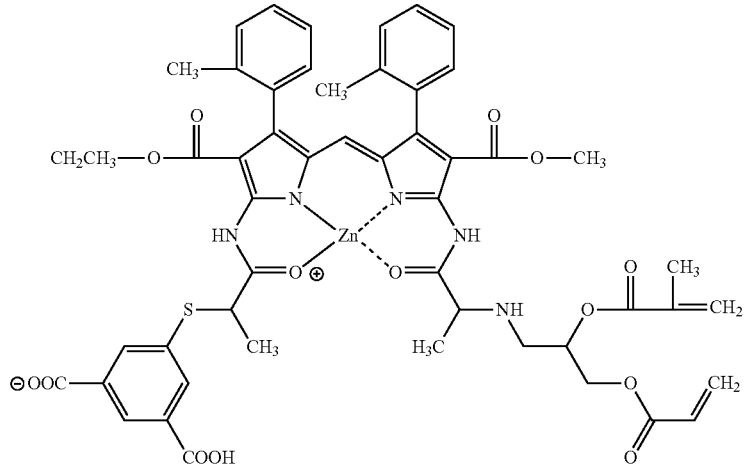

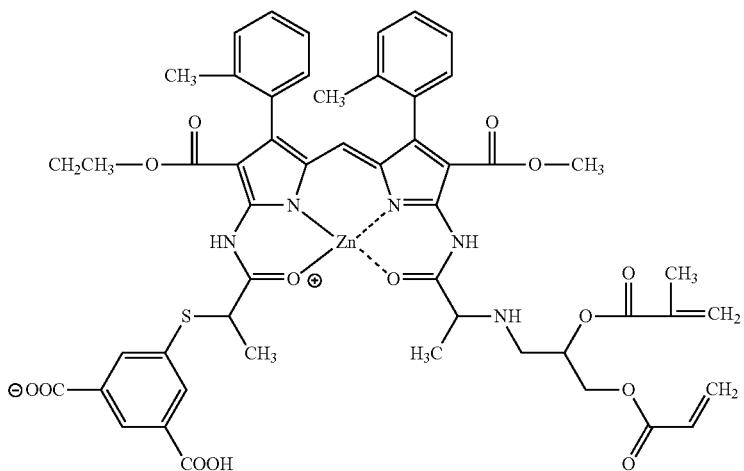
(b-37)
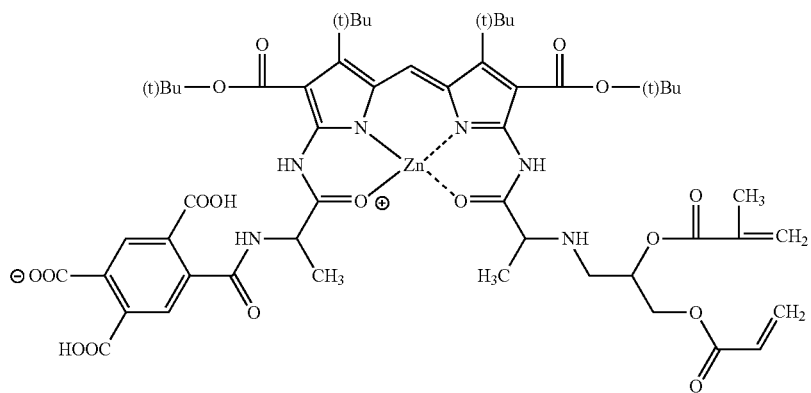
(b-38)
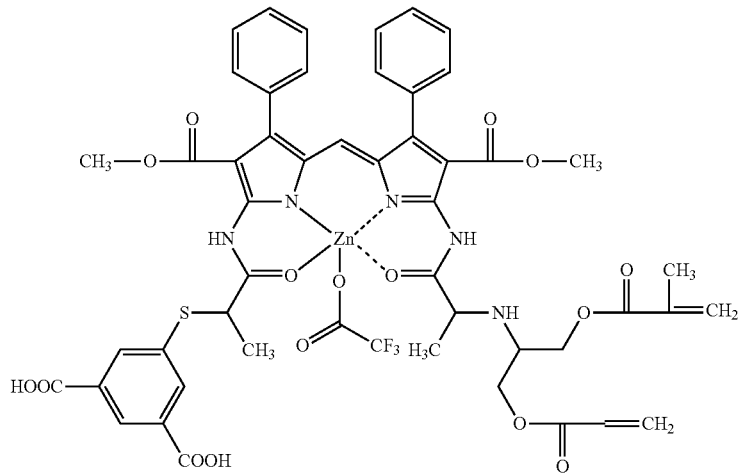
(b-39)

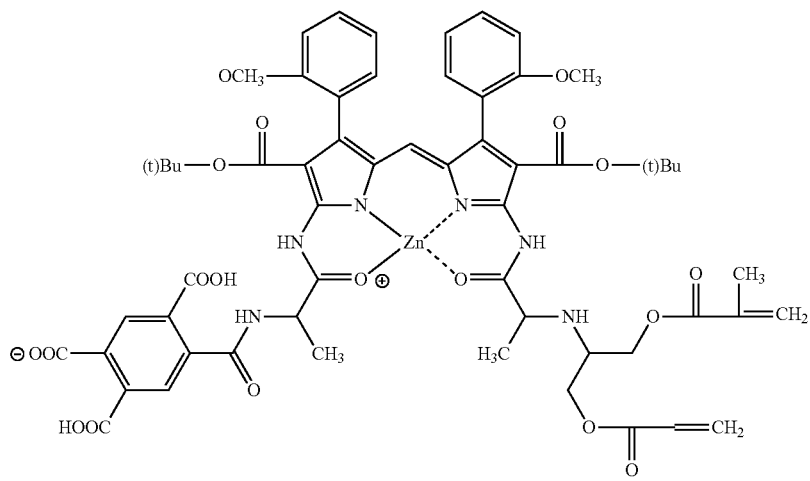
(b-40)
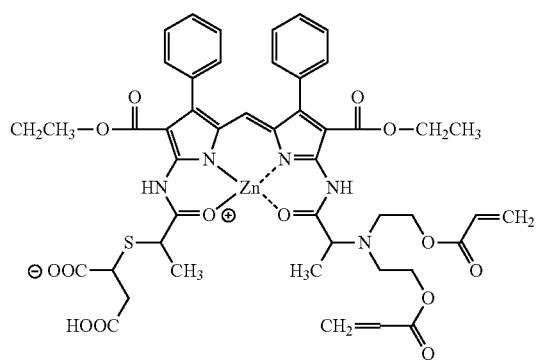
(b-41)
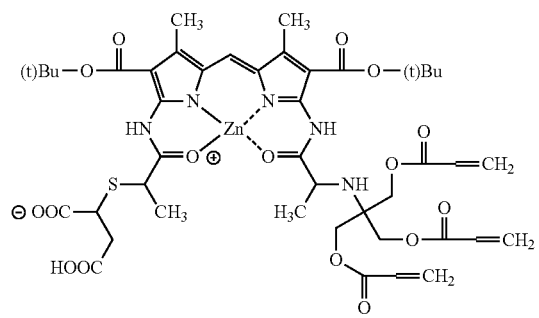
(b-42)
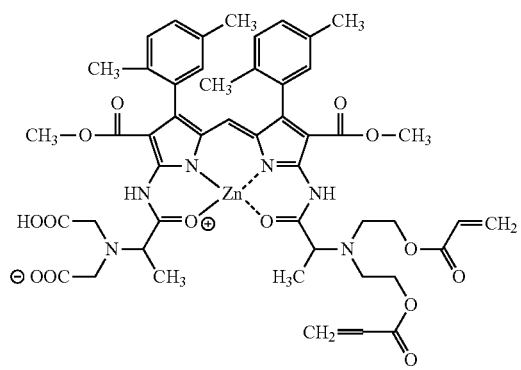
(b-43)
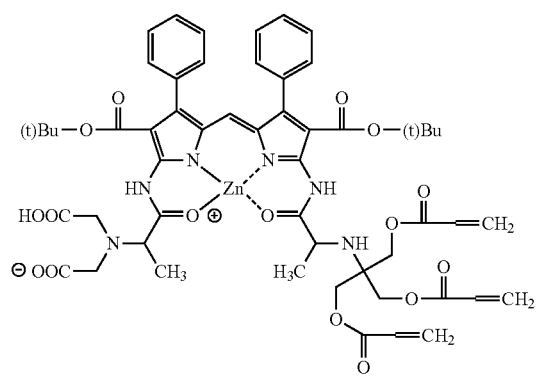
(b-44)
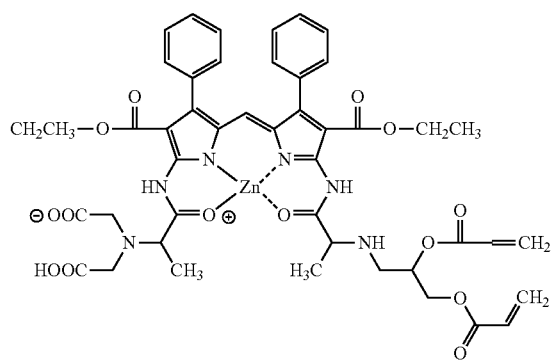
(b-45)
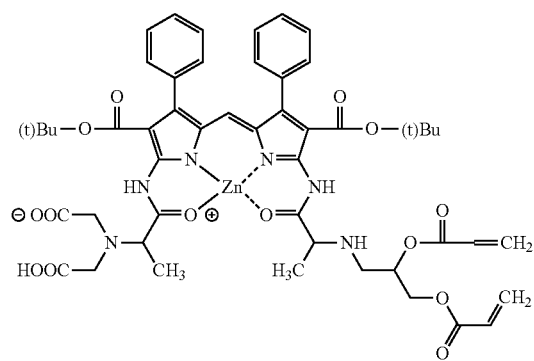
(b-46)

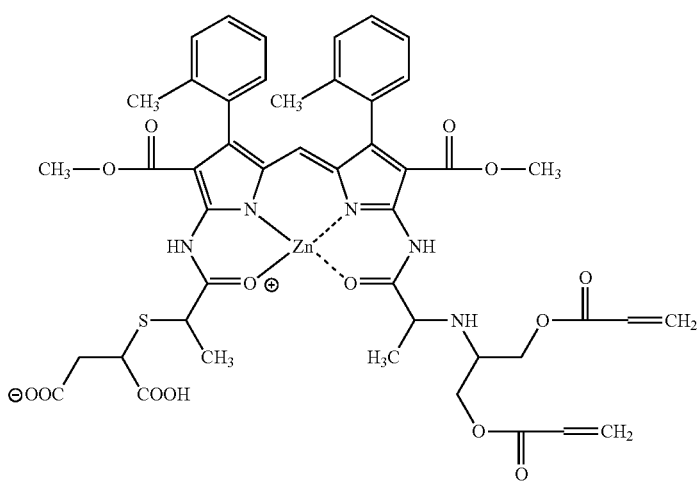
(b-47)
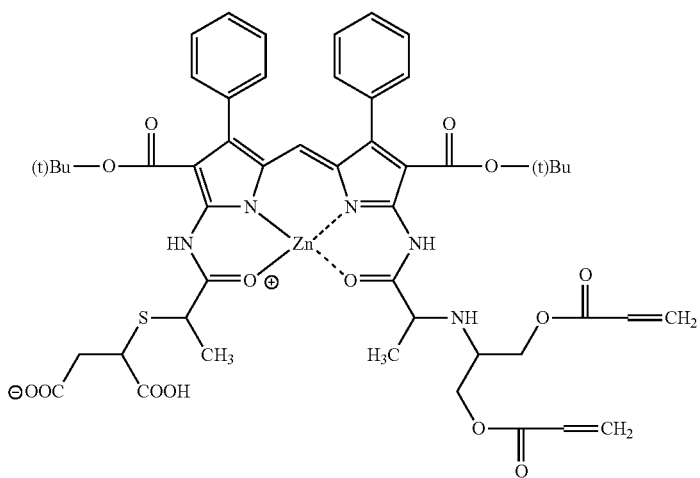
(b-48)
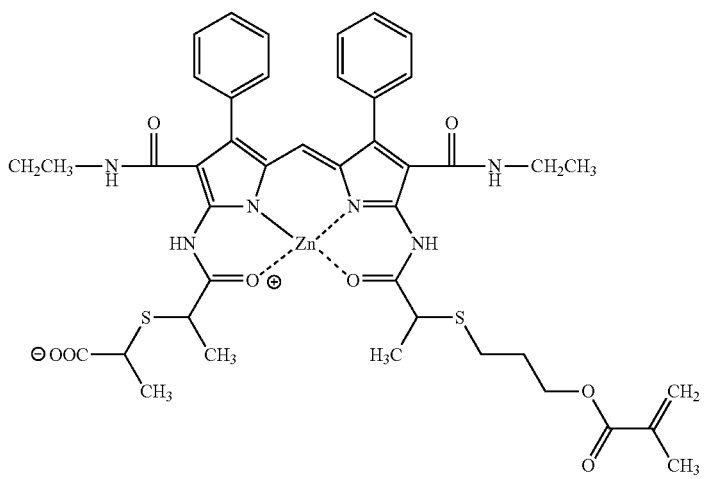
(c-1)

-continued
(c-2)
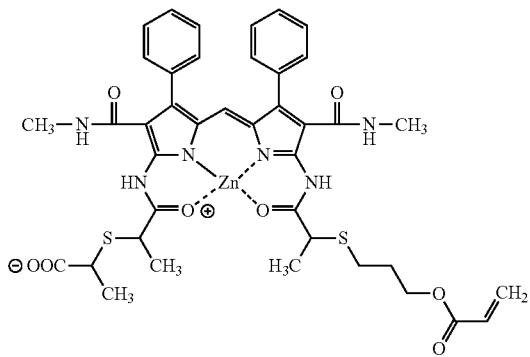
(c-3)
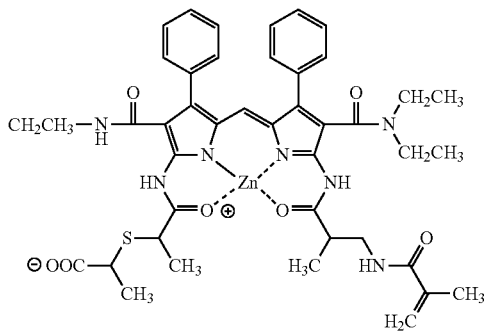
(c-4)
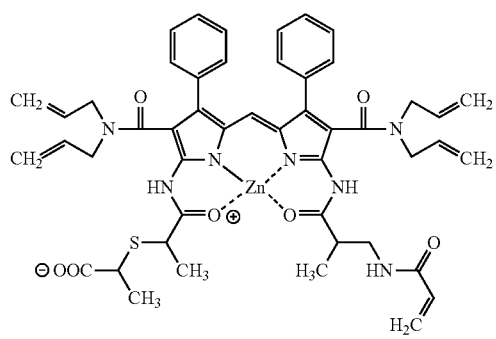
(c-5)
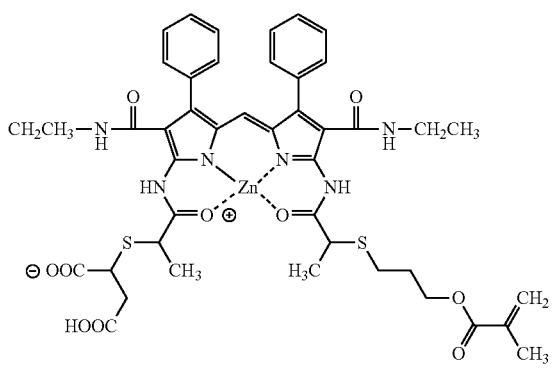
(c-6)
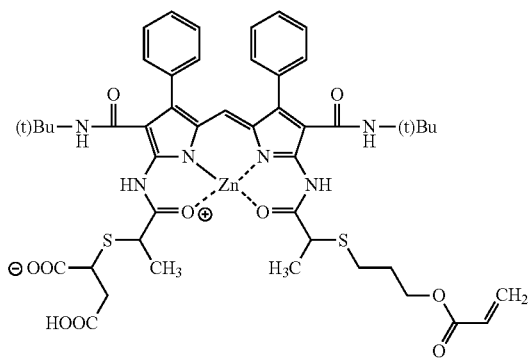
(c-7)
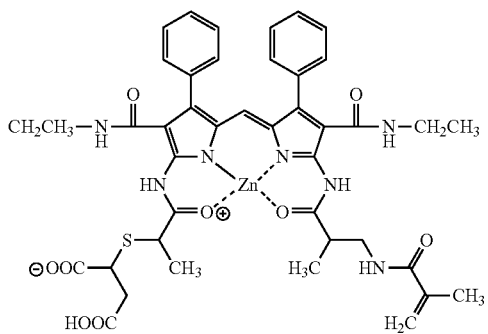
(c-8)
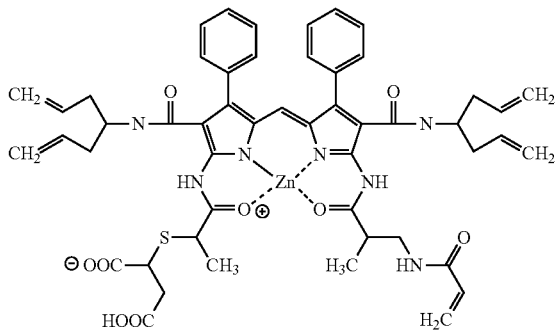
(c-9)
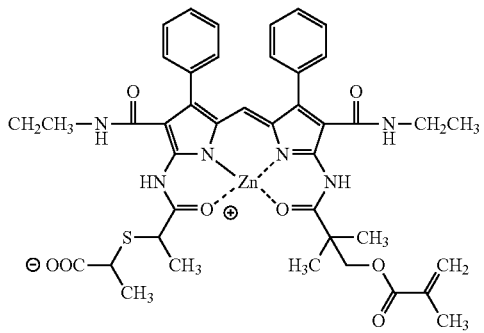

-continued
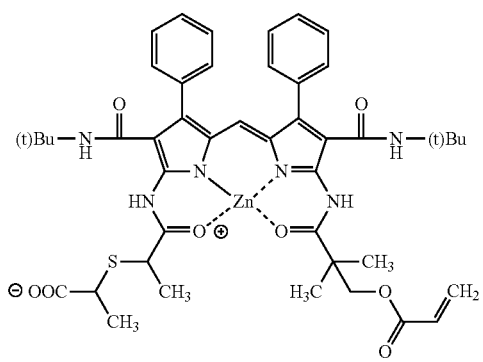
(c-10)
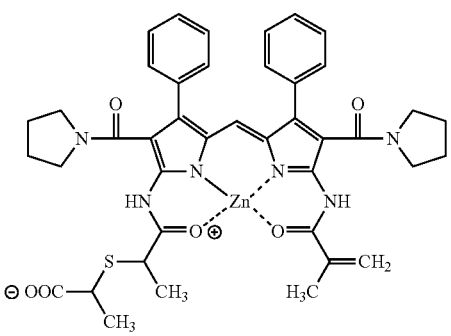
(c-11)
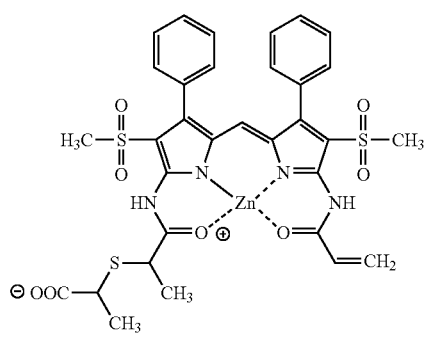
(c-12)
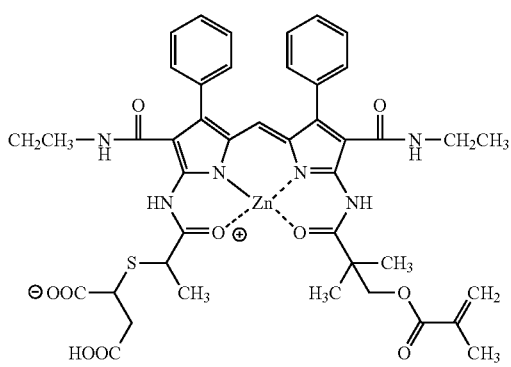
(c-13)
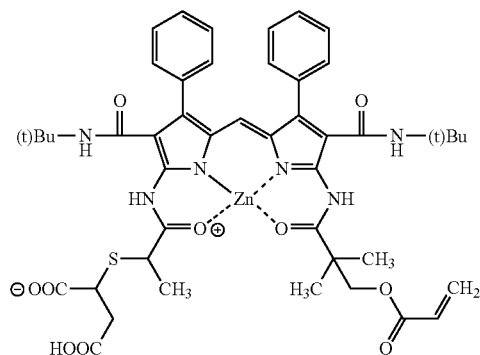
(c-14)
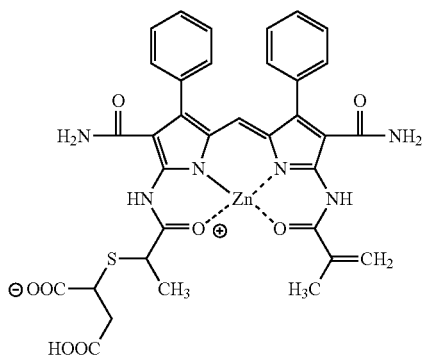
(c-15)
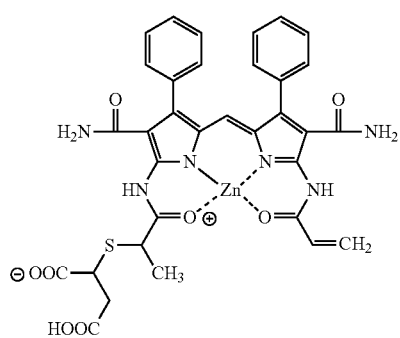
(c-16)
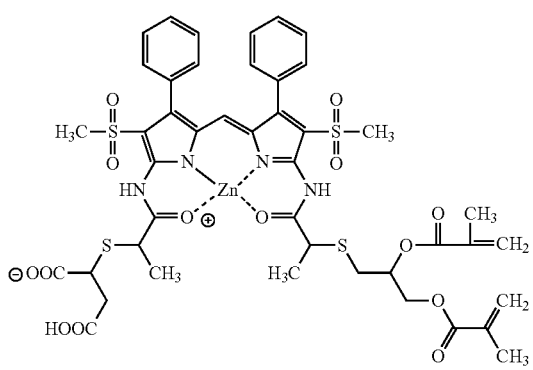
(c-17)

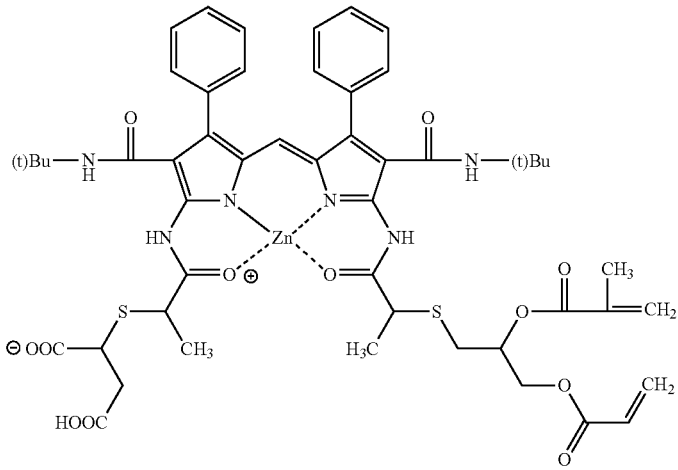
(c-18)
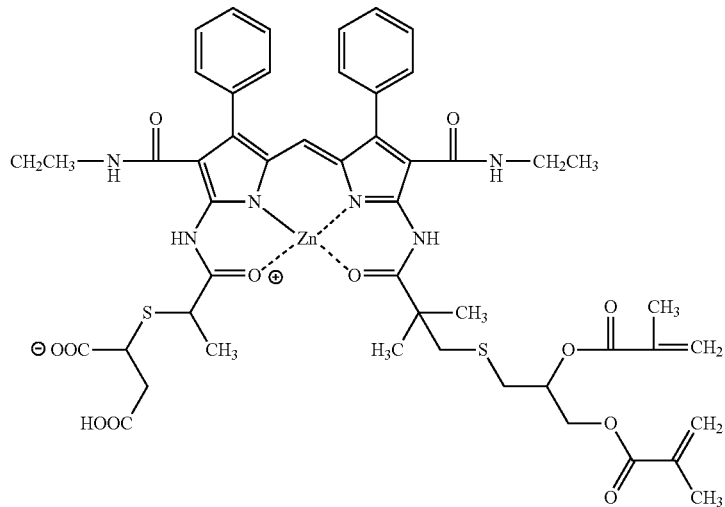
(c-19)
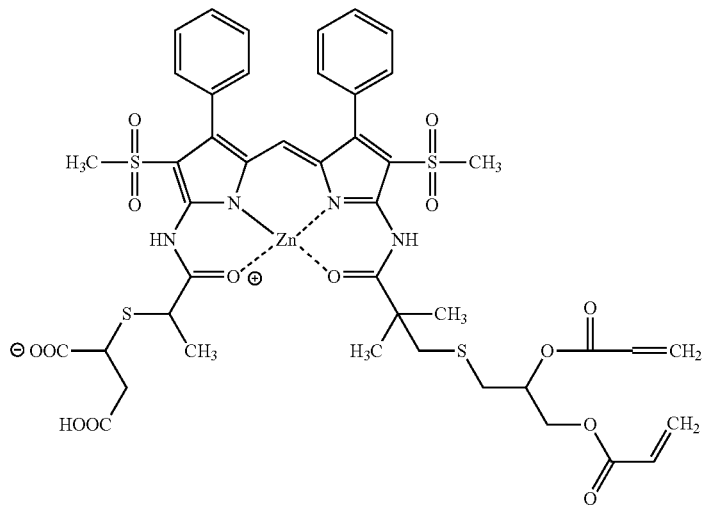
(c-20)

(c-21)
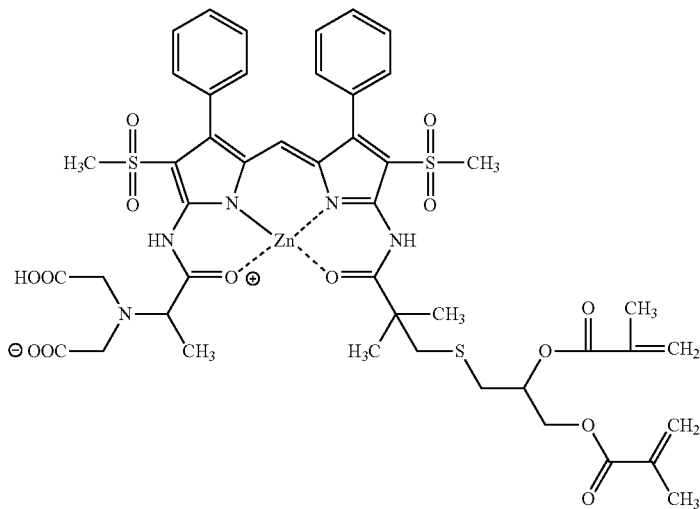
(c-22)
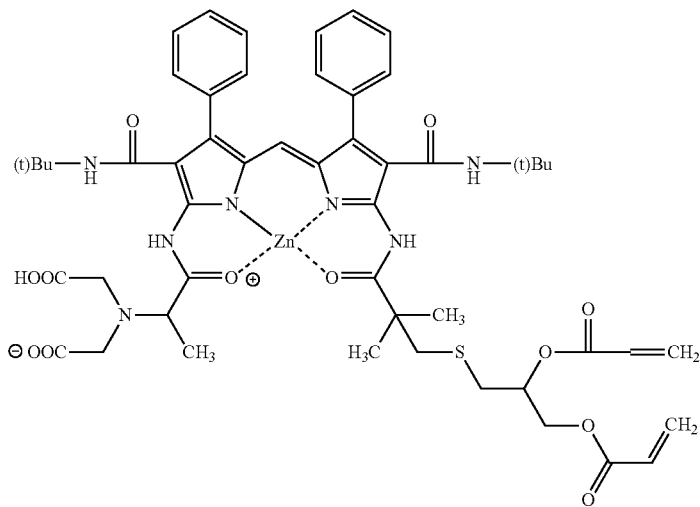
(c-23)
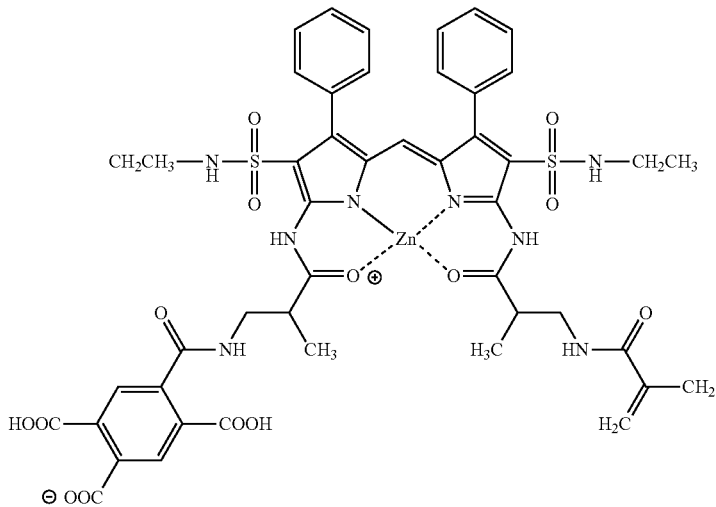

(c-24)
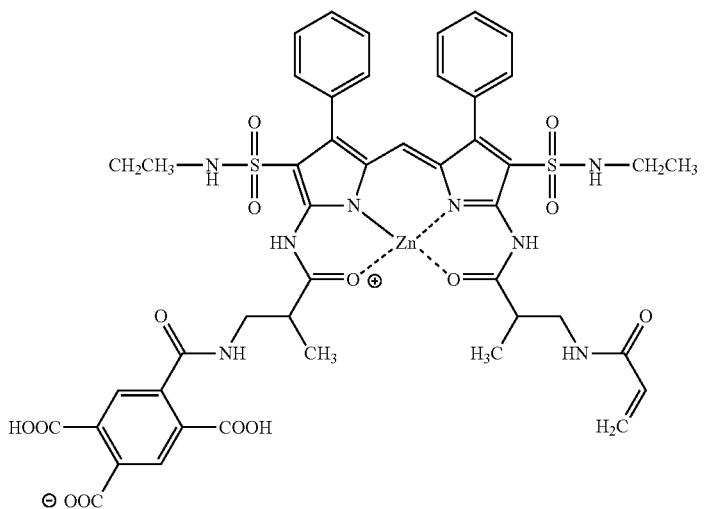
(c-25)
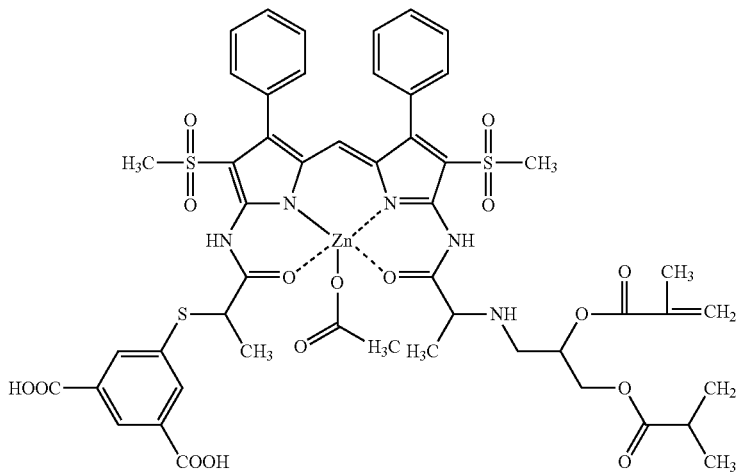
(c-26)
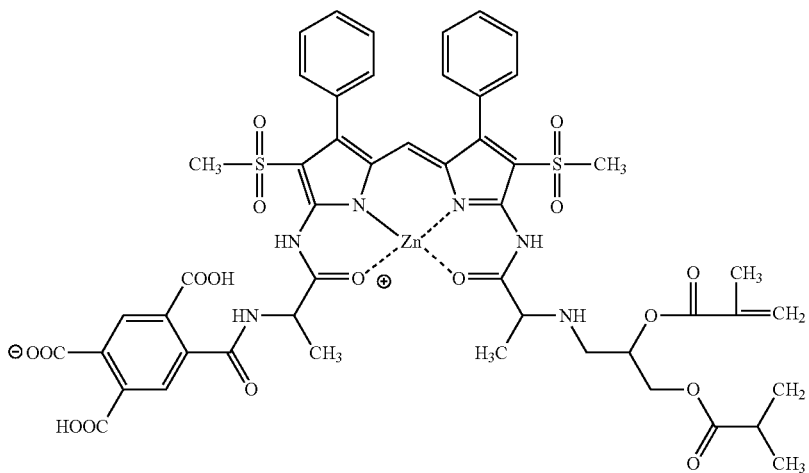

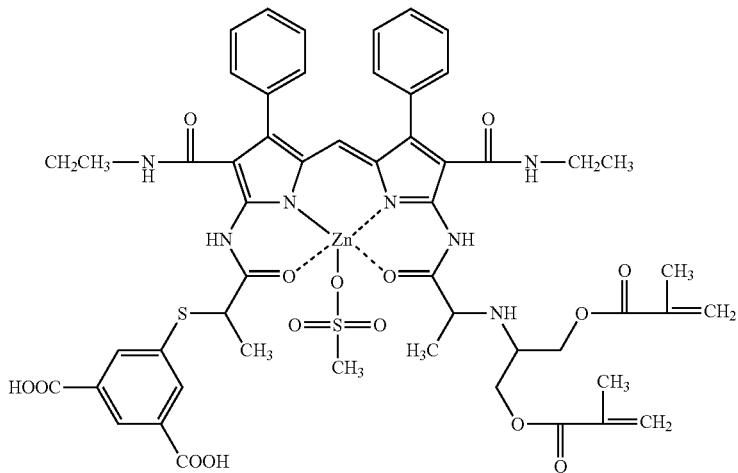
(c-27)
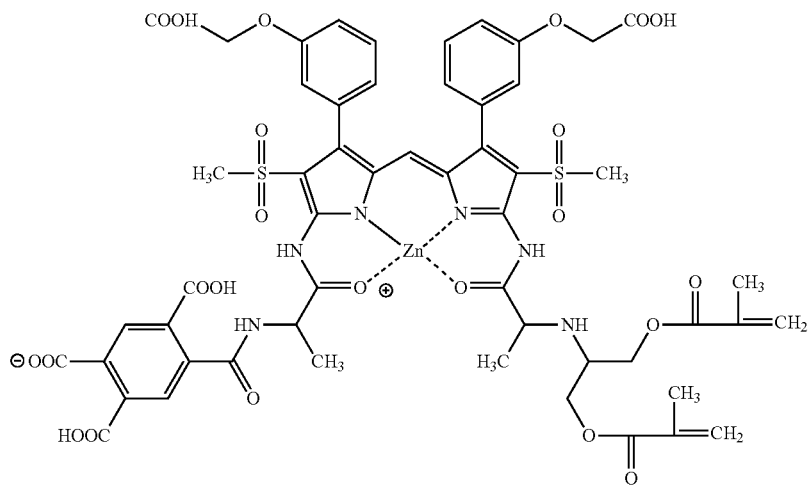
(c-28)
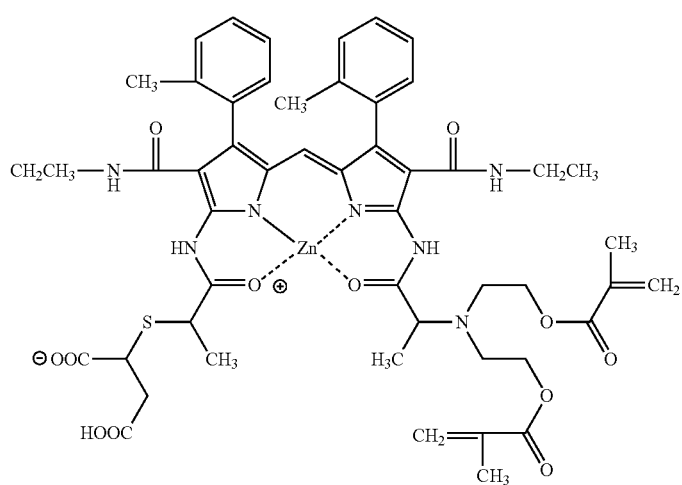
(c-29)

-continued
(c-30)
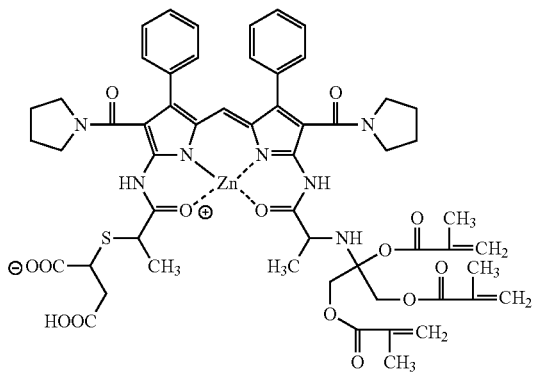
(c-31)
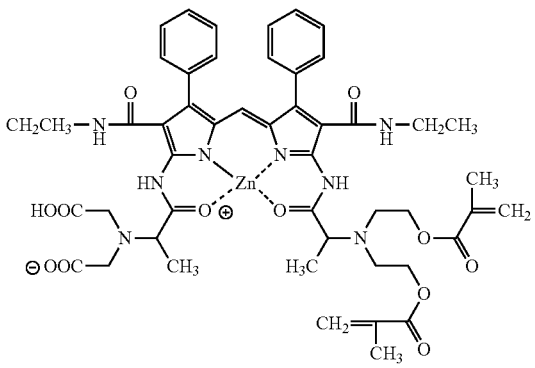
(c-32)
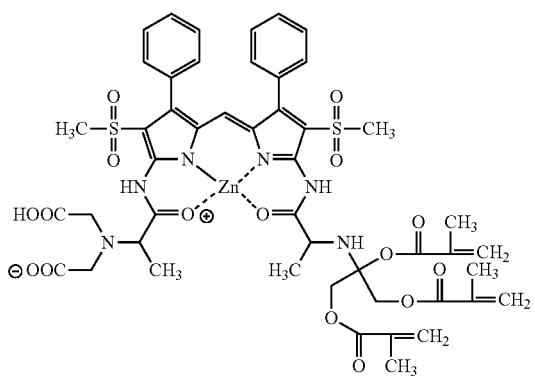
(c-33)
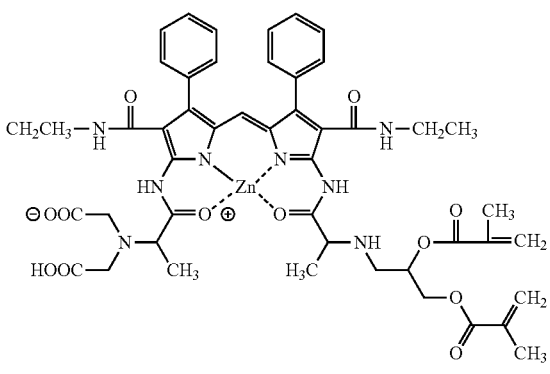
(c-34)
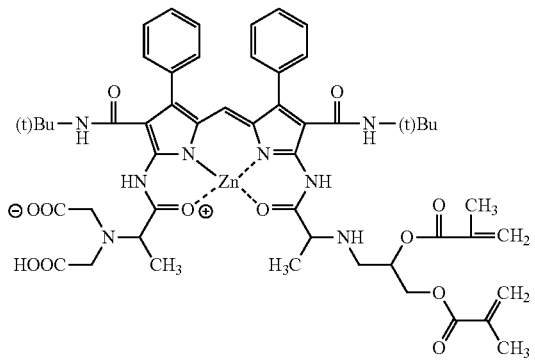
(c-35)
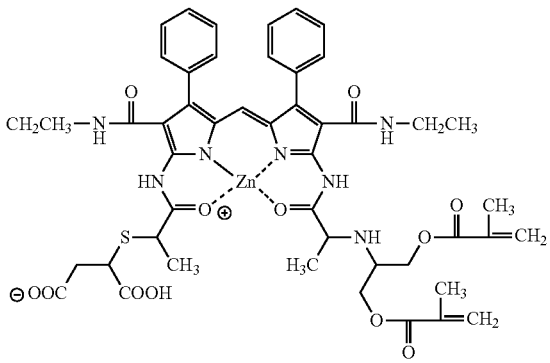
(c-36)
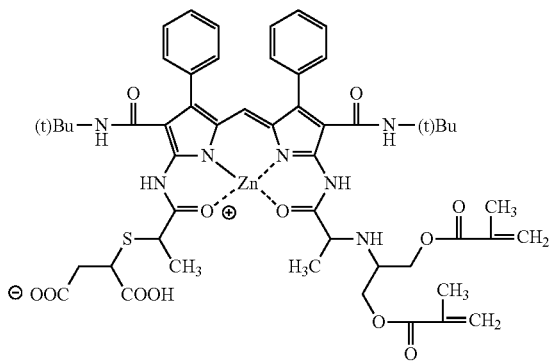
(c-37)
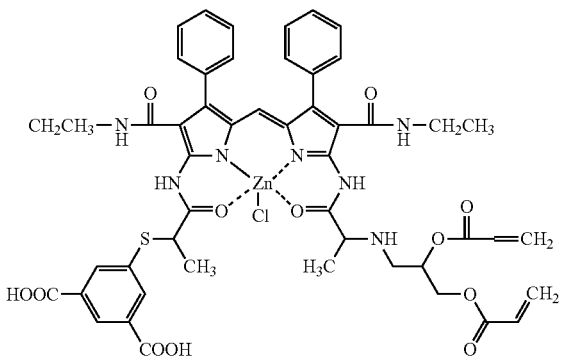

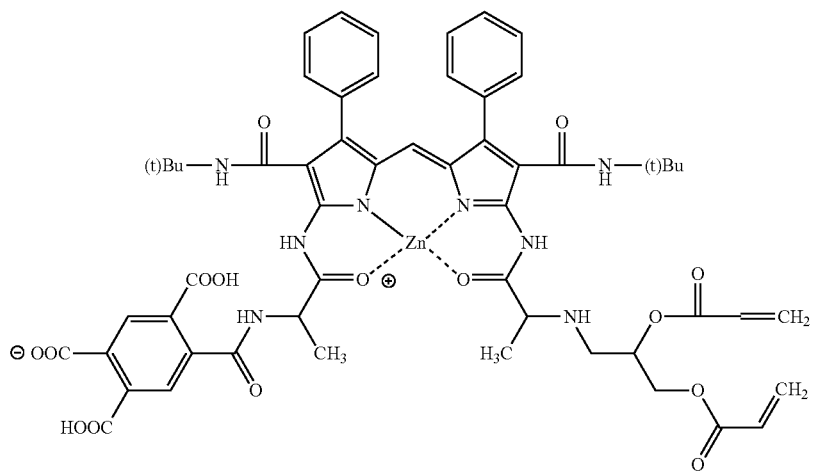
(c-38)
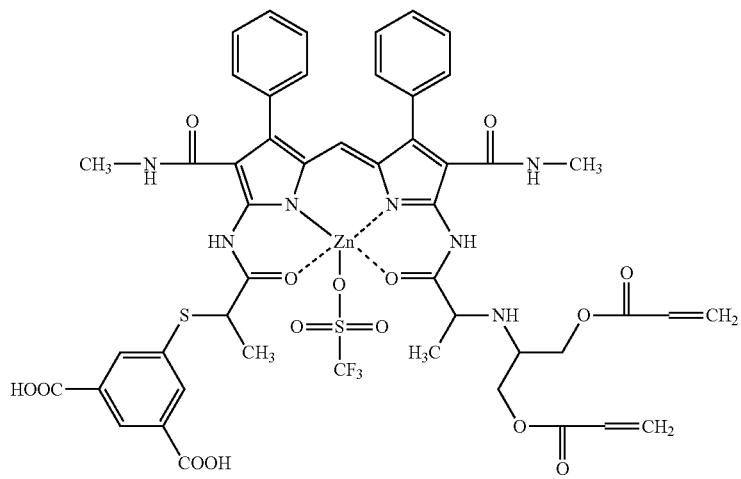
(c-39)
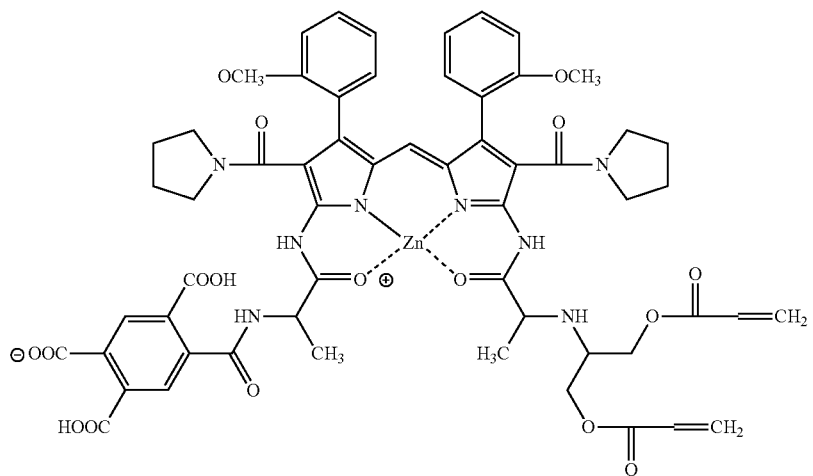
(c-40)

153    154
-continued
(c-41)
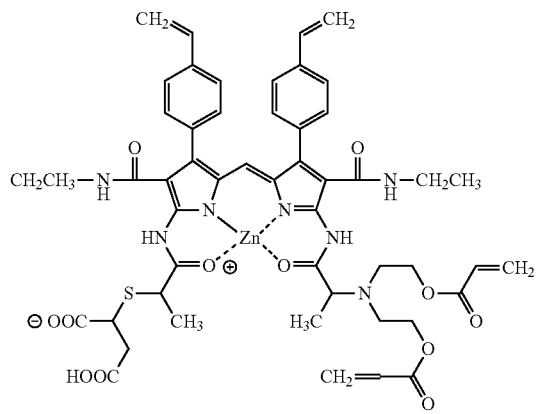
(c-42)
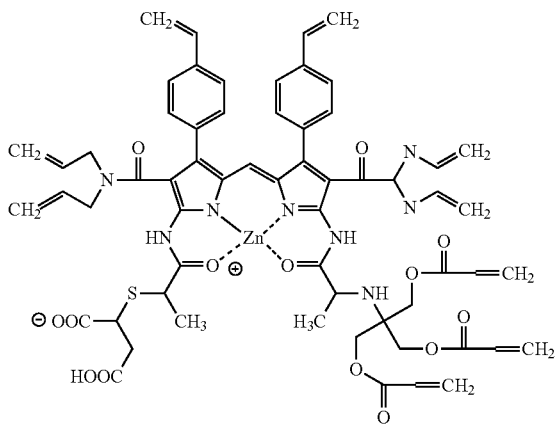
(c-43)
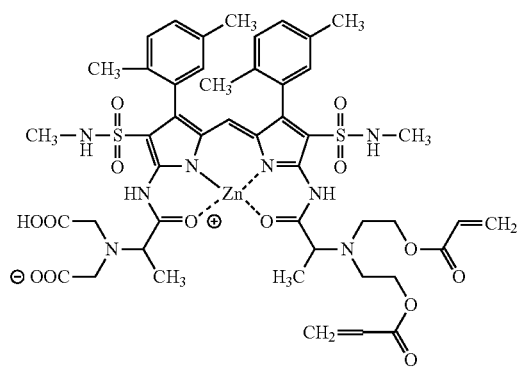
(c-44)
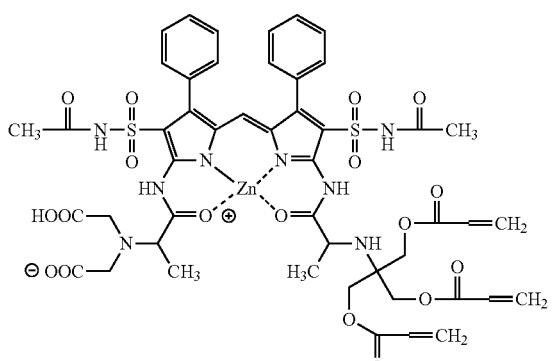
(c-45)
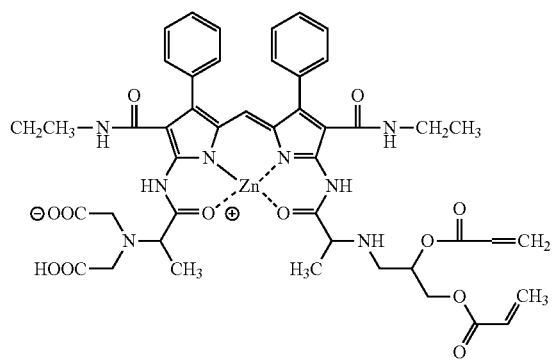
(c-46)
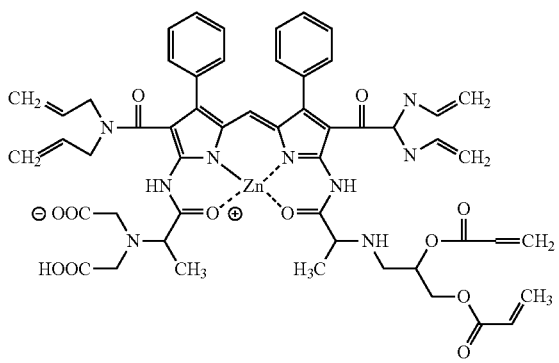
(c-47)
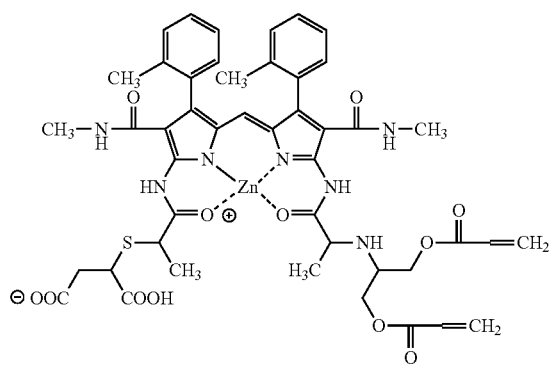
(c-48)
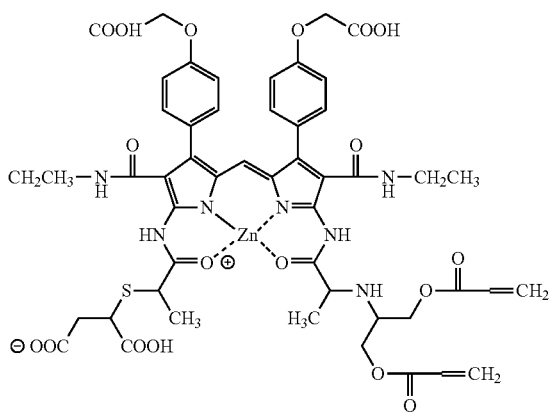

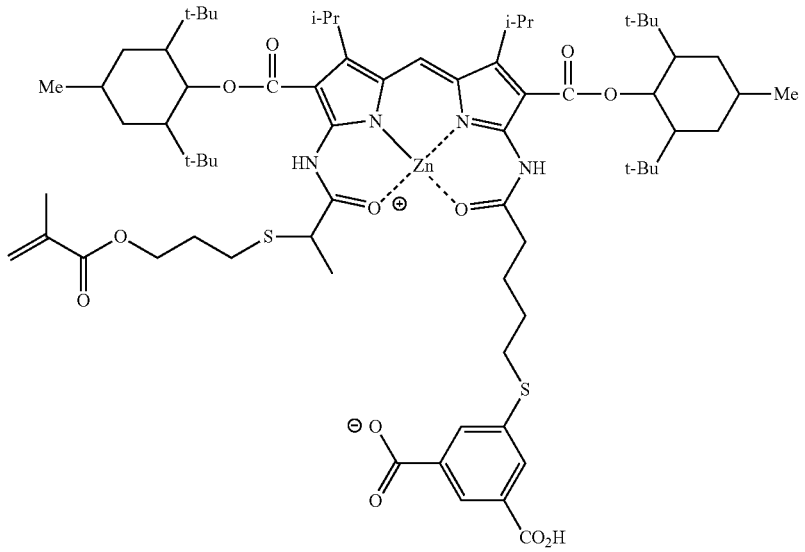
(d-1)
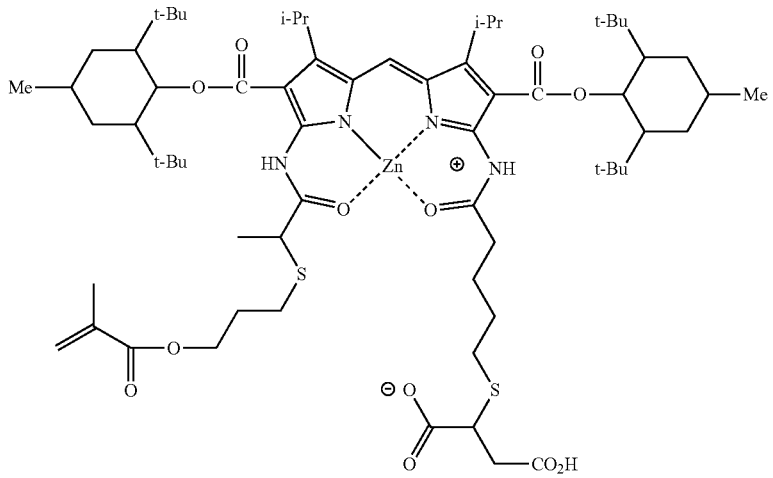
(d-2)
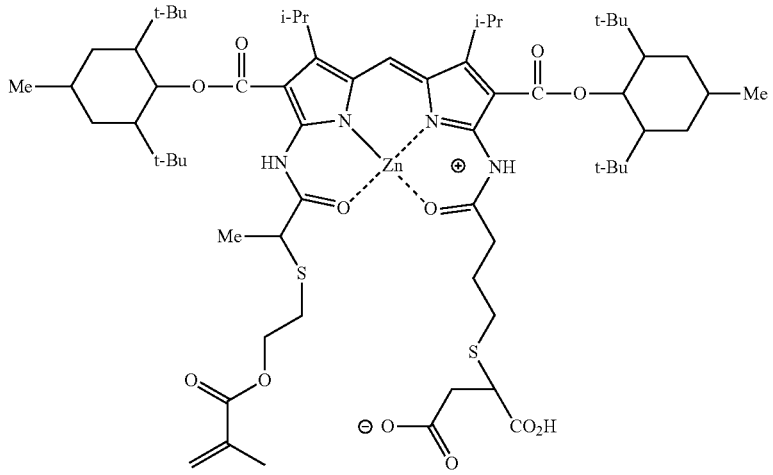
(d-3)

(d-4)
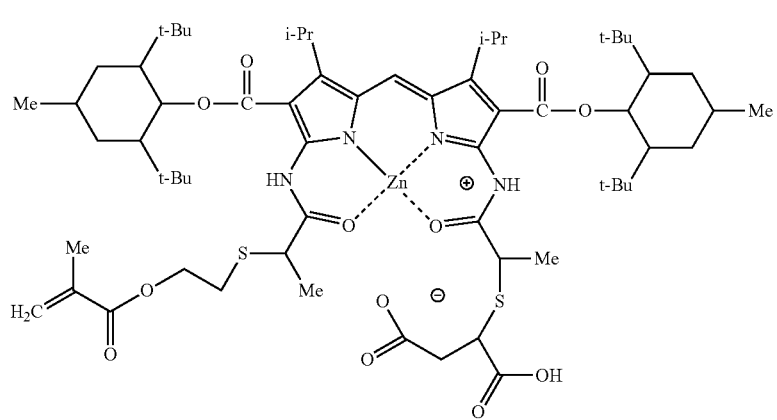
(d-5)
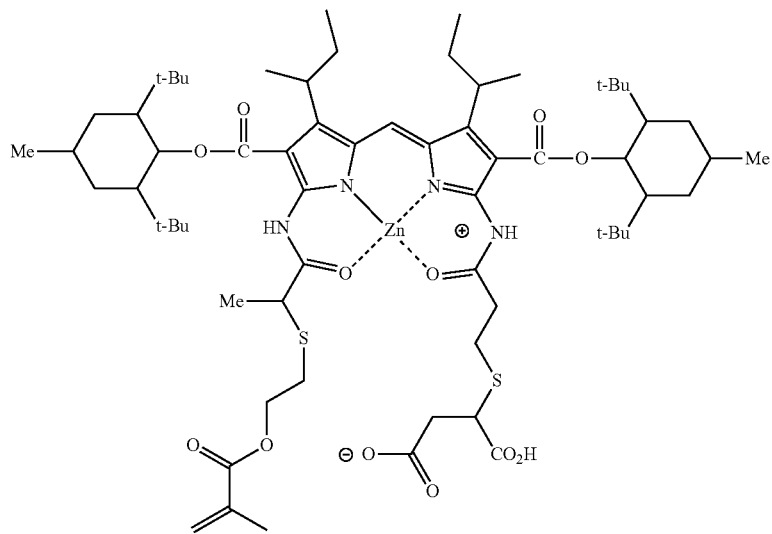
(d-6)
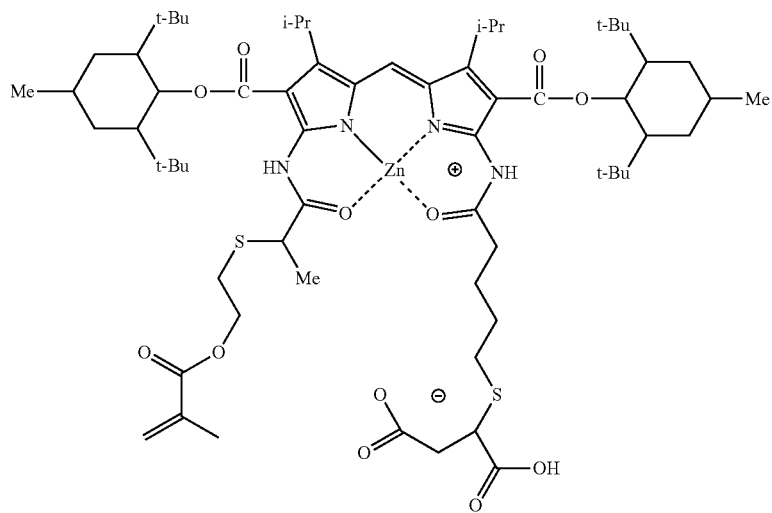

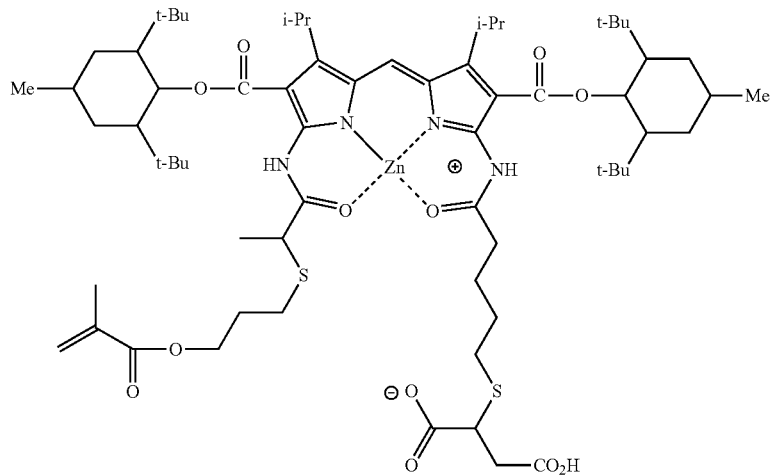
(d-7)
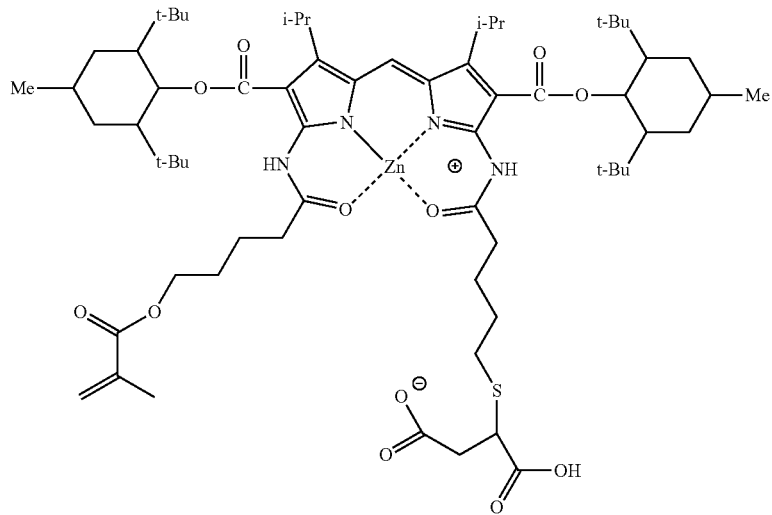
(d-8)
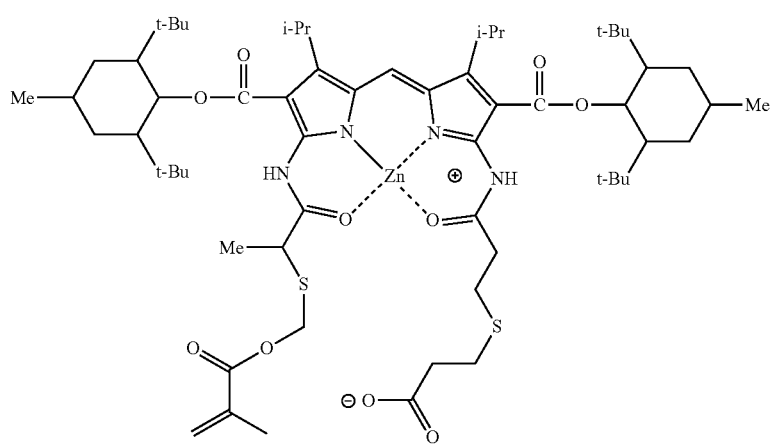
(d-9)

-continued
(d-10)
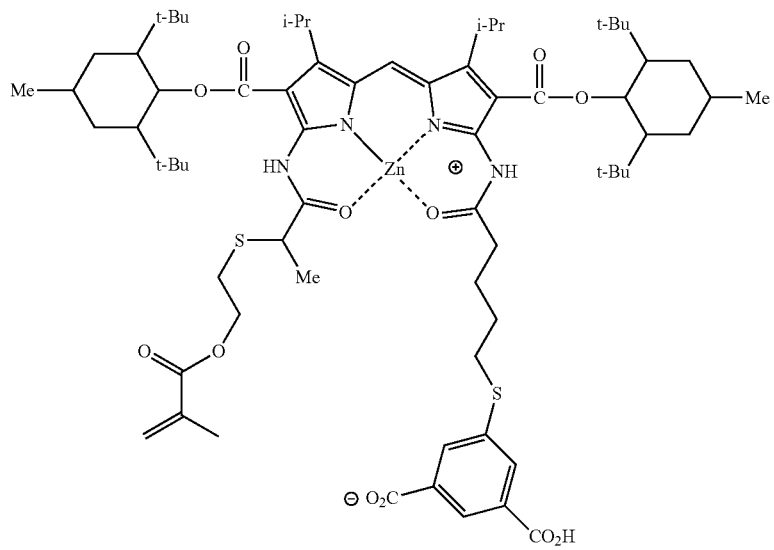
(d-11)
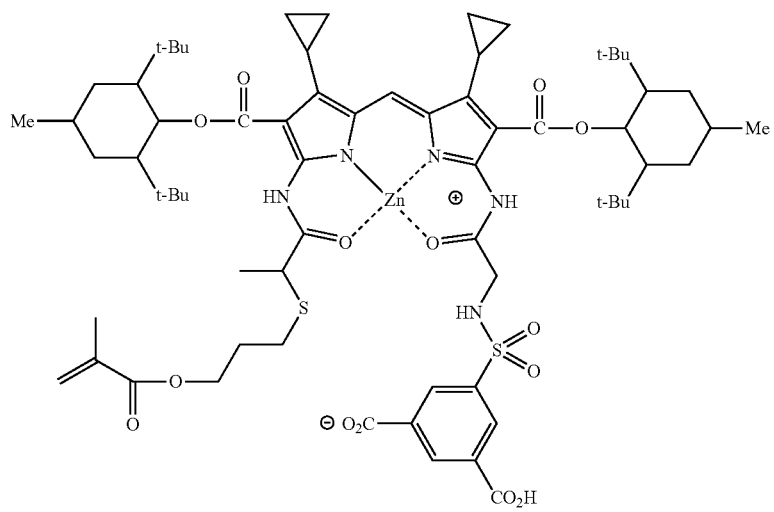
(d-12)
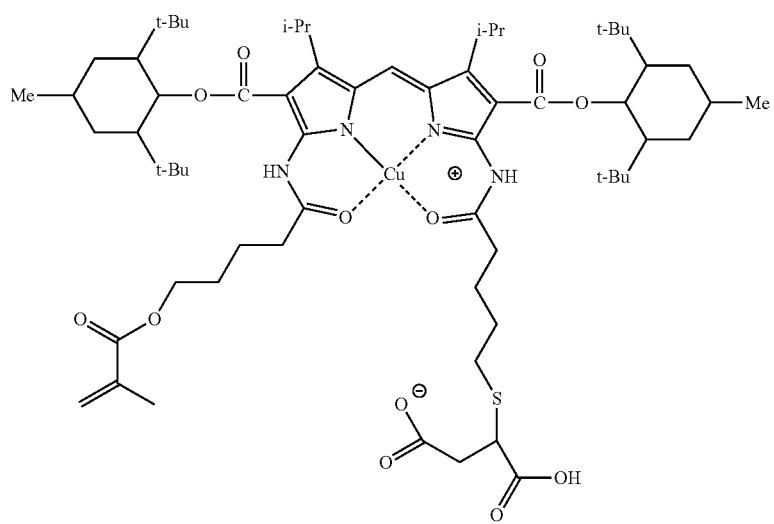

-continued
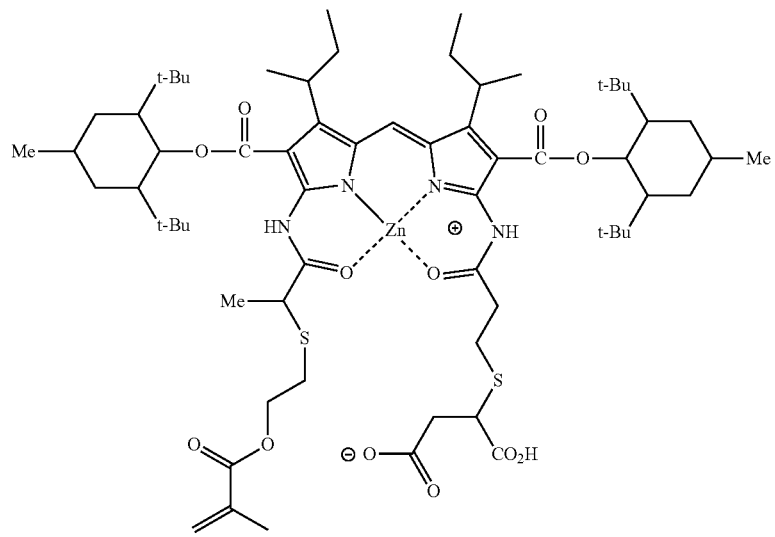
(d-13)
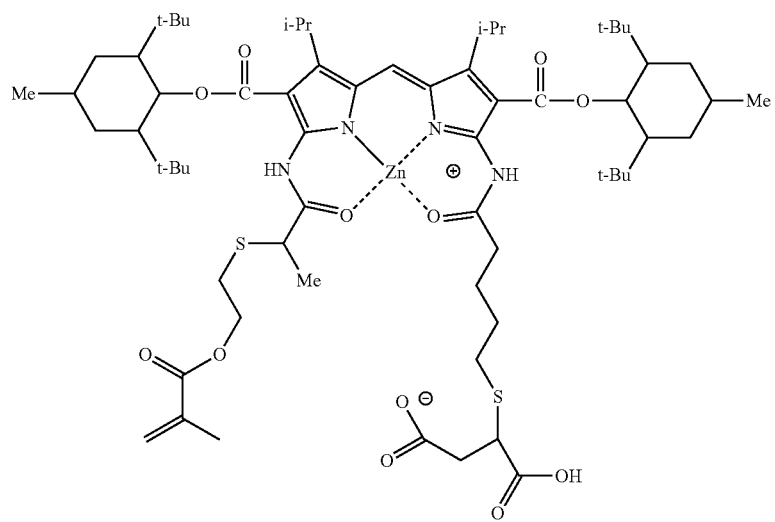
(d-14)
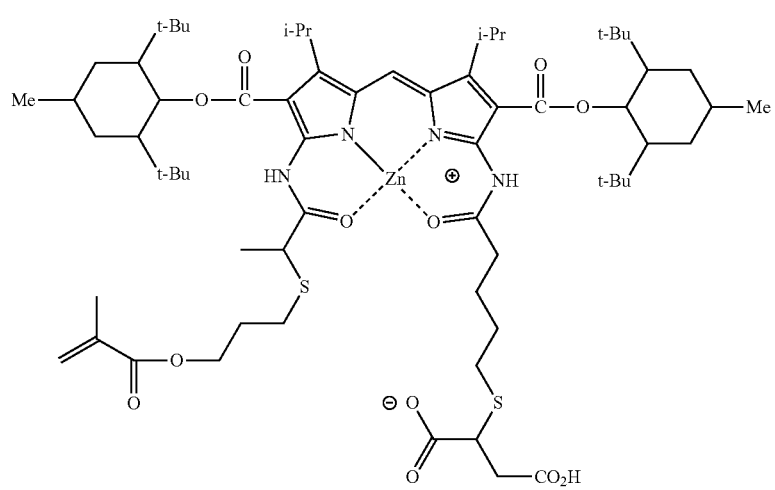
(d-15)

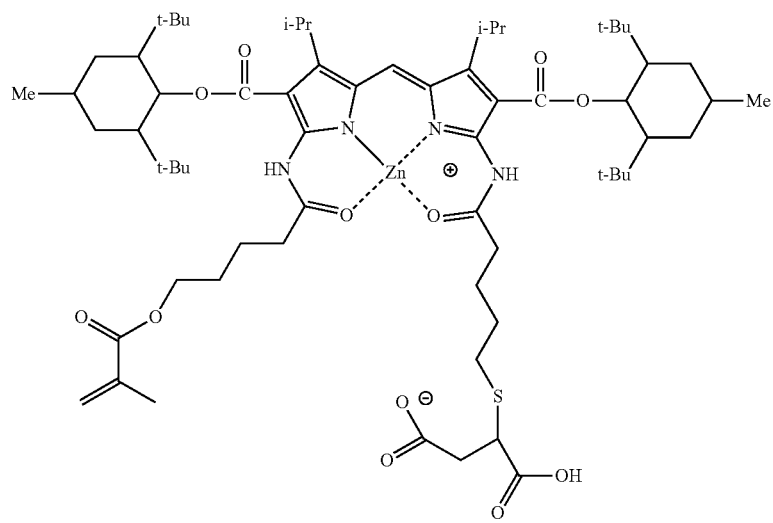
(d-16)
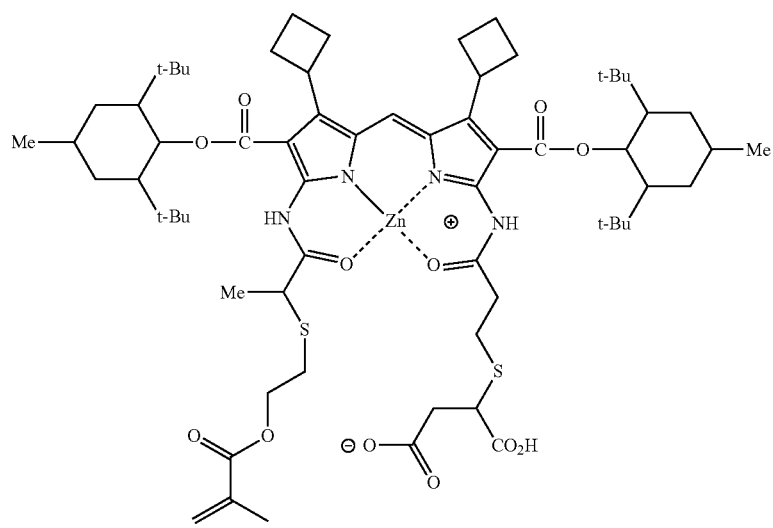
(d-17)
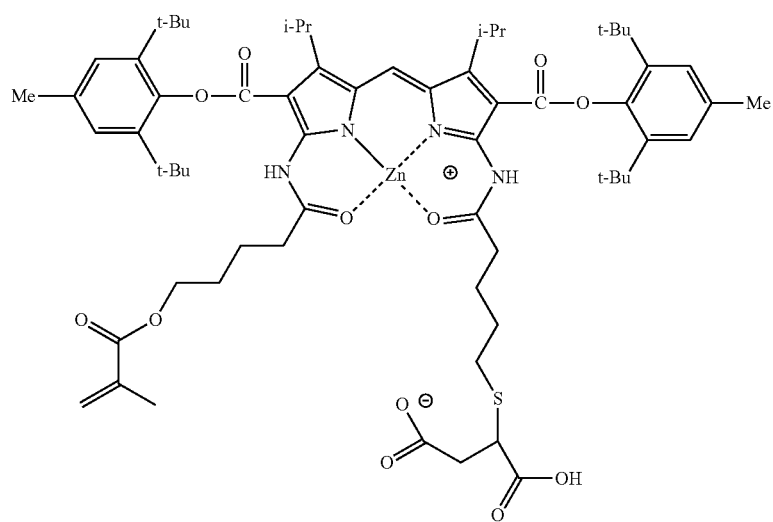
(d-18)

-continued
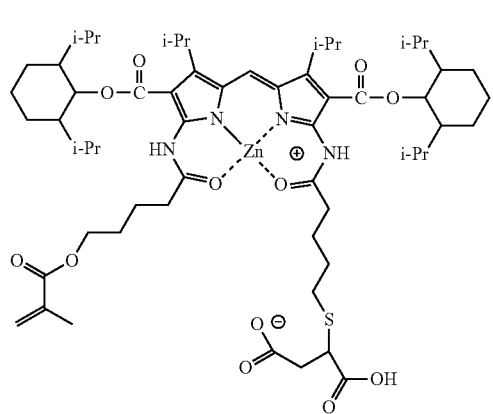
(d-19)
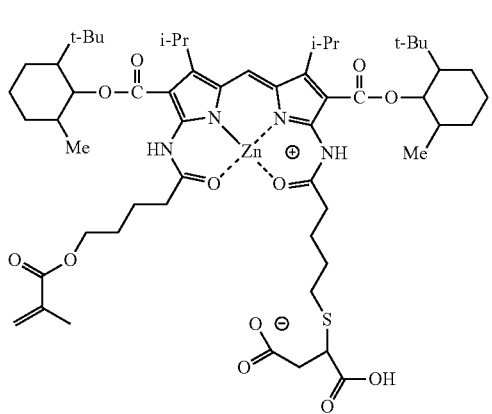
(d-20)
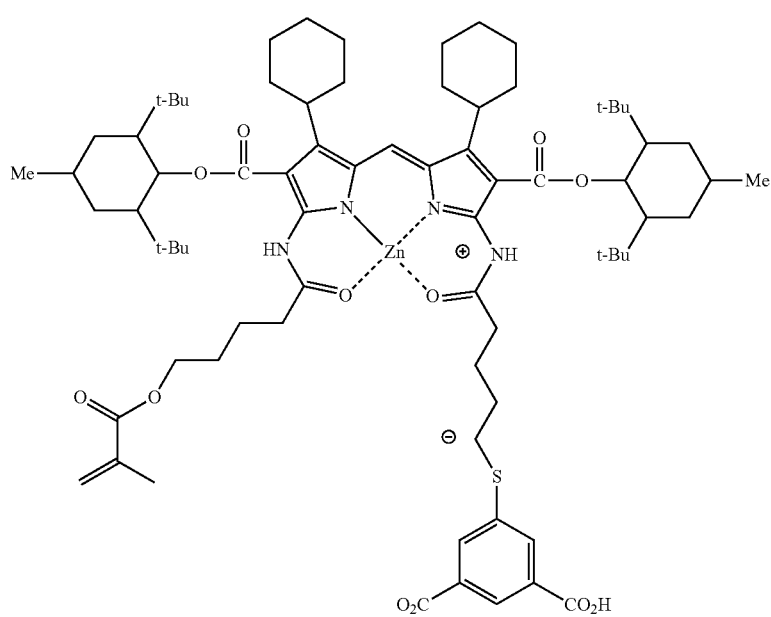
(d-21)
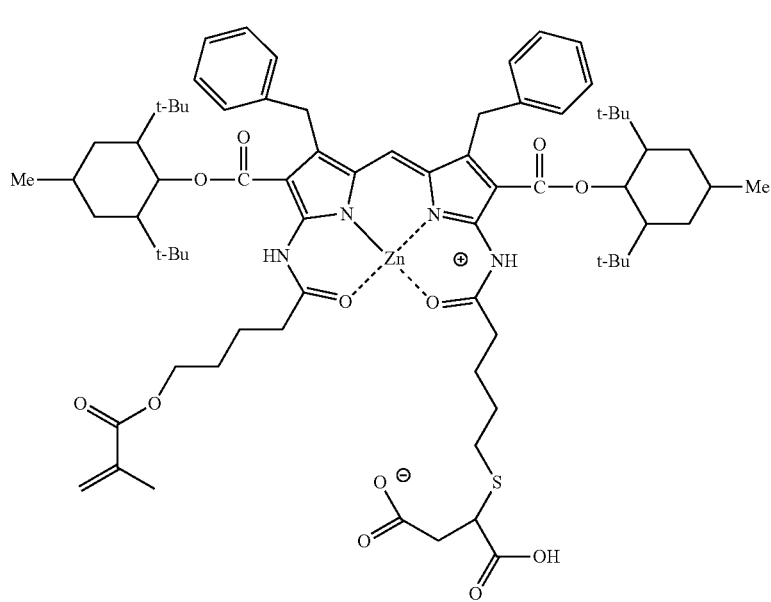
(d-22)

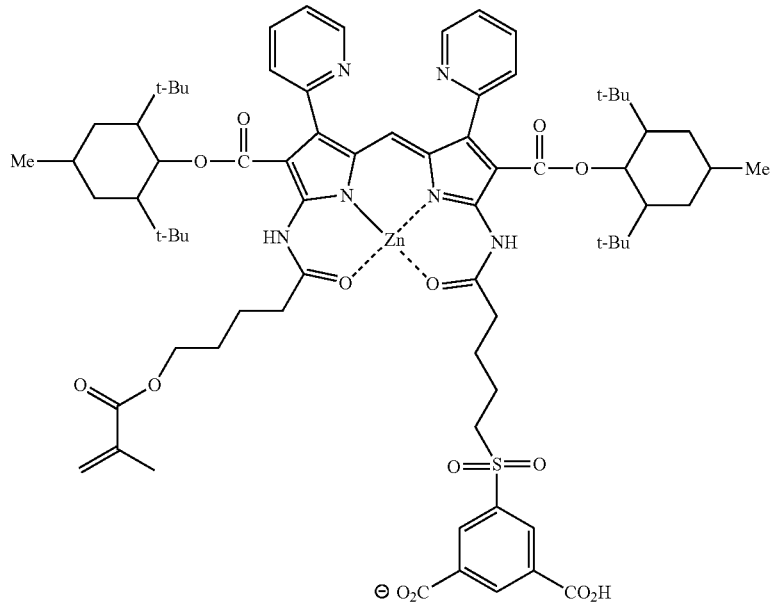
(d-23)
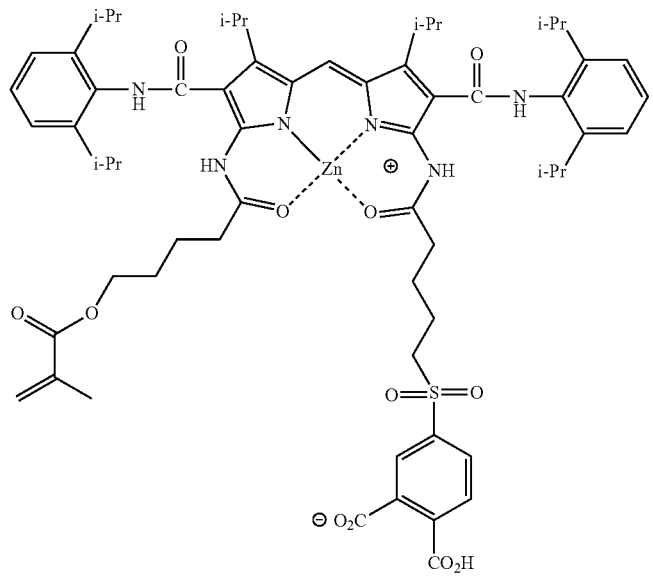
(d-24)

(d-25)
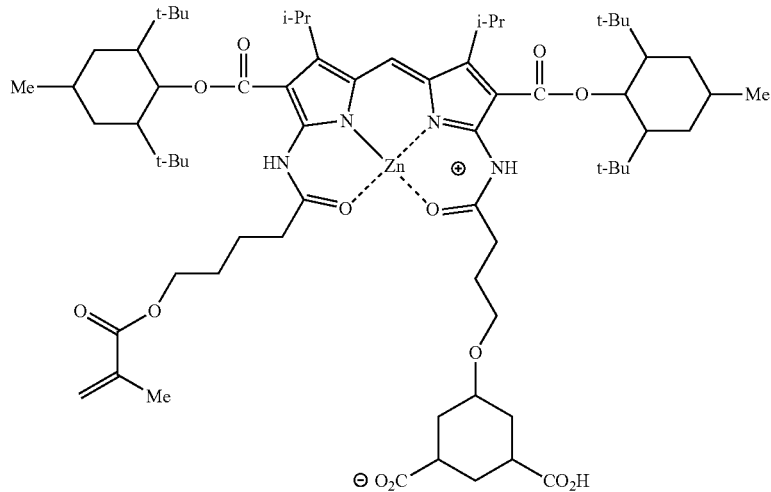
(d-26)
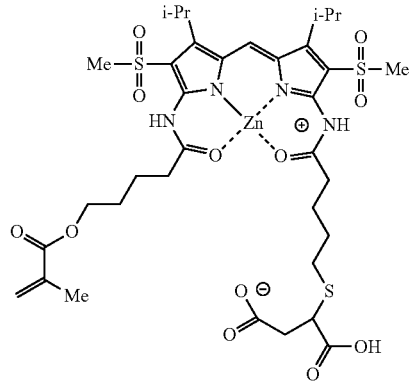
(d-27)
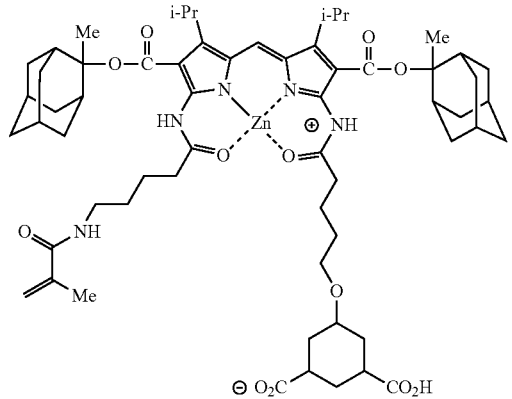
(d-28)
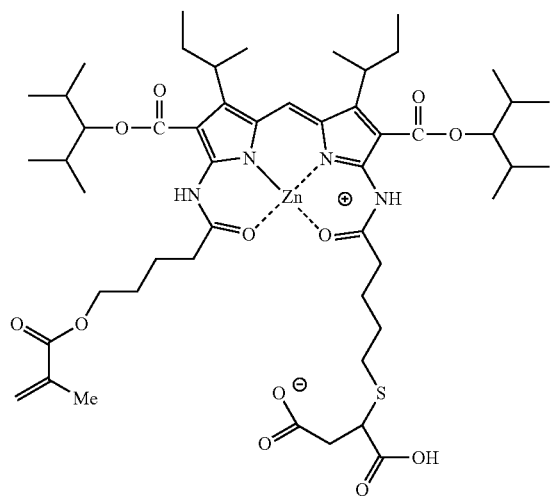
(d-29)
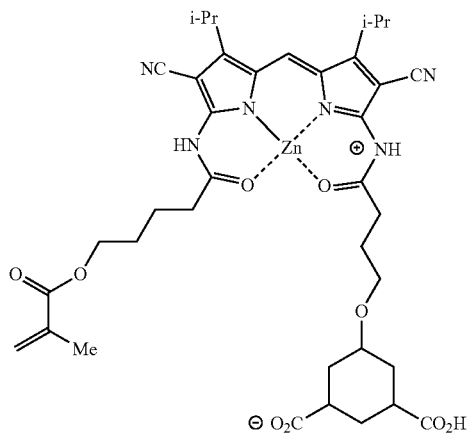

(d-30) 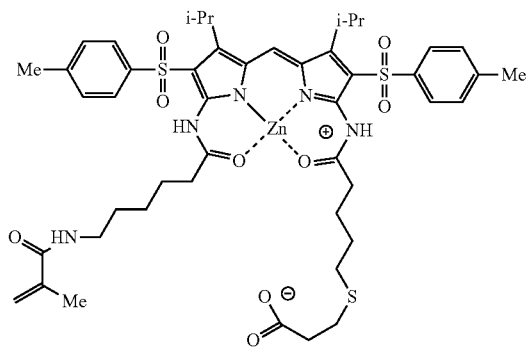
(d-31) 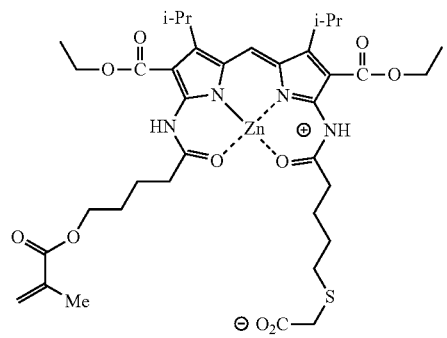
(d-32) 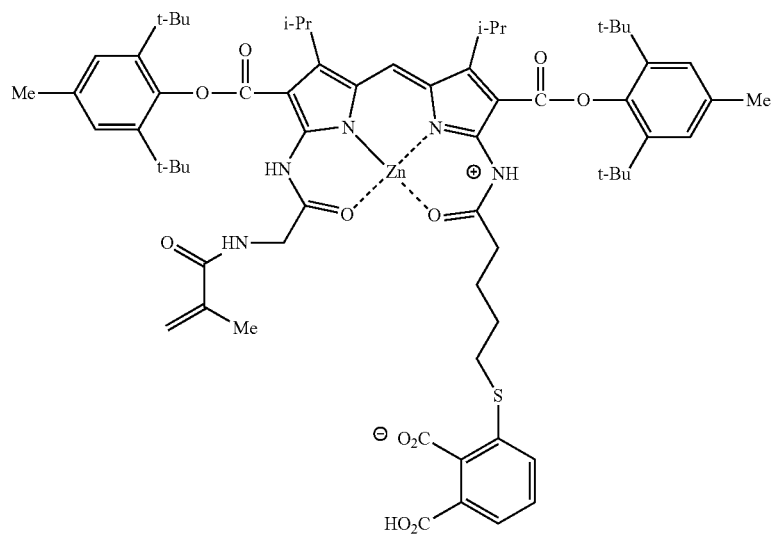
(d-33) 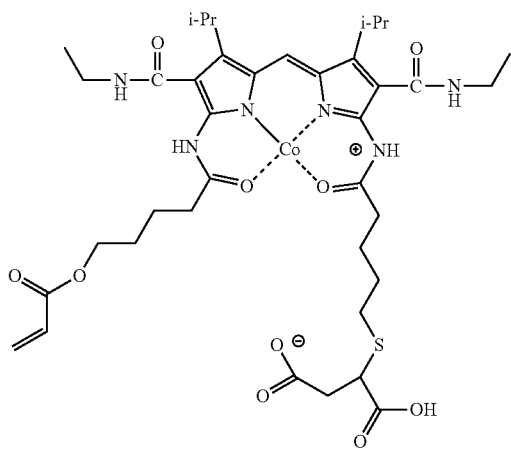
(d-34) 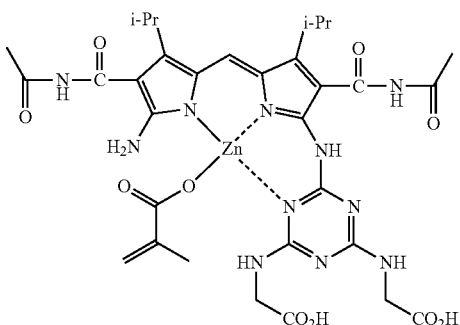

-continued
(d-35)
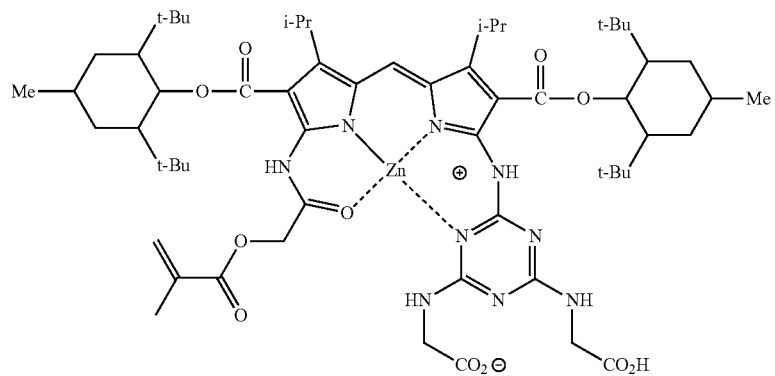
(d-36)
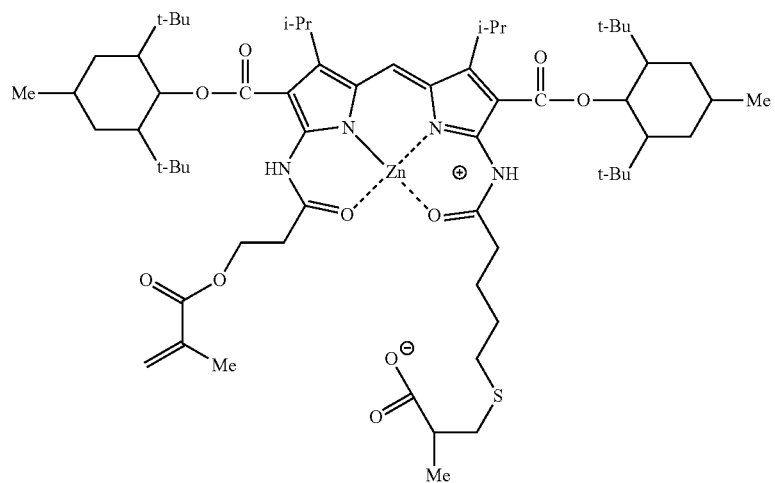
(d-37)
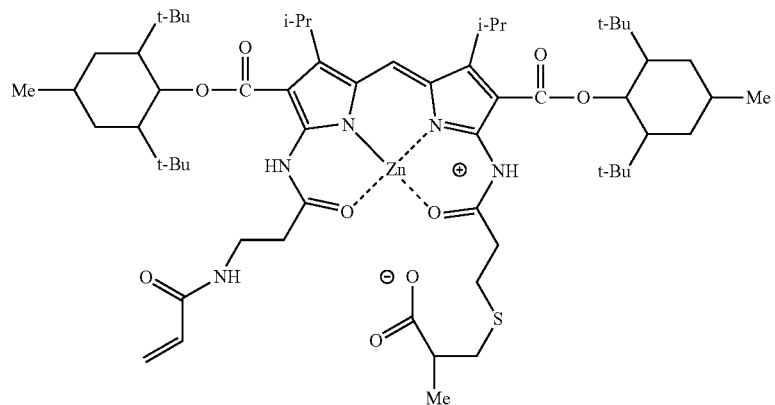
(d-38)
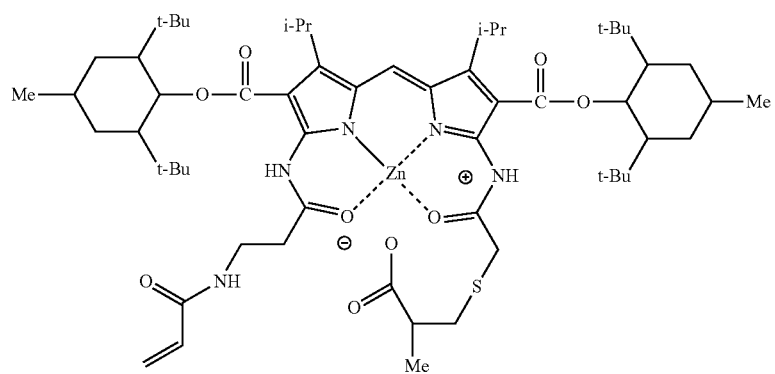

(e-1)
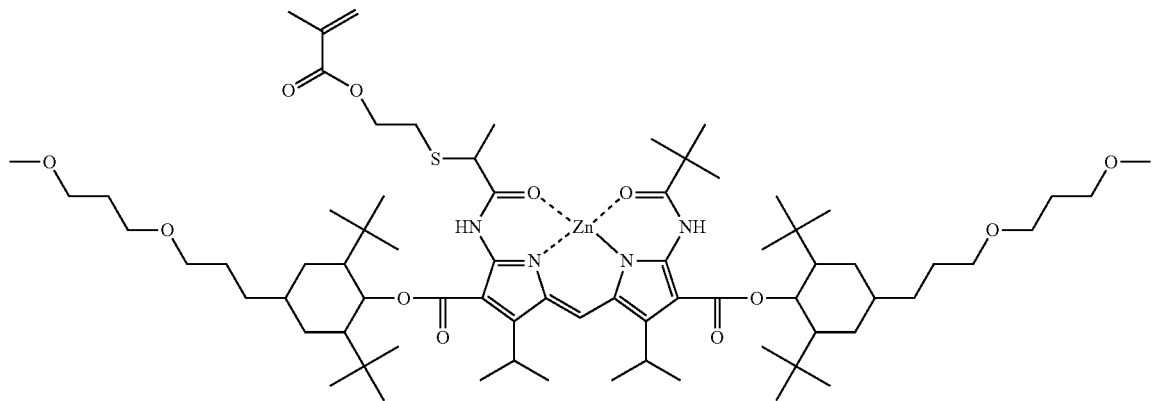
(e-2)
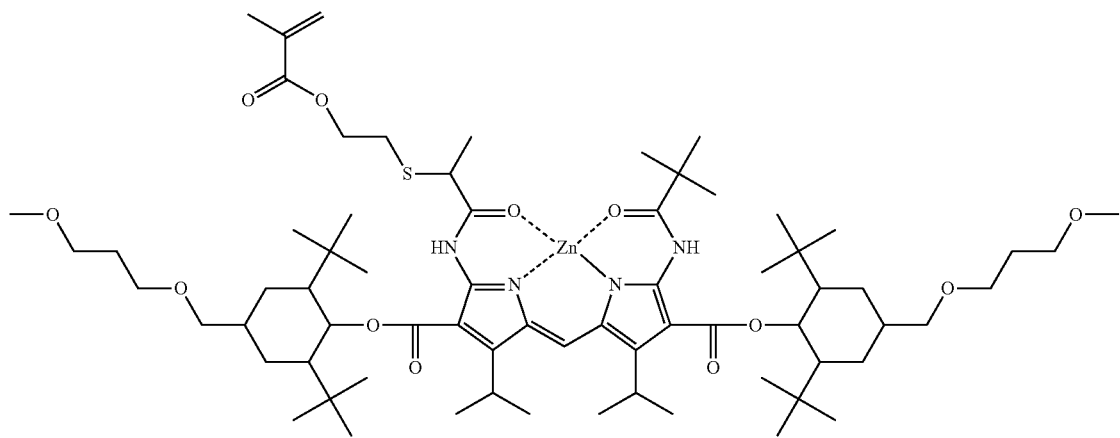
(e-3)
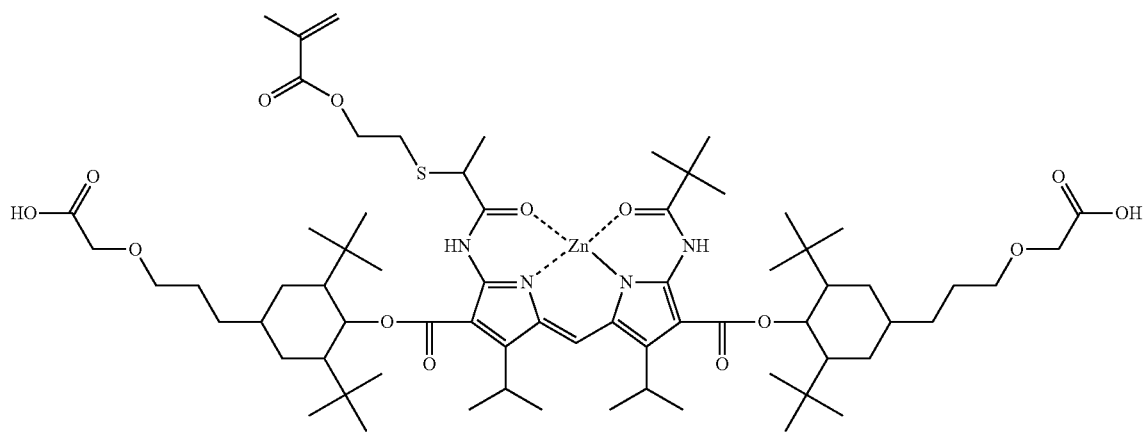

-continued
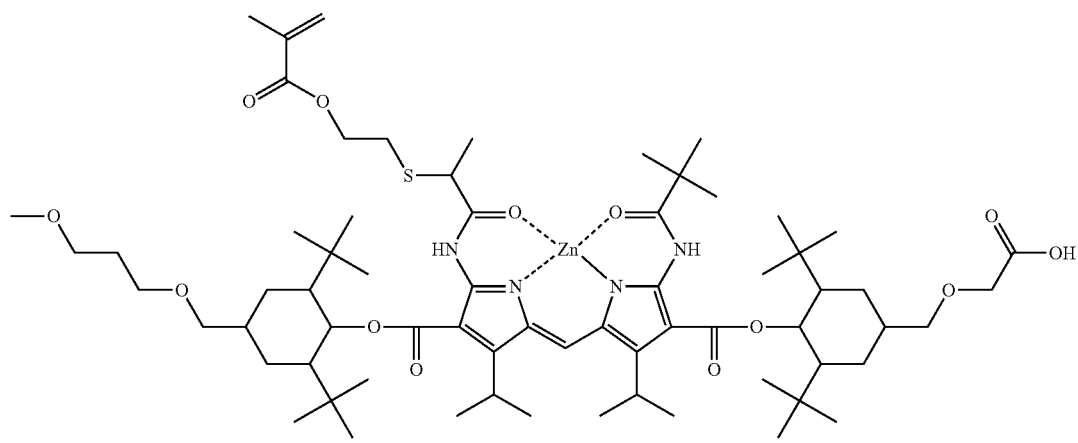
(e-4)
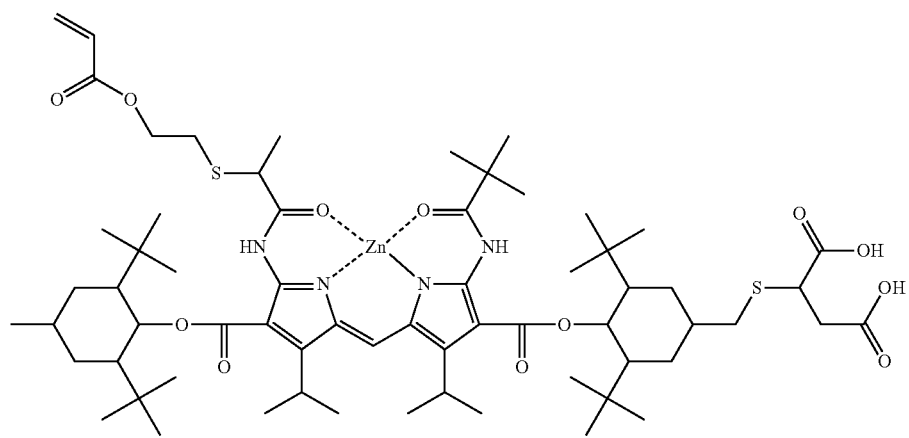
(e-5)
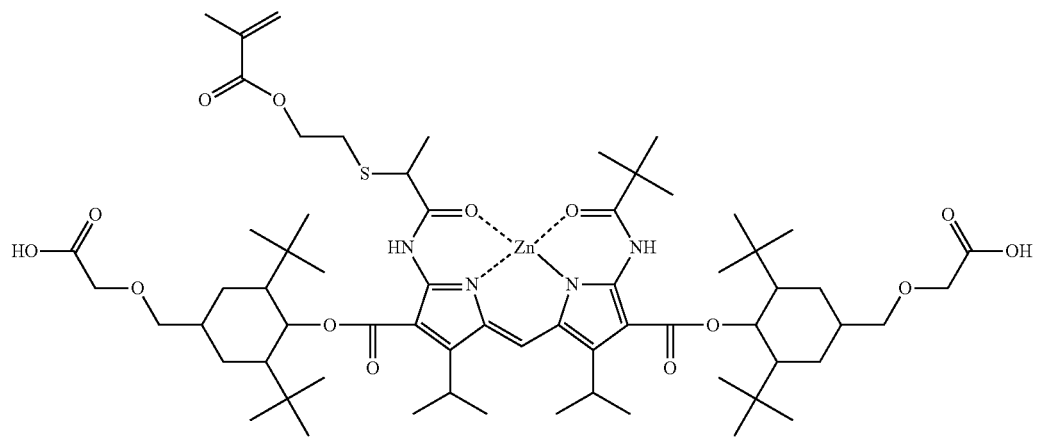
(e-6)
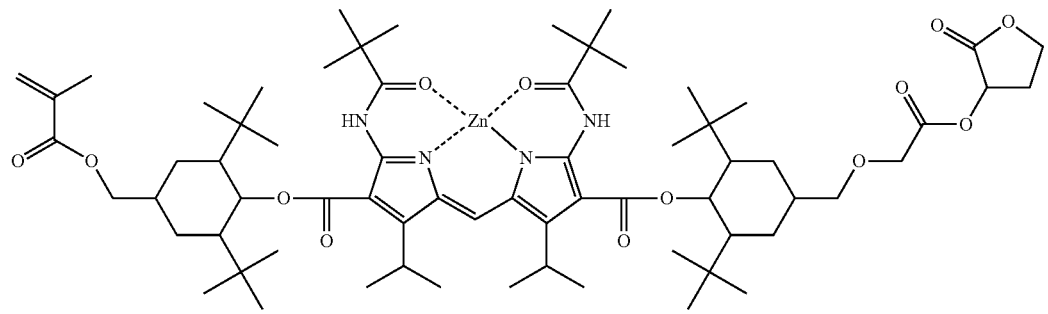
(e-7)

-continued
(e-8)
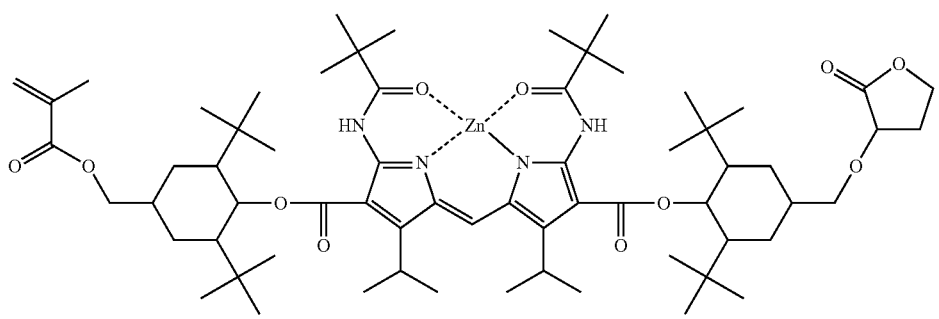
(e-9)
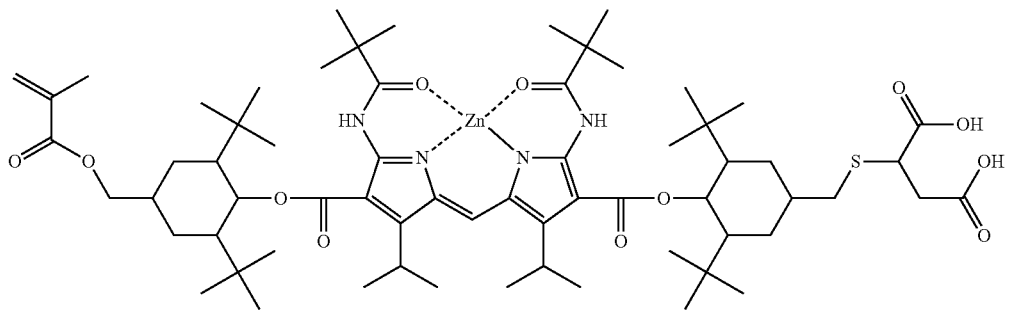
(e-10)
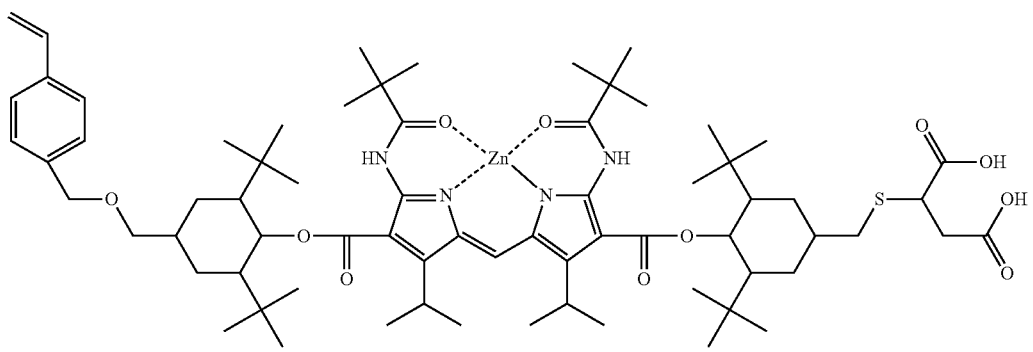
(e-11)
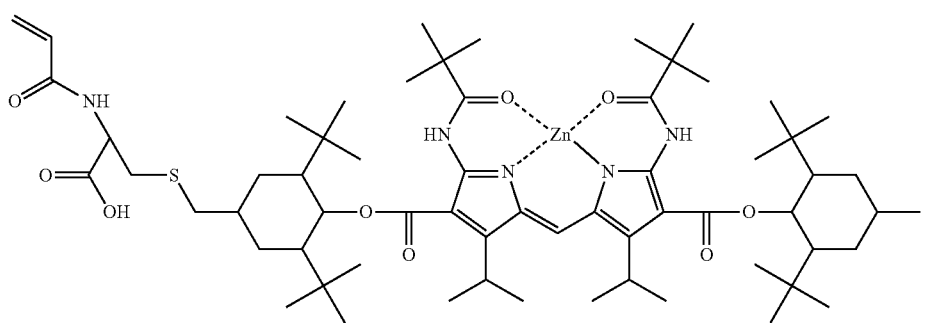
(e-12)
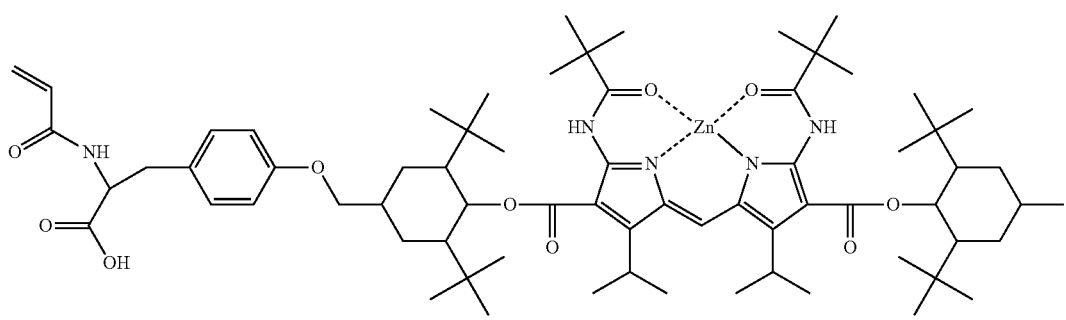

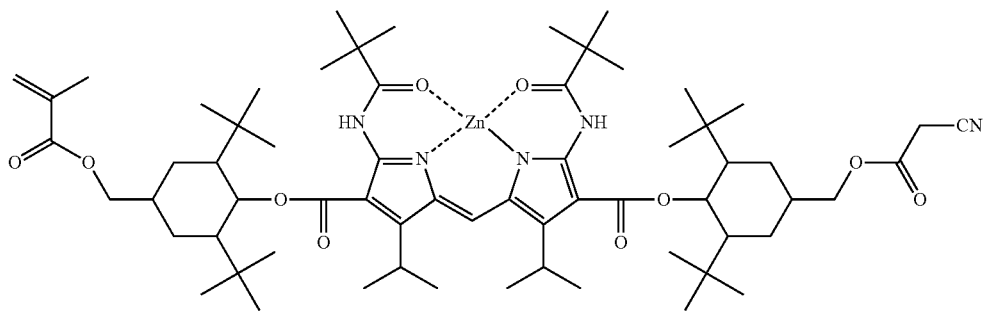

(e-13)

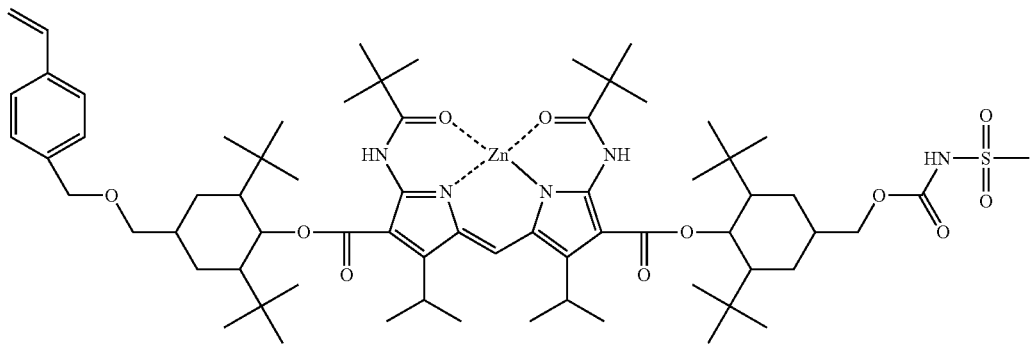

(e-14)

Among these exemplary compounds, from the viewpoint of developability, exemplary compounds a-5 to a-8, a-13 to a-48, b-5 to b-8, b-13 to b-48, c-5 to c-8, c-13 to c-48, d-1 to d-38, e-1 to e-6, e-9 and e-10 are preferred; and b-5 to b-8, b-13 to b-48, c-5 to c-8, c-13 to c-48, d-1 to d-16, e-3 to e-6, e-9 and e-10 are more preferred.

These compounds can be easily synthesized according to a method described in JP-A No. 2008-292970 as mentioned above. Further, these compounds can be synthesized in a similar manner, by referring to the synthesis examples described in the following Examples and selecting the starting compounds.

The total concentration of the compound represented by formula (1) in the colored curable composition may vary depending on the molecular weight and the molar light absorption coefficient of the compound, but the concentration is preferably from 0.5% by mass to 80% by mass, more preferably from 0.5% by mass to 70% by mass, and particularly preferably from 1% by mass to 70% by mass, with respect to the total solid content of the composition.

A method of producing a color filter from the colored curable composition according to the invention is not specifically limited, but photolithography or ink jetting is preferably employed.

In the following, colored curable compositions, which are suitably used in a photolithography method, will be explained.

Binder

The colored curable composition used in a photolithography method preferably contains at least one kind of binder. The binder is not specifically limited so long as it is alkali-soluble, and is preferably selected from the viewpoint of heat fastness, developability, availability, and the like.

The alkali-soluble binder is preferably a linear organic high-molecular polymer, and those soluble in an organic solvent and developable with a weak alkali aqueous solution are preferred. Examples of the linear organic high-molecular polymer include the polymers described in paragraphs [0227] to [0234] of JP-A No. 2008-292970 as described above.

In addition to the above, alkali-soluble binders that may be effectively used in the invention include those formed from adding an acid anhydride to a polymer having a hydroxy group, polyhydroxystyrene resin, polysiloxane resin, poly(2-hydroxyethyl(meth)acrylate), polyvinylpyrrolidone, polyethylene oxide, and polyvinyl alcohol. Further, the linear organic high-molecular polymer may be a copolymer in which a hydrophilic monomer is copolymerized. Examples of such copolymers include alkoxyalkyl (meth)acrylate, hydroxyalkyl (meth)acrylate, glycerol (meth)acrylate, (meth)acrylamide, N-methylol acrylamide, secondary or tertiary alkyl acrylamide, dialkylaminoalkyl (meth)acrylate, morpholine (meth)acrylate, N-vinyl pyrrolidone, N-vinyl caprolactum, vinyl imidazole, vinyl triazole, methyl (meth)acrylate, ethyl (meth)acrylate, branched or linear propyl (meth)acrylate, branched or linear butyl (meth)acrylate, and phenoxy hydroxypropyl (meth)acrylate. Other hydrophilic monomers that are usable in the invention include those having a tetrahydrofurfuryl group, a phosphoric acid group, a phosphate group, a quaternary ammonium salt group, an ethyleneoxy group, a propyleneoxy group, a sulfonic acid group or a group derived from a salt thereof, or a morpholinoethyl group.

The alkali-soluble binder may have a polymerizable group in a side chain in order to improve crosslinking efficiency and, for example, polymers having an allyl group, a (meth)acryl group or an allyloxyalkyl group in a side chain are also usable. Examples of such polymers having a polymerizable group include DIANAL NR Series (trade name, manufactured by Mitsubishi Rayon Co., Ltd.), PHOTOMER 6173 (trade name, COOH-containing polyurethane acrylic oligomer, manufactured by Diamond Shamrock Co., Ltd.), VISCOAT R-264 and KS RESIST 106 (trade names, manufactured by Osaka Organic Chemical Industry Ltd.), CYCLOMER P Series and PLACCEL CF200 Series (trade names, manufactured by Daicel Chemical Industries, Ltd.), and EBECRYL 3800 (trade name, manufactured by Daicel-Cytec Company Ltd.)

Further, in order to increase the strength of a cured coating film, alcohol-soluble nylon, polyether of 2,2-bis-(4-hydroxyphenyl)-propane and epichlorohydrin, and the like are also usable.

As the alkali-soluble binder, polymer (a) obtained by polymerizing a compound represented by the following formula (3) (hereinafter, also referred to as an ether dimer) is also preferably used.

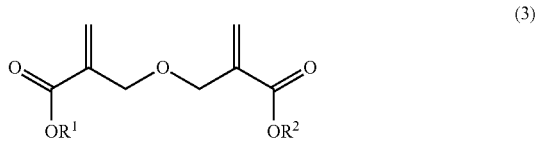

(3)

In formula (3), $R^1$ and $R^2$ each independently represent a hydrogen atom or a hydrocarbon group having 1 to 25 carbon atoms that may have a substituent.

By including polymer (a) in the colored curable composition according to the invention, heat fastness and transparency of the cured coating film formed from the composition can be further improved.

In formula (3) representing an ether dimer, the hydrocarbon group having 1 to 25 carbon atoms that may have a substituent represented by $R^1$ and $R^2$ are not particularly limited, but may be, for example, a linear or branched alkyl group such as a methyl group, an ethyl group, an n-propyl group, an isopropyl group, an n-butyl group, an isobutyl group, a t-butyl group, a t-amyl group, a stearyl group, a lauryl group or a 2-ethylhexyl group; an aryl group such as a phenyl group; an alicyclic group such as a cyclohexyl group, a t-butylcyclohexyl group, a dicyclopentadienyl group, a tricyclodecanyl group, an isobornyl group, an adamantyl group or a 2-methyl-2-adamanthyl group; an alkyl group substituted by an alkoxy group such as a 1-methoxyethyl group or a 1-ethoxyethyl group; and an aryl group-substituted alkyl group such as a benzyl group.

Among these, in particular, a group containing a primary or secondary carbon atom, such as a methyl group, an ethyl group, a cyclohexyl group and a benzyl group, which are hard to leave by acid or heat, are preferred in terms of heat fastness.

$R^1$ and $R^2$ may be the same kind of substituent, or may be different from each other.

Specific examples of the ether dimer include dimethyl-2,2'-[oxybis(methylene)]bis-2-propenoate, diethyl-2,2'-[oxybis(methylene)]bis-2-propenoate, di(n-propyl)-2,2'-[oxybis(methylene)]bis-2-propenoate, di(isopropyl)-2,2'-[oxybis(methylene)]bis-2-propenoate, di(n-butyl)-2,2'-[oxybis(methylene)]bis-2-propenoate, di(isobutyl)-2,2'-[oxybis(methylene)]bis-2-propenoate, di(t-butyl)-2,2'-[oxybis(methylene)]bis-2-propenoate, di(t-amyl)-2,2'-[oxybis(methylene)]bis-2-propenoate, di(steraryl)-2,2'-[oxybis(methylene)]bis-2-propenoate, di(lauryl)-2,2'-[oxybis(methylene)]bis-2-propenoate, di(2-ethylhexyl)-2,2'-[oxybis(methylene)]bis-2-propenoate, di(1-methoxyethyl)-2,2'-[oxybis(methylene)]bis-2-propenoate, di(1-ethoxyethyl)-2,2'-[oxybis(methylene)]bis-2-propenoate, dibenzyl-2,2'-[oxybis(methylene)]bis-2-propenoate, diphenyl-2,2'-[oxybis(methylene)]bis-2-propenoate, dicyclohexyl-2,2'-[oxybis(methylene)]bis-2-propenoate, di(t-butylcyclohexyl)-2,2'-[oxybis(methylene)]bis-2-propenoate, di(dicyclopentadienyl)-2,2'-[oxybis(methylene)]bis-2-propenoate, di(tricyclodecanyl)-2,2'-[oxybis(methylene)]bis-2-propenoate, di(isobornyl)-2,2'-[oxybis(methylene)]bis-2-propenoate, diadamantyl-2,2'-[oxybis(methylene)]bis-2-propenoate, and di(2-methyl-2-adamanthyl)-2,2'-[oxybis(methylene)]bis-2-propenoate. Among these, in particular, dimethyl-2,2'-[oxybis(methylene)]bis-2-propenoate, diethyl-2,2'-[oxybis(methylene)]bis-2-propenoate, dicyclohexyl-2,2'-[oxybis(methylene)]bis-2-propenoate and dibenzyl-2,2'-[oxybis(methylene)]bis-2-propenoate are preferred. These ether dimers may be used singly or in combination of two or more kinds.

A polymer having an epoxy group is also suitable as the alkali-soluble binder.

An epoxy group can be introduced in an alkali-soluble binder by, for example, polymerizing a monomer having an epoxy group (hereinafter, also referred to as a monomer for introducing an epoxy group) as a monomer component. Examples of the monomer having an epoxy group include glycidyl (meth)acrylate, 3,4-epoxycyclohexylmethyl (meth)acrylate and o- (or m-, p-) vinylbenzyl glycidyl ether. These monomers for introducing an epoxy group may be used singly or in combination of two or more kinds. When the monomer component used for obtaining the alkali-soluble binder includes a monomer for introducing an epoxy group, the proportion thereof is not particularly limited, but is preferably from 5 to 70% by mass, more preferably from 10 to 60% by mass, with respect to the total monomer components.

A polymer having an acidic group is also suitable as the alkali-soluble binder. The acid group is not particularly limited, but examples thereof include a carboxyl group, a pheholic hydroxy group and a carboxylic acid anhydride. These acidic groups may be used singly or in combination of two or more kinds. An acidic group can be introduced in the alkali-soluble binder by, for example, polymerizing a monomer having an acidic group and/or a monomer that can donate an acidic group after polymerization (hereinafter, also referred to a monomer for introducing an acidic group) as a monomer component.

When a monomer that can donate an acidic group after polymerization is used as a monomer component for introducing an acidic group, a treatment for donating an acidic group, such as that as described later, needs to be carried out after polymerization.

Examples of the monomer having an acidic group include monomers having a carboxyl group such as (meth)acrylic acid, itaconic acid and the like, monomers having a phenolic hydroxy group such as N-hydroxyphenyl maleimide, and monomers having a carboxylic acid anhydride such as maleic acid anhydride and itaconic acid anhydride. Among these, (meth)acrylic acid is particularly preferred.

Examples of the monomer that can donate an acidic group after polymerization include monomers having a hydroxy group such as 2-hydroxyethy (meth)acrylate, monomers having an epoxy group such as glycidyl (meth)acrylate, and monomers having an isocyanate group such as 2-isocyanatoethyl (meth)acrylate. These monomers for introducing an acidic group may be used singly or in combination of two or more kinds.

Exemplary treatments for donating an acidic group after polymerization, when a monomer that can donate an acidic group after polymerization, include a treatment in which part of polar groups in polymer side chains are modified by polymer reaction.

Among these alkali-soluble binders, from the viewpoint of heat fastness, polyhydroxystyrene resin, polysiloxane resin, acrylic resin, acrylamide resin, acrylic/acrylamide copolymer resin are preferred; and from the viewpoint of controlling developability, acrylic resin, acrylamide resin, acrylic/acrylamide resin are preferred.

Among the acrylic resins, copolymers formed by copolymerizing a monomer selected from benzyl (meth)acrylate, (meth)acrylic acid, hydroxyethyl (meth)acrylate or (meth)acrylamide, and as commercial products, KS RESIST-106 (trade name, manufactured by Osaka Organic Chemical Industry Ltd.) and CYCLOMER P Series (trade name, manufactured by Daicel Chemical Industries, Ltd.) are preferred.

The content of the binder in the colored curable composition with respect to the solid content concentration in the colored curable composition is preferably from 0.1% by mass to 50% by mass, more preferably from 0.1% by mass to 40% by mass, particularly preferably from 0.1% by mass to 30% by mass.

Cross-Linking Agent

The colored curable composition according to the invention contains at least one selected from a compound represented by formula (1) or a tautomer thereof as a colorant, and exhibits improved color purity, a higher absorption coefficient such that it can be formed into a thin film, as well as improved fastness, as compared with the conventional composition. However, the composition may further include a cross-linking agent so as to obtain an even highly cured film.

The cross-linking agent is not specifically limited so long as the film is cured by cross-linking reaction, and examples thereof include the cross-linking agents described in paragraphs [0237] to [0253] of JP-A No. 2008-292970 as described above.

When a cross-linking agent is contained in the composition, the content thereof is preferably from 1% by mass to 70% by mass, more preferably from 5% by mass to 50% by mass, and particularly preferably from 7% by mass to 30% by mass, with respect to the total solid content (by mass) of the composition. When the content falls within this range, a sufficient curing degree and a dissolution property of an unexposed portion may be maintained, while preventing the curing degree at an exposed portion from being insufficient, or preventing the dissolution property of an unexposed portion from significantly decreasing.

<Polymerizable Monomer>

The colored curable composition according to the invention suitably includes at least one kind of polymerizable monomer. A polymerizable monomer is typically included in the colored curable composition when it is a negative-working composition.

The polymerizable monomer may be included in a positive-working system containing a naphthoquinone diazide compound as described later in combination with a photopolymerization initiator as described later. In that case, the polymerizable monomer contributes to further promotion of curing degree of a formed pattern. In the following, the polymerizable monomer will be described.

The polymerizable monomer is, specifically, selected from compounds having at least one terminal ethylenically unsaturated bond, preferably two or more terminal ethylenically unsaturated bonds. These compounds are widely known in this technical field, and any of then can be used in the invention without being particularly restricted. In the invention, the polymerizable monomer may be used singly or in combination of two or more kinds.

Examples of the polymerizable monomer include unsaturated carboxylic acids (such as acrylic acid, methacrylic acid, itaconic acid, crotonic acid, isocrotonic acid and maleic acid) and esters thereof and amides thereof, preferably esters of unsaturated carboxylic acid and an aliphatic polyhydric alcohol compound and amides of unsaturated carboxylic acid and an aliphatic polyamine compound. Further, compounds obtained by addition reaction of esters or amides of unsaturated carboxylic acid having a nucleophilic substituent such as a hydroxy group, an amino group or a mercapto group with a mono- or polyfunctional isocyanate or an epoxy compound; and compounds obtained by dehydration condensation of the aforementioned esters or amides with a mono- or polyfunctional carboxylic acid are suitably used. Moreover, compounds obtained by addition reaction of esters or amides of unsaturated carboxylic acid having an electrophilic substituent such as an isocyanate group or an epoxy group with a mono- or polyfunctional alcohols, amides or thiols; and compounds obtained by substitution reaction of esters or amides of unsaturated carboxylic acid having a leaving substituent such as a halogen group or a tosyloxy group with a mono- or polyfunctional alcohols, amides or thiols are also suitable. Alternatively, the above compounds in which unsaturated carboxylic acid is changed to unsaturated phosphonic acid, styrene or vinyl ether are also applicable.

Specific compounds described in paragraphs [0095] to [0108] of JP-A No. 2009-288705 are also suitable used in the invention.

Compounds having an ethylenically unsaturated group including at least one ethylene group capable of addition polymerization, and having a boiling point of 100° C. or higher under normal pressure, are also suitable as the polymerizable monomer. Examples of such compounds include monofunctional acrylate or methacrylate, such as polyethylene glycol mono(meth)acrylate, polypropylene glycol mono(meth)acrylate and pheoxyethyl (meth)acrylate; and compounds obtained by adding ethylene oxide or propylene oxide to a polyhydric alcohol, and (meth)acrylating the same, such as polyethylene glycol di(meth)acrylate, trimethylol ethane tri(meth)acrylate, neopentylglycol di(meth)acrylate, pentaerythritol tri(meth)acrylate, pentaerythritol tetra(meth)acrylate, dipentaerythritol penta(meth)acrylate, dipentaerythritol hexa(meth)acrylate, hexanediol (meth)acrylate, trimethylolpropane tri(acryloyloxypropyl)ether, tri(acryloyloxyethyl)isocyanurate, glycerin and trimethylol ethane; urethane acrylates described in Japanese Patent Application Publication Nos. 48-41708 and 50-6034, and JP-A No. 51-37193; polyester acrylates described in JP-A No. 48-64183 and Japanese Patent Application Publication Nos. 49-43191 and 52-30490; and polyfunctional acrylates or methacryltates, such as epoxy acrylates that is obtained by reaction of an epoxy resin and (meth)acrylic acid; and mixtures of these compounds.

Among these, acrylic compounds having three or more acryloyl groups in the molecule are preferred.

Further, compounds described in paragraphs [0254] to [0257] of JP-A No. 2008-292970 and paragraphs [0054] to [0068] of JP-A No. 2009-13206 are also preferred examples of the compound having at least one ethylenically unsaturated group capable of addition polymerization and a boiling point of 100° C. or higher under normal pressure.

In addition to the above, radical polymerizable monomers represented by the following formulae (MO-1) to (MO-5) are also suitably used.

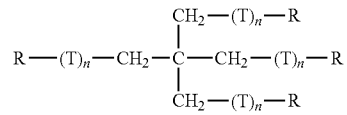

(MO-1)

-continued

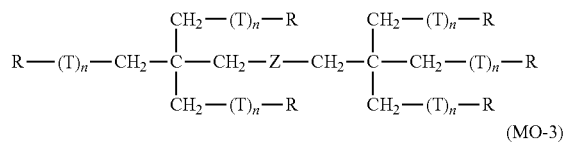
(MO-2)

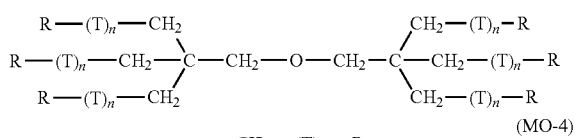
(MO-3)

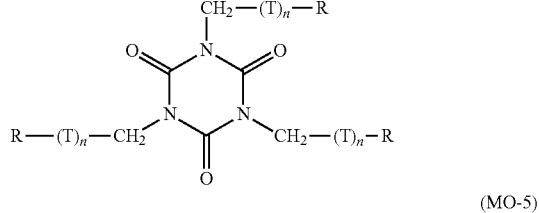
(MO-4)

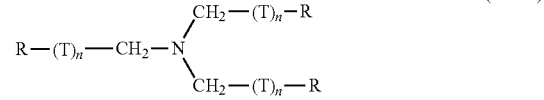
(MO-5)

In formulae (MO-1) to (MO-5), R, T and Z each independently represent any of the following substituents or linking groups, and n represents an integer of from 0 to 14. In the following R, T and Z, m represents an integer of from 1 to 8. When two or more of R or T exist in the same molecule, the two or more of R or T may be the same or different from each other. In the formulae, when T is an oxyalkylene group, the terminal end at the carbon atom side is bonded to R.

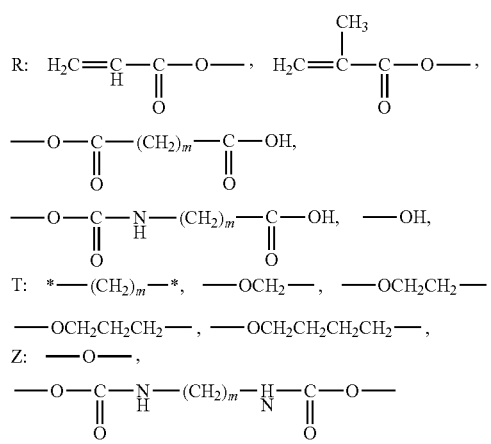

The compounds described in paragraphs [0248] to [0251] of JP-A No. 2007-269779 are also suitably used as a radical polymerizable monomer represented by formulae (MO-1) to (MO-5).

The content of the polymerizable monomer in the colored curable composition is preferably from 0.1% by mass to 90% by mass, more preferably from 1.0% by mass to 80% by mass, and particularly preferably from 2.0% by mass to 70% by mass, with respect to the solid content of the colored curable composition.

The mass ratio of the compound represented by formula (1) to the polymerizable monomer in the colored curable composition (compound represented by formula (1): polymerizable monomer) is preferably from 1:2 to 20:1, and more preferably from 1:1 to 20:1, from the viewpoint of forming a thin film.

<Radiation-Sensitive Compound>

The colored curable composition according to the invention suitably includes at least one kind of radiation-sensitive compound. The radiation-sensitive compound is a compound capable of causing chemical reaction, such as generating radicals, acid or base, upon exposure to UV light of 400 nm or less. The radiation-sensitive compound is used for the purpose of insolubilizing the binder by causing reaction such as cross-linking, polymerization or decomposition of acidic groups, or insolubilizing the coating film with respect to an alkali developer by inducing polymerization of a polymerizable monomer or oligomer remaining in the coating film or causing cross-linking of the cross-linking agent.

In particular, when the colored curable composition is a negative-working composition, it preferably includes a photopolymerization initiator; and when the colored curable composition is a positive-working composition, it preferably includes a naphthoquinone diazide compound.

(Photopolymerization Initiator)

In the following, a photopolymerization initiator included in the colored curable composition according to the invention, which is included when the composition is negative-working, will be described.

The photopolymerization initiator is not specifically limited as long as it can cause polymerization of the polymerizable monomer, but is preferably selected from the viewpoints of its properties, initiation efficiency, absorption wavelength, availability, costs and the like.

The photopolymerization initiator may be included also in a positive-working composition containing a naphthoquinone diazide compound. In that case, the curing degree of the formed pattern may be further promoted.

Examples of these photopolymerization initiators and naphthoquinone diazide compounds include the compounds described in paragraphs [0260] to [0271] of JP-A No. 2008-292970 as described above.

Examples of the photopolymerization initiator include at least one active halogen compound selected from halomethyl oxadiazole compounds and halomethyl-s-triazine compounds, 3-aryl-substituted cuimarin compounds, lophine dimers, benzophenone compounds, acetophenone compounds and derivatives thereof, cyclopentadiene-benzene-iron complexes and salts thereof, and oxime compounds. Specific examples of the photopolymerization initiator include the compounds described in paragraphs [0070] to [0077] of JP-A No. 2004-295116. Among these, from the viewpoint of causing rapid polymerization reaction, oxime compounds are preferred.

The oxime compounds (hereinafter, also referred to as oxime photopolymerization initiators) are not particularly limited, and examples thereof include oxime compounds described in JP-A No. 2000-80068, WO 02/100903 A1 and JP-A No. 2001-233842.

Specific examples of the oxime compound include 2-(o-benzolyloxime)-1-[4-(phenylthio)phenyl]-1,2-butanedione, 2-(o-benzolyloxime)-1-[4-(phenylthio)phenyl]-1,2-pentandione, 2-(o-benzolyloxime)-1-[4-(phenylthio)phenyl]-1,2-hexanedione, 2-(o-benzolyloxime)-1-[4-(phenylthio)phenyl]-1,2-heptanedione, 2-(o-benzolyloxime)-1-[4-(phenylthio)phenyl]-1,2-octanedione, 2-(o-benzolyloxime)-1-[4-(methylphenylthio)phenyl]-1,2-butanedione, 2-(o-benzolyloxime)-1-[4-(ethylphenylthio)phenyl]-1,2-butanedione, 2-(o-benzolyloxime)-1-[4-(butylphenylthio)phenyl]-1,2-butanedione, 1-(o-acetyloxime)-1-[9-ethyl-6-

(2-methylbenzoyl)-9H-carbazol-3-yl]ethanone, 1-(o-acetyloxime)-1-[9-ethyl-6-(2-methylbenzoyl)-9H-carbazol-3-yl]ethanone, 1-(o-acetyloxime)-1-[9-propyl-6-(2-methylbenzoyl)-9H-carbazol-3-yl]ethanone, 1-(o-acetyloxime)-1-[9-ethyl-6-(2-ethylbenzoyl)-9H-carbazol-3-yl]ethanone, and 1-(o-acetyloxime)-1-[9-ethyl-6-(2-butylbenzoyl)-9H-carbazol-3-yl]ethanone. However, the oxime compounds are not limited thereto.

Among these, from the viewpoint of obtaining a pattern having a favorable shape (in particular, having favorable rectangularity for solid-state image sensors) with a reduced exposure amount, oxime-o-acyl compounds, such as 2-(o-benzolyloxime)-1-[4-(phenylthio)phenyl]-1,2-octanedione and 1-(o-acetyloxime)-1-[9-ethyl-6-(2-butylbenzoyl)-9H-carbazol-3-yl]ethanone are particularly preferred. Specific examples thereof include CGI-124 and CGI-242 (trade names, manufactured by BASF Japan, Ltd.)

Further, in the invention, from the viewpoint of sensitivity, temporal stability or colorability during post heating, the oxime compound is more preferably selected from compounds represented by the following formula (1) or (ii).

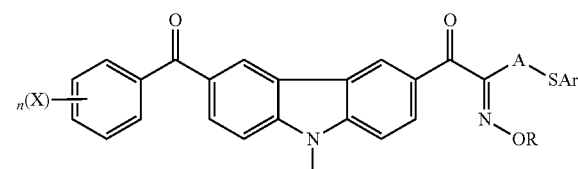

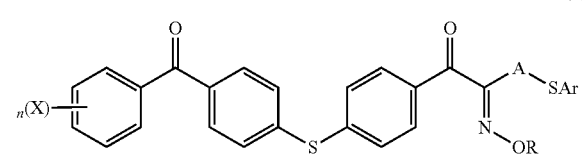

In formulae (i) and (ii), R and X each independently represent a monovalent substituent, A represents a divalent organic group, Ar represents an aryl group, and n represents an integer of from 1 to 5.

From the viewpoint of increasing sensitivity, R is preferably an acyl group, specifically an acetyl group, a propionyl group, a benzoyl group or a toluoyl group.

From the viewpoint of increasing sensitivity and suppressing coloring due to heat or time, A is preferably an unsubstituted alkylene group, an alkylene group substituted by an alkyl group (such as a methyl group, an ethyl group, a tert-butyl group or a dodecyl group), an alkylene group substituted by an alkenyl group (such as a vinyl group or an allyl group), or an alkylene group substituted by an aryl group (such as a phenyl group, a p-tolyl group, a xylyl group, a cumenyl group, a naphtyl group, an anthryl group, a phenanthryl group or a styryl group).

From the viewpoint of increasing sensitivity and suppressing coloring due to heat or time, Ar is preferably a substituted or unsubstituted phenyl group. When the phenyl group is substituted, the substituent is preferably, for example, a halogen atom such as a fluorine atom, a chlorine atom, a bromine atom or an iodine atom.

From the viewpoint of improving solubility in a solvent and absorption efficiency in a long wavelength region, X is preferably an alkyl group that may have a substituent, an aryl group that may have a substituent, an alkenyl group that may have a substituent, an alkynyl group that may have a substituent, an alkoxy group that may have a substituent, an aryloxy group that may have a substituent, an alkylthioxy group that may have a substituent, an arylthioxy group that may have a substituent, and an amino group that may have a substituent.

n in formulae (i) and (ii) is preferably an integer of 1 or 2.

The following are specific examples of the compounds represented by formula (1) or formula (ii), but the invention is not limited thereto.

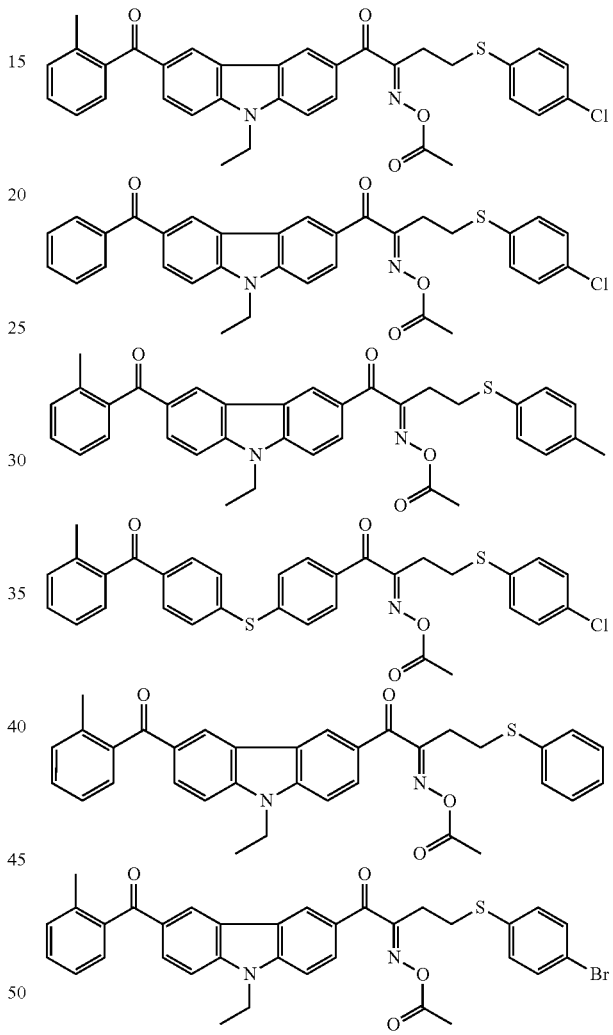

In addition to the aforementioned photopolymerization initiators, other known photopolymerization initiators described in paragraph [0079] of JP-A No. 2004-295116 may also be used in the colored curable composition according to the invention.

When the colored curable composition is negative-working, the content of the photopolymerization initiator in the colored curable composition is preferably from 0.01% by mass to 50% by mass, more preferably from 1% by mass to 30% by mass, and particularly preferably from 1% by mass to 20% by mass, with respect to the solid content of the polymerizable monomer. When the content falls in this range, favorable progression of polymerization and favorable film strength can be realized.

When the colored curable composition is positive-working, the alkali-soluble phenol resin and the cross-linking agent are usually preferably dissolved in an organic solvent in an amount of from about 2% by mass to 50% by mass, and from about 2% by mass to 30% by mass, respectively. The naphthoquinone diazide compound and the at least one compound (pigment) selected from the compounds represented by formula (1) or formula (2) or tautomers thereof are preferably added in an amount of from about 2% by mass to 30% by mass, and from 2% by mass to 50% by mass, respectively, with respect to the solution in which the binder and the cross-linking agent are dissolved.

<Solvent>

In preparing the colored curable composition according to the invention, the composition may generally contain a solvent. The solvent to be used is not specifically limited so long as it satisfies the requirements in terms of solubility of respective components of the composition or coating suitability of the photosensitive colored curable composition, but is particularly preferably selected in view of solubility, coating suitability and safety of the binder.

Examples of the solvents include solvents in paragraph [0272] of JP-A No. 2008-292970 as described above.

Among them, methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether, propylene glycol methyl ether acetate, and the like are more preferred.

<Surfactant>

From the viewpoint of further improving coating suitability, a surfactant may be added to the colored curable composition according to the invention. Examples of the surfactant include fluorinated surfactants, nonionic surfactants, cationic surfactants, anionic surfactants and silicone surfactants.

In particular, by including a fluorinated surfactant, liquid properties (fluidity, in particular) of the colored curable composition according to the invention is further improved. As a result, uniformity of the obtained coating can be improved and the amount of liquid to be used can be reduced.

Specifically, when a coating is formed by using a coating liquid including a colored curable composition containing a fluorinated surfactant, wetting properties of the coating liquid with respect to the surface to be coated is improved by lowering the surface tension therebetween, thereby improving the coating suitability to the surface to be coated. Accordingly, a film having a uniform thickness can be more suitably formed even when forming a thin film with a thickness of as small as a few micrometers by using a small amount of coating liquid.

The content of fluorine in the fluorinated surfactant is preferably from 3% by mass to 40% by mass, more preferably from 5% by mass to 30% by mass, particularly preferably from 7% by mass to 25% by mass. When the content of fluorine is within this range, a coating film having a uniform thickness can be effectively obtained and the amount of liquid to be used can be effectively reduced, as well as favorable solubility in the colored curable composition can be achieved.

Examples of the fluorinated surfactant include MEGAFAC F171, F172, F173, F176, F177, F141, F142, F143, F144, R30, F437, F475, F479, F482, F554, F780 and F781 (trade names, manufactured by DIC Corporation); FLUORAD FC430, FC431 and FC171 (trade names, manufactured by Sumitomo 3M Limited); SURFLON S-382, SC-101, SC-103, SC-104, SC-105, SC1068, SC-381, SC-383, SC-393 and KH-40 (trade names, manufactured by Asahi Glass Co., Ltd.); and SOLSPERSE 2000 (trade name, manufactured by the Lubrizol Corporation).

Specific examples of the nonionic surfactant include glycerol, trimethylol propane, trimethylol ethane, and ethoxylates and propoxylates of these compounds (such as glycerol propoxylate and glycerin ethoxylate), polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate and sorbitan fatty acid ester (PLURONIC L10, L31, L61, L62, 10R5, 17R2 and 25R2, TETRONIC 304, 701, 704, 901, 904 and 150R1, trade names, manufactured by BASF Japan Ltd.)

Specific examples of the cationic surfactant include phthalocyanine derivatives (trade name: EFKA-745, manufactured by Morishita & Co., Ltd.), organosiloxane polymer (trade name: KP341, manufactured by Shin-Etsu Chemical Co., Ltd.), (meth)acrylic (co)polymers (POLYFLOW Nos. 75, 90 and 95, trade name, manufactured by Kyoeisha Chemical Co., Ltd.) and WO01 (trade name, available from Yusho Co., Ltd.)

Specific examples of the anionic surfactant include WO04, WO05 and WO17 (trade names, available from Yusho Co., Ltd.)

Specific examples of the silicone surfactant include TORAY SILICONE DC3PA, TORAY SILICONE SH21PA, TORAY SILICONE SH28PA, TORAY SILICONE SH29PA, TORAY SILICONE SH30PA and TORAY SILICONE SH8400 (trade names, manufactured by Dow Corning Toray Co., Ltd.); TSF-4440, TSF-4300, TSF-4445, TSF-4460 and TSF-4452 (trade names, manufactured by Momentive Performance Materials Inc.); KP341, KF6001 and KF6002 (trade names, manufactured by Shin-Etsu Chemical Co., Ltd.); and BYK307, BYK323 and BYK330 (trade names, manufactured by BYK Japan KK).

The surfactant may be used singly or in combination of two or more kinds thereof.

The amount of the surfactant to be added is preferably from 0.001% by mass to 2.0% by mass, more preferably from 0.005% by mass to 1.0% by mass, with respect to the colored curable composition.

<Polymerization Inhibitor>

In order to inhibit unnecessary heat polymerization of polymerizable monomers during production or storage of the colored curable composition, it is preferred to add a small amount of polymerization inhibitor.

Specific examples of the polymerization inhibitor that may be used in the invention include hydroquinone, p-methoxyphenol, di-t-butyl-p-cresol, pyrogallol, t-butyl catechol, benzoquinone, 4,4'-thiobis(3-methyl-6-t-butylphenol), 2,2'-methylenebis(4-methyl-6-t-butylphenol) and N-nitrosophenyl hydroxyamine primary cerium salt.

The amount of the polymerization inhibitor is preferably from about 0.01% by mass to 5% by mass with respect to the total mass of the composition.

<Additives>

As necessary, the colored curable composition according to the invention may further include additives such as fillers, polymer compounds other than the aforementioned polymer compounds, adhesion promoters, antioxidants, ultraviolet absorbing agents, and aggregation inhibitors. Examples of these additives include those described in paragraphs [0274] to [0276] of JP-A No. 2008-292970 as described above.

Method of Producing Colored Curable Composition

When the colored curable composition according to the invention is prepared, respective components of the composition described above may be mixed in a batch, or may be added separately after dissolving each component in a solvent. The order of adding the components or operation conditions during the blending are not specifically limited. All components may be dissolved in a solvent at once to prepare a composition, or as necessary, two or more solutions including respective components may be prepared in advance, and these solutions may be mixed to prepare a composition when used (applied).

The composition prepared as described above may be used after subjecting the same to separation filteration using a Millipore filter or the like having preferably a pore size of from 0.01 µm to 3.0 µm, more preferably from 0.05 µm to 0.5 nm.

The colored curable composition according to the invention can be preferably used for forming color pixels of a color filter used in liquid crystal displays (LCDs), organic EL devices or solid-state image sensors (such as CCDs or CMOSs). In particular, the colored curable composition can be preferably used for forming colored pixels for solid-state image sensors such as CCD and CMOS.

The colored curable composition according to the invention is particularly suitably used for forming color filters for solid-state image sensors in which a colored pattern having a microscopic size is formed in the form of a thin film, and a favorable rectangular cross-sectional profile is required.

Generally, when the size of a pixel pattern that forms the color filter (the side length of a pixel pattern when viewed from a direction of the normal line with respect to the substrate) is 2 µm or less (for example, 0.5 µm to 2.0 µm), properties concerning formation of the pattern may be impaired as a result of increasing the amount of the colorant, or the lowered line-width sensitivity due to a bluish color hue that causes narrower DOF margins. This tendency is particularly significant when the size of pixel pattern is from 1.0 µm to 1.7 µm (further, from 1.2 µm to 1.5 µm). Moreover, when the film thickness is as small as 1 µm or less, the amount of components that contribute to photolithography properties other than the colorant in the film is relatively decreased, due to the relatively increased amount of the colorant, thereby reducing the sensitivity and making it easier to cause exfoliation of the pattern in a region with a low exposure amount. In such a case, thermal sagging is easily caused when performing thermal treatment such as post-baking. These problems are particularly significant when the film thickness is from 0.005 µm to 0.9 µm (further, from 0.1 µm to 0.7 µm).

However, when the colored curable composition according to the invention is used, a favorable pattern can be formed even with a pixel pattern size of as small as 2 µm or less as described above, and a color filter having a favorable cross-sectional profile can be produced.

(2) Resist Liquid

The resist liquid according to the invention can de defined in the same manner as the colored curable composition described above, and preferred ranges of the compound represented by formula (1) in the resist liquid according to the invention are also the same.

(3) Ink for Inkjet Printing

In the following, a colored curable composition suitably used in an inkjet method will be described.

The ink for inkjet printing in which the compound represented by formula (1) described above is used exhibits excellent storage stability, and suppressed aggregation, decomposition or the like of the compound in the ink. Further, when the ink for inkjet printing are discharged either in a continuous or intermittent manner, occurrence of discharge disorders, such as misdirection of ink droplets or defective discharge, is suppressed and excellent storage stability is achieved. Accordingly, the ink exhibits favorable recoverbility after a discharge intermission for a certain period or time, or favorable recoverbility from defective discharge.

<Compound Represented by Formula (1)>

The total content of the compound represented by formula (1) in the ink for inkjet printing is preferably from 1% by mass to 20% by mass, and more preferably from 5% by mass to 15% by mass, with respect to the total amount of the ink. When the content is less than 1% by mass, the film thickness may need to be increased in order to achieve an optical density necessary for a color filter. This is not preferred because the black matrix also needs to be thick, which makes it difficult to form the same. When the content exceeds 20% by mass, ink viscosity may be increased and discharge may become difficult, and further, it may become difficult to dissolve the compound in a solvent.

<Solvent>

The ink for inkjet printing according to the invention contains a solvent. The solvent is not specifically limited so long as it satisfies the requirements concerning the solubility of respective components or the boiling point of the solvent as described later, but the solvent is preferably selected in view of solubility, coating suitability and safety of the binder as described later. Examples of the solvent include those described in paragraphs [0030] to [0040] of JP-A No. 2009-13206.

The content of the solvent in the ink for inkjet printing according to the invention is preferably from 30% by mass to 90% by mass, more preferably from 50% by mass to 90% by mass, with respect to the total amount of the ink. When the content is 30% by mass or more, the amount of ink discharged per pixel is maintained, and wet-spreading of the ink in the pixel is favorable. Further, when the content is 90% by mass or less, predetermined amounts of components other than the solvent used for forming a functional film (such as pixels) in the ink can be maintained. In that case, when forming a color filter, the amount of ink per pixel does not increase too much, whereby occurrence of ink overflow from concave portions or color mixing among adjacent pixels can be suppressed, for example, when the ink is applied by an inkjet method to concave portions defined by partition walls.

Among the aforementioned solvents, the ink for inkjet printing according to the invention preferably contains a solvent having a high boiling point, from the viewpoint of ink discharge properties with respect to nozzles and wettability with respect to a substrate. Since a solvent having a low boiling point quickly evaporates even on an inkjet head, it may easily cause increase in ink viscosity or precipitation of solid contents on the head, which is often accompanied by degradation in discharge performances. Further, even when the ink deposited on a substrate surface wet-spreads thereon, the wet-spreading may be suppressed in some cases due to a pinning phenomenon in which the solvent evaporates at the edge of the wet-spread portion, and thus the ink viscosity is increased.

The boiling point of the solvent used in the invention is preferably from 130° C. to 280° C. When the boiling point is lower than 130° C., in-plane uniformity in the shape of pixels may be unfavorable. When the boiling point is higher than 280° C., removal of solvent by pre-baking may not be favorably performed. The boiling point of a solvent here refers to a boiling point under pressure of 1 atm, and specific values thereof can be found in a physical values table described in the Chemical Database (published by Chapman & Hall), or the like. The solvent may be used singly or in combination of two or more kinds.

Further, when the ink for inkjet printing described above does not contain the polymerizable monomer described later, or the like, the thickness of residual portions of ink (color pixels) obtained by removing the solvent contained in the ink may be reduced. This is preferred in view of costs and productivity, since the height of partition walls formed on the substrate in order to prevent color mixing or the like can be lowered.

<Polymerizable Monomer>

The ink for inkjet printing according to the invention may contain a polymerizable monomer. By adding a polymerizable monomer, adhesiveness of ink droplets to the substrate can be increased. In addition, improvements in dispersion uniformity in the ink of the compound represented by the aforementioned formulae or fastness such as weather resistance or heat resistance can be expected. The polymerizable monomer is not specifically limited, but preferably includes at least one selected from (meth)acryl-based monomers, epoxy-based monomers and oxetanyl-based monomers, due to a wide variety of substituents and availability.

The polymerizable monomer is preferably a monomer (hereinafter, referred to as "bifunctional or more monomer") having two or more of polymerizable groups. The polymerizable monomer is not specifically limited so long as a polymerization reaction by active energy ray and/or heat can be carried out, but it is more preferably a monomer (hereinafter, referred to as "trifunctional or more monomer") having three or more polymerizable groups from the viewpoint of film strength or solvent resistance.

The type of the polymerizable group is not specifically limited, but, as described above, an acryloyloxy group, a methacryloyloxy group, an epoxy group, and an oxetanyl group are specifically preferred. Examples of the polymerizable monomer include the compounds described in paragraphs [0054] to [0068] of JP-A No. 2009-13206.

The content of the polymerizable monomer described above is preferably 30% by mass to 80% by mass in the solid content of the ink for inkjet printing, and more preferably 40% by mass to 80% by mass. When the amount of the monomer to be used is in the above range, sufficient polymerization in pixel portions mat be achieved, and scratches resulting from insufficient film strength of the pixel portions are not easily formed. Further, effects such as suppressed occurrence of cracking or reticulation upon application of a transparent conductive film, improvements in solvent resistance during providing an alignment film, and suppressed lowering of voltage retention ratio may be achieved. In the present specification, the solid content of the ink for inkjet printing that specifies the blend ratio includes all components except for the solvent, and a polymerizable monomer in the form of a liquid or the like is also included in the solid content.

<Binder Resin>

The ink for inkjet printing according to the invention may contain a binder resin for the purpose of adjusting its viscosity, hardness or the like. It is possible to use a binder resin formed of only a resin not having polymerization reactivity by itself that can solidify by simply drying the same, as the binder resin. However, in order to impart sufficient strength, durability and adhesiveness to the coating film, it is preferred to use a binder resin that can be cured by polymerization reaction after forming a pixel pattern on a substrate by an inkjet method. Examples of the binder resin that can be cured by polymerization include photo-curable binder resins that can be cured by visible rays, ultraviolet rays or electron beams, and thermal-curable binder resins that can be cured by polymerization upon application of heat.

<Polymerization Initiator>

The ink for inkjet printing according to the invention may be used with a polymerization initiator in combination, in order to promote polymerization reaction of a polymerizable monomer and a binder resin. The polymerization initiator can be selected according to the type of the polymerizable monomer and a binder to be used in the ink for inkjet printing, or the polymerization route.

<Curing Agent>

A curing agent is generally used in combination with an epoxy-based monomer (epoxy group-containing monomer) or a heat-curable binder resin. As the curing agent, curing agents and promoters described in Chapter 3 of "Review of Epoxy Resin—Basic Edition I" (published by the Japan Society of Epoxy Resin Technology, Nov. 19, 2003), such as multivalent carboxylic anhydrides and multivalent carboxylic acids, may be suitably used.

<Surfactant>

A surfactant may be used in the ink for inkjet printing according to the invention. Preferable examples of the surfactant include the surfactants disclosed in paragraph [0021] of JP-A No. 7-216276, and the surfactants disclosed in JP-A No. 2003-337424 and JP-A No. 11-133600. The content of the surfactant is preferably 5% by mass or less with respect to the total amount of the colored curable composition.

Other additives include the additives described in paragraph [0058] to [0071] of JP-A No. 2000-310706.

The total content of at least one selected from the compounds represented by formula (1) is preferably from 1% by mass to 20% by mass, and more preferably from 5% by mass to 15% by mass; the content of the solvent is preferably from 30% by mass to 90% by mass, and more preferably from 50% by mass to 85% by mass; the content of the polymerizable monomer is preferably from 5% by mass to 50% by mass, and more preferably from 7% by mass to 30% by mass; and the content of the surfactant is preferably from 0.1% by mass to 5% by mass.

<Method of Producing Ink for Inkjet Printing>

The ink for inkjet printing according to the invention can be produced by a known method of producing an ink for inkjet printing. For example, the ink for inkjet printing can be prepared by dissolving the compound represented by formula (1) in a solvent, and then dissolving other components necessary for the ink for inkjet printing (such as a polymerizable monomer or a binder) in the solvent.

In preparing a monomer solution, if the materials have a low solubility with respect to the solvent, a treatment such as heating or ultrasonic treatment may be performed as appropriate within a range in which the monomer solution does not cause polymerization reaction.

When the compound represented by formula (1) is dispersed in an aqueous medium, colored fine particles containing the compound represented by the formula and an oil-soluble polymer may be dispersed in an aqueous medium, as described in JP-A No. 11-286637, JP-A No. 2001-240763 (Japanese Patent Application No. 2000-78491), JP-A No. 2001-262039 (Japanese Patent Application No. 2000-80259) or JP-A No. 2001-247788 (Japanese Patent Application 2000-62370); or the compound represented by the formula that is dissolved in an organic solvent having a high boiling point may be dispersed in an aqueous medium, as described in JP-A No. 2001-262018 (Japanese Patent Application No. 2000-78454), JP-A No. 2001-240763 (Japanese Patent Application No. 2000-78491) or JP-A No. 2001-335734 (Japanese Patent Application No. 2000-203856). The specific method of dispersing the compound represented by formula (1) in an aqueous medium and the type and the amount of an oil soluble polymer, an organic solvent having a high boiling point and an additive described in these references are suitably applied to the invention. Alternatively, the compound represented by the formula may be dispersed as a solid, in the form of fine particles. During performing dispersion, a dispersant or a surfactant may be used.

<Physical Values of Ink for Inkjet Printing>

The physical values of the ink for inkjet printing according to the invention are not specifically limited so long as the ink can be discharged by using an inkjet head, but the viscosity of the ink at the time of discharging the same is preferably from 2 mPa·s to 30 mPa·s, and more preferably from 2 mPa·s to 20 mPa·s, from the viewpoint of discharge stability. Further, when the ink is discharged by using an apparatus, the temperature of the ink for inkjet printing is preferably maintained at a substantially constant degree in a range of from 20° C. to 80° C. When the temperature of the apparatus is set to a high temperature, ink viscosity is reduced and discharge of ink having a higher viscosity is made possible. However, as the temperature is increased, denaturing of ink due to heat or thermal polymerization reaction may occur in the inkjet head, or nozzle clogging may easily occur since the solvent easily evaporates at the surface of the nozzle from which the ink is discharged. Accordingly, the temperature of the apparatus is preferably in a range of from 20° C. to 80° C.

The viscosity mentioned in this specification is a value measured by using an E-type viscometer (for example, RE-80L (trade name) produced by Toki Sangyo Co., Ltd) while maintaining the temperature of the ink for inkjet printing at 25° C.

The surface tension (static surface tension) of the ink for inkjet printing at 25° C. is preferably from 20 mN/m to 40 mN/m, and more preferably from 20 mN/m to 35 mN/m, from the viewpoint of improving wettability with respect to a non-permeable substrate and discharge stability. Further, when the ink is discharged by using an apparatus, the temperature of the ink for inkjet printing is preferably maintained at a substantially constant temperature in a range of from 20° C. to 80° C., and the surface tension at this time is preferably from 20 mN/m to 40 mN/m. In order to maintain the temperature of the ink for inkjet printing at a constant level with a predetermined accuracy, the apparatus preferably includes an ink temperature detection unit, an ink heating or cooling unit, and a unit for controlling the heating or cooling according to the temperature of the detected ink. Alternatively, the apparatus may include a unit for reducing the effects on changes in physical properties of the ink by controlling the energy applied to an ink discharge unit according to the temperature of the ink.

The surface tension described above is generally a value measured by a Wilhelm's method using a surface tensiometer (for example, CBVB-A3, trade name, produced by Kyowa Interface Science Co., Ltd.) at a liquid temperature of 25° C. and 60% RH.

Further, in order to maintain a favorable shape of the ink for inkjet printing while it is wet-spreading after being deposited onto the substrate, it is preferred to maintain liquid physical properties of the ink for inkjet printing after being deposited onto the substrate to be within predetermined ranges. In order to achieve this, it is preferred to retain the temperature of the substrate and/or the portion in the vicinity of the substrate to be in a predetermined range. Alternatively, it is also effective to reduce the effects of temperature changes by increasing heat capacity of the support that supports the substrate.

(4) Color Filter and Method for Producing the Same

In the following, a method for producing a color filter using the colored curable composition according to the invention (method for producing a color filter according to the invention) will be described.

Examples of the method for forming a pattern by photolithography using the colored curable composition according to the invention include the method described in paragraphs [0277] to [0284] of JP-A No. 2008-292970.

Specific examples of this method includes a method for producing a color filter, the method including a step of applying the colored curable composition on a substrate to form a layer; a step of exposing the layer formed from the colored curable composition to light through a mask; and a step of forming a pattern image by developing the same after the exposure.

In the method of producing the color filter according to the invention, the colored curable composition according to the invention as described above is coated on a substrate by a coating method such as rotary coating, casting coating or roll coating, thereby forming a colored curable composition layer, and thereafter, pre-curing (pre-baking) is performed as necessary, and the colored curable composition is dried (coating process).

Examples of the substrate to be used in the method of producing a color filter according to the invention include those used in liquid crystal displays such as soda glass, borosilicate glass (PYREX (trademark)), quartz glass, and these materials to which a transparent conductive film is attached; photoelectric conversion device substrates used in solid-state image sensors such as a silicon substrate; and complementary metal oxide semiconductor (CMOS) substrates. These substrates may have black stripes for isolating the pixels from each other. Further, as necessary, an undercoating layer may be provided for the purpose of improving adhesion with respect to an upper layer, preventing diffusion of materials, or flattening the surface.

Further, when the colored curable composition is coated on a substrate by rotary coating, compatibility of the colored curable composition with respect to the substrate can be improved by dropping a suitable organic solvent and rotating the substrate prior to the dropping of the colored curable composition, in order to reduce the dropping amount of the liquid.

The conditions for the pre-baking include heating at 70° C. to 130° C. for about 0.5 minutes to 15 minutes, using a hot plate or an oven.

The thickness of the colored curable composition layer formed by the colored curable composition is selected according to purposes, but it is generally preferably from 0.2 μm to 5.0 μm, more preferably from 0.3 μm to 2.5 μm, and most preferably from 0.3 μm to 1.5 μm. Further, the thickness of the colored curable composition layer mentioned here is a thickness after pre-baking.

Subsequently, in a method of producing the color filter according to the invention, exposure of the colored curable composition layer formed on the substrate is carried out through a mask (exposure process).

Preferred examples of the light or radiation rays which can be applied to the exposure include g-line, h-line, i-line, KrF light and ArF light, and i-line is particularly preferred. When i-line is used as the irradiation light, the exposure amount thereof is preferably from 100 mJ/cm$^2$ to 10,000 mJ/cm$^2$.

The exposed colored curable composition layer may be heated using a hot plate or an oven before the following development treatment at 70° C. to 180° C. for about 0.5 minutes to 15 minutes.

The exposure may be carried out while allowing a nitrogen gas to flow in a chamber in order to suppress discoloration of the colorant in the colored curable composition layer due to oxidization.

Subsequently, development is carried out using a developer with respect to the colored curable composition layer after being exposed (development process). By performing the development, a negative or positive colored pattern (resist pattern) can be formed.

The developer may be a combination of organic solvents or an aqueous alkali solution, so long as it dissolves an uncured portion (unexposed portion) of the colored curable composition layer while not dissolving a cured portion (exposed portion). When the developer is an aqueous alkali solution, the alkali concentration is preferably adjusted such that the pH is from 11 to 13, further preferably from 11.5 to 12.5. In particular, an aqueous alkali solution in which the concentration of tetraethyl ammonium hydroxide is adjusted to be from 0.001% by mass to 10% by mass, preferably 0.01% by mass to 5% by mass, may be used as the developer.

The time for development is preferably from 30 seconds to 300 seconds, further preferably from 30 seconds to 120 seconds. The temperature for development is preferably from 20° C. to 40° C., further preferably 23° C.

The development can be carried out by a paddle method, a shower method or a spray method.

Further, it is preferred to wash the pattern with water after the development, using an aqueous alkali solution. The method for washing is selected according to purposes. For example, a rinse treatment can be carried out by supplying pure water from spraying nozzles in the form of a shower from above the center of rotation while rotating the substrate such as a silicon wafer substrate at a rotation speed of from 10 rpm to 500 rpm.

Thereafter, as necessary, post-heating and/or post-exposure may be carried out with respect to the formed pattern (resist pattern) in order to promote curing of the pattern (post-curing process).

Ultraviolet Ray Irradiation Process

In the ultraviolet ray irradiation process, the pattern formed in the aforementioned development process is exposed to ultraviolet light (UV light) in an irradiation light amount [mJ/cm$^2$] of at least ten times more than the exposure amount [mJ/cm$^2$] in the exposure treatment performed before the development. By exposing the pattern to UV light for a certain period of time between the development process and the later-described heating process, color transfer caused by subsequent heating can be effectively suppressed.

Examples of the UV light source which may be used include an ultra-high pressure mercury lamp, a high pressure mercury lamp, a low pressure mercury lamp, and deep UV lamp. Among them, a light source that emits light in which the ratio of light having a wavelength of 275 nm or less is at least 5% with respect to the integral irradiation illuminance of the total light of all wavelengths is preferred. In that case, effects of suppressing color transfer among the color pixels or between the upper and lower layers, and improving light fastness may be effectively improved. From this point of view, it is preferred to use a light source different from the light source that emits bright rays such as i-line used in the exposure in the pattern forming process, specifically, a high pressure mercury lamp, a low pressure mercury lamp, or the like. Among them, for the reasons as mentioned above, the ratio of light having a wavelength of 275 nm or less is preferably 7% with respect to the integral irradiation illuminance of the total light of all wavelengths, and preferably 25% or less.

The integral irradiation illuminance refers to the sum (area) of illuminances of light of wavelengths contained in the irradiation light, which is expressed by a curve in which the vertical axis represents the illuminances of each spectral wavelength (radiation energy that passes a unit area at a unit time; (mW/m$^2$)) and the horizontal axis represents the wavelength of light (nm).

The UV light irradiation is carried out at an irradiation light amount (mJ/cm$^2$) of at least ten times more than the exposure amount of the exposure in the pattern forming process. When the irradiation light amount in the present process is less than ten times, it may not be possible to suppress-color transfer among the colored pixels or between the upper and lower layers.

Among them, an irradiation light amount of UV light is preferably from 12 times to 200 times as much as the exposure amount at the time of exposure in the pattern forming process, and more preferably from 15 times to 100 times.

In this case, the integral irradiation illuminance of the irradiated ultraviolet light is preferably 200 mW/cm$^2$ or more. When the integral irradiation illuminance is 200 mW/cm$^2$ or more, effects of suppressing color transfer among the colored pixels or between the upper or lower layers, and improving light fastness, may be even more effectively improved. The integral irradiation illuminance of the irradiated ultraviolet light is more preferably from 250 mW/cm$^2$ to 2000 mW/cm$^2$, and yet more preferably from 300 mW/cm$^2$ to 1000 mW/cm$^2$.

The post-heating is preferably performed by using a hot plate or an oven at 100° C. to 300° C., more preferably 150° C. to 250° C. The time for post-heating time is preferably from 30 seconds to 30,000 seconds, and more preferably from 60 seconds to 1,000 seconds.

The post-exposure can be carried out by using g-line rays, h-line rays, i-line rays, KrF light, ArF light, UV light, electron rays, X-rays, or the like, but g-line rays, h-line rays, i-line rays and UV light are preferred, and in particular, UV light is preferred. When UV radiation (UV curing) is performed, it is preferably carried out at a low temperature of from 20° C. to 50° C. (preferably from 25° C. to 40° C.). The wavelength of UV light preferably contains a wavelength having a range of from 200 nm to 300 nm. Examples of the light source which may be used include a high pressure mercury lamp and a low pressure mercury lamp. The time for irradiation is preferably from 10 seconds to 180 seconds, more preferably from 20 seconds to 120 seconds, and further preferably from 30 seconds to 60 seconds.

Which of the post-exposure or the post-heating is to be carried out first is not particularly limited, but it is preferred to perform the post-exposure prior to the post-heating. By performing the post-exposure to promote the curing, deformation of the pattern due to heat sagging or bottom trailing, which may be seen during the subsequent post-heating, can be suppressed.

The colored pattern thus obtained constitutes pixels in a color filter. When producing a color filter having pixels of plural colors, the pattern forming process (and as necessary, curing process) as mentioned above is repeated for a number of times of the colors of the pixels.

Further, examples of a method of producing the color filter include a method in which inkjet is employed. The method of producing the color filter by the inkjet method is not specifically limited, but includes preparing a substrate having concave portions defined by walls, and applying droplets of the ink to the concave portions by an inkjet method to form color pixels of the color filter. For example, the method described in paragraphs [0114] to [0128] in JP-A No. 2008-250188 may be used.

(5) Use of Color Filter of the Invention

The color filter according to the invention may have an indium tin oxide (ITO) layer as the transparent conductive film. Examples of the method of forming an ITO layer include an in-line low-temperature sputtering method, an in-line high-temperature sputtering method, a batch-type low-temperature sputtering method, a batch-type high-temperature sputtering method, a vacuum deposition method and a plasma CVD method. In particular, a low-temperature sputtering method is preferably used in order to reduce the damage to the color filter.

The color filter using the compound represented by formula (1) is applicable to liquid crystal displays, organic EL displays, liquid crystal projectors, games screens and portable terminals such as cellular phones digital cameras, car navigation system, and the like without particularly limited. The color filter according to the invention is particularly suitable for color image displays. Further, the color filter according to the invention is suitable as a color filter for solid-state image sensors such as CCD image sensors and CMOS image sensors, which are used in digital cameras, digital video cameras, endoscopes, cellular phones, and the like.

In particular, the color filter according to the invention is suitable for high-resolution CCD devices CMOS devices and the like having more than one million pixels. The configuration of the solid-state image sensor is not limited so long as it has the color filter according to the invention and functions as a solid-state image sensor. For example, the solid-state image sensor has a configuration in which a transfer electrode composed of a photodiode and polysilicon or the like that forms a light-receiving area is formed on a substrate, and a color filter layer and a microlens are provided thereon.

From the viewpoint of light discoloration of the colorant, a camera system having the color filter according to the invention preferably has a camera lens, a cover glass on which an IR-cut film is dichroic coated, a microlens or the like that is formed from a material having an optical property of absorbing part or the whole of UV light of 400 nm or less. Further, the camera system preferably has a structure in which oxygen permeability to the color filter is reduced in order to suppress oxidation discoloration of the colorant. For example, it is preferred that a portion or the whole body of the camera system is sealed with a nitrogen gas.

The above descriptions concerning the colored curable composition, the color filter and the production method thereof, and the displays and the solid-state image sensors using the same, with reference to various embodiments and the examples, are not intended to limit the scope of the invention, and various modifications or changes may be made within a range without departing from the spirit of the invention.

The following are exemplary embodiments of the invention. However, the invention is not limited to these exemplary embodiments.

<1> A colored curable composition comprising at least one of a compound represented by the following formula (1) or a tautomer of the compound: formula (1)

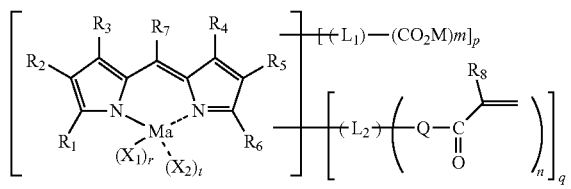

wherein in formula (1), $R_1$ to $R_6$ each independently represent a hydrogen atom or a substituent; $R_7$ represents a hydrogen atom, a halogen atom, an alkyl group, an aryl group or a heterocyclic group; a substituent represented by any of $R_1$ to $R_6$ is a divalent linking group bonded to -$L_1$- or -$L_2$-, or a substituent represented by any of $R_1$ to $R_6$ is a single bond and -$L_1$- or -$L_2$-directly substitutes the dipyrromethene skeleton; Ma represents a metal or a metal compound; $X_1$ represents a group to neutralize charges of Ma; $X_2$ represents a group capable of binding to Ma; r represents 0 or 1; t represents 0, 1 or 2; $X_1$ and $X_2$ may be bonded to each other to form a five, six or seven-membered ring; M represents a hydrogen atom, an organic base or a metal atom to neutralize charges of —$CO_2$—, or an anion (that is, $CO_2M$ represents $CO_2^-$); $L_1$ represents a single bond or a (m+1)-valent linking group; m represents 1, 2 or 3; p represents 1 or 2; $R_8$ represents a hydrogen atom or a methyl group; Q represents an oxygen atom or $NR_9$ ($R_9$ represents a hydrogen atom, an alkyl group, an alkenyl group, an aryl group, a heterocyclic group, an acyl group, an alkylsulfonyl group or an arylsulfonyl group); $L_2$ represents a single bond or an (n+1)-valent linking group; n represents 1, 2 or 3; q represents 1 or 2; when p is 2, the two of {($L_1$)-($CO_2M$)m} may be the same or different from each other; when q is 2, the two of {($L_2$)-(Q-COC($R_8$)=$CH_2$)n} may be the same or different from each other; when m is 2 or 3, the two or three of ($CO_2M$) may be the same or different from each other; and when n is 2 or 3, the two or three of (Q-COC($R_8$)=$CH_2$) may be the same or different from each other:

<2> The colored curable composition according to <1>, wherein the at least one of the compound represented by formula (1) or a tautomer of the compound is at least one of a compound represented by the following formula (2) or a tautomer of the compound represented by formula (2):

formula (2)

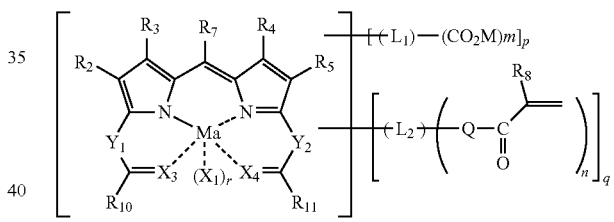

wherein in formula (2), $R_2$ to $R_5$ each independently represent a hydrogen atom or a substituent; $R_7$ represents a hydrogen atom, a halogen atom, an alkyl group, an aryl group or a heterocyclic group; $R_{10}$ and $R_{11}$ each independently represent an alkyl group, an alkenyl group, an aryl group, a heterocyclic group, an alkoxy group, an aryloxy group, an amino group, an anilino group or a heterocyclic amino group; a substituent represented by any of $R_2$ to $R_5$, $R_{10}$ or $R_{11}$ is a divalent linking group bonded to -$L_1$- or -$L_2$-, or a substituent represented by any of $R_2$ to $R_5$, $R_{10}$ or $R_{11}$ is a single bond and -$L_1$- or -$L_2$- directly substitutes the dipyrromethene skeleton; Ma represents a metal or a metal compound; $X_1$ represents a group to neutralize charges of Ma; r represents 0 or 1; $X_3$ and $X_4$ each independently represent NR (R represents a hydrogen atom, an alkyl group, an alkenyl group, an aryl group, a heterocyclic group, an acyl group, an alkylsulfonyl group or an arylsulfonyl group), a nitrogen atom, an oxygen atom or a sulfur atom; $Y_1$ and $Y_2$ each independently represent NR (R represents a hydrogen atom, an alkyl group, an alkenyl group, an aryl group, a heterocyclic group, an acyl group, an alkylsulfonyl group or an arylsulfonyl group) or an oxygen atom; $R_{10}$ and $Y_1$ may be bonded to each other to form a five, six or seven-membered ring; $R_{11}$ and $Y_2$ may be bonded to each other to form a five, six or seven-membered ring; M represents a hydrogen atom, or an organic base or a metal atom to neutralize charges of —$CO_2^-$, or an anion (i.e., $CO_2M$ represents $CO_2^-$); $L_1$ represents a single bond or a (m+1)-valent linking group; m represents 1, 2 or 3; p represents 1 or 2; $R_8$ represents a hydrogen atom or a methyl group; Q represents an oxygen atom or $NR_9$ ($R_9$ represents a hydrogen atom, an alkyl group, an alkenyl group, an aryl group, a heterocyclic group, an acyl group, an alkylsulfonyl group or an arylsulfonyl group); $L_2$ represents a single bond or an (n+1)-valent linking group; n represents 1, 2 or 3; q represents 1 or 2; when p is 2, the two of $\{(L_1)\text{-}(CO_2M)m\}$ may be the same or different from each other; when q is 2, the two of $\{(L_2)\text{-}(Q\text{-}COC(R_8)\text{=}CH_2)n\}$ may be the same or different from each other; when m is 2 or 3, the two or three of $(CO_2M)$ may be the same or different from each other; and when n is 2 or 3, the two or three of $(Q\text{-}COC(R_8)\text{=}CH_2)$ may be the same or different from each other.

<3> The colored curable composition according to <1> or <2>, wherein Ma in Formula (1) or Formula (2) is Fe, Zn, Co, V=O or Cu.

<4> The colored curable composition according to <1> or <2>, wherein Ma in Formula (1) or Formula (2) is Zn.

<5> A color filter formed by using the colored curable composition according to any one of <1> to <4>.

<6> A resist liquid comprising the colored curable composition according to any one of <1> to <4>.

<7> An ink for inkjet printing comprising the colored curable composition according to any one of <1> to <4>.

<8> A method of producing a color-filter, the method comprising:

forming a layer on a support by applying the colored curable composition according to any one of <1> to <4> to the support;

exposing the layer formed from the colored curable composition to light through a mask; and forming a patterned image by developing the layer formed from the colored curable composition after being exposed to light.

<9> The method of producing a color filter according to <8>, further comprising, after forming the patterned image by developing, subjecting the patterned image to ultraviolet irradiation.

<10> A method of producing a color filter, the method comprising forming color pixels of the color filter by depositing droplets the ink for inkjet printing according to <7> by an inkjet method to concave portions of a support, the concave portions being defined by partitions.

<11> A solid-state image sensor comprising the color filter according to <5>.

<12> A liquid crystal display comprising the color filter according to <5>.

<13> An organic EL display comprising the color filter according to <5>.

<14> An image display device comprising the color filter according to <5>.

<15> A colorant compound selected from the group consisting of a compound represented by the following formula (2) and a tautomer of the compound:

formula (2)

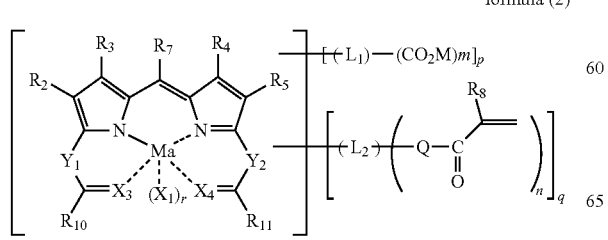

wherein in formula (2), $R_2$ to $R_5$ each independently represent a hydrogen atom or a substituent; $R_7$ represents a hydrogen atom, a halogen atom, an alkyl group, an aryl group or a heterocyclic group; $R_{10}$ and $R_{11}$ each independently represent an alkyl group, an alkenyl group, an aryl group, a heterocyclic group, an alkoxy group, an aryloxy group, an amino group, an anilino group or a heterocyclic amino group; a substituent represented by any of $R_2$ to $R_5$, $R_{10}$ or $R_{11}$ is a divalent linking group bonded to -$L_1$- or -$L_2$-, or a substituent represented by any of $R_2$ to $R_5$, $R_{10}$ or $R_{11}$ is a single bond and -$L_1$- or -$L_2$- directly substitutes the dipyrromethene skeleton; Ma represents a metal or a metal compound; $X_1$ represents a group to neutralize charges of Ma; r represents 0 or 1; $X_3$ and $X_4$ each independently represent NR (R represents a hydrogen atom, an alkyl group, an alkenyl group, an aryl group, a heterocyclic group, an acyl group, an alkylsulfonyl group or an arylsulfonyl group), a nitrogen atom, an oxygen atom or a sulfur atom; $Y_1$ and $Y_2$ each independently represent NR (R represents a hydrogen atom, an alkyl group, an alkenyl group, an aryl group, a heterocyclic group, an acyl group, an alkylsulfonyl group or an arylsulfonyl group) or an oxygen atom; $R_{10}$ and $Y_1$ may be bonded to each other to form a five, six or seven-membered ring; $R_{11}$ and $Y_2$ may be bonded to each other to form a five, six or seven-membered ring; M represents a hydrogen atom, or an organic base or a metal atom to neutralize charges of —$CO_2^-$, or an anion (i.e., $CO_2M$ represents $CO_2^-$); $L_1$ represents a single bond or a (m+1)-valent linking group; m represents 1, 2 or 3; p represents 1 or 2; $R_8$ represents a hydrogen atom or a methyl group; Q represents an oxygen atom or $NR_9$ ($R_9$ represents a hydrogen atom, an alkyl group, an alkenyl group, an aryl group, a heterocyclic group, an acyl group, an alkylsulfonyl group or an arylsulfonyl group); $L_2$ represents a single bond or an (n+1)-valent linking group; n represents 1, 2 or 3; q represents 1 or 2; when p is 2, the two of $\{(L_1)\text{-}(CO_2M)m\}$ may be the same or different from each other; when q is 2, the two of $\{(L_2)\text{-}(Q\text{-}COC(R_8)\text{=}CH_2)n\}$ may be the same or different from each other; when m is 2 or 3, the two or three of $(CO_2M)$ may be the same or different from each other; and when n is 2 or 3, the two or three of $(Q\text{-}COC(R_8)\text{=}CH_2)$ may be the same or different from each other.

EXAMPLES

In the following, the invention will be descried in further details with reference to the Examples. The materials, agents, proportions, apparatus or operations may be changed as appropriated as long as it does not depart from the scope of the invention. Accordingly, the scope of the invention is not limited to the following specific examples. Unless otherwise specified, "%" and "part" refer to "% by mass" and "part by mass", respectively, and the molecular weight refers to a weight-average molecular weight.

Example 1-1

Exemplary compound a-5 was synthesized in accordance with the following synthesis scheme.

(Synthesis Scheme of Exemplary Compound a-5)
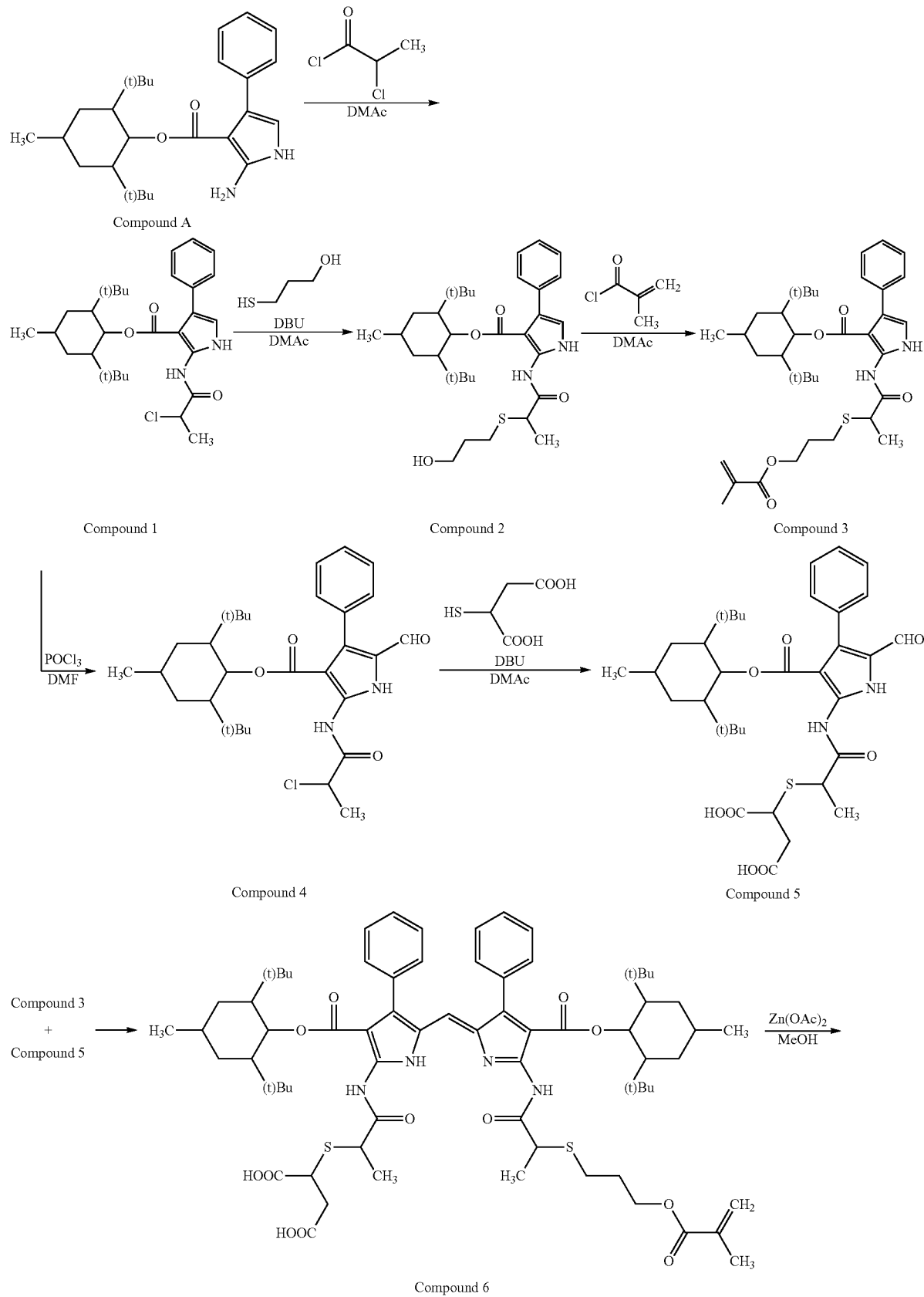

-continued

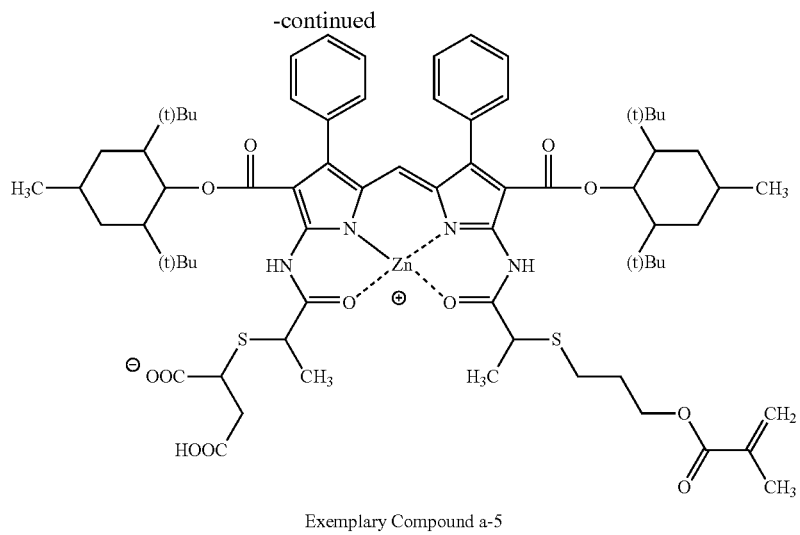

Exemplary Compound a-5

<Synthesis of Compound 1>

4.11 g of 2-aminopyrrole compound A in acetonitrile were stirred at room temperature, and 1.33 g of 2-chloropropionyl chloride were dropped therein and stirred for 30 minutes at room temperature. A precipitated crystal was separated by filtering and washed with 5 ml of acetonitrile, thereby obtaining Compound 1 (2.22 g).

Compound 1: $^1$H-NMR, 400 MHz, δ(CDCl$_3$) ppm: 0.45-1.58 (28H, m), 1.83-1.85 (3H, d), 4.57-4.6 (1H, q), 5.89 (1H, s), 6.35 (1H, s), 7.28-7.38 (5H, m), 10.78-10.82 (1H, br), 11.47-11.51 (1H, br).

<Synthesis of Compound 2>

Compound 1 (5 g) and 1.2 g of 3-mercapto-1-propanol were dissolved in 15 ml of dimethyl acetamide and stirred at room temperature. 1.82 g of DBU (1,8-diazabicyclo[5.4.0]undec-7-ene were dropped therein and stirred for 1 hour at room temperature. This reaction solution was poured in 200 ml of aqueous hydrochloric acid solution and extracted with 50 ml of ethyl acetate. The organic phase was dehydrated with 5 g of magnesium sulfate, and after filtering, the filtrate was condensed and dried to solidify. The residue was dispersion-washed with acetonitrile and a solid was collected by filtering. This solid was washed with 5 ml of acetonitrile, thereby obtaining Compound 2 (3.51 g).

Compound 2: $^1$H-NMR, 400 MHz, δ(CDCl$_3$) ppm: 0.45-1.29 (28H, m), 1.55-1.61 (3H, d), 1.84-1.92 (2H, m), 2.76-2.82 (2H, t), 3.56-3.71 (1H, q), 3.73-3.8 (2H, q), 5.89 (1H, s), 6.33 (1H, s), 7.27-7.38 (5H, m), 10.78-10.82 (1H, br), 11.36-11.42 (1H, br).

<Synthesis of Compound 3>

Compound 2 (30 g) and 0.1 of nitrobenzene were dissolved in 30 ml of dimethyl acetamide, and 14.1 g of methacrylic acid chloride were dropped therein and stirred for 4 hours at room temperature. This reaction solution were added to 1.2 L of water, and neutralized with 30 g of sodium hydrogen carbonate and extracted with 500 ml of ethyl acetate. The organic phase was dehydrated with 30 g of magnesium sulfate. After filtering, the filtrate was condensed and dried to solidify. The residue was dispersion-washed with 100 ml of acetonitrile, and a solid was collected by filtering. This solid was washed with 30 ml of acetonitrile, thereby obtaining Compound 3 (24.6 g).

Compound 3: $^1$H-NMR, 400 MHz, δ(CDCl$_3$) ppm: 0.47-1.27 (28H, m), 1.57-1.59 (3H, d), 1.9-1.93 (3H, s), 1.93-2.06 (2H, m), 2.66-2.76 (2H, m), 3.55-3.71 (1H, q), 4.2-4.25 (2H, t), 5.52 (1H, s), 5.89 (1H, s), 6.08 (1H, s), 6.33 (1H, s), 7.27-7.38 (5H, m), 10.78-10.82 (1H, br), 11.38-11.42 (1H, br).

<Synthesis of Compound 4>

While stirring 50 ml of dimethylformamide at 0° C., 5.5 ml of phosphorous oxychloride were dropped therein. After stirring for 10 minutes, Compound 1 (15 g) was added and stirred for 2.5 hours at room temperature. This reactions solution was poured in 1.5 L of water and neutralized with 7.2 g of sodium hydroxide, and 150 ml of methanol were poured therein and stirred for 2.5 hours. A crystal was subjected to filteration, and was again dispersion-washed with 150 ml of methanol, thereby obtaining Compound 4 (8 g).

Compound 4: $^1$H-NMR, 400 MHz, δ(CDCl$_3$) ppm: 0.45-1.57 (28H, m), 1.81-1.83 (3H, d), 4.44-4.5 (1H, q), 5.88 (1H, s), 7.28-7.37 (5H, m), 9.06 (1H, s), 10.78-10.82 (1H, br), 11.47-11.51 (1H, br).

<Synthesis of Compound 5>

Compound 4 (19.6 g) and 8.34 g of thiomalic acid were added to 150 ml of dimethyl acetamide and stirred at room temperature. 28 g of DBU were dropped therein and stirred for 2 hours at room temperature. This reaction solution was poured in 1.5 L of water, and the obtained crystal was collected by filteration and dried with reduced pressure. Compound 5 (17.5 g) was thus obtained.

Compound 5: $^1$H-NMR, 400 MHz, δ(CDCl$_3$) ppm: 0.45-1.59 (28H, m), 1.81-1.83 (3H, d), 1.84-1.87 (2H, d), 2.93-2.97 (1H, t), 4.56-4.61 (1H, q), 5.91 (1H, s), 7.28-7.37 (5H, m), 9.06 (1H, s), 10.92-10.96 (1H, br), 11.12-11.19 (1H, br).

<Synthesis of Compound 6>

Compound 5 (12.9 g) in 50 ml of acetic anhydride were stirred at room temperature, and 11.4 g of trifluoroacetic acid were dropped therein. Thereafter, Compound 3 (12.5 g) was added thereto and stirred for 4 hours at room temperature. This reaction solution was neutralized by gradually pouring the same in a mixture of 1 L of water, 60 g of sodium hydrogen carbonate and ethyl acetate, while stirring at room temperature. Then, the organic phase was made acidic again with an aqueous solution of hydrochloric acid, and washed with saturated salt water. The organic phase was dried with sodium sulfate and condensed with reduced pressure. The residue was purified by column chromatography and condensed with reduced pressure. Compound 6 (8.7 g) was thus obtained.

Compound 6: $^1$H-NMR, 400 MHz, δ(DMSO-$d_6$) ppm: 0.92-4.09 (76H, m), 5.24-5.28 (2H, br), 5.6 (1H, s), 5.98 (1H, s), 6.57 (1H, s), 7.28-7.45 (10H, m), 10.62-10.86 (2H, br), 12.02-12.15 (1H, m).

<Synthesis of Exemplary Compound a-5>

Compound 6 (17.6 g) in 200 ml of methanol was stirred at room temperature, and 3.25 g of zinc acetate dihydrate were added thereto and stirred for 2.5 hours. Thereafter, 200 ml of water were added to this reaction solution, and the precipitated crystal was separated by filtration and dried. Exemplary Compound a-5 (16.3 g) was thus obtained.

Exemplary Compound a-5: $^1$H-NMR, 400 MHz, δ(DMSO-$d_6$) ppm: 0.88-4.41 (76H, m), 5.72-5.8 (2H, br), 5.82 (1H, s), 6.04 (1H, s), 6.88 (1H, s), 7.28-7.58 (100H, m), 10.41-10.49 (2H, br).

It was identified by $^1$H-NMR that the synthesized compound was Exemplary Compound a-5.

Exemplary compounds a-7, a-13, a-17, a-32, a-38, b-5, b-7, b-13, b-17, b-18, b-24, b-40, b-43, b-47, c-4, c-5, c-13, c-17, c-22, c-23, c-28, c-40, c-42, c-43, c-44, c-46 and c-48, as shown in the following Table 1, were synthesized by similar procedures to that of synthesizing Exemplary Compound a-5. These compounds were also identified by $^1$H-NMR.

The color purity of a blue color of these Exemplary Compounds, as expressed by a light absorption coefficient obtained by the transmission (T $\%_{450nm}$) when T % max at λmax was normalized to 5% and the λmax of the absorption, was measured by using a spectrometer (UV-2400 PC, trade name, manufactured by Shimadzu Corporation). The results are shown in Table 1.

TABLE 1

| Exemplary Compound | T $\%_{450\,nm}$ | λmax | Light Absorption Coefficient |
|---|---|---|---|
| a-5 | 95 | 550 | 128000 |
| a-7 | 94 | 550 | 125000 |
| a-13 | 93 | 551 | 119000 |
| a-17 | 96 | 550 | 132000 |
| a-32 | 93 | 551 | 130000 |
| a-38 | 92 | 550 | 122000 |
| b-5 | 93 | 551 | 124000 |
| b-7 | 95 | 550 | 128000 |
| b-13 | 91 | 550 | 122000 |
| b-17 | 91 | 549 | 118000 |
| b-18 | 92 | 550 | 121000 |
| b-24 | 94 | 551 | 126000 |
| b-40 | 93 | 547 | 128000 |
| b-43 | 91 | 548 | 117000 |
| b-47 | 95 | 548 | 124000 |
| c-4 | 95 | 550 | 125000 |
| c-5 | 96 | 548 | 129000 |
| c-13 | 96 | 548 | 131000 |
| c-17 | 92 | 553 | 117000 |
| c-22 | 95 | 549 | 132000 |
| c-23 | 94 | 552 | 126000 |
| c-28 | 94 | 550 | 130000 |
| c-40 | 93 | 548 | 124000 |
| c-42 | 93 | 550 | 122000 |
| c-43 | 96 | 551 | 134000 |
| c-44 | 93 | 552 | 127000 |
| c-46 | 95 | 549 | 133000 |
| c-48 | 91 | 553 | 116000 |

Example 1-2

Exemplary Compound d-2 was synthesized in accordance with the following synthesis scheme and formulation.

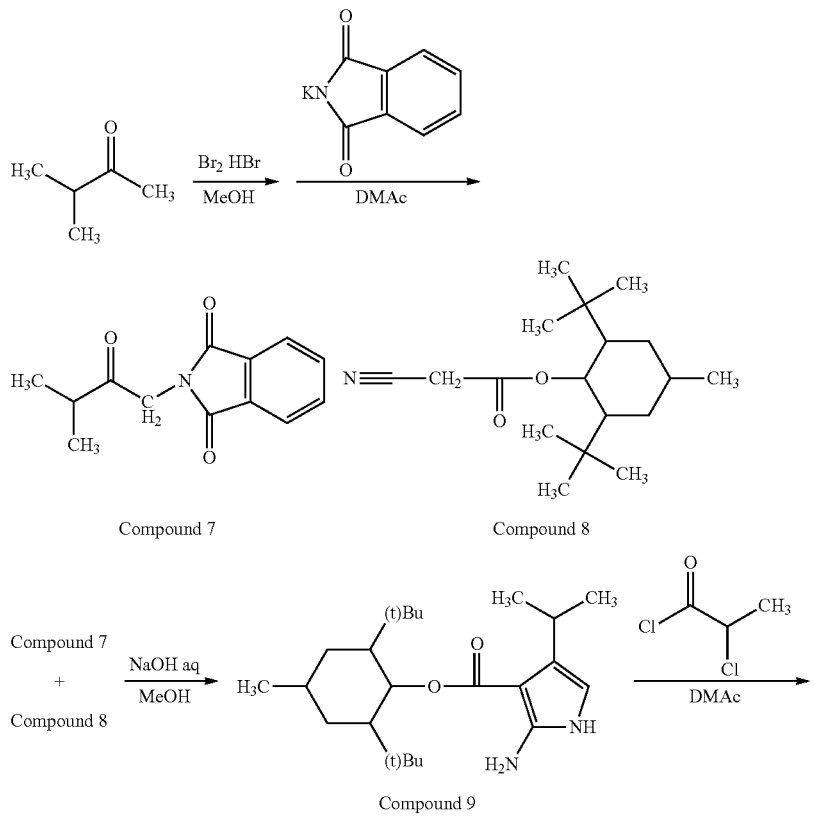

Compound 7

Compound 8

Compound 7 + Compound 8 → Compound 9

-continued
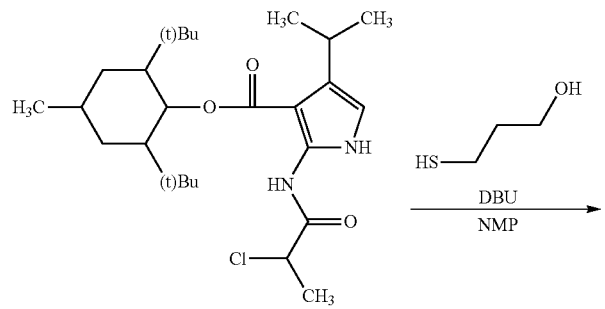
Compound 10
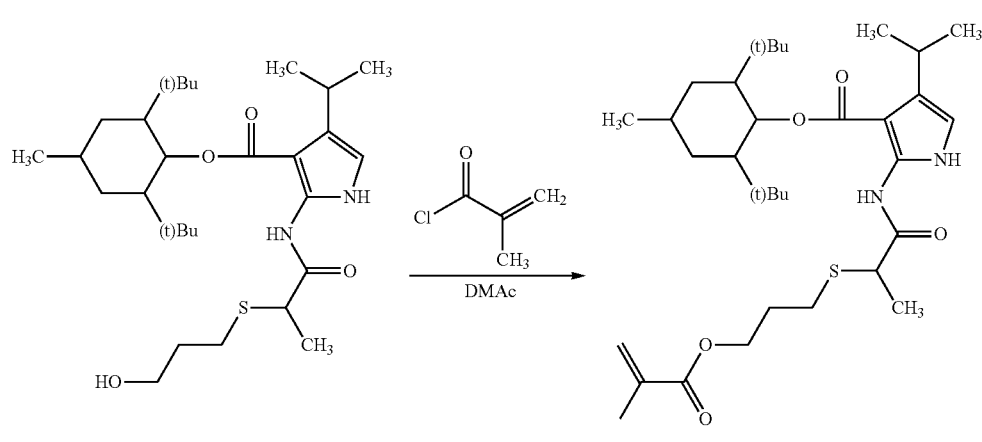
Compound 11    Compound 12
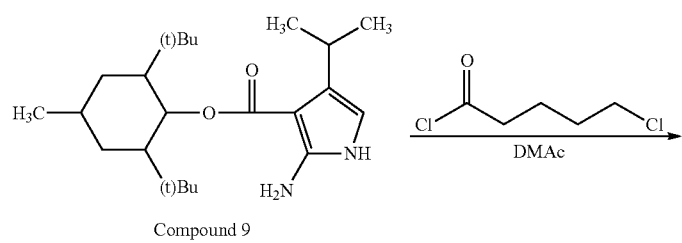
Compound 9
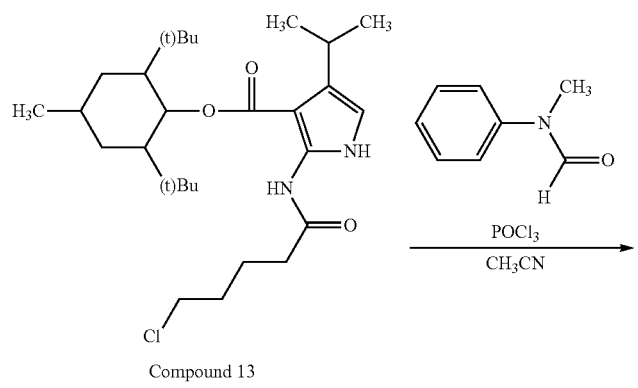
Compound 13

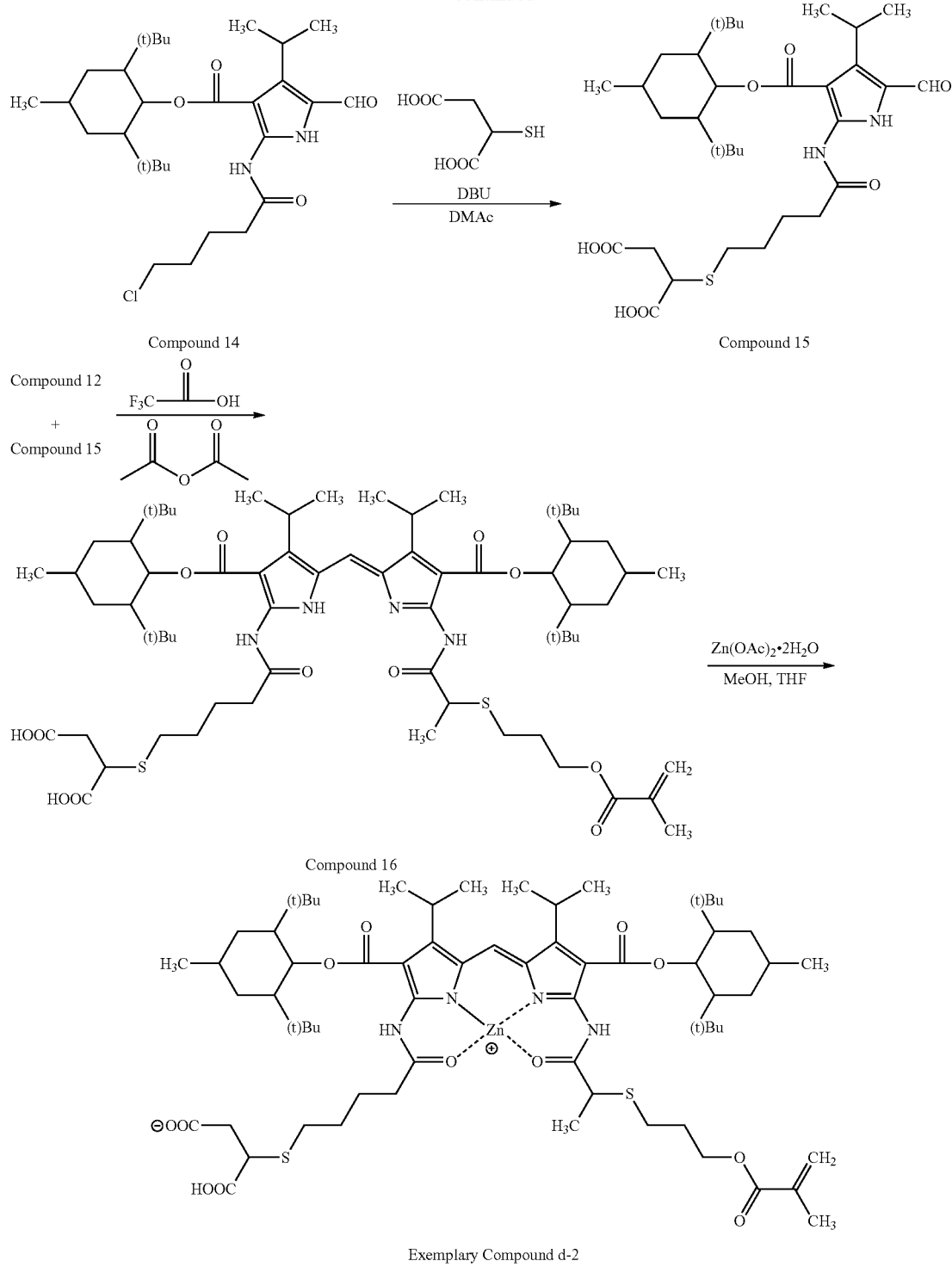

Exemplary Compound d-2

<Synthesis of Compound 7>

206.4 g of isopropyl methyl ketone in 1 L of methanol were stirred, and 7 ml of hydrobromic acid (47-49% aqueous solution) were added. Thereafter, bromine was dropped therein over 3 hours at 30-34° C. This was then stirred for 30 minutes at 30° C. After neutralizing with an aqueous solution prepared by dissolving 124 g of sodium hydrogen carbonate in 1.3 L of water, an aqueous solution prepared by dissolving 400 g of sodium chloride in 1.3 L of water was added, and a phase-separated reaction product in the form of a liquid was collected.

Separately, 222 g of phthalimide potassium salt in 800 ml of dimethyl acetamide (DMAc) were stirred and the reaction product obtained in the above process was dropped therein while cooling with water, and stirred for 4 hours at room temperature. Thereafter, 720 ml of water were added while cooling with water, and the precipitated crystal was separated by filtration. The obtained crystal was suspended in 1.5 L of toluene and undissolved matters were filtered. The filtrate was condensed, thereby obtaining Compound 7 (100 g).

Compound 7: $^1$H-NMR, 400 MHz, δ(CDCl$_3$) ppm: 1.21-1.23 (6H, d), 2.74-2.79 (1H, m), 4.56 (2H, s), 7.72-7.74 (2H, d), 7.85-7.87 (2H, d).

<Synthesis of Compound 8>

Compound 8 was synthesized in accordance with the method described in paragraph [0134] of JP-A No. 2008-292970.

<Synthesis of Compound 9>

Compound 8 (293 g) and Compound 7 (231 g) in 1.4 L of methanol were stirred under a nitrogen atmosphere, and sodium hydroxide (88 g) dissolved in 400 ml of water was dropped therein at room temperature. This was refluxed for 8 hours, and then allowed to cool at room temperature. The precipitated crystal was collected by filtration, and washed with 100 ml of methanol. Compound 9 (299 g) was thus obtained.

Compound 9: $^1$H-NMR, 400 MHz, δ(CDCl$_3$) ppm: 0.88-0.95 (18H, s), 1.00-1.03 (3H, d), 1.17-1.19 (6H, d), 1.20-1.66 (7H, m), 3.38-3.43 (1H, m), 5.19-5.24 (2H, br), 5.95 (1H, br), 6.00 (1H, s), 7.39-7.45 (1H, br).

<Synthesis of Compound 10>

Compound 9 (80 g) in 250 ml of DMAc was stirred at room temperature, and 29.2 g of 2-chloropropionyl chloride were dropped therein, and stirred for 3 hours at room temperature. This reaction solution was poured in a mixture of 500 ml of ethyl acetate and 1 L of water, and then washed with 500 ml of saturated sodium bicarbonate water, 500 ml of water and 500 ml of saturated salt water, respectively. The resultant was dried with magnesium sulfate, and condensed with reduced pressure. Compound 10 (89.4 g) was thus obtained.

Compound 10: $^1$H-NMR, 400 MHz, δ(CDCl$_3$) ppm: 0.9 (18H, s), 0.96-1.01 (3H, d), 1.20-1.23 (2H, d), 1.26-1.38 (1H, q), 1.53-1.68 (6H, m), 1.8-1.82 (3H, d), 3.44-3.53 (1H, m), 4.5-4.57 (1H, q), 6.03 (1H, br), 6.27 (1H, s), 10.4-10.45 (1H, br), 11.31-11.42 (1H, br).

<Synthesis of Compound 11>

Compound 10 (372.3 g) and 79.8 g of 3-mercapto-1-propanol were dissolved in 1 L of N-methylpyrrolidone (NMP) and stirred at room temperature. 133.4 g of DBU were dropped therein and stirred for 2 hours at room temperature. Thereafter, the reaction solution was poured in a mixture of 1.5 L of ethyl acetate and 1.5 L of water, and washed with 1 L of 1N hydrochloric acid, 1 L of saturated sodium bicarbonate water, 1 L of water and 1 L of saturated salt water, respectively. The organic phase was dehydrated with 50 g of magnesium sulfate. After filtration, the filtrate was condensed and dried to solidify. The residue was dispersion-washed with 300 ml of acetonitrile and a solid was collected by filtration. This solid was washed with 30 ml of acetonitrile, thereby obtaining Compound 11 (317 g).

Compound 11: $^1$H-NMR, 400 MHz, δ(CDCl$_3$) ppm: 0.9 (18H, s), 1.02-1.03 (3H, d), 1.21-1.22 (6H, d), 1.23-1.41 (5H, m), 1.56-1.57 (3H, d), 1.6-1.63 (2H, br), 1.79-1.89 (2H, m), 2.72-2.78 (2H, t), 3.43-3.47 (1H, m), 3.51-3.55 (1H, q), 3.78-3.73 (2H, q), 6.0 (1H, s), 6.23 (1H, s), 10.51-10.55 (1H, br), 11.21-11.29 (1H, br).

<Synthesis of Compound 12>

Compound 11 (30 g) and 0.1 ml of nitrobenzene were dissolved in 250 ml of DMAc, and 14.1 g of methacrylic acid chloride were dropped therein and stirred for 2 hours at room temperature. This reaction solution was added to a mixture of 1.5 L of ethyl acetate and 1.5 L of water, and extracted into an organic phase. Thereafter, the organic phase was washed twice with 400 ml of 1N saturated hydrochloric acid, twice with 400 ml of saturated sodium bicarbonate water, twice with 400 ml of saturated salt water and twice with 400 ml of water, respectively. The organic phase was dehydrated with 30 g of magnesium sulfate, and after filtration, the filtrate was condensed and dried to solidify. Compound 12 (27.9 g) was thus obtained.

Compound 12: $^1$H-NMR, 400 MHz, δ(CDCl$_3$) ppm: 0.9 (18H, s), 1.02-1.03 (3H, d), 1.21-1.22 (6H, d), 1.23-1.41 (5H, m), 1.56-1.57 (3H, d), 1.6-1.63 (2H, br), 1.9 (3H, s), 1.93-2.02 (2H, m), 2.6-2.73 (2H, t), 3.42-3.5 (1H, m), 3.51-3.56 (1H, q), 4.06-4.12 (1H, q), 4.14-4.23 (2H, t), 5.5 (1H, s), 6.11-6.15 (2H, m), 6.23 (1H, s), 10.42-10.48 (1H, br), 11.28-11.32 (1H, br).

<Synthesis of Compound 13>

Compound 9 (263.6 g) in 800 ml of DMAc was stirred at room temperature, and 5-chlorovaleric acid chloride (108.5 g) was dropped therein while cooling with ice over 2 hours. This was stirred for 3 hours at room temperature. This reaction solution was poured in 18 L of water and the precipitated crystal was collected by filtration. The obtained crystal was dispersion-washed with 1 L of acetonitrile, thereby obtaining Compound 13 (313 g).

Compound 13: $^1$H-NMR, 400 MHz, δ(CDCl$_3$) ppm: 0.9 (18H, s), 0.96-1.01 (3H, d), 1.20-1.75 (17H, m), 1.76-2.00 (2H, m), 2.41-2.53 (2H, m), 3.4-3.58 (1H, m), 3.54-3.60 (2H, m), 6.0 (1H, br), 6.22 (1H, s), 10.55 (2H, br).

<Synthesis of Compound 14>

While stirring N-methylformanilide (66.2 g) and 330 ml of acetonitrile at 0° C., phosphorous oxychloride (75 g) was dropped therein while maintaining the temperature so as not to exceed 5° C. After stirring for 1 hour, Compound 13 (202 g) was added and stirred for 3 hours at room temperature, and then stirred for 1 hour at 40° C. This reaction solution was poured in 2 L of water and the precipitated crystal was collected by filtration. The obtained crystal was washed by pouring thereon 500 ml of water and 500 ml of methanol, thereby obtaining Compound 14 (181 g).

Compound 14: $^1$H-NMR, 400 MHz, δ(CDCl$_3$) ppm: 0.9 (18H, s), 0.96-1.21 (3H, d), 1.22-1.76 (17H, m), 1.78-2.22 (2H, m), 2.45-2.55 (2H, m), 3.4-3.58 (1H, m), 3.54-3.60 (2H, m), 6.3 (1H, br), 9.88 (1H, s), 11.09 (1H, br), 11.47 (1H, br).

<Synthesis of Compound 15>

Compound 14 (300 g) and thiomaleic acid (129 g) were added to 3 L of DMAc and stirred at room temperature, and DBU (434 g) was dropped therein over 30 minutes while maintaining the temperature so as not to exceed 30° C. This reaction solution was stirred for 5 hours at 60° C., and 103 g of sodium hydroxide dissolved in 600 ml of water were dropped therein over 10 minutes and cooled to room temperature. The precipitated crystal was collected by filtering, and washed by pouring thereon with 1 L of ethyl acetate and 200 ml methanol cooled down to 5° C., respectively. The obtained crystal was dispersed in 1 L of ethyl acetate and 1 L of water, and 220 ml of concentrated hydrochloric acid were added to allow the crystal to dissolve in an organic phase. This was washed twice with 1 L of water, and once with 1 L of saturated salt water. After drying with 80 g of magnesium sulfate, the resultant was subjected to filtration and the filtrate was condensed with reduced pressure. Compound 15 (255 g) was thus obtained.

Compound 15: $^1$H-NMR, 400 MHz, δ(CDCl$_3$) ppm: 0.9 (18H, s), 0.96-1.21 (3H, d), 1.22-1.76 (17H, m), 1.78-2.22

(2H, m), 2.45-2.65 (4H, m), 3.35-3.61 (2H, m), 3.54-3.60 (2H, m), 6.3 (1H, br), 9.92 (1H, s), 11.11 (1H, br), 11.81 (1H, br).

<Synthesis of Compound 16>

Compound 12 (8.27 g), Compound 15 (8.92 g) and 45 ml of acetic anhydride were stirred at room temperature, and 5.39 ml of trifluoro acetic acid were dropped therein while cooling with ice, and stirred for 3 hours at room temperature. An aqueous solution prepared by adding 60 g of sodium hydrogen carbonate and 3 drops of pyridine to 400 ml of water was stirred at room temperature, and the reaction solution was dropped therein to neutralize the same, and stirred for 3 hours at room temperature. The precipitated crystal was collected by filtering, washed with water, and air-dried. Compound 16 (16 g) was thus obtained.

Compound 16: $^1$H-NMR, 400 MHz, $\delta$(CDCl$_3$) ppm: 0.92 (36H, s), 0.96-2.0 (44H, m), 2.04 (3H, s), 2.62-2.83 (3H, m), 2.97-3.56 (7H, m), 4.14-4.27 (1H, m), 5.0 (1H, br), 6.05 (3H, br), 7.52-7.56 (1H, br), 10.25-10.89 (1H, br), 11.34-11.56 (1H, br).

<Synthesis of Exemplary Compound d-2>

Compound 16 (12.6 g), 150 ml of methanol and 75 ml of tetrahydrofuran were stirred at room temperature, and zinc acetate dihydrate (2.2 g) was added thereto and stirred for 2 hours. Thereafter, 500 ml of water was added to the reaction solution, and the precipitated crystal was collected by filtering and air-dried. Exemplary Compound d-2 (13 g) was thus obtained.

Exemplary Compound d-2: $^1$H-NMR, 400 MHz, $\delta$(DMSO-d$_6$) ppm: 0.97 (36H, s), 0.99-2.05 (47H, m), 2.07-3.05 (8H, m), 4.04-4.4 (3H, m), 5.53 (1H, br), 6.05-6.12 (3H, br), 8.8 (1H, s), 10.97-11.18 (1H, br), 11.91-12.01 (1H, br).

It was identified by $^1$H-NMR that the synthesized compound was Exemplary Compound d-2.

Exemplary Compounds d-1, d-2, d-5, d-8, d-10, d-11, d-12, d-18, d-20, d-24, d-27 and d-35, as shown in the following Table 2, were synthesized by similar procedures to that of synthesizing Exemplary Compound d-2, and these Exemplary compounds were also identified by $^1$H-NMR.

The color purity of a blue color of these Exemplary Compounds, as expressed by a light absorption coefficient obtained by the transmission (T %$_{450nm}$) when T % max at λmax was normalized to 5% and the λmax of the absorption, was measured by using a spectrometer (UV-2400 PC, trade name, manufactured by Shimadzu Corporation). The results are shown in Table 2.

TABLE 2

| Exemplary Compound | T %$_{450\,nm}$ | λmax | Light Absorption Coefficient |
|---|---|---|---|
| d-1 | 94 | 546 | 122000 |
| d-2 | 94 | 546 | 124000 |
| d-5 | 93 | 545 | 129000 |
| d-8 | 95 | 546 | 130000 |
| d-10 | 96 | 546 | 130000 |
| d-11 | 95 | 547 | 123000 |
| d-12 | 90 | 555 | 115000 |
| d-18 | 95 | 546 | 122000 |
| d-20 | 91 | 546 | 121000 |
| d-24 | 91 | 546 | 118000 |
| d-27 | 92 | 546 | 126000 |
| d-35 | 91 | 546 | 118000 |

Example 1-3

Exemplary Compounds e-1 to e-14 can be obtained by synthesizing 2,6-di-tert-butyl-4-alkylcyclohexanols as an intermediate. 2,6-di-tert-butyl-4-alkylcyclohexanols can be synthesized in accordance with a method in which 2,6-di-tert-butylcyclohexanones are obtained by adding hydrogen to 2,6-di-tert-butyl phenols, and reducing the same with lithium aluminum hydride, as described in Journal of American Chemistry, Vol. 179, pp. 5019-5023 (1957). Alternatively, 2,6-di-tert-butylcyclohexanols can be synthesized by a method in which 2,6-di-tert-butylcyclohexanones are reduced with sodium boron hydride under the presence of magnesium chloride or aluminum chloride, using diglyme as a reaction solvent, as described in Japanese Patent No. 4,065,576.

Among these, Exemplary Compound e-9 was synthesized in accordance with the following synthesis scheme and formulation.

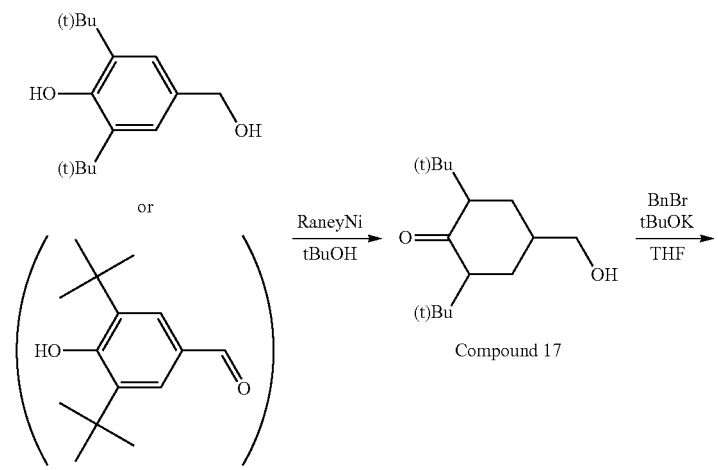

Compound 17

-continued
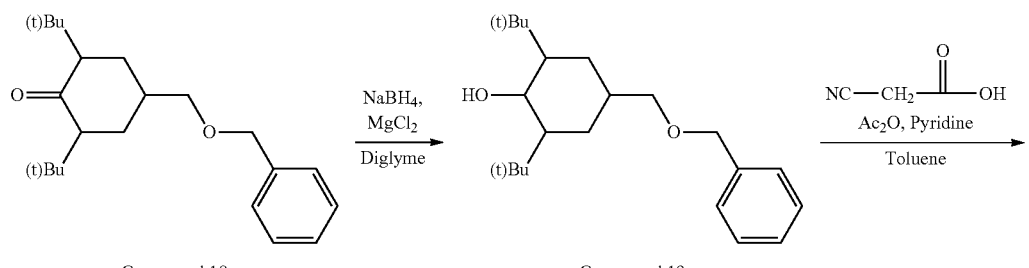
Compound 18     Compound 19
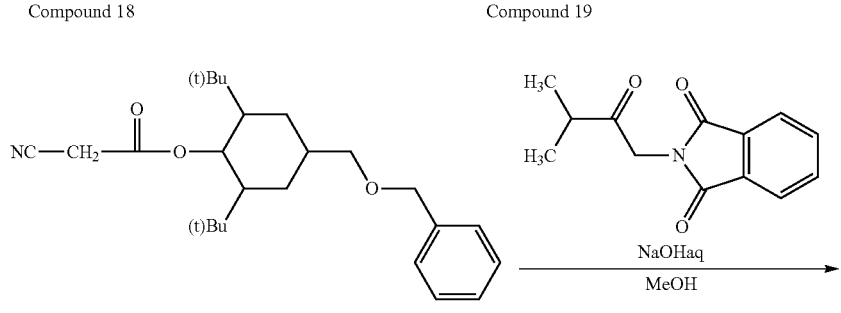
Compound 20
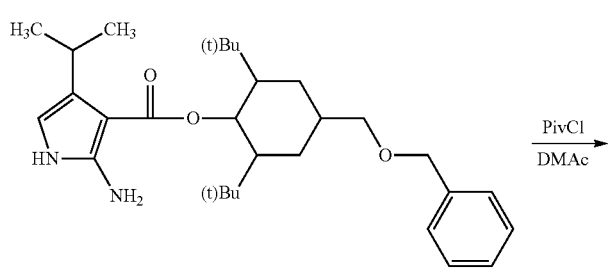
Compound 21
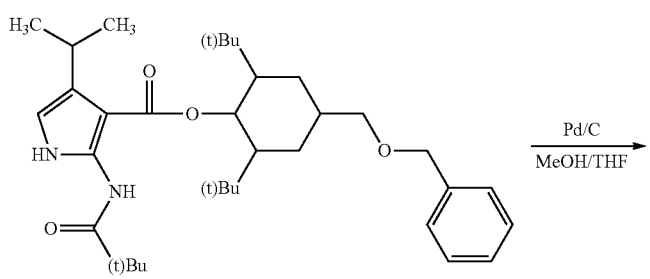
Compound 22
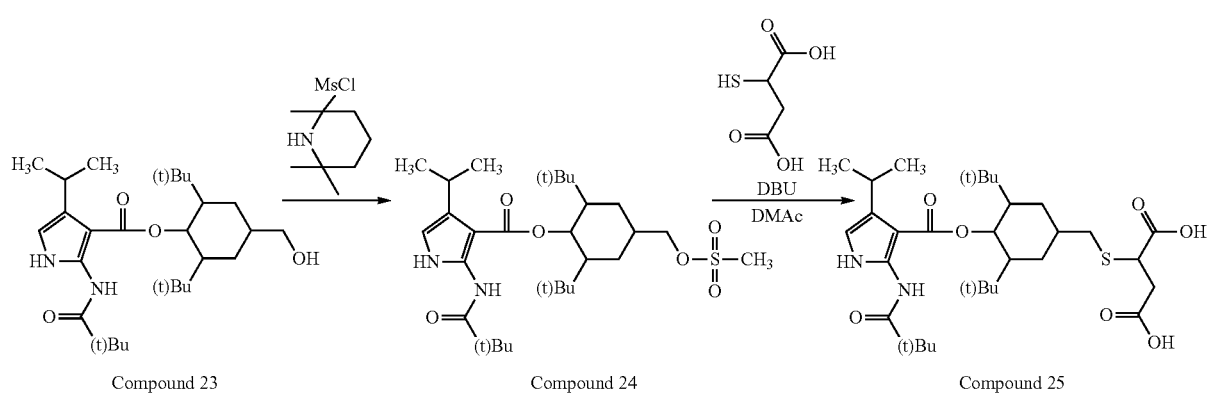
Compound 23     Compound 24     Compound 25

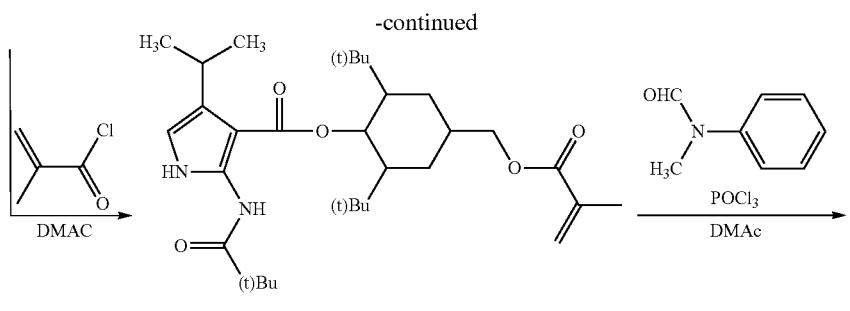

Compound 26

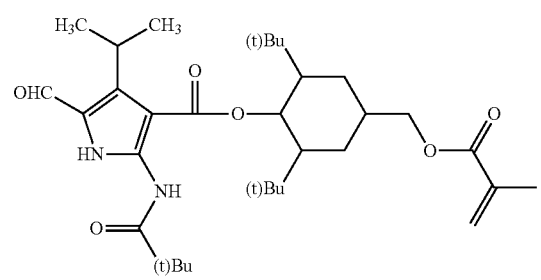

Compound 27

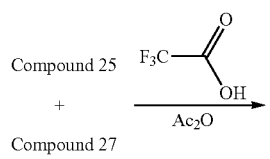

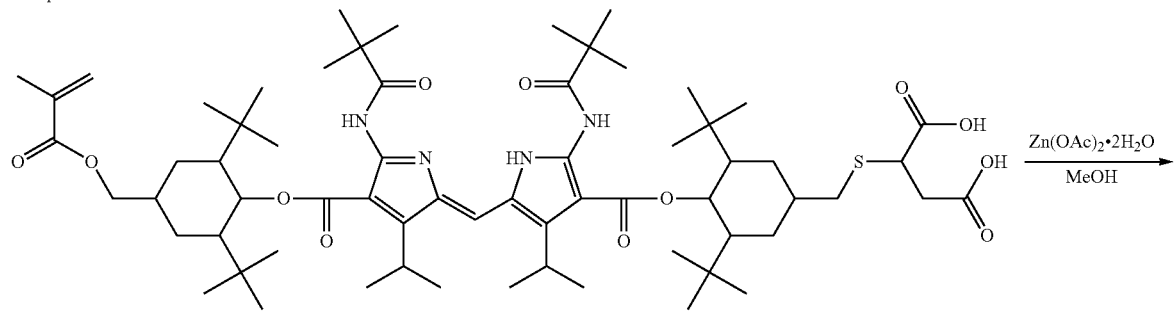

Compound 28

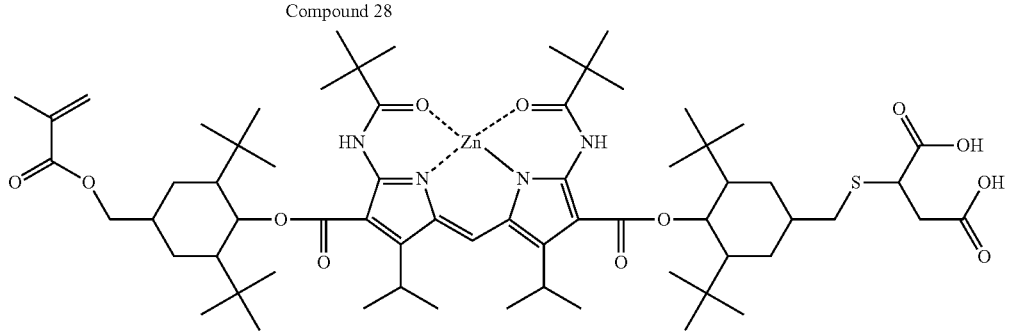

Exemplary Compound e-9

<Synthesis of Compound 17>

73.6 g of 2,6-di-tert-butyl-4-(hydroxymethyl)phenol, 12.5 g of Raney nickel and 340 ml of tert-butyl alcohol were placed in a 1 L stainless steel autoclave, and substituted with hydrogen after sealing the same. Starting from a temperature of 25° C. and a hydrogen initial pressure of 86.7 kg/cm², the temperature was elevated to 125° C. and stirred for 1 hour for 50 minutes at 125° C.

After cooling down to room temperature, the reaction product was taken out and the catalyst was separated by filtering. The obtained reaction product was quantified by gas chromatography, and it was found that Compound 17 (74.8 g) with 94% purity was obtained. The structure was identified by NMR. It is also possible to obtain Compound 17 in a similar manner by this method in which 3,5-di-tert-butyl-4-hydroxybenzaldehyde was used as a starting material.

Compound 17: $^1$H-NMR, 400 MHz, δ(CDCl$_3$) ppm: 0.981 (18H, s), 1.18-1.3 (2H, m), 1.96-2.09 (1H, m), 2.17-2.27 (4H, m), 3.52-3.58 (2H, t)

<Synthesis of Compound 18>

74.8 g of Compound 17 were dissolved in 300 ml of tetrahydrofuran at 0° C. or lower, and 38.4 g of tert-butoxypotassium were added thereto. 58.5 g of benzyl bromide were dropped therein while maintaining the temperature to be 10° C. or lower, and stirred for 1 hour while cooling with ice. The completion of reaction was confirmed by thin film chromatography, and the reaction solution was poured in 1 L of water and extracted with 300 ml of ethyl acetate. The organic phase was washed with magnesium sulfate, and the filtrate was condensed under reduced pressure. The residue was collected by column chromatography, and Compound 18 (85 g, 92.4% purity) was obtained.

Compound 18: $^1$H-NMR, 400 MHz, δ(CDCl$_3$) ppm: 0.97 (18H, s), 1.19-1.3 (2H, m), 2.08-2.28 (5H, m), 3.31-3.35 (2H, d), 4.52 (2H, s), 7.33-7.41 (5H, m)

<Synthesis of Compound 19>

Compound 18 (85 g, 257 mmol) was dissolved in 250 ml of diglyme, and sodium boron hydride (9.7 g, 257 mol) was added thereto. Subsequently, magnesium chloride (12.1 g, 127 mmol) was added at 25° C. and stirred for 11 hours at 100° C. The completion of reaction was confirmed by thin film chromatography, and cooled down to room temperature. 20 ml of ethyl acetate and 20 ml of methanol were gradually added to this reaction solution. Thereafter, a solution in which 40 ml of concentrated hydrochloric acid were diluted with 500 ml of water, and 300 ml of ethyl acetate were added and stirred for 6 hours, and a target product was extracted. The organic phase was dried with magnesium sulfate, and the filtrate was condensed with reduced pressure. The residue was purified by column chromatography, and Compound 19 (83 g) was obtained.

Compound 19: $^1$H-NMR, 400 MHz, δ(CDCl$_3$) ppm: 0.97 (18H, s), 1.02-1.18 (2H, m), 1.57-1.77 (5H, m), 3.35-3.39 (2H, d), 4.4-4.44 (1H, br), 4.53-4.57 (2H, s), 7.33-7.43 (5H, m)

<Synthesis of Compound 23>

Compound 22 (24 g, 42.3 mmol) was dissolved in 50 ml of methanol and 50 ml of tetrahydrofuran, 2.4 g of palladium-carbon (manufactured by Wako Chemical, Ltd., 5%, wet) were added, and hydrogen substitution was carried out and stirred for 2 hours at room temperature. The completion of reaction was confirmed by thin film chromatography, and the catalyst was filtered with celite. After condensing with reduced pressure, Compound 23 (18.5 g, 92% purity) was obtained.

Compound 23: $^1$H-NMR, 400 MHz, δ(CDCl$_3$) ppm: 0.91-1.01 (20H, m), 1.12-1.47 (16H, m), 1.47-1.92 (4H, m), 3.32-3.54 (1H, m), 3.56-3.72 (2H, d), 6.02-6.12 (1H, s), 6.18-6.27 (1H, s), 10.48-10.63 (1H, br), 10.82-10.97 (1H, br)

Compounds 20 to 22, Compounds 24 to 28 and Exemplary Compound e-9, which were synthesized in the above synthesis scheme, can be obtained by a similar process using similar reaction to the synthesis reaction of Compounds 17 to 19 and Compound 23.

The reason why tert-butyl alcohol was used as a reaction solvent in the synthesis of Compound 17 is that the effect of tert-butyl alcohol of suppressing hydrogenation decomposition of benzyl alcohol in the process of hydrogenating benzyl alcohol is reported on page 255 of "Hydrogenation—Application for Organic Synthesis—" (Tokyo Kagaku Dojin) and page 887 of Bull. Chem. Soc. Jpn., vol 37 (1964). It was found also in the present synthesis examples that the yield was improved and the reaction time was reduced by using tert-butyl alcohol as a reaction solvent.

The light absorbance efficiency was measured by using a spectrometer (UV-2400PC, trade name, manufactured by Shimadzu Corporation) as color purity of a blue color, based on the transmission (T %$_{450nm}$) when T % max at λmax was normalized to 5% and the λmax of the absorption. The results are shown in Table 3.

TABLE 3

| Exemplary Compound | T %$_{450\,nm}$ | λmax | Light Absorption Coefficient |
|---|---|---|---|
| e-1 | 94 | 546 | 132000 |
| e-2 | 94 | 546 | 129000 |
| e-3 | 93 | 545 | 129000 |
| e-4 | 95 | 546 | 130000 |
| e-5 | 94 | 546 | 133000 |
| e-6 | 96 | 547 | 123000 |
| e-8 | 95 | 547 | 131000 |
| e-9 | 94 | 546 | 136000 |
| e-11 | 96 | 546 | 121000 |
| e-12 | 95 | 545 | 138000 |
| e-13 | 96 | 546 | 126000 |
| e-14 | 94 | 547 | 128000 |

Example 2

(1) Preparation of Resist Solution A (Negative)

| | |
|---|---|
| Propylene glycol monomethyl ether acetate (PGMEA) | 5.20 parts |
| Cyclohexanone | 52.6 parts |
| Binder | 30.5 parts |
| (benzyl methacrylate/methacrylic acid/methacrylic acid-2-hydroxyethyl copolymer, molar ratio = 60:20:20, 41% cyclohexanone solution) | |
| Dipentaerythritol hexaacrylate | 10.2 parts |
| Polymerization inhibitor (p-methoxyphenol) | 0.006 parts |
| Fluorinated surfactant | 0.80 parts |
| (trade name: F-475, manufactured by DIC Corporation) | |
| Photopolymerization initiator | 0.58 parts |
| (trade name: TAZ-107, manufactured by Midori Kagaku Co., Ltd.) | |

The above components were mixed and dissolved, thereby preparing Resist Solution A.

(2) Preparation of Glass Substrate with Undercoating Layer

A glass substrate (CORNING 1737, trade name, manufactured by Corning Incorporated) was subjected to ultrasonic washing with 0.5% NaOH water, and washed with water and subjected to dehydration baking (200° C./20 minutes). Subsequently, Resist Solution A obtained in process (1) was applied on the glass substrate to form a layer with a thickness of 2 μm with a spin coater, and dried by heating for 1 hour at 220° C., thereby preparing a cured film (undercoating layer).

(3) Preparation of Resist Solution B (Negative)

| | |
|---|---|
| Cyclohexanone | 80 parts |
| Dipentaerythritol hexaacrylate | 14.0 parts |
| Polymerization inhibitor (p-methoxyphenol) | 0.006 parts |
| Fluorinated surfactant | 0.80 parts |
| (trade name: F-475, manufactured by DIC Corporation) | |

| | |
|---|---|
| Photopolymerization initiator (trade name: TAZ-107, manufactured by Midori Kagaku Co., Ltd.) | 2.0 parts |
| Exemplary Compound a-5 | 4.0 parts |

The above components were mixed and dissolved, and filtered using a polyethylene filter having a pore size of 0.50 µm or less, thereby preparing a dye-containing resist solution (negative-working colored curable composition solution).

(4) Exposure and Development of Resist (Image Formation)

The dye-containing resist solution prepared in process (3) was applied to the undercoating layer formed on the glass substrate, to a thickness of 0.6 µm using a spin coater, and this was subjected to pre-baking for 120 seconds at 100° C. Subsequently, the coated film was exposed to light having a wavelength of 365 nm at an exposure amount of 200 mJ/cm$^2$ via a mask having a line width of 2 µm using an exposure apparatus (UX3100-SR, trade name, manufactured by Ushio Inc.) After the exposure, development was performed using a developer (CD-2000, trade name, manufactured by Fujifilm Electronic Materials Co., Ltd.) for 40 seconds at 25° C. Thereafter, the exposed film was rinsed with running water for 30 seconds and spray-dried, and then subjected to post-baking for 15 minutes at 200° C.

(5) Evaluation

Temporal storage stability of the dye-containing resist solution, and heat fastness, light fastness, solvent resistance and pattern shape of the film formed on the glass substrate from the dye-containing resist solution were evaluated in the following manner. The results are shown in Table 4.

<Temporal Storage Stability>

After storing the dye-containing resist solution for 1 month at room temperature, the degree of precipitation of foreign matters in the solution was visually observed and evaluated in accordance with the following criteria.

—Evaluation Criteria—

A: Precipitation was not observed.
B: A slight degree of precipitation was observed.
C: Precipitation was observed.

<Heat Fastness>

After heating the glass substrate coated with the dye-containing resist solution for 1 hour by placing the same on a hot plate at 200° C. such that the substrate side was faced to the hot plate, a color difference (ΔEab value) between before and after the heating was measured by using a colorimeter (MCPD-1000, trade name, manufactured by Otsuka Electronics Co., Ltd.) and evaluated in accordance with the following criteria. The smaller the ΔEab value is, the more favorable the heat fastness is.

The ΔEab value is calculated by the following color difference formula based on CIE1976 (L*a*b*) color space (see page 266 of New Edition Color Science Handbook, edited by the Color Science Association of Japan, 1985).

$$\Delta Eab = \{(\Delta L)^2 + (\Delta a)^2 + (\Delta b)^2\}^{1/2}$$

—Evaluation Criteria—

A: The ΔEab value was less than 5.
B: The ΔEab value was not less than 5 but not greater than 15.
C: The ΔEab value was greater than 15.

<Light Fastness>

A UV cut filter (cut off: 366 nm or less) was placed on the glass substrate coated with the dye-containing resist solution, and this was exposed to a xenon light at 100,000 lux for 20 hours (equivalent of 2,000,000 lux/h). Then, a color difference (ΔEab value) between before and after the exposure was measured and used as an index for evaluating light fastness. The evaluation was made in accordance with the following criteria. The smaller the ΔEab value is, the more favorable the light fastness is.

—Evaluation Criteria—

A: The ΔEab value was less than 5.
B: The ΔEab value was not less than 5 but not greater than 15.
C: The ΔEab value was greater than 15.

<Solvent Resistance>

The spectral transmittance of the coating films after post-baking obtained in process (4) was measured (spectral transmittance A). Resist solution A obtained in process (1) was applied to the coating films to a thickness of 1 µm, and subjected to pre-baking (100 µm, 120 seconds). Thereafter, development was performed using a developer (CD-2000, trade name, manufactured by Fujifilm Electronic Materials Co., Ltd.) for 120 seconds at 23° C., and the spectral transmittance was measured again (spectral transmittance B). From the difference in spectral transmittance A and spectral transmittance B, the dye residual ratio (%) was calculated and used as an index for evaluating the solvent resistance. The closer the residual ratio is to 100%, the more favorable the solvent resistance is.

—Evaluation Criteria—

A: Dye residual ratio was greater than 90%.
B: Dye residual ratio was not less than 70% but not greater than 90%.
C: Dye residual ratio was less than 70%.

<Pattern Shape>

The developed pattern of the coating films after post-baking obtained, in process (4) was observed using an optical microscope (digital microscope RX-20, trade name, manufactured by Olympus Corporation), and whether or not a fine pattern was formed was evaluated in accordance with the following criteria.

—Evaluation Criteria—

A: Fine pattern was formed.
B: Pattern was formed but the edge was not fine.
C: Pattern was not formed.

Examples 3 to 35

A pattern was formed and evaluated in a similar manner to Example 2, except that the exemplary compound according to the invention was changed to the same amount of exemplary compound as indicated in the following Table 3 in the preparation of resist solution B (process (3)). The results are shown in Table 3.

Comparative Examples 1 and 2

A pattern was formed and evaluated in a similar manner to Example 2, except that the exemplary compound according to the invention was changed to the same amount of comparative dyes 1 or 2 (Comparative Examples 1 or 2) as indicated below, in the preparation of resist solution B (process (3)). The results are shown in Table 4.

TABLE 4

| Example No. | Formula (1) | Temporal Stability | Heat Fastness | Light Fastness | Solvent Resistance | Pattern Shape |
|---|---|---|---|---|---|---|
| Example 2 | a-5 | A | A | A | A | A |
| Example 3 | a-17 | A | A | A | A | A |
| Example 4 | a-20 | A | A | A | A | A |
| Example 5 | a-30 | A | A | A | A | A |
| Example 6 | a-38 | A | A | A | A | A |
| Example 7 | b-5 | A | B | A | A | A |
| Example 8 | b-17 | A | B | A | A | A |
| Example 9 | b-20 | A | B | A | A | A |
| Example 10 | b-40 | A | A | A | A | A |
| Example 11 | b-43 | A | A | A | A | A |
| Example 12 | c-5 | A | A | A | A | A |
| Example 13 | c-19 | A | A | A | A | A |
| Example 14 | c-26 | A | A | A | A | A |
| Example 15 | c-48 | A | A | A | A | A |
| Example 16 | d-1 | A | A | A | A | A |
| Example 17 | d-2 | A | A | A | A | A |
| Example 18 | d-11 | A | A | A | A | A |
| Example 19 | d-15 | A | A | A | A | A |
| Example 20 | d-21 | A | A | A | A | A |
| Example 21 | d-23 | A | A | A | A | A |
| Example 22 | d-25 | A | A | A | A | A |
| Example 23 | d-32 | A | A | A | A | A |
| Example 24 | d-33 | B | A | A | A | A |
| Example 25 | d-35 | B | A | A | A | A |
| Example 26 | e-1 | A | A | A | A | A |
| Example 27 | e-2 | A | A | A | A | A |
| Example 28 | e-3 | A | A | A | A | A |
| Example 29 | e-4 | A | A | A | A | A |
| Example 30 | e-5 | A | A | A | A | A |
| Example 31 | e-6 | A | A | A | A | A |
| Example 32 | e-8 | A | A | A | A | B |
| Example 33 | e-9 | A | A | A | A | A |
| Example 34 | e-13 | A | A | A | A | B |
| Example 35 | e-14 | A | A | A | A | B |
| Comparative 1 | Comparative Dye 1 | C | C | B | C | B |
| Comparative 2 | Comparative Dye 2 | A | B | B | B | B |

Comparative Dye 1: the following compound described in JP-A No. 54-65730

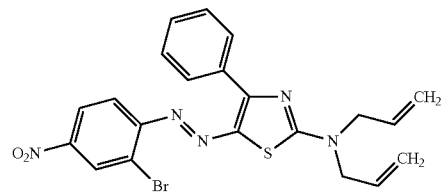 [SMILES: C=CCN(CC=C)c1nc(-c2ccccc2)c(/N=N/c2ccc([N+](=O)[O-])cc2Br)s1]

Comparative Dye 2: C.I. Acid Red 87

As shown in Table 4, in the Examples in which the dye according to the invention was used, the dye-containing resist solutions prepared in the form of a solution (colored curable composition) exhibit superior storage stability over time as compared with those prepared in Comparative Examples 1 and 2. Further, the pattern formed from the colored curable compositions prepared in the Examples exhibit favorable heat fastness, light fastness, solvent resistance and pattern shape.

Moreover, the dye compounds according to the invention used in Examples 2 to 10, 16 to 22 and 26 to 33 exhibit remarkably high solubility with respect to various organic solvents, including cyclohexanone used in the Examples (such as ethyl acetate with even higher safety), thereby being effective also in view of operation safety or reducing operation burden.

Examples 2B to 35B, Comparative Examples 1B and 2B

Confirmation of Pattern Shape (1) Preparation of Silicon Wafer Substrate with Undercoating Layer A 6-inch silicone wafer was subjected to a heat treatment in an oven at 200° C. for 30 minutes. Subsequently, resist solution A prepared in process (1) in Example 2 was applied to this silicon wafer to have a dry thickness of 1.0 µm, and further dried for an hour in an oven at 220° C. to form an undercoating layer. A silicon wafer substrate with an undercoating layer was thus obtained.

A photo-curable coating film was formed on the undercoating layer formed on the silicon wafer prepared in process (1) by applying the colored curable composition prepared in Examples 2 to 35, and subjected to a heat treatment (prebaking) for 120 seconds using a hot plate at 100° C.

Subsequently, the photo-curable coating film was exposed to light with a wavelength of 365 nm via an island pattern mask having a square pattern with the size of 1.2 µm on each side, while changing the exposure amount in a range of from 100 to 2,500 mJ/cm² by 100 mJ/cm², using an i-line stepper exposure device (FPA-3000i5+, trade name, manufactured by Canon Inc.)

Thereafter, the silicon wafer substrate on which the exposed coating film was formed was placed on a horizontal rotating table of a spin shower developing machine (product type: DW-30, manufactured by Chemitronics Co., Ltd.), and paddle development was carried out at 23° C. for 60 seconds using a developer (60% CD-2000, trade name, manufactured by Fujifilm Electronics Materials Co., Ltd.), thereby forming a colored pattern on the silicon wafer substrate.

(2) Formation of Color Filter

The silicon wafer substrate on which the colored pattern was formed was fixed to the horizontal rotating table by vacuum chucking, and a rinse treatment was carried out by supplying pure water in the form of a shower from nozzles placed over the center of rotation, while rotating the silicon wafer substrate at 50 rpm using a rotating apparatus. The silicon wafer substrate was then spray-dried, and a color filter was obtained.

The thus formed pattern image had a profile with a favorable rectangular cross section of the square shape, which was suitable for use in solid-state image sensors.

Confirmation of Color Transfer

An effect of suppressing color transfer among adjacent pixels or between the upper and lower layers by performing ultraviolet irradiation in which the developed pattern was exposed to ultraviolet light in an exposure amount (mJ/cm²) of at least ten times greater than the exposure amount (mJ/cm²) in the exposure process performed before the development.

Color filters were produced in accordance with the following steps using the resist solutions prepared in Examples 2 to 35 and Comparative Examples 1 and 2, and evaluation of color transfer was carried out.

Further, color filters were produced without performing ultraviolet irradiation after the development, and evaluation of color transfer was carried out.

(1) Preparation of Single-color Color Filter
—Preparation of Silicone Wafer Substrate with Undercoating Layer—
A 6-inch silicone wafer was subjected to a heat treatment in an oven at 200° C. for 30 minutes. Subsequently, resist solution A prepared in process (1) in Example 2 was applied to this silicon wafer to have a dry thickness of 1.0 μm, and further dried for an hour in an oven at 220° C. to form an undercoating layer. A silicon wafer substrate with an undercoating layer was thus obtained.

(2) Exposure and Development of Negative-Working Curable Composition
A colored film was formed on the undercoating layer formed on the silicon wafer as prepared above by applying the negative-working composition prepared in Examples 2 to 25 and Comparative Examples 1 and 2 to have a dry thickness of 1 μm with a spin coater, and subjecting the same to pre-baking for 120 seconds at 100° C.

This colored film was exposed to light via an island pattern mask in which square pixels having the size of 2.0 μm on each side were arranged in a region of 4 mm×3 mm, with an exposure amount of 200 mJ/cm² and an illuminance of 1,200 mW/cm² (integral irradiation illuminance) using an i-line stepper (FPA-3000i5+, trade name, manufactured by Canon Inc.)

Thereafter, the colored film was subjected to paddle development to form a pattern with a developer (CD-2000, trade name, 60%, manufactured by Fujifilm Electronic Materials Co., Ltd.) for 60 seconds at 23° C., and this was rinsed with running water for 20 seconds and spray-dried.

Subsequently, the entire region of the silicon wafer to which the pattern was formed was exposed to ultraviolet rays of 10,000 (mJ/cm²) using a high-pressure mercury lamp (UMA-802-HC552FFAL, trade name, manufactured by Ushio Inc.) Thereafter, the exposed pattern was subjected to post-baking for 300 seconds using a hot plate at 220° C., thereby forming a color pattern. The ratio of light having a wavelength of 275 nm or less in the light emitted from the high-pressure mercury lamp was 10%.

A single-color color filter was thus prepared.

(3) Evaluation
The color filter prepared in the above process was evaluated in the following manner. The results are shown in the following Table 4.

Color Transfer
A transparent primer solution (CT-2000L, trade name, manufactured by Fujifilm Electronic Materials Co., Ltd.) was applied to the color pattern side of the color filter prepared in the above process, and dried to have a dry thickness of 1 μm, thereby forming a transparent film. This transparent film was subjected to a heat treatment for 5 minutes at 200° C. After the heat treatment, the light absorbance of the transparent film adjacent to the color pattern was measured using a colorimeter (MCPD-3000, trade name, manufactured by Otsuka Electronics Co., Ltd.) The ratio (%) of the light absorbance of the obtained transparent film with respect to the light absorbance of the color pattern measured before heating the same was calculated and used as an index for evaluating the color transfer.

—Evaluation Criteria—
Color transfer to adjacent pixels (%)
A: Color transfer to adjacent pixels was less than 1%
B: Color transfer to adjacent pixels was not less than 1% but less than 10%
C: Color transfer to adjacent pixels was not less than 10% but not greater than 30%
D: Color transfer to adjacent pixels was less than 30%

TABLE 5

| Example No. | Formula (1) | Color Transfer to Adjacent Pixels (with no UV irradiation) | Color Transfer to Adjacent Pixels (with UV irradiation) |
| --- | --- | --- | --- |
| Example 2B | a-5 | C | B |
| Example 3B | a-17 | C | B |
| Example 4B | a-20 | C | A |
| Example 5B | a-30 | B | A |
| Example 6B | a-38 | C | A |
| Example 7B | b-5 | C | B |
| Example 8B | b-17 | C | B |
| Example 9B | b-20 | C | B |
| Example 10B | b-40 | C | A |
| Example 11B | b-43 | C | B |
| Example 12B | c-5 | C | B |
| Example 13B | c-19 | C | B |
| Example 14B | c-26 | C | A |
| Example 15B | c-48 | B | A |
| Example 16B | d-1 | B | A |
| Example 17B | d-2 | B | A |
| Example 18B | d-11 | B | A |
| Example 19B | d-15 | B | A |
| Example 20B | d-21 | B | A |
| Example 21B | d-23 | B | A |
| Example 22B | d-25 | B | A |
| Example 23B | d-32 | B | A |
| Example 24B | d-33 | C | A |
| Example 25B | d-35 | C | A |
| Example 26B | e-1 | B | A |
| Example 27B | e-2 | B | A |
| Example 28B | e-3 | B | A |
| Example 29B | e-4 | B | A |
| Example 30B | e-5 | B | A |
| Example 31B | e-6 | B | A |
| Example 32B | e-8 | B | A |
| Example 33B | e-9 | B | A |
| Example 34B | e-13 | B | A |
| Example 35B | e-14 | C | A |
| Comparative 1B | Comparative Dye 1 | D | D |
| Comparative 2B | Comparative Dye 2 | D | C |

As shown in Table 4, in the Examples in which the dye according to the invention was used, color transfer to the adjacent pixels was suppressed as compared with the cases of Comparative Examples 1B and 2B. Further, the color transfer to the adjacent pixels was even more suppressed by performing ultraviolet irradiation.

Example 36

(1) Preparation of Colored Curable Composition (Positive)

| | |
| --- | --- |
| Ethyl lactate (EL) | 30 parts |
| Resin P-1 (see below) | 3.0 parts |
| Naphthoquinone diazide compound N-1 (see below) | 1.8 parts |
| Cross-linking agent: hexamethoxymethylolated melamine | 0.6 parts |
| Photo-acid generator: TAZ-107, trade name, manufactured by Midori Kagaku Co., Ltd.) | 1.2 parts |
| Fluorinated surfactant (F-475, trade name, manufactured by DIC Corporation) | 0.0005 parts |
| Dye: Exemplary Compound a-5 (compound according to the invention) | 0.3 parts |

The above components were mixed and dissolved to obtain a colored curable composition (positive-working).

Resin P-1 and naphthoquinone diazide compound N-1 were synthesized in the following manner.

(2) Synthesis of Resin P-1

70.0 g of benzyl methacrylate, 13.0 g of methacrylic acid, 17.0 g of 2-hydroxyethyl methacrylate and 600 g of 2-methoxypropanol were placed in a three-neck flask, and a stirrer, a reflux condenser and a thermometer were attached thereto. This was stirred for 10 hours under a nitrogen flow at 65° C., with the addition of a polymerization initiator (V-65, trade name, manufactured by Wako Pure Chemical Industries, Ltd.) in an amount such that it functions as a catalyst. The obtained resin solution was dropped in 20 L of ion exchange water while vigorously agitating the same, thereby obtaining a white powder. This white powder was vacuum-dried for 24 hours at 40° C., and 145 g of resin P-1 was thus obtained. The weight-average molecular weight (Mw) and the number-average molecular weight (Mn) as measured by GPC were 28,000 and 11,000, respectively.

(3) Synthesis of Naphthoquinone Diazide Compound N-1

42.45 g of Trisp-PA (manufactured by Honshu Chemical Industry Co., Ltd.), 61.80 g of o-naphthoquinone diazide-5-sulfonyl chloride and 300 ml of acetone were placed in a three-neck flask, and 24.44 g of triethylamine were dropped therein over an hour at room temperature. After the dropping, the mixture was further stirred for 2 hours, and this reaction solution was poured in a large amount of water while stirring the same. A precipitation of naphthoquinone diazide sulfonate was collected by suction filtration, and vacuum-dried for 24 hours at 40° C. A photosensitive compound (Naphthoquinone Diazide Compound N-1) was thus obtained.

The colored curable composition (positive-working) was evaluated in a similar manner to Example 2. As a result, it was found that the composition exhibited excellent storage stability, heat fastness, light fastness, solvent resistance and pattern shape.

Examples 37 and 38, Comparative Example 3 and 4

Examples 37 and 38

Preparation of Dark Color Composition K1 for Forming Partitions

Dark color composition K1 was prepared in the following manner.

K pigment dispersion 1 and propylene glycol monomethyl ether acetate were weighed in the amounts as shown in Table 5 and mixed at 24° C. (±2° C.), and stirred at 150 rpm for 10 minutes. While continuing the stirring, methyl ethyl ketone (2-butanone), binder 2, hydroquinone monomethyl ether, DPHA solution, 2,4-bis(trichloromethyl)-6-[4'-N,N-bisethoxycarbonylmethyl)amino-3'-bromophenyl]-s-triazine and surfactant 1 were weighed in the amounts described in Table 5 and added to the mixture in this order at 25° C. (+2° C.). Thereafter, the mixture was stirred for 30 minutes at 40° C. (±2° C.) at 150 rpm. The amounts of the components described in Table 5 are mass based, and the specific composition is described below.

<K Pigment Dispersion 1>

TABLE 6

| | |
|---|---|
| Carbon black (NIPEX 35, trade name, manufactured by Evonik Industries) | 13.1% |
| Dispersant (Compound B1, following structure) | 0.65% |

TABLE 6-continued

| | |
|---|---|
| Polymer (random copolymer of benzyl methacrylate/methacrylic acid = 72/28, molecular weight: 37,000) | 6.72% |
| Propylene glycol monomethyl ether acetate | 79.53% |
| <Binder 2> | |
| Polymer (random copolymer of benzyl methacrylate/methacrylic acid = 278/22, molecular weight: 38,000) | 27% |
| Propylene glycol monomethyl ether acetate | 73% |
| <DPHA Solution> | |
| Dipentaerythritol hexaacrylate (containing 550 ppm polymerization inhibitor (MEHQ), KAYARAD DPHA, trade name, manufactured by Nippon Kayaku Co., Ltd.) | 76% |
| Propylene glycol monomethyl ether acetate | 24% |
| <Surfactant 1> | |
| Compound 1 (following structure) | 30% |
| Methyl ethyl ketone | 70% |
| Dark Color Composition | K1 |
| K Pigment Dispersion (Carbon Black) | 25 |
| Propylene glycol monomethyl ether acetate | 8 |
| 2-butanone | 53 |
| Binder 2 | 9.1 |
| Hydroquinone monomethyl ether | 0.002 |
| DPHA Solution | 4.2 |
| 2,4-bis(trichloromethyl)-6-[4'-(N,N-bisethoxycarbonylmethyl)amino-3'-bromophenyl]-s-triazine | 0.16 |
| Surfactant 1 | 0.044 |

Compound B1

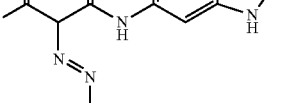

Compound 1 (PO: propylene oxide, EO: ethylene oxide)

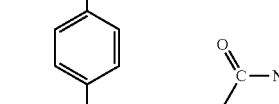

(n = 6, x = 55, y = 5, Mw = 33940, Mw/Mn = 2.55)

(Formation of Partitions)

An alkali-free glass substrate was washed with a UV washing machine, and then washed with a brush and a washing agent. The substrate was further washed with ultrasonic waves with ultra-pure water. The substrate was subjected to a heat treatment for 3 minutes at 120° C. so that the surface was in a stable state.

The substrate was cooled and the temperature was controlled to 23° C., and dark color composition K1 was applied thereon with a coater for glass substrate having a slit-shaped nozzle (MH-1600, trade name, manufactured by FAS Asia). Subsequently, part of the solution was dried to allow the coating layer to lose its fluidity in a vacuum drying apparatus (VCD, manufactured by Tokyo Ohka Kogyo Co., Ltd.), and pre-baking was performed for 3 minutes at 120° C. Dark color composition layer K1 having a thickness of 2.3 μm was thus obtained.

Pattern exposure (partition width: 20 µm, space width: 100 µm) was performed under a nitrogen atmosphere and an exposure amount of 300 mJ/cm$^2$, using a proximity exposure apparatus having an ultra-high-pressure mercury lamp in which the substrate and a mask (quartz exposure mask having an image pattern) were placed upright with a distance of 200 µm between the exposure mask surface and dark color composition layer K1.

Subsequently, the surface of dark color composition layer K1 was uniformly moistened by spraying pure water from shower nozzles, and a patterning image was obtained by performing shower development with a KOH developer (containing nonionic surfactant, CDK-1 (trade name), manufactured by Fujifilm Electronic Materials Co., Ltd., diluted by 100 times) at 23° C. for 80 seconds, with a flat nozzle pressure of 0.04 MPa. Thereafter, residues were removed by jetting ultra-pure water using an ultra-high-pressure washing nozzle at a pressure of 9.8 MPa, and post-exposure was performed from the side of the substrate on which dark color composition layer K1 was formed in air at an exposure amount of 2,500 mJ/cm$^2$. This was then heated for 50 minutes in an oven at 240° C., thereby obtaining stripe-shaped partitions having a thickness of 2.0 µm, an optical density of 4.0, and an opening having a width of 0.100 µm.

(Ink Repellent Plasma Treatment)

The substrate on which the partitions were formed was subjected to an ink repellent plasma treatment using a cathode-coupling parallel-plate plasma treatment apparatus.

Gas: CF$^4$
Gas flow rate: 80 sccm
Pressure: 40 Pa
RF power: 50 W
Treatment time: 30 sec (Method of Preparing Red (R) Ink)

The following components shown in Table 7 were mixed and stirred for an hour. Thereafter, the mixture was subjected to filtration with reduced pressure using a microfilter having an average pore size of 0.25 µm, thereby preparing red inks according to the invention (Ink R-1 and Ink R-2).

TABLE 7

| Class | Material | Example 27 Ink R-1 | Example 28 Ink R-2 |
|---|---|---|---|
| Solvent | Cyclohexanone | 69.95% | 79.95% |
| Monomer | DPCA-60 | 20% | 10% |
| Surfactant | KF-353 | 0.05% | 0.05% |
| Dye | Exemplary Compound a-5 | 10% | 10% |
| | Ink Viscosity (mPa · s) | 8.9 | 5.2 |
| | Surface Tension (mN/m) | 25.4 | 30.4 |

The following are details of the components.

Dye: Exemplary Compound a-5 represented by formula (2)

DPCA-60 (KAYARAD DPCA-60, trade name, manufactured by Nippon Kayaku Co., Ltd.): caprolactone-modified dipentaerythritol hexaacrylate KF-353 (manufactured by Shin-Etsu Chemical Co., Ltd.): polyether-modified silicone oil (Measurement of Viscosity and Surface Tension)

The viscosity of the obtained ink was measured using an E-type viscometer (RE-80L, trade name, manufactured by Toki Sangyo Co., Ltd.) while maintaining the temperature of the ink at 25° C.

—Measurement Conditions—
Rotor: 1° 34×R24
Measurement time: 2 minutes
Measurement temperature: 25° C.

While maintaining the temperature of the ink at 25° C., the surface tension of the ink was measured using a surface tensiometer (CBVB-A3, trade name, manufactured by Kyowa Interface Science Co., Ltd.)

(Method of Measuring Contrast)

A cold cathode tube as a light source with a diffuser panel was used as a backlight unit, and a single-color substrate was sandwiched by two polarizing plates (POLAX-15N, trade name, manufactured by Luceo Co., Ltd.). The contrast was calculated by dividing the Y value of chromaticity of light that passes the polarizing plates positioned in parallel nicol by the Y value of chromaticity of light that passes the polarizing plates positioned in cross nicol (Y value in parallel nicil/Y value in cross nicol). The chromaticity was measured by using a color luminance meter (BM-5A, trade name, manufactured by Topcon Corporation). The single-color substrate was manufactured by the following method.

A solid film was formed on a glass substrate from the red ink for forming a color filter (Inks R-1 and R-2) by ink jetting or spin coating, and this was subjected to pre-baking (pre-heating) for 2 minutes at 100° C. and post-baking (post-heating) for 30 minutes at 220° C., in a similar manner to the formation of a color filter, thereby forming a film having a thickness of 2 µm.

The measurement angle of the color luminance meter was set at 1° and the measurement was conducted over the sample (field of vision ϕ: 5 mm). The amount of light of the backlight was set such that the illuminance was 400 cd/m$^2$ when the two polarizing plates are positioned in parallel nicol without placing a sample therebetween.

The contrast of the two types of single-color substrates obtained in the above process was not less than 50,000, respectively.

(Preparation of ITO Layer)

Subsequently, a film of ITO (indium tin oxide) having a thickness of 1,500 angstroms was formed on the single-color substrate by performing sputtering at a film surface temperature of 200° C. for 15 minutes using a sputtering apparatus. A color filter substrate with an ITO film was thus prepared.

(Changes in Spectroscopic Characteristics Before and after ITO Sputtering)

A spectral transmittance curve in a wavelength range of from 400 nm to 700 nm was obtained using a UV-visible absorption spectrometer (V-570, trade name, manufactured by JASCO Corporation) before and after the ITO sputtering. When the amount of change in the spectral transmittance at a maximum peak is small, it indicates that heat fastness is favorable. Significant changes in the shape of the spectrum were not observed in the obtained substrates before and after the ITO sputtering, thereby proving that a high degree of heat fastness was achieved.

Comparative Examples 3 and 4

Preparation of Pigment Dispersion 17.5 parts of C.I. Pigment Red 177 (CROMOPHTHAL RED A2B, trade name, manufactured by BASF Japan Ltd.) was mixed with 2.5 parts of pigment dispersion (Compound B1), 80 parts of a solvent (1,3-butanediol diacetate, 1,3-BGDA) and MMPGAC (propylene glycol monomethyl ether acetate). After pre-mixing, the mixture was dispersed using a motor mill (M-50, trade name, manufactured by Eiger Japan) with zirconia beads having a diameter of 0.65 mm, at a filling rate of 80% and a peripheral rate of 9 m/s for 25 hours. A pigment dispersion for R (R1) was thus prepared.

A pigment dispersion for R (R2) was prepared in a similar manner to the preparation of pigment dispersion R1, except that the pigment was changed to C.I. Pigment Red 254 (IRGAPHOR RED B-CF, trade name, manufactured by BASF Japan Ltd.)

The number-average particle size of these pigment dispersions was measured using a particle size analyzer (NANOTRACK UPA-EX 150, trade name, manufactured by Nikkiso Co., Ltd.) As a result, the number-average particle diameter of these pigment dispersions was 50 nm, respectively.

(Preparation of Comparative Inks)

Pigment inks R-a and R-b were prepared by using the above-mentioned pigment dispersions at the amounts described in the following Table 7. The materials used are as follows.

DPS100 (manufactured by Nippon Kayaku Co., Ltd.): KAYARAD DPS100

TMPTA (manufactured by Nippon Kayaku Co., Ltd.): KAYARAD TMPTA

Surfactant: Surfactant 1 (previously mentioned)

V-40 (manufactured by Wako Pure Chemical Industries, Ltd.): azobis(cyclohexan-1-carbonitrile)

TABLE 8

| Class | Material | Comparative 3 Comparative Ink R-a | Comparative 4 Comparative Ink R-b |
|---|---|---|---|
| Solvent | 1,3-BGDA | 23.9% | 48.5% |
|  | MMPGAC | 20% | none |
| Monomer | DPS100 | 20% | 10% |
|  | TMPTA | none | 5% |
| Surfactant | Surfactant 1 | 0.1% | 0.1% |
| Dye | Pigment Dispersion R1 | 2.5% | 32.5% |
|  | Pigment Dispersion R2 | 32.5% | 2.5% |
| Initiator | V-40 | 1% | 1.4% |

(Method of Preparing Color Filter for Evaluation)

A single-color color filter was prepared by ejecting the ink prepared in the above process in a region defined by partitions (concave portions surrounded by projecting portions) on the substrate prepared in the above process, using an inkjet printer (DMP-2831, trade name, manufactured by Fujifilm Dimatix, Inc.), and then heating the same for 2 minutes in an oven at 100° C. Subsequently, the color filter was placed in an oven at 220° C. for 30 minutes, whereby a single-color filter was prepared.

(Evaluation)

Storage Stability of Ink

The inks prepared in the above process were stored in a constant-temperature room at 50° C., and 30 days after the storage, the viscosity thereof was measured. The storage stability was evaluated by a difference (%) of the viscosity of the ink measured immediately after the preparation and the viscosity of the ink measured after storing for 30 days, i.e., ((viscosity after 30 days—viscosity immediately after preparation)/viscosity immediately after the preparation)).

The results were evaluated in accordance with the following criteria.

A: Difference in viscosity was less than 10%
B: Difference in viscosity was from 10% to less than 20%
C: Difference in viscosity was from 20% to less than 30%
D: Difference in viscosity was 30% or greater Continuous Ejection Stability Ejection stability of the ink prepared in the above process was evaluated. The evaluation was conducted by observing the state after performing continuous ejection for 30 minutes. The ejection was carried out by using an inkjet printer (DMP-2831, trade name, manufactured by Fujifilm Dimatix, Inc.) and a head cartridge with an ejection amount of 10 pL, at an ejection frequency of 10 kHz.

The results were evaluated in accordance with the following criteria.

A: Continuous ejection was possible without problems

B: A slight degree of absence or disorder of ejection was observed during the ejection, but the normal state was recovered during the ejection. There were no significant problems.

C: Absence or disorder of ejection occurred during the ejection, and the normal state was not recovered during the ejection. However, the normal state was recovered by performing maintenance.

D: Absence or disorder of ejection occurred during the ejection, and the normal state was not recovered during the ejection. The normal state was not recovered even with maintenance.

The maintenance included purging (forcibly ejecting ink from nozzles by pressurizing the ink in the head) and blotting (sucking ink on the nozzle surface by slightly contacting the head nozzle surface to a cleaning pad) performed by DMP-2831.

Ejection Stability after Intermission

Ejection stability was evaluated by using the ink prepared in the above process. The evaluation was conducted by observing the state after performing ejection for 5 minutes, having an intermission for 24 hours, and again performing ejection under the same conditions. The ejection was carried out by using an inkjet printer (DMP-2831, trade name, manufactured by Fujifilm Dimatix, Inc.) and a head cartridge with an ejection amount of 10 pL, at an ejection frequency of 10 kHz.

The results were evaluated in accordance with the following criteria.

A: Ejection was carried out at the same time as receiving ejection instructions.

B: A slight degree of absence or disorder of ejection was observed immediately after receiving ejection instructions, but the normal state was recovered during the ejection. There were no significant problems.

C: Absence or disorder of ejection occurred during the ejection, and the normal state was not recovered during the ejection. However, the normal state was recovered by performing maintenance.

D: Absence or disorder of ejection occurred during the ejection, and the normal state was not recovered during the ejection. The normal state was not recovered even with maintenance.

The maintenance included purging (forcibly ejecting ink from nozzles by pressurizing the ink in the head) and blotting (sucking ink on the nozzle surface by slightly contacting the head nozzle surface to a cleaning pad) performed by DMP-2831.

Heat Fastness

The color filter prepared in the above process was placed in an oven heated to 230° C. and allowed to stand for an hour. The color hue of the color filter was measured before and after the above process. The measurement of color hue was conducted by using a UV-visible absorption spectrometer (V-560, trade name, manufactured by JASCO Corporation). The results were evaluated by the following criteria.

A: Difference in color hue ($\Delta$Eab) was less than 5.
B: Difference in color hue ($\Delta$Eab) was from 5 to less than 15.
C: Difference in color hue ($\Delta$Eab) was 15 or greater.

Chemical Resistance

The color filter prepared in the above process was immersed in respective chemical solutions (N-methylpyrrolidone, 2-propanol, 5% aqueous solution of sulfuric acid and 5% aqueous solution of sodium hydroxide). The color hue of the color filter was measured before and after the immersion. The measurement of color hue was conducted by using a UV-visible absorption spectrometer (V-560, trade name, manufactured by JASCO Corporation). The results were evaluated by the following criteria.

A: Difference in color hue ($\Delta$Eab) was less than 5.

B: Difference in color hue (ΔEab) was from 5 to less than 15.

C: Difference in color hue (ΔEab) was 15 or greater.

The results of evaluation of inks for inkjet and color filters are shown in the following Table 9.

TABLE 9

| Evaluation Criteria | Example 37 | Example 38 | Comparative 3 | Comparative 4 |
|---|---|---|---|---|
| Ink Viscosity (mPa·s) | 8.9 | 5.2 | 11.2 | 10.8 |
| Surface Tension (mN/m) | 25.4 | 30.4 | 29.5 | 30.2 |
| Ink Storage Stability | A | A | A | B |
| Continuous Ejection Stability | A | A | C | C |
| Ejection Stability after Intermission | A | B | D | D |
| Heat Fastness | A | A | A | A |
| Chemical Resistance (N-methyl pyrrolidone) | A | B | A | A |
| Chemical Resistance (2-propanol) | A | A | A | A |
| Chemical Resistance (5% aqueous sulfuric acid solution) | A | A | A | A |
| Chemical Resistance (5% aqueous sodium hydroxide solution) | A | A | B | B |

As shown in Table 9, the ink for inkjet printing described in the present specification exhibited both excellent storability and ejection stability. Further, the color filter produced by using the ink for inkjet printing described in the present specification exhibited chemical resistance and heat fastness that were as excellent as that of color filters produced by using a pigment ink.

On the other hand, the Comparative Examples in which a pigment ink was used exhibited poor ejection stability and not applicable for practical usage.

All publications, patent applications, and technical standards mentioned in this specification are herein incorporated by reference to the same extent as if each individual publication, patent application, or technical standard was specifically and individually indicated to be incorporated by reference.

This application claims priority under 35 USC 119 from Japanese Patent Application No. 2009-237658 filed Oct. 14, 2009 and No. 2010-014776 filed Jan. 26, 2010, the disclosures of which are incorporated by reference herein.

The invention claimed is:

1. A colored curable composition comprising at least one of a compound represented by the following formula (1) or a tautomer of the compound:

formula (1)

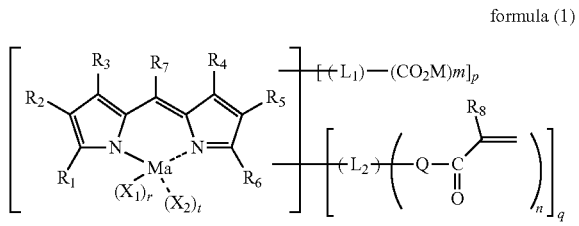

wherein in formula (1), $R_1$ to $R_6$ each independently represent a hydrogen atom or a substituent; $R_7$ represents a hydrogen atom, a halogen atom, an alkyl group, an aryl group or a heterocyclic group; a substituent represented by any of $R_1$ to $R_6$ is a divalent linking group bonded to $-L_1-$ or $-L_2-$, or a substituent represented by any of $R_1$ to $R_6$ is a single bond and $-L_1-$ or $-L_2-$ directly substitutes the dipyrromethene skeleton; Ma represents a metal or a metal compound; $X_1$ represents a group to neutralize charges of Ma; $X_2$ represents a group capable of binding to Ma; r represents 0 or 1; t represents 0, 1 or 2; $X_1$ and $X_2$ may be bonded to each other to form a five, six or seven-membered ring; M represents a hydrogen atom, an organic base or a metal atom to neutralize charges of $-CO_2-$, or an anion (that is, $CO_2M$ represents $CO_2^-$); $L_1$ represents a single bond or a (m+1)-valent linking group; m represents 1, 2 or 3; p represents 1 or 2; $R_8$ represents a hydrogen atom or a methyl group; Q represents an oxygen atom or $NR_9$ ($R_9$ represents a hydrogen atom, an alkyl group, an alkenyl group, an aryl group, a heterocyclic group, an acyl group, an alkylsulfonyl group or an arylsulfonyl group); $L_2$ represents a single bond or an (n+1)-valent linking group; n represents 1, 2 or 3; q represents 1 or 2; when p is 2, the two of $\{(L_1)-(CO_2M)m\}$ may be the same or different from each other; when q is 2, the two of $\{(L_2)-(Q-COC(R_8)=CH_2)n\}$ may be the same or different from each other; when m is 2 or 3, the two or three of $(CO_2M)$ may be the same or different from each other; and when n is 2 or 3, the two or three of $(Q-COC(R_8)=CH_2)$ may be the same or different from each other.

2. The colored curable composition according to claim 1, wherein the at least one of the compound represented by formula (1) or a tautomer of the compound is at least one of a compound represented by the following formula (2) or a tautomer of the compound represented by formula (2):

formula (2)

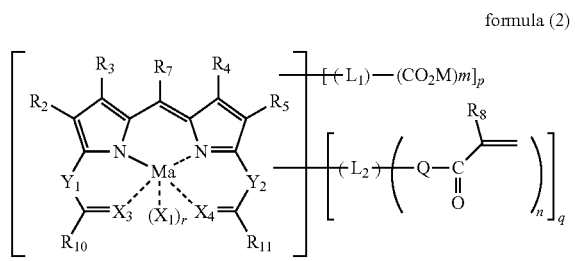

wherein in formula (2), $R_2$ to $R_5$ each independently represent a hydrogen atom or a substituent; $R_7$ represents a hydrogen atom, a halogen atom, an alkyl group, an aryl group or a heterocyclic group; $R_{10}$ and $R_{11}$ each independently represent an alkyl group, an alkenyl group, an aryl group, a heterocyclic group, an alkoxy group, an aryloxy group, an amino group, an anilino group or a heterocyclic amino group; a substituent represented by any of $R_2$ to $R_5$, $R_{10}$ or $R_{11}$ is a divalent linking group bonded to $-L_1-$ or $-L_2-$, or a substituent represented by any of $R_2$ to $R_5$, $R_{10}$ or $R_{11}$ is a single bond and $-L_1-$ or $-L_2-$ directly substitutes the dipyrromethene skeleton; Ma represents a metal or a metal compound; $X_1$ represents a group to neutralize charges of Ma; r represents 0 or 1; $X_3$ and $X_4$ each independently represent NR (R represents a hydrogen atom, an alkyl group, an alkenyl group, an aryl group, a heterocyclic group, an acyl group, an alkylsulfonyl group or an arylsulfonyl group), a nitrogen atom, an oxygen atom or a sulfur atom; $Y_1$ and $Y_2$ each independently represent NR (R represents a hydrogen atom, an alkyl group, an alkenyl group, an aryl group, a heterocyclic group, an acyl group, an alkylsulfonyl group or an arylsulfonyl group) or an oxygen atom; $R_{10}$ and $Y_1$ may be bonded to each other to form a five, six or seven-membered ring; $R_{11}$ and $Y_2$ may be bonded to each other to form a five, six or seven-membered ring; M represents a hydrogen atom, or an organic base or a metal atom to neutralize charges of $-CO_2^-$, or an anion (i.e., $CO_2M$ represents $CO_2^-$); $L_1$ represents a single bond or a (m+1)-valent linking group; m represents 1, 2 or 3; p represents 1 or 2; $R_8$ represents a hydrogen atom or a methyl group; Q represents an oxygen atom or $NR_9$ ($R_9$ represents a hydrogen atom, an alkyl group, an alkenyl group, an aryl group, a heterocyclic group, an acyl group, an alkylsulfonyl group or an arylsulfonyl group); $L_2$ represents a single bond or an (n+1)-valent linking group; n represents 1, 2 or 3; q represents 1 or 2; when p is 2, the two of $\{(L_1)-(CO_2M)m\}$ may be the same or different from each other; when q is 2, the two of $\{(L_2)-(Q-COC(R_8)=CH_2)n\}$ may be the same or different from each other; when m is 2 or 3, the two or three of $(CO_2M)$ may be the same or different from each other; and when n is 2 or 3, the two or three of $(Q-COC(R_8)=CH_2)$ may be the same or different from each other.

3. The colored curable composition according to claim 1, wherein Ma in Formula (1) or Formula (2) is Fe, Zn, Co, V=O or Cu.

4. The colored curable composition according to claim 1, wherein Ma in Formula (1) or Formula (2) is Zn.

5. A color filter formed by using the colored curable composition according to claim 1.

6. A resist liquid comprising the colored curable composition according to claim 1.

7. An ink for inkjet printing comprising the colored curable composition according to claim 1.

8. A method of producing a color filter, the method comprising:
forming a layer on a support by applying the colored curable composition according to claim 1 to the support;
exposing the layer formed from the colored curable composition to light through a mask; and
forming a patterned image by developing the layer formed from the colored curable composition after being exposed to light.

9. The method of producing a color filter according to claim 8, further comprising, after forming the patterned image by developing, subjecting the patterned image to ultraviolet irradiation.

10. A method of producing a color filter, the method comprising forming color pixels of the color filter by depositing droplets of the ink for inkjet printing according to claim 7 by an inkjet method to concave portions of a support, the concave portions being defined by partitions.

11. A solid-state image sensor comprising the color filter according to claim 5.

12. A liquid crystal display comprising the color filter according to claim 5.

13. An organic EL display comprising the color filter according to claim 5.

14. An image display device comprising the color filter according to claim 5.

15. A colorant compound selected from the group consisting of a compound represented by the following formula (2) and a tautomer of the compound:

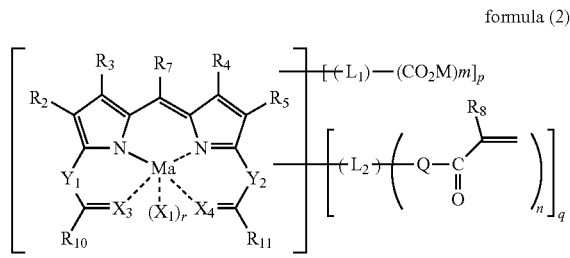

formula (2)

wherein in formula (2), $R_2$ to $R_5$ each independently represent a hydrogen atom or a substituent; $R_7$ represents a hydrogen atom, a halogen atom, an alkyl group, an aryl group or a heterocyclic group; $R_{10}$ and $R_{11}$ each independently represent an alkyl group, an alkenyl group, an aryl group, a heterocyclic group, an alkoxy group, an aryloxy group, an amino group, an anilino group or a heterocyclic amino group; a substituent represented by any of $R_2$ to $R_5$, $R_{10}$ or $R_{11}$ is a divalent linking group bonded to $-L_1-$ or $-L_2-$, or a substituent represented by any of $R_2$ to $R_5$, $R_{10}$ or $R_{11}$ is a single bond and $-L_1-$ or $-L_2-$ directly substitutes the dipyrromethene skeleton; Ma represents a metal or a metal compound; $X_1$ represents a group to neutralize charges of Ma; r represents 0 or 1; $X_3$ and $X_4$ each independently represent NR (R represents a hydrogen atom, an alkyl group, an alkenyl group, an aryl group, a heterocyclic group, an acyl group, an alkylsulfonyl group or an arylsulfonyl group), a nitrogen atom, an oxygen atom or a sulfur atom; $Y_1$ and $Y_2$ each independently represent NR (R represents a hydrogen atom, an alkyl group, an alkenyl group, an aryl group, a heterocyclic group, an acyl group, an alkylsulfonyl group or an arylsulfonyl group) or an oxygen atom; $R_{10}$ and $Y_1$ may be bonded to each other to form a five, six or seven-membered ring; $R_{11}$ and $Y_2$ may be bonded to each other to form a five, six or seven-membered ring; M represents a hydrogen atom, or an organic base or a metal atom to neutralize charges of $—CO_2^-$, or an anion (i.e., $CO_2M$ represents $CO_2^-$); $L_1$ represents a single bond or a (m+1)-valent linking group; m represents 1, 2 or 3; p represents 1 or 2; $R_8$ represents a hydrogen atom or a methyl group; Q represents an oxygen atom or $NR_9$ ($R_9$ represents a hydrogen atom, an alkyl group, an alkenyl group, an aryl group, a heterocyclic group, an acyl group, an alkylsulfonyl group or an arylsulfonyl group); $L_2$ represents a single bond or an (n+1)-valent linking group; n represents 1, 2 or 3; q represents 1 or 2; when p is 2, the two of $\{(L_1)-(CO_2M)m\}$ may be the same or different from each other; when q is 2, the two of $\{(L_2)-(Q-COC(R_8)=CH_2)n\}$ may be the same or different from each other; when m is 2 or 3, the two or three of $(CO_2M)$ may be the same or different from each other; and when n is 2 or 3, the two or three of $(Q-COC(R_8)=CH_2)$ may be the same or different from each other.

* * * * *